(12) United States Patent
Matsunaga et al.

(10) Patent No.: US 7,113,213 B2
(45) Date of Patent: Sep. 26, 2006

(54) IMAGE SYSTEM, SOLID-STATE IMAGING SEMICONDUCTOR INTEGRATED CIRCUIT DEVICE USED IN THE IMAGE SYSTEM, AND DIFFERENCE OUTPUT METHOD USED FOR THE IMAGE SYSTEM

(76) Inventors: Yoshiyuki Matsunaga, 1-2-21-212, Kobukuroyai, Kamakura-shi, Kamakura-shi (JP) 247; Keiji Mabuchi, 2-14-10, Minamikase, Saiwai-ku, Kawasaki-shi, Kanagawa-ken (JP) 211; Shinji Ohsawa, 1-21-24-204, Kokubukita, Ebina-shi, Kanagawa-ken (JP) 234-04; Nobuo Nakamura, 2-1-E620, Toshiba-cho, Fuchu-shi, Tokyo (JP) 183; Hirofumi Yamashita, 1-5-22, Higashiyaguchi, Ota-ku, Tokyo (JP) 146; Hiroki Miura, 2-8-2, Shiomidai, Isogo-ku, Yokohama-shi, Kanagawa-ken (JP) 235; Nagataka Tanaka, 4-19-18-409, Nakamachidai, Tsuzuki-ku Kanagawa-ken, Yokohama-shi (JP) 224

( * ) Notice: Subject to any disclaimer, the term of this patent is extended or adjusted under 35 U.S.C. 154(b) by 610 days.

(21) Appl. No.: 09/927,632

(22) Filed: Aug. 13, 2001

(65) Prior Publication Data

US 2001/0052941 A1 Dec. 20, 2001

Related U.S. Application Data

(63) Continuation of application No. 09/022,339, filed on Feb. 11, 1998, which is a continuation of application No. PCT/JP96/02285, filed on Aug. 12, 1996.

(30) Foreign Application Priority Data

| Aug. 11, 1995 | (JP) | ................................ 7-206142 |
| Aug. 11, 1995 | (JP) | ................................ 7-206143 |
| Aug. 11, 1995 | (JP) | ................................ 7-206144 |
| Aug. 11, 1995 | (JP) | ................................ 7-208140 |
| Mar. 11, 1996 | (JP) | ................................ 8-053220 |
| Mar. 15, 1998 | (JP) | ................................ 08-059845 |

(51) Int. Cl.
*H04N 3/14* (2006.01)
(52) U.S. Cl. ...................... 348/308; 348/241; 348/301
(58) Field of Classification Search ................ 348/294, 348/297, 300, 301, 302, 303, 308, 22.1, 241; 250/208.1; 257/292, 291, 293, 294, 231
See application file for complete search history.

(56) References Cited

U.S. PATENT DOCUMENTS

| 4,805,025 A | 2/1989 | Akiyama et al. |
| 4,809,075 A | 2/1989 | Akimoto et al. |
| 4,819,070 A | 4/1989 | Hynecek |
| 4,926,247 A | 5/1990 | Nagasaki et al. |
| 4,942,474 A | 7/1990 | Akimoto et al. |
| 5,138,458 A | 8/1992 | Nagasaki et al. |
| 5,144,447 A | 9/1992 | Akimoto et al. |
| 5,172,249 A | 12/1992 | Hashimoto |
| 5,187,583 A | 2/1993 | Hamasaki |
| 5,296,696 A | 3/1994 | Uno |
| 5,322,994 A | 6/1994 | Uno |
| 5,335,075 A | 8/1994 | Komiya et al. |
| 5,343,254 A | 8/1994 | Wada et al. |
| 5,379,068 A | 1/1995 | Hamasaki |
| 5,402,171 A | 3/1995 | Tagami et al. |
| RE34,926 E | 5/1995 | Hieda et al. |
| 5,488,415 A | 1/1996 | Uno |
| 5,625,411 A | 4/1997 | Inuiya et al. |
| 5,793,423 A | 8/1998 | Hamasaki |
| 6,091,449 A | 7/2000 | Matsunaga et al. |

FOREIGN PATENT DOCUMENTS

| JP | 61-70874 | 4/1986 |
| JP | 61-154063 | 7/1986 |

| | | |
|---|---|---|
| JP | 62-213485 | 9/1987 |
| JP | 63-93282 | 4/1988 |
| JP | 63-116458 | 5/1988 |
| JP | 1-154678 | 6/1989 |
| JP | 1-238381 | 9/1989 |
| JP | 1-245769 | 9/1989 |
| JP | 2-174378 | 7/1990 |
| JP | 3-135175 | 6/1991 |
| JP | 4-4681 | 1/1992 |
| JP | 4-348566 | 12/1992 |
| JP | 5-37940 | 2/1993 |
| JP | 5-56357 | 3/1993 |
| JP | 5-207220 | 8/1993 |
| JP | 5-207376 | 8/1993 |
| JP | 5-227487 | 9/1993 |
| JP | 6-98080 | 4/1994 |
| JP | 6-217205 | 8/1994 |
| JP | 6-350886 | 12/1994 |
| JP | 7-30086 | 1/1995 |
| JP | 7-231076 | 8/1995 |
| JP | 61-189785 | 8/1996 |
| JP | 8-251485 | 9/1996 |
| JP | 9-46596 | 2/1997 |
| WO | WO97/07631 | 2/1997 |

OTHER PUBLICATIONS

Chamberlain, Savvas G. "Photosensitivity and Scanning of Silicon Image Detector Arrays." IEEE, Journal of Solid-State Circuits, vol. SC-4, No. 6, Dec. 1969, pp. 333-342.

Patent Abstracts of Japan, vol. 18, No. 535 (E-1615), Oct. 12, 1994, JP 06 189199, Jul. 8, 1994.

*Primary Examiner*—Aung Moe

(57) ABSTRACT

An image system uses an amplification-type MOS sensor for receiving an optical image through a photoelectric conversion element, converting the image into an electrical signal, and outputting the signal. This system includes an optical system for guiding this optical image to a predetermined position, an image processing means having a sensor for photoelectrically converting the optical image guided to the predetermined position by the optical system into an electrical signal in units of pixels, and a signal process device for processing an output from the image processing means, and outputting the resultant data. The sensor includes a photoelectric conversion element placed at the predetermined position, an output circuit having an amplification MOS transistor connected to the photoelectric conversion element and serving to amplify and output an output from the photoelectric conversion element at a first timing and output noise independent of the output from the photoelectric conversion element at a second timing, and a noise reduction circuit, connected to the output of the output circuit, having the same impedance at the first and second timings when viewed from the output circuit, and obtaining the difference between outputs from the output circuits at the first and second timings. By setting the same impedance, proper noise cancellation can be performed.

36 Claims, 90 Drawing Sheets

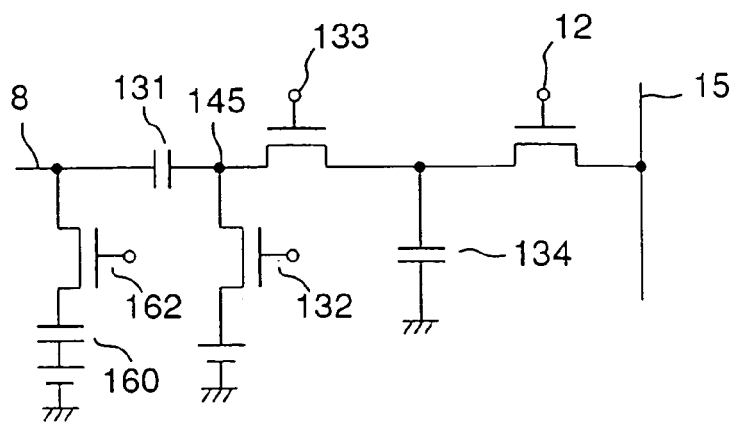
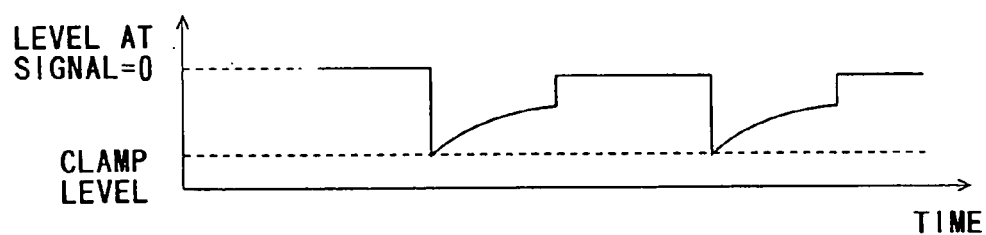
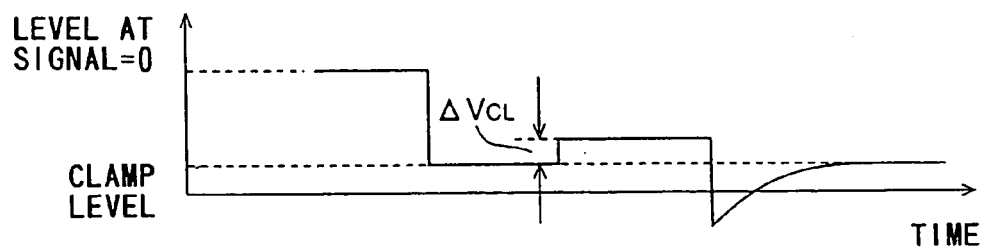
FIG.55

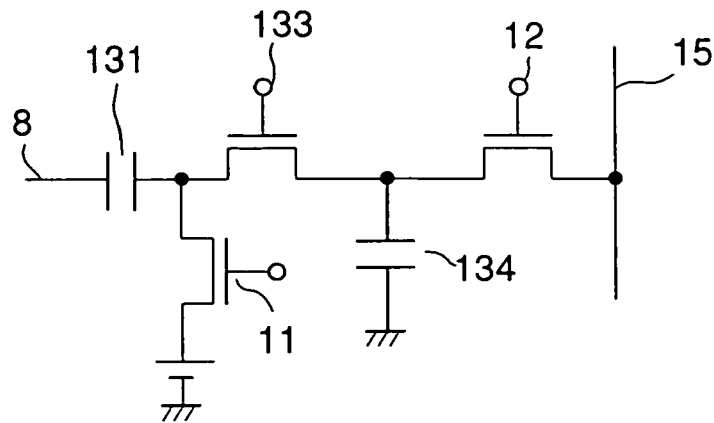
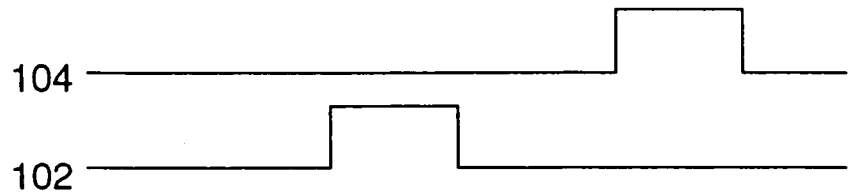
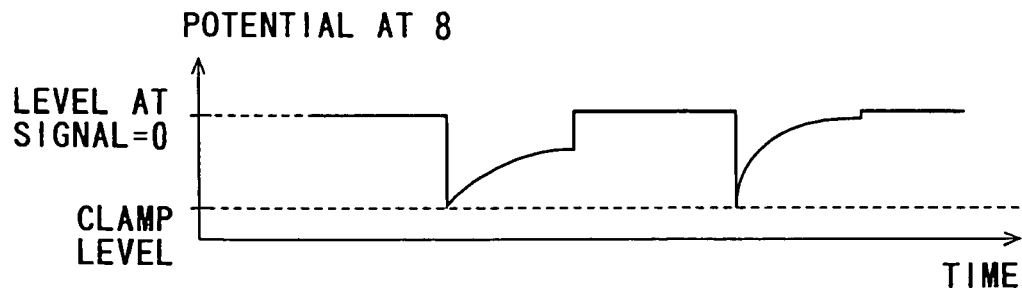
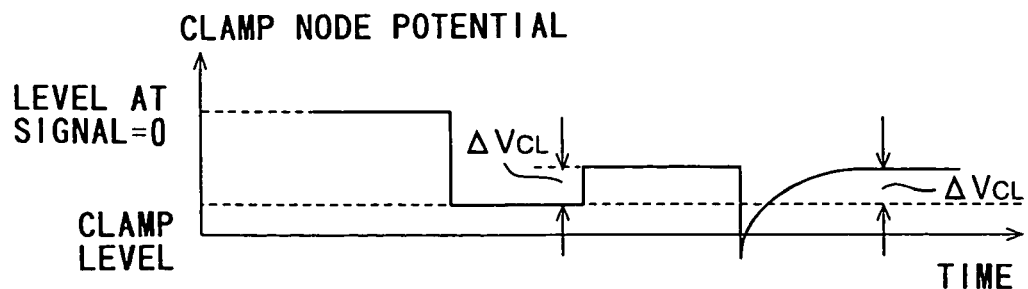
FIG.56

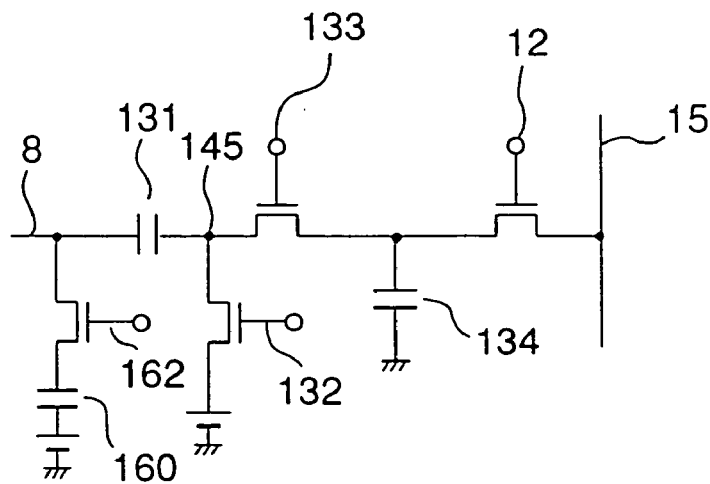
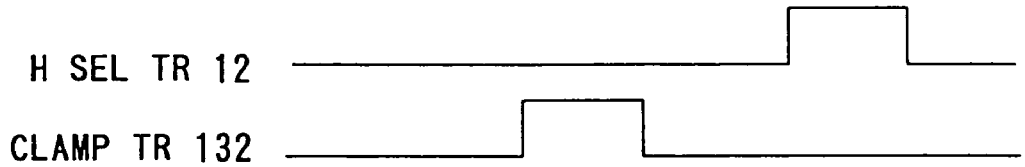
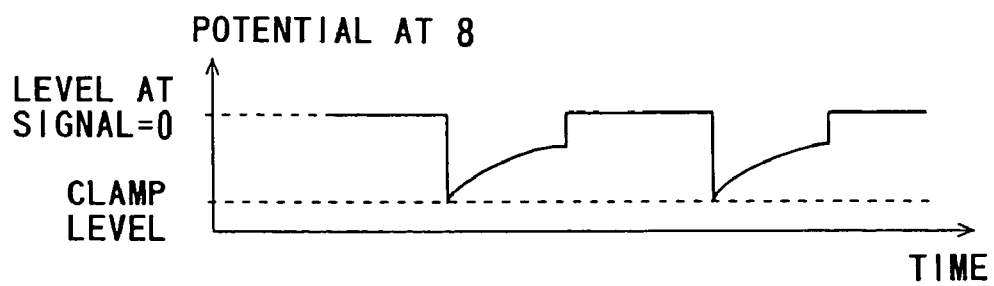
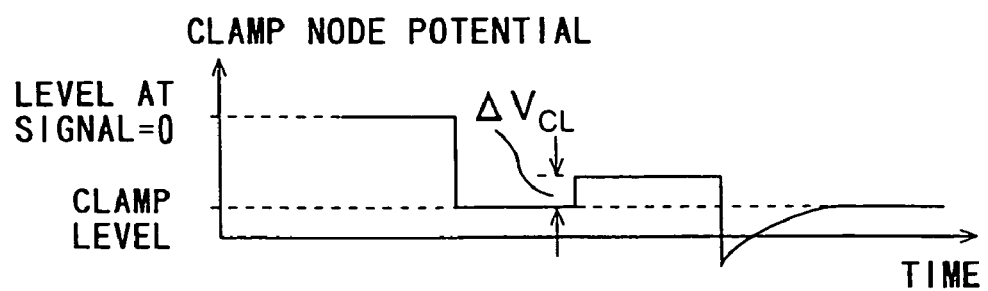
FIG.76

IMAGE SYSTEM, SOLID-STATE IMAGING SEMICONDUCTOR INTEGRATED CIRCUIT DEVICE USED IN THE IMAGE SYSTEM, AND DIFFERENCE OUTPUT METHOD USED FOR THE IMAGE SYSTEM

CROSS-REFERENCE TO RELATED APPLICATIONS

This application is a continuation of application Ser. No. 09/022,339, filed Feb. 11, 1998, which has been abandoned, which is a continuation of PCT/JP96/02285, filed Aug. 12, 1996, the disclosures of which are herein incorporated by reference.

BACKGROUND OF THE INVENTION

The present invention relates to a solid-state imaging device using an amplification-type MOS sensor designed to amplify a signal charge in each cell, and a system using the solid-state imaging device.

With the advances in the semiconductor device technologies, video cameras have become smaller and portable and have been widely used. For the sake of portability, electronic equipment uses a battery as a power supply. Conventionally, video cameras have used CCD sensors as imaging elements. A CCD sensor, however, requires a plurality of types of voltages to drive the device, and hence requires a power supply circuit for generating such voltages from the battery voltage. This interferes with a further reduction in the size of the video camera and a reduction in power consumption.

Studies on compact, lightweight video cameras have been made to make the devices easier to handle. In addition, solid-state imaging devices with larger numbers of pixels have been developed to obtain high-quality images. To realize compact, lightweight video cameras, strong demands have arisen for solid-state imaging devices which allow reductions in power consumption and voltage as well as a reduction in size.

To simply realize a compact solid-state imaging device with a large number of pixels, the pixel size may be reduced. If, however, the pixel size is reduced, the amount of signal charge processed per pixel decreases. As a result, the dynamic range of the solid-state imaging device narrows, and a clear, high-resolution video cannot be obtained.

A CCD uses a plurality of types of voltages as driving voltages for the device, and hence a simple system cannot be coped with in terms of camera system configuration and handling. That is, for application to portable cameras and personal computer cameras, a solid-state imaging device which attains a high S/N ratio and uses a single power supply, and also attains reductions in power consumption and voltage is required. The CCD, however, cannot be driven by a single power supply, and cannot attain reductions in power consumption and voltage. Furthermore, since the S/N ratio decreases as the pixel size decreases, the above requirements cannot be met.

Studies on other devices which can satisfy the above requirements show that an MOS sensor using an amplification-type transistor is available as a solid-state imaging device which can be driven by a single power supply.

This solid-state imaging device is designed to amplify a signal detected by a photodiode in each cell by using a transistor, and is characterized by having a high sensitivity.

Unlike a CCD sensor manufactured by a special manufacturing process, an MOS sensor is manufactured by an MOS process which is widely used for a semiconductor memory such as a DRAM, a processor, and the like. An MOS sensor can therefore be formed on the same semiconductor chip on which a semiconductor memory and a processor are formed, or easily allows sharing of a manufacturing line with a semiconductor memory or a processor.

In the above conventional MOS sensor (amplification-type MOS sensor) using an amplification transistor, it is difficult to reduce luminance irregularity called fixed pattern noise, as will be described later. In addition, the output dynamic range of this amplification-type MOS sensor is as narrow as about 60 dB, which is insufficient as compared with the dynamic range of a silver-halide photographic film, which is 90 dB, and that of a CCD sensor, which is 70 dB. In practice, therefore, considerable limitations are imposed, in terms of image quality, in mounting the amplification-type-MOS sensor in image system equipment such as a video camera.

FIG. 1 is a circuit diagram showing a conventional solid-state imaging device using an amplification-type MOS sensor. Unit cells P0-i-j corresponding to pixels are arranged in the form of a two-dimensional matrix. Although FIG. 1 shows only a 2×2 matrix, the actual apparatus has several thousand cells×several thousand cells. Reference symbol i denotes a variable in the horizontal (row) direction; j, a variable in the vertical (column) direction. Each unit cell P0-i-j is constituted by a photodiode 1-i-j, an amplification transistor 2-i-j, a vertical selection transistor 3-i-j, and a reset transistor 4-i-j. A vertical address circuit 5 and a horizontal address circuit 13 are arranged to sequentially select unit cells P0-1-1, ..., P0-i-j, ... which are arranged in the form of a two-dimensional matrix. The vertical address circuit 5 has pairs of address output terminals and reset signal terminals which correspond to n representing the number of horizontal arrays (the number of arrays in the horizontal (row) direction) of unit cells P0-1-1, ..., P0-i-j of the n×m two-dimensional matrix. The horizontal address circuit 13 has address output terminals corresponding to m representing the number of vertical arrays (the number of arrays in the vertical (column) direction) of unit cells P0-1-1, ..., P0-i-j of the n×m two-dimensional matrix. Note that m, n, i, and j are arbitrary integers.

Vertical address lines 6-1, 6-2, ... sequentially and respectively extend from the vertical address circuit 5 in the horizontal (row) direction along the unit cells P0-1-1, P0-1-2, ..., P0-2-j, ... arranged in the horizontal (row direction). Each of the vertical address lines 6-1, 6-2, ... is connected to a corresponding one of the n address output terminals of the vertical address circuit 5.

Reset signal lines 7-1, 7-2, ... sequentially and respectively extend from the vertical address circuit 5 in the horizontal (row) direction along the unit cells P0-1-1, P0-1-2, ..., P0-2-j, ... arranged in the horizontal (row) direction. Each of the reset signal lines 7-1, 7-2, ... is connected to a corresponding one of the n reset signal terminals of the vertical address circuit 5.

Vertical signal lines 8-1, 8-2, ... sequentially and respectively extend from the horizontal address circuit 13 in the vertical direction along the unit cells P0-1-1, P0-1-2, ..., P0-2-j, ... arranged in the vertical direction. Each of the vertical signal lines 8-1, 8-2, ... is connected to a corresponding one of the m address output terminals of the horizontal address circuit 13.

The vertical address lines 6-1, 6-2, ... horizontally extending from the vertical address circuit 5 are connected to the gates of the vertical selection transistors 3-1-1, ... of the unit cells in the respective rows to determine horizontal lines for reading out signals. Similarly, the reset signal lines 7-1, 7-2, . . . horizontally extending from the vertical address circuit 5 are connected to the gates of the reset transistors 4-1-1, . . . in the corresponding rows.

The photodiode 1-i-j for detecting incident light forms a light-receiving portion for detecting incident light, and generates a signal charge corresponding to the amount of light received. One photodiode forms one pixel. The amplification transistor 2-i-j amplifies the signal charge generated by the photodiode 1-i-j, and outputs the resultant charge as a detection signal. The cathode of the photodiode 1-i-j is connected to the gate of the amplification transistor 2-i-j to amplify the signal charge from the photodiode 1-i-j and generate an amplified output corresponding to the signal charge on the drain side as a detection signal.

The source-drain path of the vertical selection transistor 3-i-j is connected between a DC system power supply and the drain of the amplification transistor 2-i-j. The gate of the vertical selection transistor 3-i-j is connected to the vertical address line 6-j of the vertical address circuit 5.

The reset transistor 4-i-j has a source-drain path connected between the DC system power supply and the cathode of the photodiode 1-i-j, and is operated to reset the signal charge in the photodiode 1-i-j.

More specifically, the source of the vertical selection transistor 3-i-j and the source of the reset transistor 4-i-j are commonly connected to the drain voltage terminal of the DC system power supply to receive a drain voltage.

As described above, the vertical address lines 6-1, 6-2, . . . horizontally extending from the vertical address circuit 5 are connected to the gates of the vertical selection transistors 3-1-1, . . . of the unit cells in the respective rows to determine horizontal lines for reading out signals. Similarly, the reset signal lines 7-1, 7-2, . . . horizontally extending from the vertical address circuit 5 are connected to the gates of the reset transistors 4-1-1, . . . in the respective rows.

In a read operation for the n×m arrangement (n (rows)×m (column) matrix), the vertical address circuit 5 operates to sequentially activate the vertical address lines 6-1, 6-2, . . . so as to activate the n horizontal lines (the lines in the row direction) in the read scanning order, and to output signals to the output terminals so as to reset the signal charges in the pixels.

The above arrangement is associated with an image detection portion. In addition to this image detection portion, this apparatus includes an output portion for reading out the image detected by the image detection portion. The output portion is constituted by load transistors 9-1, 9-2, . . . , signal transfer transistors 10-1, 10-2, . . . , storage capacitors 11-1, 11-2, . . . , and horizontal (row) selection transistors 12-1, 12-2, . . . . The output portion has the following arrangement.

The sources of the amplification transistors 2-1-1, 2-1-2, . . . of the unit cells in the respective columns are respectively connected to the vertical signal lines 8-1, 8-2, . . . , which are arranged in the column direction, in the corresponding columns. Each of the load transistors 9-1, 9-2, . . . is provided for the unit cell in a corresponding one of the columns. One end of each of the vertical signal lines 8-1, 8-2, . . . is connected the DC system power supply through a corresponding one of the load transistors 9-1, 9-2, . . . and the source-drain path thereof.

The other end of each of the vertical signal lines 8-1, 8-2, . . . is connected, through a corresponding one of the signal transfer transistors 10-1, 10-2, . . . for receiving signals corresponding one line, to a corresponding one of the storage capacitors 11-1, 11-2, . . . for storing signals corresponding to one line. The other end of each of the vertical signal lines 8-1, 8-2, . . . is also connected to a signal output terminal (horizontal signal line) 15 through a corresponding one of the horizontal selection transistors 12-1, 12-2, . . . which are selected by horizontal address pulses supplied from the horizontal address circuit 13.

That is, the other end of each of the vertical signal lines 8-1, 8-2, . . . is connected to one end of a corresponding one of the storage capacitors 11-1, 11-2, . . . through the source/drain of a corresponding one of the signal transfer transistors 10-1, 10-2, . . . , and is also connected to the signal output terminal (horizontal signal line) 15 through a corresponding one of the horizontal (row) selection transistors 12-1, 12-2, . . . . The other end of the storage capacitors 11-1, 11-2, . . . is grounded, and the gates of the signal transfer transistors 10-1, 10-2, . . . are connected to a common gate 14. The signal transfer transistors 10-1, 10-2, . . . are turned on by applying a signal transfer pulse to the common gate 14 at the timing at which signal transfer is to be performed. With this operation, voltages appearing on the vertical signal lines 8-1, 8-2, . . . can be transferred to the storage capacitors 11-1, 11-2, . . . and stored therein.

The horizontal address circuit 13 sequentially selects pixel positions corresponding to one horizontal line to be read out. In a pixel read operation for the n×m arrangement (n (rows)×m (columns) matrix), the horizontal address circuit 13 generates horizontal address pulses to activate the horizontal (row) selection transistors 12-1, 12-2, . . . at pixel positions corresponding to the respective scanning positions.

In a pixel read operation for the n×m arrangement (n (rows)×m (columns) matrix), scanning can therefore be controlled such that signals are read out from pixels at the respective lines while the line position is sequentially changed.

The operation of this MOS-type solid-state imaging device will be described below with reference to the timing chart of FIG. 2.

When an address pulse for setting the vertical address line 6-i at high level is applied from the vertical address circuit 5 to the vertical address line 6-i, only the selection transistors 3-i-1, 3-i-2, . . . in this row are turned on. As a result, source follower circuits are constituted by the amplification transistors 2-i-1, 2-i-2, . . . in this row and the load transistors 9-1, 9-2, . . . .

With this operation, the gate voltages of the amplification transistors 2-i-1, 2-i-2, . . . , i.e., voltages almost the same as those of photodiodes 1-i-1, 1-i-2, . . . , appear on the vertical signal lines 8-1, 8-2, . . . .

When a signal transfer pulse is applied to the common gate 14 of the signal transfer transistors 10-1, 10-2, . . . at this time, amplified signal charges represented by the products of the voltages appearing on the vertical signal lines 8-1, 8-2, . . . and the capacitance values of the storage capacitors 11-1, 11-2, . . . are stored in the storage capacitors 11-1, 11-2, . . . .

After the signal charges are stored in the storage capacitors 11-1, 11-2, . . . , the vertical address circuit 5 applies a reset pulse to the reset line 7-i. The reset transistors 4-i-1, 4-i-2, . . . are turned on by this reset pulse, and the signal charges stored in the photodiodes 1-i-1, 1-i-2, . . . are discharged through the reset transistors 4-i-1, 4-i-2, . . . . With this operation, the photodiodes 1-i-1, 1-i-2, . . . are reset.

Horizontal address pulses are sequentially applied from the horizontal address circuit 13 to the horizontal selection transistors 12-1, 12-2, . . . . As a result, the horizontal selection transistors 12-1, 12-2, . . . are kept on while the horizontal address pulses are applied thereto. The signal charges stored in the storage capacitors 11-1, 11-2, . . . are then output from the stored signal output terminal (horizontal signal line) 15 through the horizontal selection transistors 12-1, 12-2, . . . in the ON state. With this operation, image signals corresponding to one line can be obtained as output signals.

By sequentially repeating this operation for the subsequent rows (horizontal lines), all the signals can be read out from the photodiodes arranged two-dimensionally.

By performing read control while changing the line position in this manner, image signals corresponding to one frame can be sequentially extracted. By continuously repeating this operation, a motion image can be obtained.

Each unit cell P0-i-j of the above conventional MOS-type solid-state imaging device always requires three transistors, i.e., the amplification transistor 2-i-j for amplifying a charge signal from the photodiode 1-i-j, the vertical selection transistor 3-i-j for selecting a line for reading out a signal, and the reset transistor 4-i-j for charging/discharging the gate of the amplification transistor 2-i-j. That is, in the conventional MOS-type solid-state imaging device, a three-transistor arrangement is required for one photodiode serving as a light-receiving portion corresponding to a unit pixel. It is therefore difficult to reduce the unit cell size and the size of the imaging device itself.

In addition, since a charge signal is amplified and output by using the amplification transistor 2-i-j, noise is caused by the amplification transistor 2-i-j. The amplification transistor 2-i-j is provided for each unit cell serving as a pixel. Even while no light is incident on the photodiode, the amplification transistor generates an output. This phenomenon is based on a dark current or thermal noise, which cannot be avoided owing to the characteristics of the amplification transistor, and a variation in the threshold voltage. The phenomenon is unique to each pixel of the matrix arrangement and differs among the respective pixels. Therefore, even if uniform light is irradiated on the entire light-receiving surface, the resultant image signals vary in level among the pixels, resulting in an image signal with luminance irregularity. This image with luminance irregularity is called fixed pattern noise because this noise is two-dimensionally distributed, i.e., distributed on a plane called a frame, and is fixed to a certain position. The problem of this noise is serious, and becomes more noticeable with a reduction in pixel size. This arrangement cannot therefore be practically used for an imaging device unless this problem is solved.

BRIEF SUMMARY OF THE INVENTION

It is a first object of the present invention to provide various types of applied apparatuses using an amplification-type MOS-type solid-state imaging device which can attain a reduction in size and allows the use of a single power supply.

It is a second object of the present invention to provide an amplification-type MOS-type solid-state imaging device with noise canceler circuits which can obtain a clear image signal, and an applied apparatus using the same. It is another object of the present invention to provide a noise canceling method which can obtain a clear image signal.

An image system according to the present invention is characterized by comprising an optical system for receiving an optical image from an object and guiding the optical image to a predetermined position; image processing means including a sensor for photoelectrically converting the optical image guided to the predetermined position into an electrical signal corresponding to a light amount of the optical image in units of pixels; and a signal processing device for processing an output from the image processing means in a predetermined form, and outputting the output, the sensor comprising a photoelectric conversion element placed at the predetermined position, an output circuit including an amplification MOS transistor connected to the photoelectric conversion element serving to amplify and output an output from the photoelectric conversion element at a first timing and output noise independent of the output from the photoelectric conversion element at a second timing, and a noise reduction circuit connected to an output of the output circuit, having the same impedance at the first and second timings when viewed from the output circuit, and serving to obtain a difference between outputs from the output circuit at the first and second timings.

Another image system according to the present invention is characterized by comprising an optical system for receiving an optical image from an object and guiding the optical image to a predetermined position; image processing means including a sensor for photoelectrically converting the optical image guided to the predetermined position into an electrical signal corresponding to a light amount of the optical image in units of pixels; and a signal processing device for processing an output from the image processing means in a predetermined form, and outputting the output, the sensor comprising a photoelectric conversion element placed at the predetermined position, an output circuit including an amplification MOS transistor connected to the photoelectric conversion element serving to amplify and output an output from the photoelectric conversion element at a first timing and output noise independent of the output from the photoelectric conversion element at a second timing, a signal line connected to the output circuit; and a noise reduction circuit including a clamp capacitor having one end connected to the signal line, a sample/hold capacitor connected between the other end of the clamp capacitor and a predetermined potential, and an impedance correction circuit for selectively applying a capacitance less than a capacitance two times a series capacitance of the clamp capacitor and the sample/hold capacitor between the signal line and the predetermined potential, and serving to obtain a difference between outputs from the output circuit at the first and second timings.

A still another image system according to the present invention is characterized by comprising an optical system for receiving an optical image from an object and guiding the optical image to a predetermined position; image processing means including a sensor for photoelectrically converting the optical image guided to the predetermined position into an electrical signal corresponding to a light amount of the optical image in units of pixels; and a signal processing device for processing an output from the image processing means in a predetermined form, and outputting the output, the sensor comprising a photoelectric conversion element placed at the predetermined position, an output circuit including an amplification MOS transistor connected to the photoelectric conversion element and serving to amplify and output an output from the photoelectric conversion element at a first timing and output noise independent of the output from the photoelectric conversion element at a second timing, a signal line connected to an output of the output circuit, a source follower circuit having an input connected to the signal line, a clamp capacitor having one end connected to an output of the source follower circuit, a sample/hold capacitor connected between the other end of the clamp capacitor and a first predetermined potential, and a clamp transistor connected between the other end of the clamp capacitor and a second predetermined potential and serving to selectively clamp the sample/hold capacitor.

A still further image system according to the present invention is characterized by comprising an optical system for receiving an optical image from an object and guiding the optical image to a predetermined position; image processing means including a sensor for photoelectrically converting the optical image guided to the predetermined position into an electrical signal corresponding to a light amount of the optical image in units of pixels; and a signal processing device for processing an output from the image processing means in a predetermined form, and outputting the output, the sensor comprising a photoelectric conversion element placed at the predetermined position, an output circuit including an amplification MOS transistor connected to the photoelectric conversion element and serving to amplify and output an output from the photoelectric conversion element at a first timing and output noise independent of the output from the photoelectric conversion element at a second timing, a signal line connected to an output of the output circuit, a clamp capacitor having one end connected to the signal line, a sample/hold capacitor connected between the other end of the clamp capacitor and a first predetermined potential, and a clamp transistor connected between the other end of the clamp capacitor and a second predetermined potential and serving to clamp the sample/hold capacitor at a predetermined timing.

A still another image system according to the present invention is characterized by comprising an optical system for receiving an optical image from an object and guiding the optical image to a predetermined position; image processing means including a sensor for photoelectrically converting the optical image guided to the predetermined position into an electrical signal corresponding to a light amount of the optical image in units of pixels; and a signal processing device for processing an output from the image processing means in a predetermined form, and outputting the output, the sensor comprising a pixel for outputting a voltage corresponding to noise and the light amount at a first timing, and outputting a voltage corresponding to the noise at a second timing, and a noise reduction circuit including a three-terminal element having a first node to which an output from the pixel is supplied, and a second node for storing a charge, and a third node to which a predetermined amount of charge controlled in accordance with a potential of the first node is transferred from the second node, and serving to obtain a difference between outputs from the pixel at the first and second timings.

A still further image system according to the present invention is characterized by comprising an optical system for receiving an optical image from an object and guiding the optical image to a predetermined position; image processing means including a sensor for photoelectrically converting the optical image guided to the predetermined position into an electrical signal corresponding to a light amount of the optical image in units of pixels; and a signal processing device for processing an output from the image processing means in a predetermined form, and outputting the output, the sensor comprising a pixel for outputting a voltage corresponding to noise and the light amount at a first timing, and outputting a voltage corresponding to the noise at a second timing, and a noise reduction circuit for outputting a difference between a charge amount corresponding to an output voltage from the pixel at the first timing and a charge amount corresponding to an output voltage from the pixel at the second timing.

A still another image system according to the present invention is characterized by comprising an optical system for receiving an optical image from an object and guiding the optical image to a predetermined position; image processing means including a sensor for photoelectrically converting the optical image guided to the predetermined position into an electrical signal corresponding to a light amount of the optical image in units of pixels; and a signal processing device for processing an output from the image processing means in a predetermined form, and outputting the output, the sensor comprising a pixel for outputting a first electrical signal corresponding to noise and the light amount at a first timing, and outputting a second electrical signal corresponding to the noise at a second timing, and a noise reduction circuit for receiving the first and second electrical signals with the same input impedance, and outputting a difference between the first and second electrical signals.

A still another image system according to the present invention is characterized by comprising an optical system for receiving an optical image from an object and guiding the optical image to a predetermined position; image processing means including a sensor for photoelectrically converting the optical image guided to the predetermined position into an electrical signal corresponding to a light amount of the optical image in units of pixels; and a signal processing device for processing an output from the image processing means in a predetermined form, and outputting the output, wherein a dynamic range of outputs from the image processing means is not less than 70 dB.

An image system according to the present invention is characterized in that an output from the sensor is an analog signal, and the image processing means further comprises an analog/digital converter for converting the output from the sensor into a digital signal and a timing signal generation circuit for supplying a timing signal for controlling an operation of the sensor to the sensor.

An image system according to the present invention is characterized in that a power level of the timing signal is equal to a power level supplied to the sensor.

An image system according to the present invention is characterized in that an output from the sensor is a voltage signal, and the image processing means further comprises a voltage/current converter to which an output from the sensor is supplied; a current/voltage converter to which an output from the voltage/current converter is supplied; an amplifier for amplifying an output from the current/voltage converter with a gain corresponding to a desired sensitivity; and a clamp circuit for clamping an output from the amplifier.

An image system according to the present invention is characterized in that an output from the sensor is a voltage signal, and the image processing means further comprises a voltage/current converter to which an output from the sensor is supplied; a current/voltage converter to which an output from the voltage/current converter is supplied; an amplifier for amplifying an output from the current/voltage converter with a gain corresponding to a desired sensitivity; and a clamp circuit for clamping an output from the amplifier and supplying the output to the analog/digital converter.

An image system according to the present invention is characterized in that the signal processing device comprises a process circuit for performing a predetermined process for an output from the image processing means, and an encoder circuit for converting an output from the process circuit into a composite video signal.

An image system according to the present invention is characterized in that the optical system comprises a lens for focusing the optical image; diaphragm control means for controlling an amount of light incident on the image processing means; focus control means for controlling a distance between the lens and the image processing means; and a color filter arranged on the pixel.

An image system according to the present invention is characterized in that the image processing means comprises a plurality of image processing means arranged in accordance with wavelengths of the optical image, and the optical system comprises a lens for focusing the optical image; diaphragm control means for controlling an amount of light incident on the image processing means; focus control means for controlling a distance between the lens and the image processing means; and splitting means for splitting the optical image focused by the lens into a plurality of optical images in accordance with wavelengths, and supplying the split optical images to the plurality of image processing means.

An image system according to the present invention is characterized in that the signal processing device comprises storage means for storing an output from the image processing means in a predetermined form.

An image system according to the present invention is characterized in that the signal processing device comprises an image monitor for displaying an output from the image processing means in a predetermined form.

An image system according to the present invention is characterized in that the signal processing device comprises print means for printing an output from the image processing means in a predetermined form.

An image system according to the present invention is characterized by further comprising an interface circuit to which an output from the signal processing device is supplied; a signal bus to which an output from the interface circuit is supplied; and an information processing unit connected to the signal bus.

An image system according to the present invention is characterized by further comprising a frame memory for storing an output from the analog/digital converter; and a compression unit for compressing a signal stored in the frame memory.

An image system according to the present invention is characterized by further comprising storage means for storing an output from the compression unit.

An image system according to the present invention is characterized by further comprising an interface circuit to which an output from the image compression unit is supplied; and a signal bus to which an output from the interface circuit is supplied.

An image system according to the present invention is characterized by further comprising a light source for irradiating light on the object, and characterized in that the signal processing device includes a print unit for printing an image corresponding to the object in accordance with an output from the image processing means, and the optical image is a light emitted from the light source and reflected by the object.

An image system according to the present invention is characterized by further comprising a moving unit for relatively moving the object and the light source.

An image system according to the present invention is characterized by further comprising a light source for irradiating light on the object, and characterized in that the signal processing device includes a modem for performing signal conversion to transmit an output from the image processing means to a telephone line, and the optical image is a light emitted from the light source and reflected by the object.

An image system according to the present invention is characterized by further comprising a moving unit for relatively moving the object and the light source.

An image system according to the present invention is characterized by further comprising a light source for irradiating light on the object; moving means for relatively moving the object and the light source; and position detection means for detecting a positional relationship between the object and the light source, and characterized in that the signal processing device processes an output from the image processing means by using an output from the position detection means, and the optical image is light emitted from the light source and reflected by the object.

An image system according to the present invention is characterized in that the pixels are one-dimensionally arranged in a predetermined direction in the image processing means, the optical system includes a lens placed to be movable by the moving means, and a pair of separator lenses placed on the sensor side at a distance from the lens to separate light from the lens into two light components in the predetermined direction and supply the light components to the sensor, and the signal processing device detects a distance between focal positions of the two light components from the separator lenses, and outputs a signal for driving the moving means on the basis of the detection result.

An image system according to the present invention is characterized by further comprising a light source for irradiating light on the object, and characterized in that the object is a film which is placed between the light source and the sensor and on which a video is recorded.

A solid-state imaging device according to the present invention is characterized by comprising a photoelectric conversion element; an output circuit including an amplification MOS transistor connected to the photoelectric conversion element and serving to amplify an output from the photoelectric conversion element at a first timing and output noise independent of the output from the photoelectric conversion element at a second timing; and a noise reduction circuit connected to an output of the output circuit, having the same impedance at the first and second timings when viewed from the output circuit, and serving to obtain a difference between outputs from the output circuit at the first and second timings.

A solid-state imaging device according to the present invention is characterized by further comprising a signal line for connecting the output circuit to the noise reduction circuit.

A solid-state imaging device according to the present invention is characterized in that the noise reduction circuit comprises a clamp capacitor having one end connected to the signal line; a clamp transistor connected between the other end of the clamp capacitor and a clamp potential to be selectively turned on; a sample/hold capacitor connected between the other end of the clamp capacitor and a predetermined potential; and an impedance correction circuit connected between the signal line and a predetermined potential.

A solid-state imaging device according to the present invention is characterized in that the impedance correction circuit comprises: a switch element which is selectively turned on while the clamp transistor is in an OFF state; and a correction capacitor connected in series with the switch element and having a capacitor equal to series capacitor of the clamp capacitor and the sample/hold capacitor.

A solid-state imaging device according to the present invention is characterized in that the noise reduction circuit comprises an impedance converter connected to the signal line, and an impedance viewed from the output circuit is an input impedance of the impedance converter.

A solid-state imaging device according to the present invention is characterized in that the impedance converter comprises: an input MOS transistor having a gate connected to the signal line and a source connected to a predetermined potential; and a load connected between a drain of the second MOS transistor and a power supply potential.

A solid-state imaging device according to the present invention is characterized in that the noise reduction circuit comprises a slice transistor having a gate connected to the signal line, and an impedance viewed from the output circuit is a gate capacitor of the slice transistor.

A solid-state imaging device according to the present invention is characterized in that the noise reduction circuit further comprises a slice capacitor connected between a source of the slice transistor and a slice pulse supply terminal; and a slice charge transfer capacitor connected between a drain of the slice transistor and a predetermined potential and serving to charge the difference.

A solid-state imaging device according to the present invention is characterized by comprising: a photoelectric conversion element; an output circuit including an amplification MOS transistor connected to the photoelectric conversion element and serving to amplify an output from the photoelectric conversion element at a first timing and output noise independent of the output from the photoelectric conversion element at a second timing; a signal line connected to the output circuit; and an impedance correction circuit including a clamp capacitor having one end connected to the signal line, a sample/hold capacitor connected between the other end of the clamp capacitor and a predetermined potential, and an impedance correction circuit for selectively applying a capacitance less than two times a difference between a series capacitance of the clamp capacitor and the sample/hold capacitor and the clamp capacitor between the signal line and a predetermined potential, and serving to obtain a difference between outputs from the output circuit at the first and second timings.

A solid-state imaging device according to the present invention is characterized by comprising a photoelectric conversion element; an output circuit including an amplification MOS transistor connected to the photoelectric conversion element and serving to amplify an output from the photoelectric conversion element at a first timing and output noise irrelevant to the output from the photoelectric conversion element at a second timing; a signal line connected to an output of the output circuit; a source follower circuit having an input connected to the signal line; a clamp capacitor having one end connected to an output of the source follower circuit; a sample/hold capacitor connected between the other end of the clamp capacitor and a first predetermined potential; and a clamp transistor connected between the other end of the clamp capacitor and a second predetermined potential and serving to selectively clamp the sample/hold capacitor.

A solid-state imaging device according to the present invention is characterized in that the clamp capacitor and the sample/hold capacitor are two-dimensionally stacked on each other on a single substrate.

A solid-state imaging device according to the present invention is characterized by comprising: a photoelectric conversion element; an output circuit including an amplification MOS transistor connected to the photoelectric conversion element and serving to amplify an output from the photoelectric conversion element at a first timing and output noise independent of the output from the photoelectric conversion element at a second timing; a signal line connected to an output of the output circuit; a clamp capacitor having one end connected to the signal line; a sample/hold capacitor connected between the other end of the clamp capacitor and a first predetermined potential; and a clamp transistor connected between the other end of the clamp capacitor and a second predetermined potential and serving to clamp the sample/hold capacitor at a predetermined timing.

A solid-state imaging device according to the present invention is characterized by comprising: a pixel for outputting a voltage corresponding to noise and incident light at a first timing, and outputting a voltage corresponding to the noise at a second timing; and a noise reduction circuit including a three-terminal element having a first node to which an output from the pixel is supplied, a second node for storing a charge, and a third node to which a predetermined amount of charge controlled in accordance with a potential of the first node is transferred from the second node, and serving to obtain a difference between outputs from the pixel at the first and second timings.

A solid-state imaging device according to the present invention is characterized in that the three-terminal element is an MOS transistor having the first node as a gate, the second node as a source, and the third node as a drain.

A solid-state imaging device according to the present invention is characterized by comprising: a pixel for outputting a voltage corresponding to noise and incident light at a first timing, and outputting a voltage corresponding to the noise at a second timing; and a noise reduction circuit for outputting a difference between a charge amount corresponding to an output voltage from the pixel at the first timing and a charge amount corresponding to an output voltage from the pixel at the second timing.

A solid-state imaging device according to the present invention is characterized by comprising: a pixel for outputting a first electrical signal corresponding to noise and incident light at a first timing, and outputting a second electrical signal corresponding to the noise at a second timing, and a noise reduction circuit for receiving the first and second electrical signals with the same input impedance, and outputting a difference between the first and second electrical signals.

A solid-state imaging device according to the present invention is characterized by comprising: a plurality of horizontal selection lines; a plurality of vertical signal lines crossing the horizontal selection lines; a plurality of pixels, each of which is arranged at intersections between the horizontal selection line and the vertical signal line, selectively activated in accordance with a potential of the horizontal selection line, outputs a first electrical signal corresponding to noise and incident light to the vertical signal line at a first timing in an activation interval, and outputs a second electrical signal corresponding to the noise to the vertical signal line at a second timing in the activation interval; and a plurality of noise reduction circuits, each of which is connected to one end of a corresponding one of the plurality of vertical signal lines, receives the first and second electrical signals with the same input impedance, and outputs a difference between the first and second electrical signals.

A solid-state imaging device according to the present invention is characterized by comprising: a plurality of horizontal selection lines; a plurality of vertical signal lines crossing the horizontal selection lines; a plurality of pixels, each of which is arranged at an intersection between the horizontal selection line and the vertical signal line, selectively activated in accordance with a potential of the horizontal selection line, outputs a first electrical signal corresponding to noise and incident light to the vertical signal line at a first timing in an activation interval, and outputs a second electrical signal corresponding to the noise to the vertical signal line at a second timing in the activation interval; and a plurality of noise reduction circuits each including a three-terminal element having a first node connected to one end of a corresponding one of the plurality of vertical signal lines, a second node for storing a charge, and a third node to which a predetermined amount of charge controlled in accordance with a potential of the first node is transferred from the second node, and serving to obtain a difference between outputs from the pixel at the first and second timings.

A solid-state imaging device according to the present invention is characterized by comprising: a plurality of horizontal selection lines; a plurality of vertical signal lines crossing the horizontal selection lines; a plurality of pixels, each of which is arranged at an intersection between the horizontal selection line and the vertical signal line, selectively activated in accordance with a potential of the horizontal selection line, outputs a first voltage corresponding to noise and incident light to the vertical signal line at a first timing in an activation interval, and outputs a second voltage corresponding to the noise to the vertical signal line at a second timing in the activation interval; and a plurality of noise reduction circuits each connected to one end of a corresponding one of the plurality of vertical signal lines and serving to output a difference between a charge amount corresponding to the first voltage and a charge amount corresponding to the second voltage.

A solid-state imaging device according to the present invention is characterized by comprising: a plurality of horizontal selection lines; a plurality of vertical signal lines crossing the horizontal selection lines; a plurality of pixels, each of which is arranged at an intersection between the horizontal selection line and the vertical signal line, selectively activated in accordance with a potential of the horizontal selection line, outputs a first electrical signal corresponding to noise and incident light to the vertical signal line at a first timing in an activation interval, and outputs a second electrical signal corresponding to the noise to the vertical signal line at a second timing in the activation interval; and a plurality of noise reduction circuits including a plurality of clamp capacitors each connected to one end of a corresponding one of the plurality of vertical signal lines, a plurality of sample/hold capacitors each connected between the other end of a corresponding one of the plurality of clamp capacitors and a first predetermined potential, and a plurality of clamp transistors each connected between the other end of a corresponding one of the plurality of clamp capacitors and a second predetermined potential and serving to clamp the corresponding sample/hold capacitor at a predetermined timing.

A solid-state imaging device according to the present invention is characterized by further comprising: a first shift register for sequentially activating the plurality of horizontal selection lines; an output terminal; a plurality of switching elements each having one end connected to an output of a corresponding one of the noise reduction circuits and the other commonly connected to the output terminal; and a second shift register for sequentially outputting control signals for selectively turning on the plurality of switching elements.

A solid-state imaging device according to the present invention is characterized by further comprising: an output terminal; a plurality of switching elements each having one end connected to an output of a corresponding one of the plurality of noise reduction circuits and the other end commonly connected to the output terminal; an address terminal for receiving an address signal; and an address decoder for decoding the address signal, selectively activating the plurality of horizontal selection lines in accordance with a result of decoding, and outputting a control signal for selectively turning on the plurality of switching elements.

A solid-state imaging device according to the present invention is characterized by further comprising: a timing generator for generating timing signals for driving the first and second shift registers; and an analog/digital converter having an input coupled to the output terminal.

A solid-state imaging device according to the present invention is characterized by further comprising an analog/digital converter having an input coupled to the output terminal.

A solid-state imaging device according to the present invention is characterized by further comprising an analog amplifier for amplifying a signal from the output terminal and supplying the signal to the input of the analog/digital converter.

A solid-state imaging device according to the present invention is characterized by further comprising an analog amplifier for amplifying a signal from the output terminal and supplying the signal to the input of the analog/digital converter.

A solid-state imaging device according to the present invention is characterized by comprising: a plurality of vertical signal lines; a plurality of pixels each provided for a corresponding one of the plurality of vertical signal lines and serving to output a first electrical signal corresponding to noise and incident light to the vertical signal line at a first timing and output a second electrical signal corresponding to the noise to the vertical signal line at a second timing; and a plurality of noise reduction circuits, each of which is connected to one end of a corresponding one of the plurality of vertical signal lines, receives first and second electrical signals with the same input impedance, and outputs a difference between the first and second electrical signals.

A solid-state imaging device according to the present invention is characterized by comprising: a plurality of vertical signal lines; a plurality of pixels each provided for a corresponding one of the plurality of vertical signal lines and serving to output a first electrical signal corresponding to noise and incident light to the vertical signal line at a first timing and output a second electrical signal corresponding to the noise to the vertical signal line at a second timing; and a plurality of noise reduction circuits each including a three-terminal element having a first node connected to one end of a corresponding one of the plurality of vertical signal lines, a second node for storing a charge, and a third node to which a predetermined amount of charge controlled in accordance with a potential of the first node is transferred from the second node, and serving to obtain a difference between outputs from the pixel at the first and second timings.

A solid-state imaging device according to the present invention is characterized by comprising: a plurality of vertical signal lines; a plurality of pixels each provided for a corresponding one of the plurality of vertical signal lines and serving to output a first voltage corresponding to noise and incident light to the vertical signal line at a first timing and output a second voltage corresponding to the noise to the vertical signal line at a second timing; and a plurality of noise reduction circuits each connected to one end of a corresponding one of the plurality of vertical signal lines and serving to output a difference between a charge amount corresponding to the first voltage and a charge amount corresponding to the second voltage.

A solid-state imaging device according to the present invention is characterized by comprising: a plurality of vertical signal lines; a plurality of pixels each provided for a corresponding one of the plurality of vertical signal lines and serving to output a first electrical signal corresponding to noise and incident light to the vertical signal line at a first timing and output a second electrical signal corresponding to the noise to the vertical signal line at a second timing; and a plurality of noise reduction circuits including a plurality of clamp capacitors each connected to one end of a corresponding one of the plurality of vertical signal lines, a plurality of sample/hold capacitors each connected between the other end of a corresponding one of the plurality of clamp capacitors and a first predetermined potential, and a plurality of clamp transistors each connected between the other end of a corresponding one of the plurality of clamp capacitors and a second predetermined potential and serving to clamp a corresponding one of the sample/hold capacitors at a predetermined timing.

A solid-state imaging device according to the present invention is characterized by comprising: a plurality of horizontal selection lines; a plurality of vertical signal lines crossing the horizontal selection lines; a plurality of pixels, each of which is arranged at an intersection between the horizontal selection line and the vertical signal line, selectively activated in accordance with a potential of the horizontal selection line, outputs a first electrical signal corresponding to noise and incident light to the vertical signal line at a first timing in an activation interval, and outputs a second electrical signal corresponding to the noise to the corresponding vertical signal line at a second timing in the activation interval; and a noise reduction circuit which is connected to one end of the vertical signal line, receives the first and second electrical signals with the same input impedance, and outputs a difference between the first and second electrical signals.

A solid-state imaging device according to the present invention is characterized by comprising: a plurality of horizontal selection lines; a plurality of vertical signal lines crossing the horizontal selection lines; a plurality of pixels, each of which is arranged at an intersection between the horizontal selection line and the vertical signal line, selectively activated in accordance with a potential of the horizontal selection line, outputs a first electrical signal corresponding to noise and incident light to the vertical signal line at a first timing in an activation interval, and outputs a second electrical signal corresponding to the noise to the vertical signal line at a second timing in the activation interval; and a plurality of noise reduction circuits each including a three-terminal element having a first node connected to one end of a corresponding one of the plurality of vertical signal lines, a second node for storing a charge, and a third node to which a predetermined amount of charge controlled in accordance with a potential of the first node is transferred from the second node, and serving to obtain a difference between outputs from the pixel at the first and second timings.

A solid-state imaging device according to the present invention is characterized by comprising: a plurality of horizontal selection lines; a plurality of vertical signal lines crossing the horizontal selection lines; a plurality of pixels, each of which is arranged at an intersection between the horizontal selection line and the vertical signal line, selectively activated in accordance with a potential of the horizontal selection line, outputs a first voltage corresponding to noise and incident light to the vertical signal line at a first timing in an activation interval, and outputs a second voltage corresponding to the noise to the corresponding vertical signal line at a second timing in the activation interval; and a noise reduction circuit connected to one end of the vertical signal line to output a difference between a charge amount corresponding to the first voltage and a charge amount corresponding to the second voltage.

A solid-state imaging device according to the present invention is characterized by comprising: a plurality of horizontal selection lines; a plurality of vertical signal lines crossing the horizontal selection lines; a plurality of pixels, each of which is arranged at an intersection between the horizontal selection line and the vertical signal line, selectively activated in accordance with a potential of the horizontal selection line, outputs a first electrical signal corresponding to noise and incident light to the vertical signal line at a first timing in an activation interval, and outputs a second electrical signal corresponding to the noise to the vertical signal line at a second timing in the activation interval; and a noise reduction circuit including a clamp capacitor connected to one end of the vertical signal line, a sample/hold capacitor connected between the other end of the clamp capacitor and a first predetermined potential, and a clamp transistor each connected between the other end of the clamp capacitor and a second predetermined potential and serving to clamp the sample/hold capacitor at a predetermined timing.

A semiconductor integrated circuit according to the present invention is characterized by comprising: a semiconductor substrate; the solid-state imaging device according to the present invention and formed on a surface of the semiconductor substrate; and a light shield film formed on the solid-state imaging device and having a plurality of openings corresponding to the plurality of pixels.

A semiconductor integrated circuit according to the present invention is characterized by further comprising color filters selectively formed on the openings.

A semiconductor integrated circuit according to the present invention is characterized by further comprising micro lenses formed on the openings.

A difference signal output method according to the present invention is characterized by comprising the following steps of: applying a first voltage to a gate of an MOS transistor; resetting a charge stored in a capacitor having one end connected to a source of the MOS transistor; applying a first pulse to the other end of the capacitor to discharge a predetermined charge from the source of the MOS transistor through a drain thereof; applying a second voltage to the gate of the MOS transistor; applying a second pulse having the same amplitude as that of the first pulse to the other end of the capacitor; and transferring a charge corresponding to a difference between the first and second voltages from the source of the MOS transistor to the drain.

A difference output method according to the present invention is characterized by comprising the following steps of: applying a first voltage to one end of a first capacitor and also applying a clamp voltage to the other end of the first capacitor; and applying a second voltage to the one end of the first capacitor to charge a difference between the first and second voltages in a second capacitor having one end directly connected to the other end of the first capacitor.

A difference output method according to the present invention is characterized in that one end of the first capacitor is connected to an output terminal of an impedance converter, and the first and second voltages are output from the impedance converter.

A difference output method according to the present invention is characterized in that one of the first and second voltages is a sum of an output voltage corresponding to light incident on a pixel of a solid-state imaging element and a fixed pattern noise voltage generated by the pixel, and the other is the fixed pattern noise.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 55 shows a time variation of the potentials of the vertical signal line and the present invention node;

FIG. 56 shows a time variation of the potentials of the vertical signal line and the clamp node;

FIG. 76 shows a potential of the noise canceler of the thirtieth embodiment;

DETAILED DESCRIPTION OF THE INVENTION

Embodiments of an MOS-type solid-state imaging device according to the present invention and applicable apparatuses using the MOS-type solid-state imaging device will be described.

Figure 3:
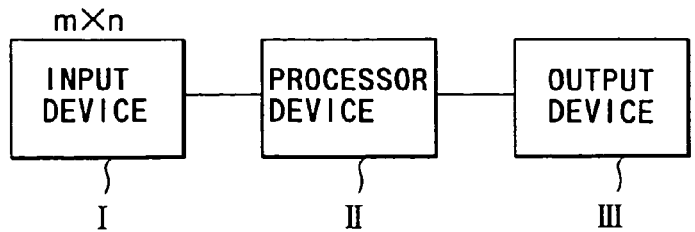
FIG. 3 is a diagram showing the basic structure of a solid-state imaging device.

In general, a CCD sensor has been employed as the solid-state imaging device. The basic structure of the solid-state imaging device comprises an input device I, a processor device II and an output device III, as shown in FIG. 3. The input device I has a structure in which photodiodes forming pixels for plural pixels are disposed to output photoelectric signals from the pixels to correspond to the quantity of received light. The processor device II sequentially reads the signals from the pixels and cancels noise. The output device III is a circuit for outputting the signals read from the pixels. Since the CCD sensor requires a plurality of power sources for operation, energy cannot easily be saved. When the CCD sensor is structured to be operated with a battery, a power supply circuit having a large circuit size is required to generate a plurality of voltage levels.

In the present invention, an MOS sensor which can be operated by a single power source is employed instead of the CCD sensor. The problem of the MOS sensor, i.e., a low S/N ratio is overcome by providing a noise canceler at the processor device II in addition to the read control circuit. Thus, saving of energy, size reduction can be achieved.

An MOS sensor according to the present invention is an MOS sensor in which m×n photodiodes are disposed in a matrix configuration to have m×n pixels. The MOS sensor according to the present invention comprises a light receiving section (an input device) in which the photodiodes are disposed into m×n matrix configuration, a processor device having a reading section for sequentially reading signals from the photodiodes forming the light receiving section and a noise canceler circuit section, and an output device for outputting the signals read by the processor device.

The processor device has the reading section and the noise canceler circuit according to the present invention. The MOS sensor according to the present invention is arranged to output signals at respective timing at which only the noise component is output and timing at which a signal component on which the noise component is superimposed is output. Thus, the noise component is canceled to obtain a signal component free from an influence of the noise. The noise canceler circuit is arranged to be capable of aligning the impedance when only the noise component is output and when the noise component and the signal component are output so as to be capable of accurately canceling noise. Since the above-mentioned noise canceler circuit is provided, the MOS sensor according to the present invention is made to be an advanced MOS sensor exhibiting low noise which is a satisfactory level for practical use and performing noise cancellation at high speed.

If the solid-state imaging device is the MOS sensor according to the present invention, the sensor section of the MOS sensor for performing photoelectric conversion and another circuit (such as an IV converter, an AGC circuit, a CLP circuit and an ADC circuit) can be manufactured by employing a usual MOS process. Therefore, the foregoing circuits can easily be formed on one semiconductor chip. Moreover, the electric power consumption can be reduced and thus a video camera or the like can be operated with a single voltage level. Thus, the power supply circuit can be simplified and the apparatus can easily be operated with a battery.

First Embodiment (System Embodiment)

A variety of systems comprising the MOS-type solid-state imaging device will now be described which is attempted to reduce electric power consumption, lower the voltage level, improve the S/N ratio and realize single power source operation.

Figure 4:
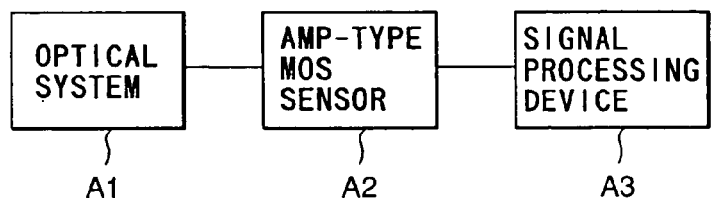
FIG. 4 is a diagram showing the basic structure of a solid-state imaging device using an MOS sensor as an image detection portion.

FIG. 4 shows a general structure of an apparatus comprising the MOS sensor to serve as an image detection portion. As shown in FIG. 4, the apparatus comprises an optical system A1, an MOS sensor A2 and a signal processing device A3. The optical system A1 is a unit for introducing an optical image to the MOS sensor A2, the optical system A1 being specifically formed by arbitrarily combining lenses, prisms, pin holes, diachronic mirrors, light converging optical fibers, concave mirrors, convex mirrors, color filters, a shutter mechanism and a diaphragm mechanism to meet the purpose of the apparatus.

The MOS sensor A2 converts an optical image introduced by the optical system A1 into an image signal corresponding to the quantity of light of the optical image and performs a noise canceling process to output only a signal component free from noise. The element of the noise canceling process of the MOS sensor A2 is a noise canceler circuit which is one of important elements to be described later.

The signal processing device A3 is a unit for processing the output from the MOS sensor A2 subjected to the noise canceling process according to the structure of the system. If a video camera is assumed as the system, the signal processing device A3 is an application function section for converting an image signal output from the MOS sensor A2 into a composite video signal according to the PAL system, an NTSC system or the like.

The MOS sensor A2 can be operated by a single power source. The MOS sensor A2 comprises photodiodes to form a light receiving section for converting light into electric signals. The plural photodiodes corresponding to pixels are disposed in a matrix configuration as has been performed by the conventional structure. To precisely form the pixels, the area of each photodiode is reduced, thus resulting in that the output from each photodiode being decreased. In order to amplify the small output, amplifiers (transistors) are provided to correspond to the pixels. Noise (inevitable noise component caused from the characteristic of the amplifying transistor) generated due to use of the amplifiers is canceled by an operation of resetting the output from the photodiode of the MOS sensor A2, retention of the output signal (the noise component) of the amplifier when the resetting operation is performed and canceling process of the signal component and the noise component by using the held output signal (the noise component) and output signal (the signal component+the noise component) from the amplifier before or after the resetting operation. Thus, noise is canceled and only the signal component is extracted.

Since the MOS sensor A2 is structured as described later, an output free from 1/f noise can be obtained in which the amplitude of the voltage of the output signal is about 10 mV or lower and output current is about 1 mA or larger. Moreover, the dynamic range of the output from the MOS sensor A2 can be improved to 70 dB or greater which is a similar level as that obtainable from the CCD sensor. When a proper signal process is performed, the dynamic range can be improved to 90 dB, which is similar to that obtainable from a silver-halide film.

As a result, a variety of systems can be realized in which the high sensitive amplifying type MOS sensor is used as an imaging device thereof. Thus, an applicable apparatus of the amplifying type MOS solid-state imaging device (the amplifying type MOS sensor) can be provided with which the electric power consumption can be reduced, the required voltage level can be lowered and the S/N ratio can be improved.

Second Embodiment (Application of Amplifying-Type MOS Sensor to Video Camera)

Figure 5:
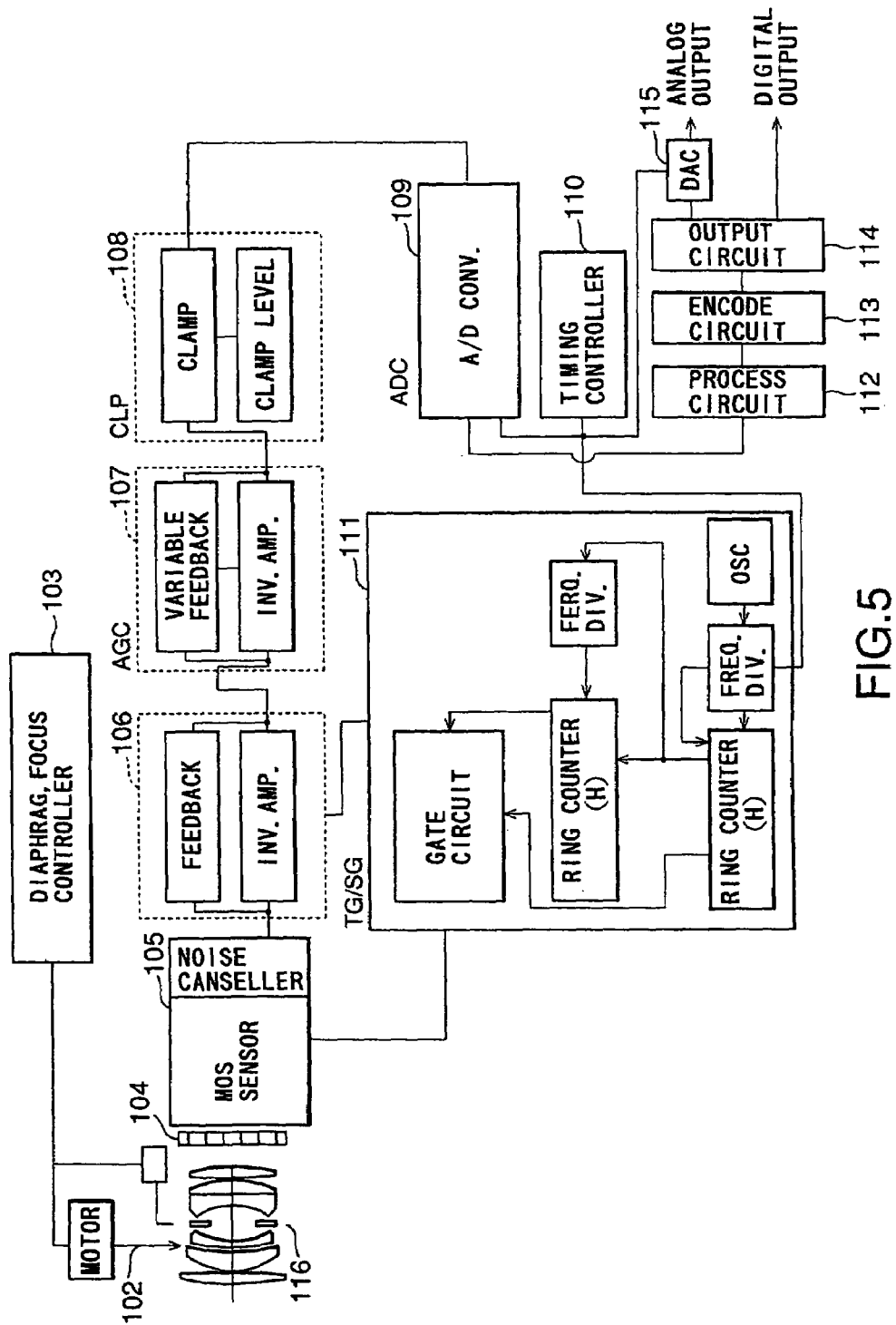
FIG. 5 is a diagram for explaining a second embodiment according to the present invention and showing a video camera using an MOS sensor of the present invention.

FIG. 5 shows an embodiment of a video camera using the MOS sensor according to the present invention. As shown in FIG. 5, a video camera according to the present invention comprises a lens 101 for picking up an image of an object, a focus adjusting mechanism 102 for adjusting the focus of the optical system, a diaphragm/focus adjusting circuit 103 for controlling a diaphragm mechanism 116 and the focus adjusting mechanism 102, an MOS sensor 105 for converting an optical image formed by the lens 101 into an electric signal corresponding to the quantity of light of the optical image in pixel units, a color filter array 104 disposed on the image forming side of the MOS sensor 105 and having a color filer section for each pixel for any one of R, G and B, a current-to-voltage converter 106 for converting the electric signal obtained by the MOS sensor 105 into a voltage signal, an AGC circuit 107 for adjusting the level of the voltage signal obtained through the current-to-voltage converter 106, a clamp (CLP) circuit 108 for clamping voltage signals having levels aligned by the AGC circuit 107, an analog-to-digital converter (ADC) 109 for converting an output from the CLP circuit 108 into a digital signal having the corresponding level, a timing control circuit 110 for generating a timing pulse (a clock signal) for arranging timing which is the base of the operation of the system, a TG/SG circuit 111 for controlling the operation of the MOS sensor 105 in synchronization with the clock signal output from the timing control circuit 110, a process control circuit 112 for processing a digital signal output from the ADC circuit 109, an encoder circuit 113 for encoding a signal processed by the process control circuit 112, an output circuit 114 for outputting an encoded signal and a digital-to-analog converter 115 for converting a signal output through output circuit 114 into an analog signal.

In the video camera 100 having the above-mentioned structure, light from the object is made incident on the MOS sensor 105 through the lens 101, and incidental light is photoelectrically converted into an electric signal so as to be output as a current value. The color filter array 104 in which red, blue and green filters are periodically disposed to correspond to the pixels is formed on the MOS sensor 105. As a result, color image signals corresponding to three primary colors are output from one MOS sensor 105 as electric signals.

The electric signals output from the MOS sensor 105 are supplied to the ADC circuit 109 through the current-to-voltage converter 106, the AGC circuit 107 and the CLP circuit 108.

The ADC circuit 109 converts the output into digital data in which one sample value is formed by, for example, 8 bits in response to an image signal supplied from the CLP 408, and then supplies data to the process control circuit 112.

The process control circuit 112 comprises, for example, a color separation circuit, a clamping circuit, a gamma correction circuit, a white clip circuit, a black clip circuit and a knee circuit to subject the supplied image signal to required processes. If necessary, the process control circuit 112 subjects the supplied image signal to a color balance process and the like. The signal processed by the process control circuit 112 is supplied to the encoder circuit 113.

The encoder circuit 113 calculates the supplied signal to convert the signal into a brightness signal and a color difference signal. When the output from the video camera is communicated through a network or the like, the encoder circuit 113 performs a process for converting the signal to be adaptable to the PAL method, the NTSC method or the like.

The timings of the operations of the MOS sensor 105 and the current-to-voltage converter 106 are controlled in response to a timing signal and a synchronizing signal supplied from the TG/SG circuit (a timing generator/signal generator) 111. The power for operating the TG/SG circuit 111 and output voltage from the same are the same as the level of the power supplied to the MOS sensor 105.

Then, the image signal is supplied to the digital-to-analog converter 115 through the output circuit 114. The digital-to-analog converter 115 converts the supplied signal into an analog video signal so as to output the same as a camera signal. Also the image signal can directly be output as a digital signal through the output circuit 114. The foregoing camera signals are supplied to a recording apparatus, such as a video tape recorder and a monitor apparatus.

According to this embodiment, a video camera having a necessity of processing an image at 30 frames in one second and capable of reducing electric power consumption, lowering required voltage level can be provided which is enabled to cancel a fixed pattern noise component in a horizontal blanking period and obtain an image signal exhibiting excellent S/N and an excellent quality of the formed image.

Figure 6:
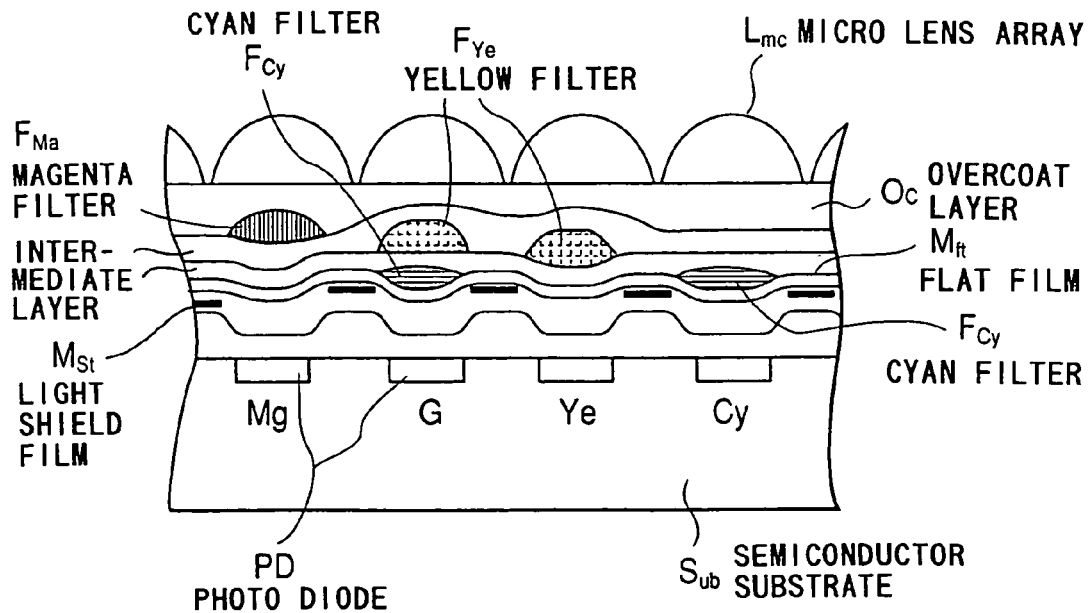
FIG. 6 is a cross sectional view showing an MOS-type imaging device having a structure in which a color filter array 104 and an MOS sensor 105 are integrated.

Although the color filter array 104 and the MOS sensor 105, which is the imaging device, are individual devices in this embodiment, a CCD device has been structured in recent years such that the imaging device and the color filter are integrally formed. Therefore, the color filter array 104 and the MOS sensor 105 may be formed integrally. An imaging device having the integrated color filter array 104 and the MOS sensor 105 may have a structure shown in FIG. 6.

That is, a light shielding film Mst which is a light shielding mask having an opening corresponding to the light receiving region of each photodiode PD and made of, for example, aluminum, is formed on the light receiving surface of each photodiode of the semiconductor substrate Sub in which a plurality of small photodiodes are disposed into a matrix configuration. On the light shielding film Mst, a transparent flat and smooth film Mft is formed, and then a cyan filter Fcy, a magenta filter Fmg and a yellow filter Fye are formed thereon.

The photodiodes PD are sectioned into those for a magenta image Mg, a green image G, a yellow image Ye and a cyan image Cy. The cyan filter Fcy is formed to be positioned on the light receiving surface of the photodiodes for the green image and the cyan image, the magenta filter Fmg is formed to be positioned on the light receiving surface of the photodiode for the magenta image, and the yellow filter Fye is formed to be positioned on the light receiving surface of the photodiode for the yellow image. Then, a transparent overcoating layer Oc is formed on the upper surface of the photodiode PD, and a microlens array Lmc is formed on the overcoating layer Oc. The microlens array Lmc has a structure in which a multiplicity of small lenses are disposed. Each of the small lens sections is designed to be positioned on the light receiving surface of the photodiode PD. The microlens array Lmc acts to maintain the quantity of incidental light upon the photodiode PD so that the detection sensitivity of the photodiode PD is raised.

When an imaging device having the integrated color filter is employed as an imaging device (the MOS sensor 105) of a single-plate type imaging system, the necessity of individually disposing the color filter can be canceled. Thus, the position alignment of the color filter with respect to each pixel on the light receiving surface of the MOS sensor 105 can be omitted. As a result, the space of the optical system can be reduced.

Third Embodiment (Application to Amplifying-Type MOS Sensor to Video Camera)

Figure 7:
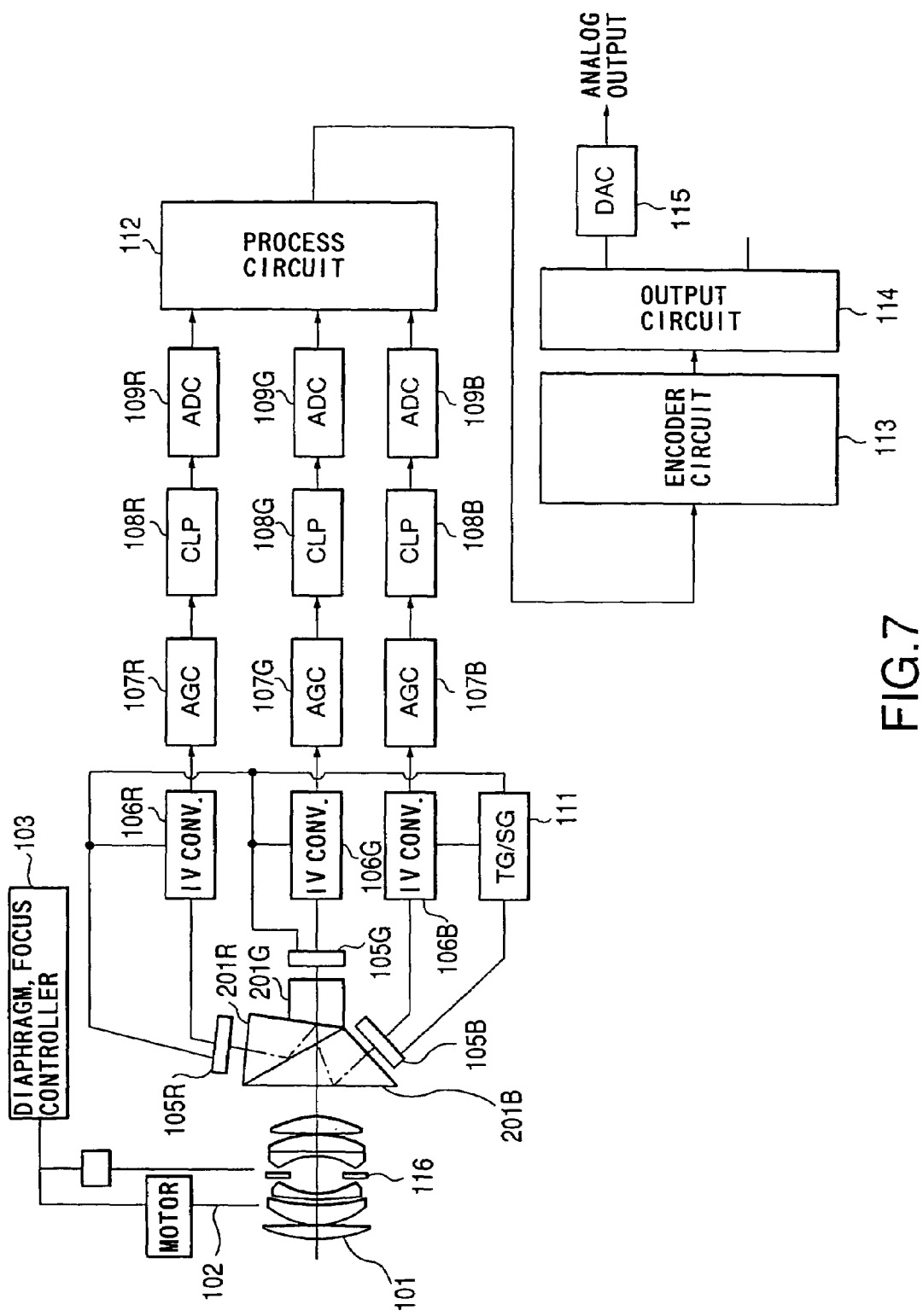
FIG. 7 is a diagram for explaining a third embodiment according to the present invention and showing another video camera using an MOS sensor of the present invention.

FIG. 7 shows another embodiment of the video camera comprising the MOS sensor according to the present invention. The video camera shown in FIG. 7 has a three-plate type structure, in which the imaging system is divided into three (RGB: Red, Green and Blue) systems as compared with the structure shown in FIG. 5 which has the single-plate type imaging system. As shown in FIG. 7, a video camera according to the present invention comprises a lens 101 which is an optical system for forming an image of an object, a focus adjusting mechanism 102 for adjusting the focus of the optical system, a diaphragm/focus adjusting circuit 103 for controlling a diaphragm mechanism 116 for adjusting the quantity of incidental light into the optical system and a focus adjusting mechanism 102, a color separating prisms 201R, 201G and 201B for separating the optical image formed by the lens 101 into three primary color components (RGB), MOS sensors 105R, 105G and 105B for the R component, the G component and the B component which are imaging devices on which the image separated into the three primary color components R, G and B by the color separating prisms 201R, 201G and 201B is formed and in which the image is converted into an electric signal corresponding to the quantity of light of the optical image in pixel units, current-to-voltage converters 106R, 106G and 106B for the R component, the G component and B component for converting the electric signals obtained by the MOS sensors 105R, 105G and 105B into voltage signals, AGC circuits 107R, 107G and 107B for the R component, the G component and the B component for adjusting the levels of the voltage signals obtained by the current-to-voltage converters 106R, 106G and 106B, clamp (CLP) circuits 108R, 108G and 108B for the R component, the G component and the B component for clamping the voltage signals having the levels aligned by the AGC circuits 107R, 107G and 107B, analog-to-digital converters (ADC) 109R, 109G and 109B for the R component, the G component and the B component for converting outputs from the CLP circuits 108R, 108G and 108B into digital signal having the corresponding levels, a timing control circuit 110 for generating timing pulses for arranging the timing which is the base of the operation of the system, a TG/SG circuit 111 for the R component, the G component and the B component for controlling the operation of the MOS sensor 105 in synchronization with the timing pulse output from the timing control circuit 110, a process control circuit 112 for processing digital signals from the ADC circuits 109R, 109G and 109B, an encoder circuit 113 for encoding the signal processed by the process control circuit 112, an output circuit 114 for controlling input and output of the encoded signal and a digital-to-analog converter 115 for converting the signal through the output circuit 114 into an analog signal.

In the video camera having the above-mentioned structure, light from an object is allowed to pass through the lens 101 and the color separating prisms 201R, 201G and 201B so as to be focused on the MOS sensors 105R, 105G and 105B.

The color separating prisms 201R, 201G and 201B separate the optical image into R, G and B three primary color components. An image separated into the R, G and B three primary color components by the color separating prisms 201R, 201G and 201B is, for each component, focused on the MOS sensors 105R, 105G and 105B.

The optical image in the form of the R, G and B components formed on the MOS sensors 105R, 105G and 105B is photoelectrically converted into an electric signal so as to be output as a current value corresponding to the brightness.

The electric signals in the form of color components output from the MOS sensors 105R, 105G and 105B are supplied to the ADC circuits 109R, 109G and 109B through the current-to-voltage converter 106, the AGC circuit 107 and the CLP circuit 108 corresponding to the color components.

The ADC circuits 109R, 109G and 109B for the corresponding colors convert an image signal supplied from the CLP circuit 108 into digital data in which one sample value is comprised of, for example, 8 bits to supply data above to the process control circuit 112.

The process control circuit 112 comprises, for example, a gamma correction circuit, a white clip circuit, a black clip circuit and a knee circuit to subject the supplied image signal to required processes. If necessary, the process control circuit 112 subjects the supplied image signal to a color balance process and the like. The signal processed by the process control circuit 112 is supplied to the encoder circuit 113. The encoder circuit 113 calculates the supplied signal and subjects the signal to a color balance process or the like. When the output from the video camera is communicated through a network or the like, the encoder circuit 113 performs a process for converting the signal to be adaptable to the PAL method, the NTSC method or the like which are standard color television broadcast method.

The timings of the MOS sensors 105R, 105G and 105B and the current-to-voltage converters 106R, 106G and 106B are controlled in response to the timing signals and synchronizing signals supplied from the corresponding TG/SG circuits 111. The operating power for the TG/SG circuit 111 and the output voltage from the same are the same level as that of the electric power which is supplied to the MOS sensor 105.

Then, the image signal is, through the output circuit 114, supplied to the D/A converter 115. The D/A converter 115 converts the supplied signal into an analog video signal so as to output the same as a camera signal. Also the image signal can directly be output as a digital signal through the output circuit 114. The foregoing camera signals are supplied to a recording apparatus, such as a video tape recorder and a monitor apparatus.

According to this embodiment, a video camera having a necessity of processing an image at 30 frames in one second and capable of reducing electric power consumption, lowering the required voltage level can be provided which is enabled to cancel a fixed pattern noise component in a horizontal blanking period and obtain an image signal exhibiting excellent S/N and an excellent quality of the formed image.

Although the above-mentioned structures are arranged to use the color separating prism to separate the optical image into the three primary color components R, G and B, a diachronic mirror may be employed to separate the optical image. In this case, diachronic mirrors for reflecting red, green and blue components are employed to separate and distribute incidental light so as to separate the optical image into the R, G and B components. The optical images are formed by MOS sensors for R, G and B images so that R, G and B image signals are obtained. Thus, a structure can be formed in which any prism is required to separate the optical image into three primary color components.

Fourth Embodiment (Application of Amplifying-Type MOS Sensor in Network System)

Figure 8:
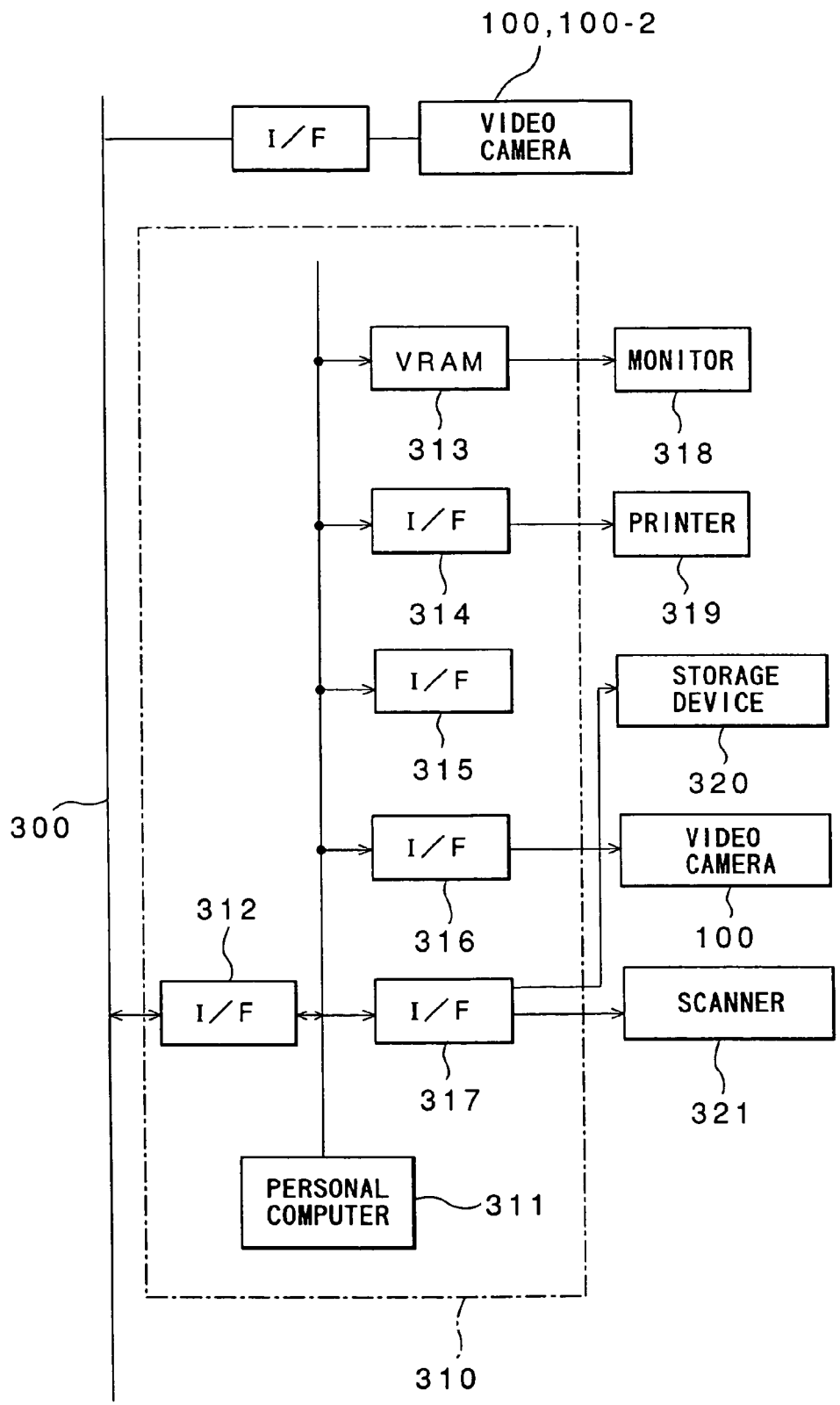
FIG. 8 is a diagram explaining a fourth embodiment according to the present invention and showing an example of application of an MOS sensor of the present invention to a network system.

FIG. 8 shows an example of the structure of a system for transferring, to a monitor or the like, a signal from the video camera 100 or 100-2 according to the fifteenth and sixteenth embodiments through a network. Referring to FIG. 8, reference numeral 300 represents a network such as a LAN (Local Area Network), a public line (a telephone line), an exclusive line, Internet or Intranet or the like. The video camera 100 or 100-2 is connected to the network 300 through an interface 301.

Reference numeral 310 represents an intelligent terminal which is a personal computer or a work station. The intelligent terminal 310 comprises a personal computer 311 including a processor, a main memory, a clock generator and so forth, an interface 312 for establishing the connection to the network, a video RAM 313 which is a memory for displaying an image, a printer interface 314, standard bus interfaces 315 and 317 such as SCSI (Small Computer System Interface), and an interface 316 for connecting the video camera. These are connected to each other via an internal bus line. A monitor 318, such as a CRT or a liquid crystal display unit, is connected to the video RAM 313. A printer 319 is connected to the printer interface 314. A large-capacitor external storage unit 320, such as an optical disk unit, a hard disk unit or a DVD (Digital Video Disc) is connected to the standard bus interface 317. An image scanner 321 for outputting an image from, for example, a hard copy is connected to the standard bus interface 317. A video camera 100 having, for example, the above-mentioned structure is connected to the interface 316 for connecting the video camera.

In the above-mentioned structure, an image of an object obtained by the video camera 100 or 100-2 is, as described above, subjected to a process for converting the same into a digital signal compressed by the MPEG method so as to be output to the network or the like by the encoder circuit 113. The composite video signal is, as digital data, output to the network 300 through the interface 301 while being formed into a transmission format for the network. The intelligent terminal 310 is connected to the network 300 through the interface 312. Thus, if data transferred from the video camera 100 or 100-2 is destined to the intelligent terminal 310, the computer 311 of the intelligent terminal 310 receives transferred data from the network 300 through the interface 312. Then, the computer 311 extracts image information portion from transferred data. Since the image has been compressed in the video camera 100 or 100-2, the computer 311 expands the image so as to reproduce an original image. Data of the reproduced image is sequentially written on the video RAM 313. Since the image is in the form of a motion picture, image data in the video RAM 313 is sequentially updated. As a result, the dynamic image supplied from the video camera 100 or 100-2 is displayed on the monitor 318 for displaying introduced data in the video RAM 313 as an image.

The image of the object obtained by the video camera 100 or 100-2 is, as described above, converted by the encoder circuit 113 into digital data in the compressed form by the MPEG method so as to be communicated through the network or the like. Then, digital data is output to the computer 311 through the interface 316. The computer 311 expands the supplied image to reproduce the original image. Then, the computer 311 sequentially writes data of the reproduced image onto the video RAM 313. Thus, the motion picture image supplied from the video camera 100 or 100-2 is displayed on the monitor 318 for displaying image data from the video RAM 313 as an image.

When the image obtained by the video camera 100 or 100-2 connected to the intelligent terminal 310 is transferred to the network 300, the computer 311 edits the image into the transferring format adapted to the network, and then outputs the same to the network 300 through the interface 312.

Fifth Embodiment (Application of Amplifying-Type MOS Sensor to Still Camera)

Figure 9:
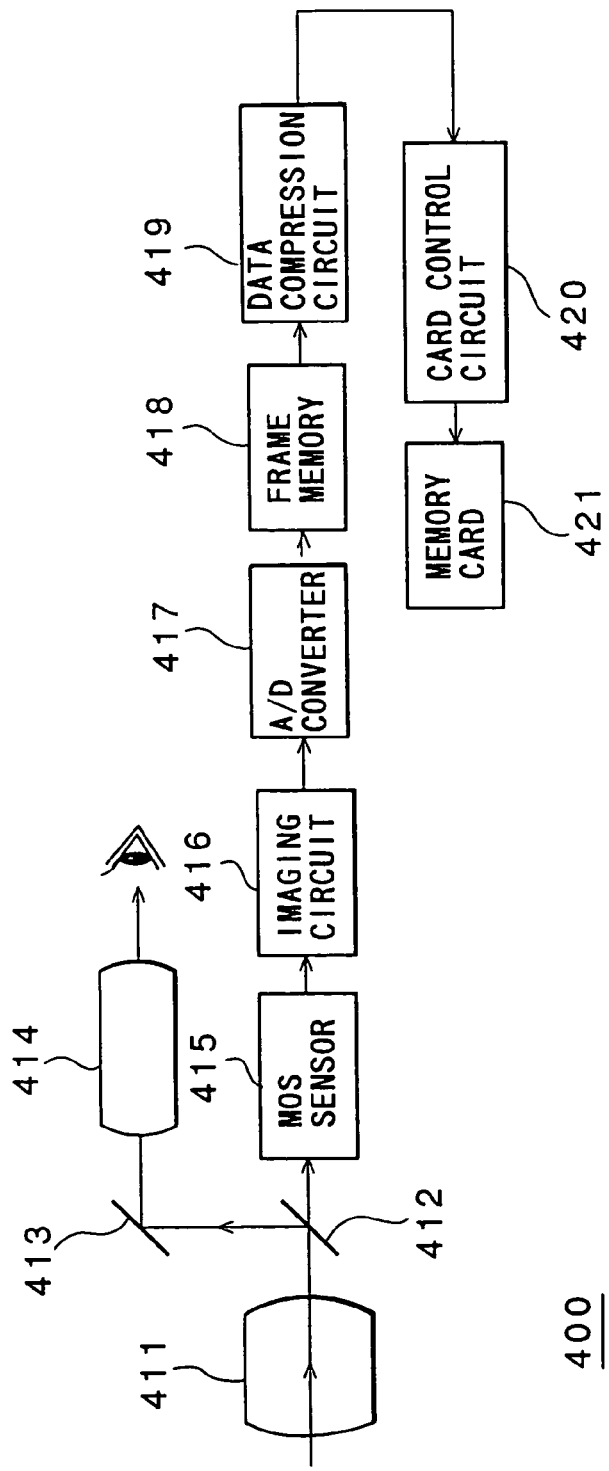
FIG. 9 is a diagram explaining a fifth embodiment according to the present invention and showing an example of application of an MOS sensor of the present invention to a still camera.

FIG. 9 shows an embodiment of a still camera using the MOS sensor according to the present invention. As shown in FIG. 9, a still camera 400 according to the present invention comprises an optical system 411 including a lens system and a diaphragm and arranged to extract an image of an object, an MOS sensor 415, on which an image formed by the optical system 411 is made incident, a mirror 412 disposed between an imaging surface of the MOS sensor 415 and the optical system 411 so as to have a function of a shutter which is arbitrarily inserted/removed to and from an optical path formed between the MOS sensor 415 and the optical system 411 to distribute the image of the object extracted by the optical system 411 to a finder 414 when the mirror 412 is inserted into the foregoing optical path and cause the image of the object extracted by the optical system 411 to be formed on the imaging surface of the MOS sensor 415 when the mirror 412 is removed from the optical path, a mirror 413 for introducing light reflected by the mirror 412 to the finder 414, an imaging circuit 416 for reading the signal of the image supplied from the MOS sensor 415 for each color component, an A/D converter 417 for converting the read output into a digital signal, a frame memory 418 for, for each frame, storing the digital signal converted by the A/D converter 417, a compressing circuit 419 for compressing the digital signal stored by the frame memory 418 in frame units, a memory card 421 for storing image data and a card control circuit 420 for controlling compressed image data to be written on the memory card 421.

When a shutter button (not shown) is depressed, an image of an object obtained by the optical system 411 is made incident on the MOS sensor 415. The MOS sensor 415 is a solid-state imaging device having the noise canceler circuit according to the present invention arranged to convert the image into an electric signal corresponding to the quantity of light of the optical image in pixel units when the optical image obtained by the optical system 411 has been formed. To take a color image, the MOS sensor 415 has a color filter array having any one of R, B and G color filters on the image forming surface thereof for each pixel. The imaging circuit 416 separates the electric signal obtained from the MOS sensor 415 into R, B and G components so as to output the separated components. The current-to-voltage converter 106 converts the electric signals for the respective colors output from the imaging circuit 416 into digital signals, the digital signals being temporarily stored in the frame memory 418 for each frame.

The digital signal stored in the frame memory 418 is compressed by the compressing circuit 419 for a unit of frame so as to be output to the card control circuit 420. The card control circuit 420 causes data of the compressed image to be stored in the memory card 421 which is the data storage medium.

Thus, the still image picked up whenever the shutter button is depressed is compressed for each frame so as to be stored in the memory card 421. The memory card 421 is arranged to be detachable from the camera. The image stored in the memory card 421 is expanded so as to be reproduced so that the original image is displayed on the monitor or output to a hard copy unit, such as a video printer by loading the memory card 421 to a reading and reproducing apparatus (not shown).

This embodiment enables the electric power consumption to be reduced, the required voltage level to be lowered and a high speed successive image picking-up to be performed with a high S/N ratio such that a plurality of frames can successively be picked up in one second. Thus, a still camera exhibiting a compact size, excellent function and satisfactory performed can be obtained. That is, a still camera can be provided which is capable of canceling fixed pattern noise component, which is a problem for the MOS sensor, in a short time, which exhibits excellent S/N and which enables a high quality picture to be obtained.

Sixth Embodiment (Application of Amplifying-Type MOS Sensor to Facsimile Machine)

Figure 10:
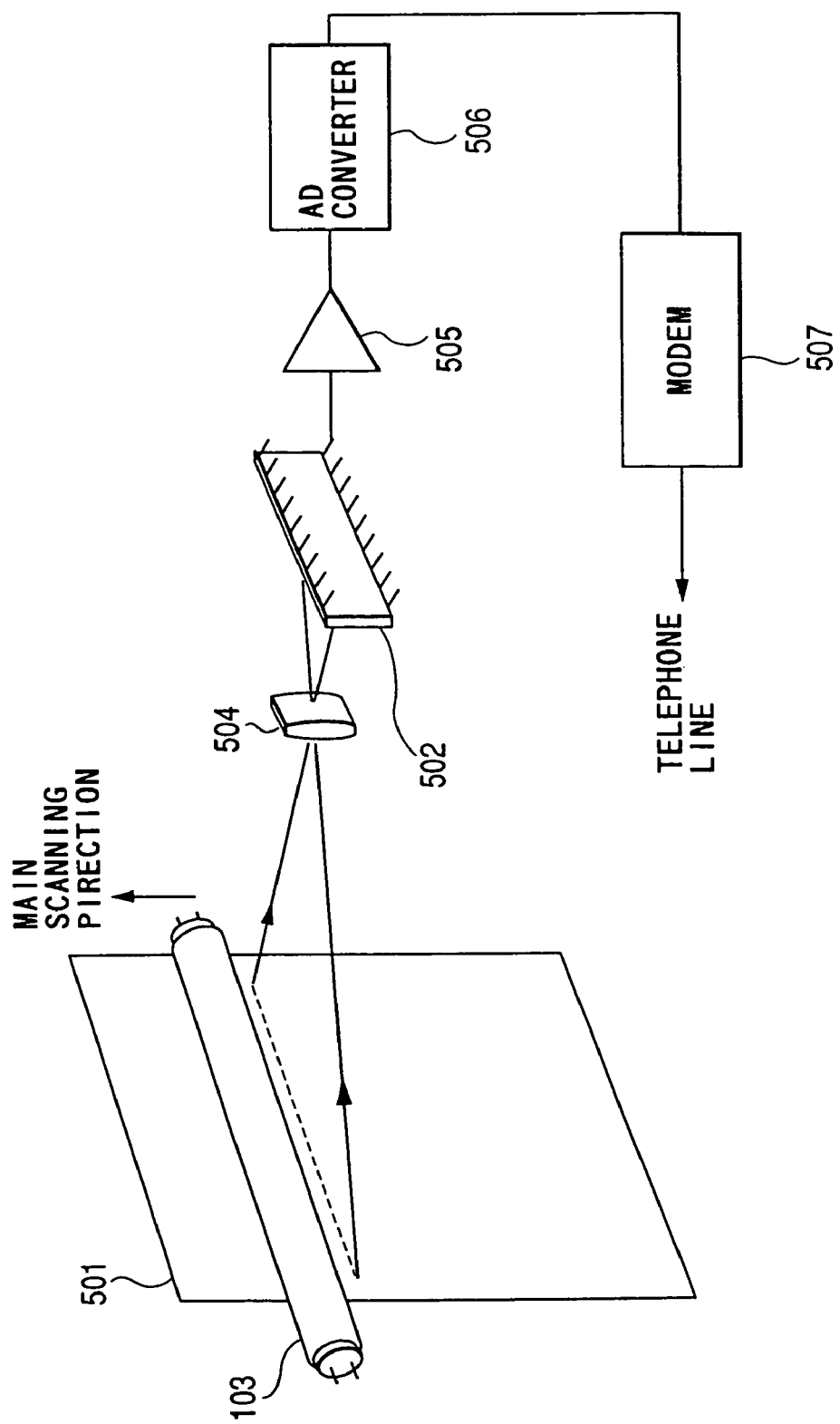
FIG. 10 is a diagram explaining a sixth embodiment according to the present invention and showing a facsimile machine using an MOS sensor of the present invention.

FIG. 10 shows an embodiment in which a facsimile machine comprises the MOS sensor according to the present invention. FIG. 10 shows a principle structure. An original document, such as a handwritten paper or a printed sheet, or a sheet-shape original document 501, such as a photograph, is fed by a main conveyance mechanism (not shown) in the main scanning direction so as to be read by an MOS sensor 502 fixed at a predetermined position traversing the original document. Reference numeral 503 represents a light source, and 504 represents a lens for forming the image of the original document on the light receiving surface of the MOS sensor 502.

The MOS sensor 502 is a linear sensor having light receiving portions (photodiodes) corresponding to the pixels and disposed in one-dimensional configuration, the MOS sensor 502 being a monochrome solid-state imaging device having the noise canceler circuit according to the present invention.

When the sheet original document 501 is set to the facsimile machine, the main conveying mechanism (not shown) conveys the original document 501 into the main scanning direction. Thus, the image of the original document is, through the lens 504, formed on the light receiving surface of the MOS sensor 502 secured to a predetermined position by a quantity for each line. The MOS sensor 502 reads information of the formed image of the original document.

That is, the MOS sensor 502 reads and outputs the signals corresponding to the quantity of received light in the receipt order as image signals in unit of pixels. Thus, the amplifier 505 sequentially amplifies the image signals. Then, the amplified image signals are converted into digital signals by the A/D converter 506. Then, the modem 507 modulates the digital signals to be adaptable to the telephone line, and then outputs to the telephone line.

The receiving side machine demodulates the supplied signals, and prints the pixels in the traversing direction of a recording sheet with a density corresponding to the signal level in the receipt order. Thus, the image is reproduced as a hard copy.

This embodiment is able to reduce electric power consumption, lowers the required voltage and reads an image at high speed with high S/N. Thus, a facsimile machine having a compact size, excellent function and satisfactory performance can be obtained. That is, the problem of fixed pattern noise component experienced with the MOS sensor can be canceled in a short time. Therefore, a facsimile machine exhibiting excellent S/N and capable of transferring a high quality image at high speed can be provided.

In recent years, a linear sensor of a contact type has been put into practical use which comes in contact with the surface of an original document to read the image of the original document. To realize the contact type linear sensor, a structure may be formed by integrating a lens for introducing the image of the original document, a light receiving section to which the image introduced by the lens is formed and which converts the image into an electric signal which corresponds to the quantity of light and a light emitting device which applies light to the surface of the original document. The present invention may be applied to the foregoing structure.

Seventh Embodiment (Application of Amplifying-Type MOS Sensor to Copying Machine)

Figure 11:
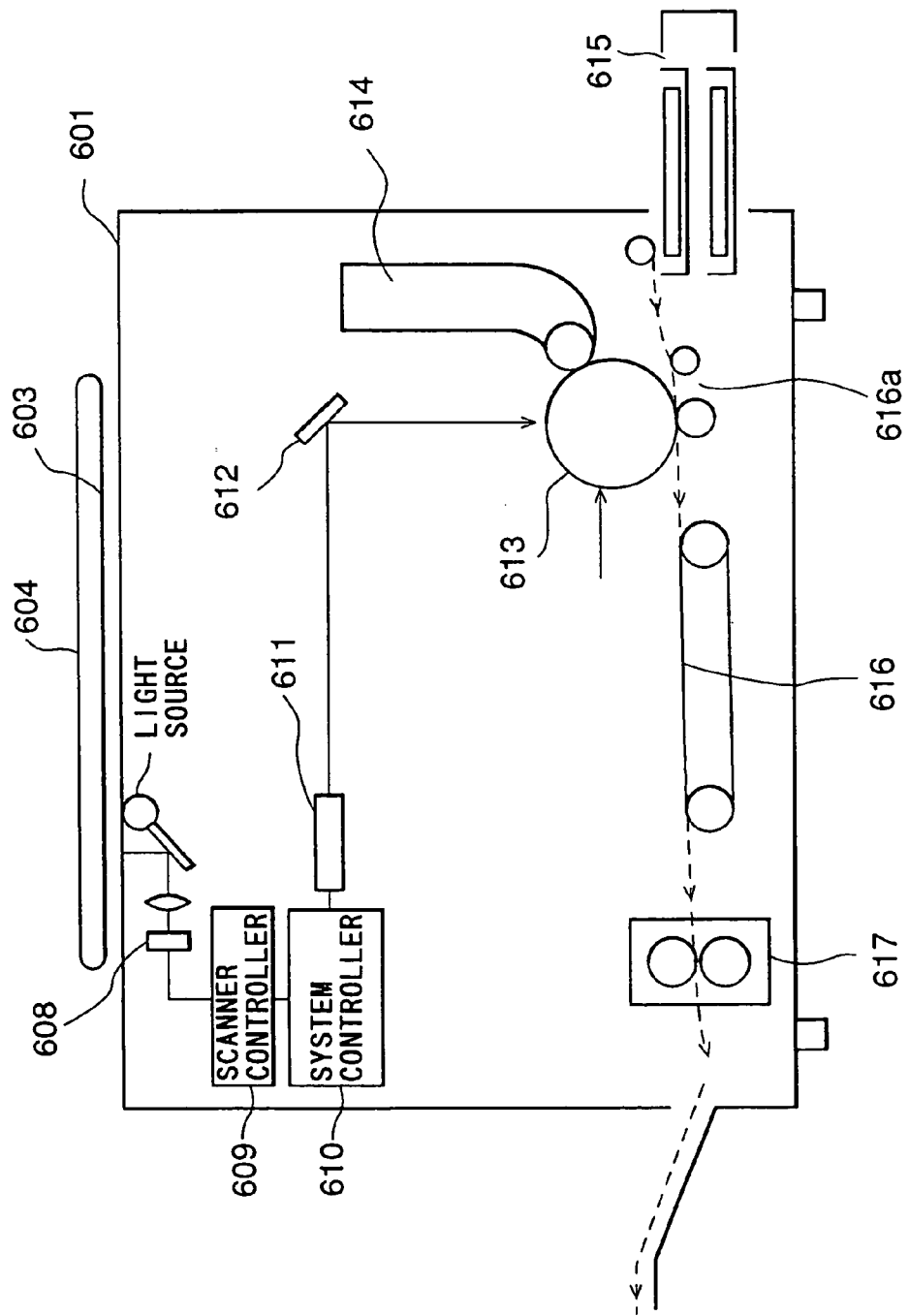
FIG. 11 is a diagram explaining a seventh embodiment according to the present invention and showing an electronic copying machine using an MOS sensor of the present invention.

FIG. 11 shows an embodiment of an electronic copying machine having the MOS sensor according to the present invention. FIG. 11 shows the principle structure. A original-document retainer 602 comprising a transparent glass is disposed on the upper surface of a box-like frame 601. A sheet original document 603, which is a handwritten original document or a sheet shape original document 603, such as a picture, is placed on the original-document table 602, the original document 603 being pressed by a pressing cover 604.

The frame 601 includes an optical system disposed substantially just below the original-document table 602 and arranged to be capable of reciprocating between two ends of the original-document table 602 at predetermined speed. The reciprocate direction is, in this embodiment, called a main scanning direction. The optical system comprises a light source 605, a mirror 606 and a lens 607. The light source 605 is disposed in a direction (which is called as a "sub-scanning direction") perpendicular to the main scanning direction.

An MOS sensor 608 is disposed at the imaging position of the lens 60. The MOS sensor 608 is a linear sensor having light receiving sections (photodiodes) corresponding to pixels and disposed in one-dimensional configuration, the MOS sensor 608 being a monochrome solid-state imaging device having the noise canceler circuit according to the present invention.

An image for one line in the sub-scanning direction is formed on the MOS sensor 608. The MOS sensor 608 converts the image into a signal corresponding to the quantity of light. A scanner controller 609 controls the MOS sensor 608 so that signals corresponding to the quantity of received light are read as image signals in the disposing order of the pixels and then output. Moreover, the scanner controller 609 controls the movement of the optical system in the main scanning direction so that the optical system is sequentially moved in the main scanning direction. The system controller 610 totally controls the system. Moreover, the system controller 610 controls the output from a laser beam source 611 in response to the signals output from the MOS sensor 608 and corresponding to the quantity of received light. A laser beam source 611 emits a spot-shape laser beam. The laser beam emitted from the laser beam source 611 is reflected by a polygonal mirror 612 which is a scanning mirror for scanning the laser beam so as to be formed on a cylindrical photosensitive drum 613. The position, at which the laser beam is formed, is the image forming position. The photosensitive drum 613 is rotated in one direction at predetermined speed. The photosensitive drum 613 is electrically charged by a charging unit (not shown) at a position (upstream of the image forming position) upstream of the position at which the laser beam is applied.

The polygonal mirror 612 is controlled by the system controller 610 so that the surface of the cylindrical photosensitive drum 613 is scanned with the spot-shaped laser beam corresponding to the output speed of the signal output from the MOS sensor 608. Assuming that the direction of rotation of the photosensitive drum 613 is the main scanning direction, the laser beam is scanned in a direction perpendicular to the rotation direction, the surface of the photosensitive drum 613 loses the electric charges to correspond to the quantity of the laser beam. Thus, a latent image corresponding to the image of the original document is formed on the surface of the photosensitive drum 613. When the photosensitive drum 613, at a position downstream of the image forming position, passes through the position of a developing section 614 for converting the latent image into a visible image, the latent image at the corresponding position is converted into a visible image with toner supplied from the developing section 614. The toner image is transferred to copy paper sheets sequentially picked up from an accommodating tray 615 for the copy paper sheets and conveyed to a conveying passage 616 below the photosensitive drum 613.

The speed at which the copy paper sheet is conveyed and the rotation speed of the photosensitive drum 613 are synchronized with each other. The toner image of the latent image sequentially formed for each line and then formed on the surface of the photosensitive drum 613 are transferred to the copy paper sheets so that toner images, which are the same as those of the original document, are left on the copy paper sheets. The conveying passage 616 is a passage through which the copy paper sheet to which the toner image has been transferred is conveyed to a discharge port. A conveying mechanism provided for the conveying passage 616 conveys the copy paper sheet to the discharge port. A fixing section 617 is a unit disposed in front of the discharge port to fix the toner. When copy paper sheet, to which the toner image has been transferred, is allowed to pass through the fixing section 617, the toner is fixed to the copy paper sheet. Then, the copy paper sheet is discharged to the discharge port.

Since the structure is formed as described above, the copying operation is performed such that the sheet original document 603 is placed on the upper surface of the original-document table 602. Then, the pressing cover 604 presses the original document 603. Since the optical system capable of reciprocating from one end of the original-document table 602 to another end of the same in the main scanning direction at predetermined speed is disposed at a position substantially just below the original-document table 602, a print start operation causes the light source 605, the mirror 606 and the lens 607 forming the optical system reciprocate in the main scanning direction.

Assuming that the main scanning direction is considered the vertical direction, the lateral direction of the original-document table 602 is determined to be the widthwise direction. In this case, the light source 605 of the optical system illuminates the portion corresponding to the width of the original-document table 602. The mirror 606 and the lens 607 of the optical system forms the image in the foregoing range on the light receiving surface of the MOS sensor 608. The MOS sensor 608 is a linear sensor having light receiving sections (the photodiodes) corresponding to the pixels and disposed in one-dimensional configuration, the MOS sensor 608 being a monochrome solid-state imaging device having the noise canceler circuit according to the present invention.

Therefore, the MOS sensor 608 picks up images for one line (that is, one line in the sub-scanning direction) in the widthwise direction, and then converts the images into signals corresponding to the quantity of received light. The scanner controller 609 controls the MOS sensor 608 so that the signals corresponding to the quantity of received light in the disposing order of the pixels are read and output as image signals in pixel units. Moreover, the scanner controller 609 controls the movement of the optical system in the main scanning direction so that the optical system is sequentially moved in the main scanning direction. As a result, signals of the images of the original document 603 on the original-document table 602 corresponding to the quantity of received light are obtained sequentially in the main scanning direction for each line in the sub-scanning direction in the disposing order of the pixels.

The signals are supplied to the system controller 610, and then the system controller 610 controls the output from the laser beam source 611 to correspond to the signals. Therefore, the laser beam source 611 emits light having the intensity corresponding to the quantity of received light output from the MOS sensor 608.

Since the system controller 610 controls the polygonal mirror 612 to swing in synchronization with the reading speed of the MOS sensor 608, the optical images for one line (that is, for one line in the sub-scanning direction) are formed on the photosensitive drum 613 by the polygonal mirror 612.

The photosensitive drum 613 is rotated in one direction at peripheral speed corresponding to the main scanning speed. The outer surface of the photosensitive drum 613 has been electrically charged by the charging means when the outer surface reaches the position, at which the image is formed with the laser beam. When the photosensitive drum 613 is irradiated with the laser beam, the portion of the photosensitive drum 613 irradiated with the laser beam loses charges by a quantity corresponding to quantity of applied light. Therefore, the image of the original document is, as a latent image, left on the photosensitive drum 613 in a downstream region in the direction of rotation from the position which has been scanned with the laser beam for forming the image.

The latent image is developed and converted into a visible image with the toner supplied from the developing section 614 when the latent image passes through the position corresponding to the developing section 614. The toner image is transferred to the copy paper sheets sequentially picked up from the accommodating tray 615 for accommodating the copy paper sheets and conveyed to the conveying passage 616 at a position below the photosensitive drum 613. Since the conveyance speed of the copy paper sheet and the speed of rotation of the photosensitive drum 613 are synchronized with each other, the toner image of the latent image sequentially formed on the surface of the photosensitive drum 613 for each line is transferred. Thus, the toner image of the image which is the same as the image of the original document is left on the copy paper sheet. The copy paper sheet, to which the toner image has been transferred, is conveyed through the conveying passage 616 toward the discharge port by the conveying mechanism. When the copy paper sheet passes through the fixing section 617 formed in front of the discharge port, toner is fixed to the copy paper sheet by the fixing section 617. Then, the copy paper sheet is discharged.

According to this embodiment, the electric power consumption can be reduced, the required voltage level can be lowered and an original document can be read at high speed with excellent S/N ratio. Thus, an electronic copying machine exhibiting a compact size, excellent function and satisfactory performance can be obtained. That is, a fixed pattern noise component which has raised a problem with the MOS sensor can be canceled in a short time. Thus, an electronic copying machine can be provided which exhibits an excellent S/N ratio and thus capable of reading a high quality image at high speed and copying the same.

Although the position of the original document is fixed and the optical system is moved in the main scanning direction in this embodiment, the optical system may be fixed and the original document may be conveyed in the main scanning direction. Although the copying machine according to this embodiment is a monochrome machine, a copying machine may be employed in which color filters in three primary colors are provided for the optical system to separate the color so as to form latent images in the respective colors and develop the latent images with tone in the corresponding colors so that a color copy is obtained.

Eighth Embodiment (Application of Amplifying-Type MOS Sensor to Scanner)

Figure 12:
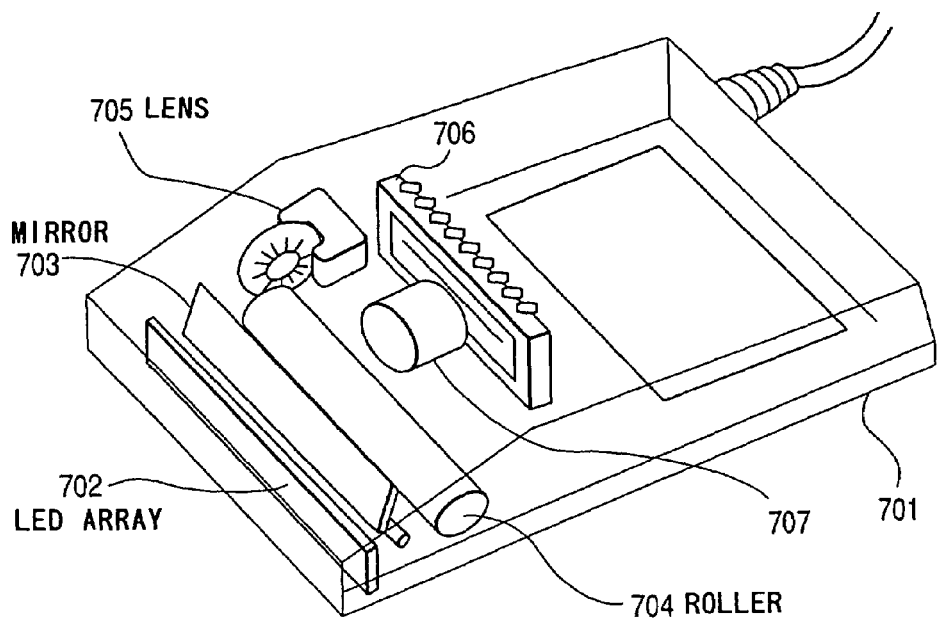
FIG. 12 is a diagram explaining an eighth embodiment according to the present invention and showing a handy image scanner using an MOS sensor of the present invention.

FIG. 12 shows an embodiment of a handy image scanner using the MOS sensor according to the present invention. An image scanner 700, as shown in FIG. 12, comprises a frame 701 in which a LED array 702 serving as a light source, a mirror 703 and a roller 704 are attached. The LED array 702 has a length substantially the same as the width of the frame 701 to illuminate the outside portion below the frame 701. The mirror 703 is disposed adjacent to the LED array 702 to pick up an image of an original document irradiated by the LED array 702 into the frame 701 through a slit 701a formed in the lower portion of the frame 701.

In the handy image scanner shown in FIG. 12, the frame 701 is placed on an original document. Then, it is manually slid on the original document to scan the original document. At this time, a roller 704 is disposed to synchronize detection of the line position and the reading timing in order to output the image of the original document for line units through the slit 701a.

To be brought into contact with the original document and rotated attributable to friction with the original document, a portion of the outer surface of the roller 704 is exposed through the lower portion of the frame 701. The position of exposure is near the slit 701a.

The frame 701 includes an encoder 705 for detecting a direction and amount of rotation of the roller 704 in synchronization with the rotation of the roller 704. Moreover, the frame 701 includes an MOS sensor 706 and a lens 707 for forming, on the light receiving surface of the MOS sensor 706, an image of the original document introduced by the mirror 703.

The MOS sensor 706 is a linear sensor having light receiving sections (photodiodes) disposed in one-dimensional array for unit of pixels, the MOS sensor 706 being a monochrome solid-state imaging device having the noise canceler circuit according to the present invention. In recent years, the linear sensor of a type arranged to be brought into close contact with the surface of an original document to read the image of the original document has been widely used. The contact type sensor can be realized by employing a structure formed by combining a lens for introducing the image of an original document, light receiving sections disposed in pixel units to convert the image into an electric signal corresponding to the quantity of light and a light emitting device for irradiating the surface of the original document with light.

FIG. 12 shows a principle structure.

The signal read from the MOS sensor 706 is subjected to position correspondence in accordance with an output from the encoder 705 so as to be used to control the reading timing.

The sheet-form original document is placed on a plain portion, and then the handy scanner is placed on the original document. Then, the handy scanner is moved in the direction in which the roller 704 can be rotated. The direction of movement at this time is the main scanning direction. At this time, the LED array 702 illuminates the surface of the original document so that the image of the original document is introduced into the mirror 703 through the slit 701a. The image is reflected by the mirror 703, and then formed on the MOS sensor 706 by a lens 707.

The MOS sensor 706 is a line image sensor on which the image of the original document for each line is made incident through the lens 707.

As described above, the handy image scanner according to this embodiment is arranged such that the frame 701 is placed on the original document and then manually moved on the surface of the original document. To output the image of the original document in unit of lines through the slit 701, the roller 704 is provided which synchronizes the detection of the position of the line and the reading timing. The roller 704 is brought into contact with the original document so as to be rotated because of the friction with the original document. As a result, a detection signal representing the direction and amount of rotation of the roller 704 is output from the encoder 705. In response to the detection signal supplied from the encoder 705, a control means (not shown) performs control in such a manner that the output signal from the MOS sensor 706 coincides with each line.

According to this embodiment, the electric power consumption can be reduced, the required voltage can be lowered and high speed reading with excellent S/N can be realized. Thus, a compact image scanner can be obtained which exhibits advanced function and satisfactory performance. That is, the fixed pattern noise component raised a problem for the MOS sensor can be canceled in a short time. Thus, an image scanner exhibiting excellent S/N and thus capable of transferring a high quality image at high speed can be provided.

Although the handy image scanner has been described in this embodiment, the present invention can be applied to a desk-top type image scanner structured such that an original document is placed on a original-document table and the optical system performs the main scanner operation. Moreover, an apparatus can be realized which has a structure in which the position of the optical system is fixed and the original document is conveyed in the main scanning direction. Although this embodiment has been described about the monochrome unit, a color image scanner can be realized by providing color filters in three primary colors for the optical system to separate colors to obtain image signals in respective colors so as to obtain color image signals. Moreover, a variety of modification are permitted such that the optical system comprises a concave mirror to introduce the image to the MOS sensor or an optical fiber formed by binding optical fibers is employed to introduce the image to the MOS sensor.

Ninth Embodiment (Desk-Top Type Color Image Scanner)

Figure 13:
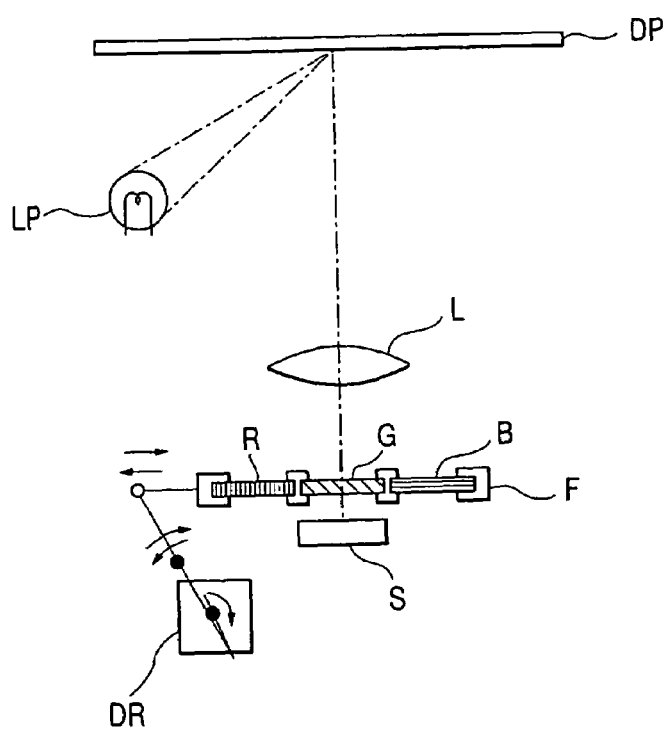
FIG. 13 is a diagram explaining a ninth embodiment according to the present invention and showing an example of the structure of an MOS sensor using a mechanical switch type color filter.

An optical system used for the desk-top type color image scanner will be described as the ninth embodiment. In the desk-top type color image scanner, the optical system is fixed and the document is scanned in the main scanning direction. As shown in FIG. 13, color filters in three primary colors are provided for the optical system to separate colors so as to obtain image signals in respective colors. Referring to FIG. 13, an MOS sensor S for obtaining image signals is a line sensor formed by linearly disposing pixels for one line. A color filter F is disposed on the light receiving side of the MOS sensor S. The color filter F has a structure in which optical filter sections in R (Red), G (Green) and B (Blue) are disposed in parallel. An optical image of an original document DP is formed on the MOS sensor S through a lens L and the color filter F. The original document DP is irradiated with light emitted from a light source LP.

The color filter F is movably supported by a drive and scanning mechanism DR to perform scanning so that the optical filter sections in R (Red), G (Green) and B (Blue) are moved on the light receiving surface of the MOS sensor S. When a red image is received, the optical filter section for the red component is brought to the light receiving surface of the MOS sensor. When a green image is received, the optical filter section for the green component is brought to the light receiving surface. When a blue image is received, the optical filter section for the blue component is brought to the light receiving surface. The foregoing movement is performed in synchronization with the timing at which the images are collected.

As a result, image signals of optical images in R (Red), G (Green) and B (Blue) can be obtained from the MOS sensor.

Tenth Embodiment (Application of Amplifying-Type MOS Sensor to Film Scanner)

The amplifying type MOS sensor according to the present invention may be applied to a film scanner for reading each frame of, for example, 35 mm long film to cause a personal computer or an image display unit.

Figure 14:
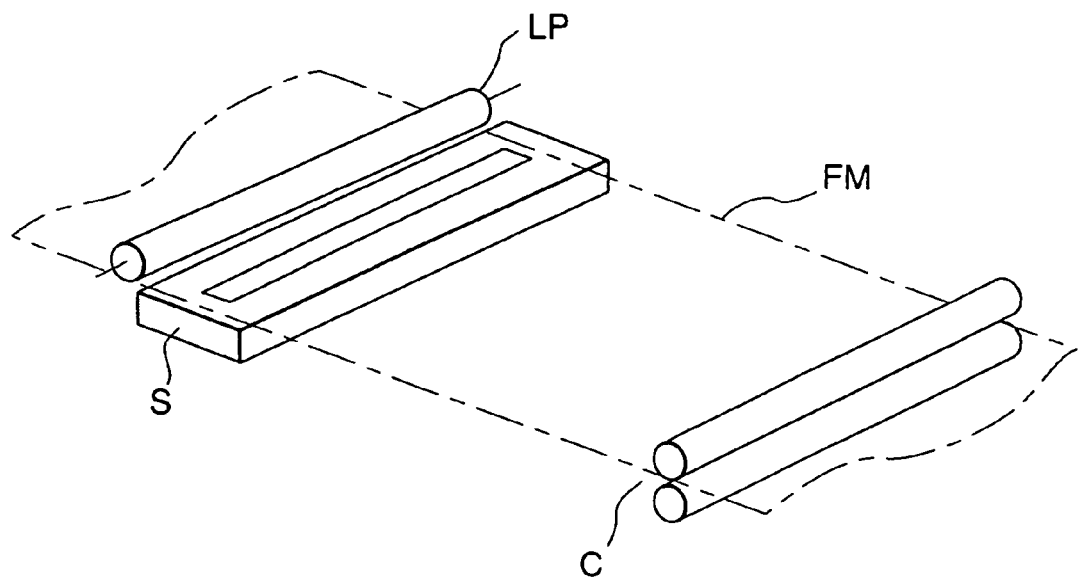
FIG. 14 is a diagram explaining a tenth embodiment according to the present invention and showing an example of application of an MOS sensor of the present invention to a film scanner.

An example of the structure is shown in FIG. 14. As shown in FIG. 14, the film scanner has a contact type line sensor S comprising an amplifying type MOS sensor, a developed silver-halide long film FM disposed to face the light receiving surface of the line sensor S, a light source LP for irradiating the silver-halide long film FM with light at a position above the light receiving position of the line sensor S and a pair of conveying rollers C for holding and conveying the silver-halide long film F in one direction at predetermined speed.

Thus, the conveying roller C holds the silver-halide long film FM, and then the conveying roller C is rotated at predetermined speed. As a result, the silver-halide long film FM is conveyed in one direction at predetermined speed. Thus, the contact type line sensor S reads the image on the silver-halide long film FM in such a manner that synchronization with the speed at which the film is conveyed is established. Thus, a signal corresponding to the quantity of received light is obtained. The signal is subjected to the noise canceling process so that an image of the film composed of only the image component is, in line units, converted into an electric signal so as to be output.

Eleventh Embodiment (Application to Auto-Focusing Mechanism)

Figure 15:
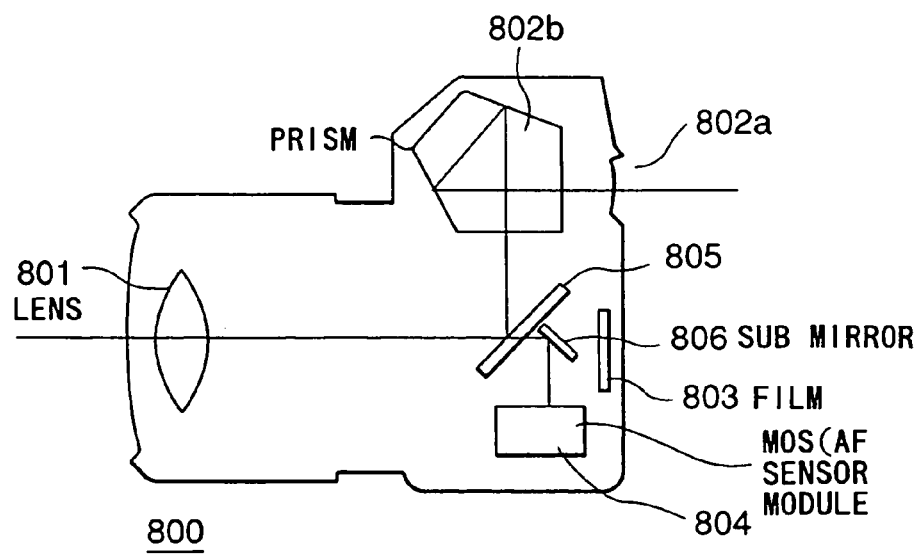
FIG. 15 is a diagram explaining an eleventh embodiment according to the present invention and showing a single lens reflex camera having an automatic focusing mechanism using an MOS sensor of the present invention.

FIG. 15 shows an embodiment of a single lens reflex camera having an automatic focusing mechanism comprising the MOS sensor according to the present invention. Referring to FIG. 15, the single lens reflex camera 800 according to the present invention comprises a lens 801 provided with a focal point adjustment mechanism, a film 803 on which an optical image obtained by the lens 801 is formed and exposed to light, a prism 802b for introducing the optical image obtained by the lens 801 into a finder 802a of the single lens reflex camera 800, an automatic focus sensor module 804 according to the present invention, automatic focus sensor module 804 comprising a half mirror, disposed on an optical path for the lens 801 and arranged to be completed deviated from the optical path in response to a shutter operation and a sub-mirror 806 attached to the rear side of the finder mirror 805 and arranged to cause an optical image which has transmitted the finder mirror 805 to be formed on the film 803 when the finder mirror 805 is positioned on the optical path for the lens 801.

Figure 16:
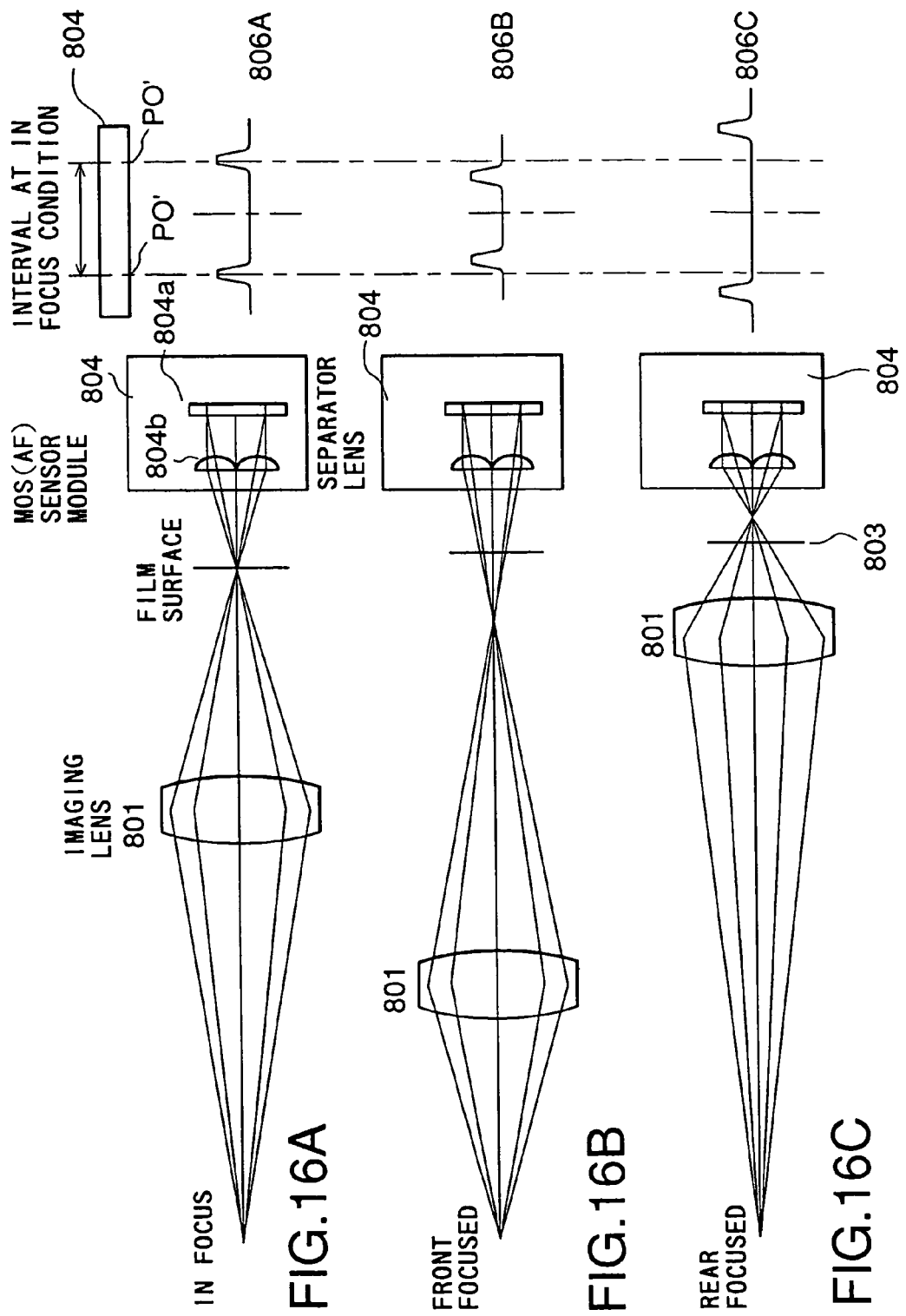
FIGS. 16A, 16B and 16C are diagrams showing the principle of focusing of the automatic focusing mechanism.

The automatic focus sensor module 804 comprises the MOS sensor having the noise canceler circuit according to the present invention. As shown in FIG. 16, a separator lens 804b is secured on the front surface of the light receiving surface of the MOS sensor 804a. The MOS sensor 804a has a light receiving surface having a two-dimensional configuration structure. The separator lens 804b is, as shown in FIG. 16, structured such that one pair of convex lenses are disposed adjacently. An optical image distributed by the sub-mirror 806 is, by the separator lens 804b, formed on different regions of the light receiving surface of the MOS sensor 804a. Since the separator lens 804b having the structure in which the pair of the convex lenses are disposed adjacently introduces the optical image to the light receiving surface of the MOS sensor 804a, images are formed on different regions of the light receiving surface so that a pair of images are obtained.

In the camera having the above-mentioned structure, an image of an object obtained by the lens 801 is distributed to the prism 802b and the sub-mirror 806 by the finder mirror 805. The image of the object distributed to the finder mirror 805 is allowed to pass through the prism 802b, and then formed on the finder 802a. Thus, the image of the object captured by the single lens reflex camera 800 can be visualized.

On the other hand, the image of the object distributed to the sub-mirror 806 is introduced into the automatic focus sensor module 804. The automatic focus sensor module 804 comprises the MOS sensor 804a. The front surface of the MOS sensor 804a has the separator lens 804b. The separator lens 804b forms the image onto different regions of the light receiving surface of the MOS sensor 804a. Since the MOS sensor 804a generates electric signals corresponding to the quantity of light of the optical image formed on the photodiodes corresponding to the pixels forming the light receiving, the electric signals are sequential read.

In the automatic focus sensor module 804, the light receiving surface of the portion of the MOS sensor 804a is divided into two image forming regions by the separator lens 804b. Thus, in a state of in focus, the MOS sensor 804a outputs images of the object respectively formed on the two image forming regions in the form as indicated with 806A shown in FIG. 16A such that same images appear with respect to reference pixel positions P0 and P0' in each of the divided image forming regions.

In a front focused state (a state where the focus position is deviated forwards than the surface of the film), the MOS sensor 804a outputs as indicated with 806B shown in FIG. 16B such that same images appear more inwards than the reference pixel positions P0 and P0' in each of the divided image forming regions.

In a rear focused state (a state where the focus position is deviated rearwards than the surface of the film), the MOS sensor 804a outputs as indicated with 806C shown in FIG. 16C such that same images appear outwardly apart from the reference pixel positions P0 and P0' in each of the divided image forming regions.

Therefore, a controlling variable is obtained which is required to adjust the focus of the lens 801 in a direction in which the output from the MOS sensor 804a is made in such a manner that the same images appear with respect to the reference pixel positions P0 and P0' in each of the divided image forming regions. Then, the focal point adjustment mechanism is controlled by a degree corresponding to the obtained controlling variable. Thus, the focal point of the lens 801 is adjusted to focus the surface of the film.

When a shutter button is depressed, the finder mirror 805 is jumped and deviated from the optical path. Thus, the image of the object obtained by the lens 801 is formed on the surface of the film, and the film is exposed to light. As a result, a focus-adjusted image of the object can be photographed.

The camera having the automatic focusing mechanism according to the present invention is able to detect a state of focusing with a small electric power consumption and low voltage. Moreover, high speed reading can be realized with excellent S/N. Even if an object is photographed at high shutter speed or if a high speed successive photographing is performed, the state of focusing can satisfactorily be detected. As a result, the focusing control can immediately be performed to photograph a clear image. That is, the fixed pattern noise component, which has raised a problem for the MOS sensor, can be canceled in a short time. Therefore, a high quality image can be read at high speed with excellent S/N and state of focusing can be detected at high speed. As a result, control of focusing can immediately be performed so that a clear image is photographed.

Although the single lens reflex camera has been described in this embodiment, the automatic focusing mechanism may be applied to a lens shutter camera, a binocular and an optical microscope.

Description will be given with respect to a low noise MOS sensor used in the above systems, i.e., the MOS sensor in which the fixed pattern noise is efficiently removed and a large output dynamic range larger than 70 dB can be obtained, a noise canceler used in the MOS sensor, and a unit cell of the MOS sensor.

A solid-state imaging device using an amplification-type MOS sensor includes a photodiode as a light receiving portion. A detection signal from the photodiode is amplified by a transistor in each cell. Thus, the solid-state imaging device using an amplification-type MOS sensor has a high sensitivity.

Generally, in an amplification-type MOS-type solid-state imaging device, an output signal from the photodiode which is a light receiving element corresponding to a pixel is amplified by an amplification transistor provided in the same unit cell. During amplification, a variation of the threshold voltage of the amplification transistors is superposed on the signal. Therefore, even if the potentials of the photodiodes in each unit cell are the same, the output signals may vary since the amplification transistors are different for the cells and the threshold voltages are also different for the cells. Therefore, when an image picked-up by the amplification-type MOS-type solid-state imaging device is reproduced, noise due to the threshold variation of the amplification transistor are generated.

As described above, in an amplification-type MOS-type solid-state imaging device, the threshold voltages of the amplification transistors in the unit cells are different from each other and the threshold voltage is unique to the unit cell. Therefore, it is unavoidable to generate noise fixedly distributed on the reproduced image, i.e., a two-dimensional noise. Since this noise is fixed in the position on the image, it is called a fixed pattern noise.

A noise canceler of the present invention described later is used to remove the fixed pattern noise.

The solid-state imaging device using the amplification-type MOS sensor amplifying the signal charges in the cell and the noise canceler used for the amplification-type MOS sensor will be described in details.

Twelfth Embodiment

Figure 17:
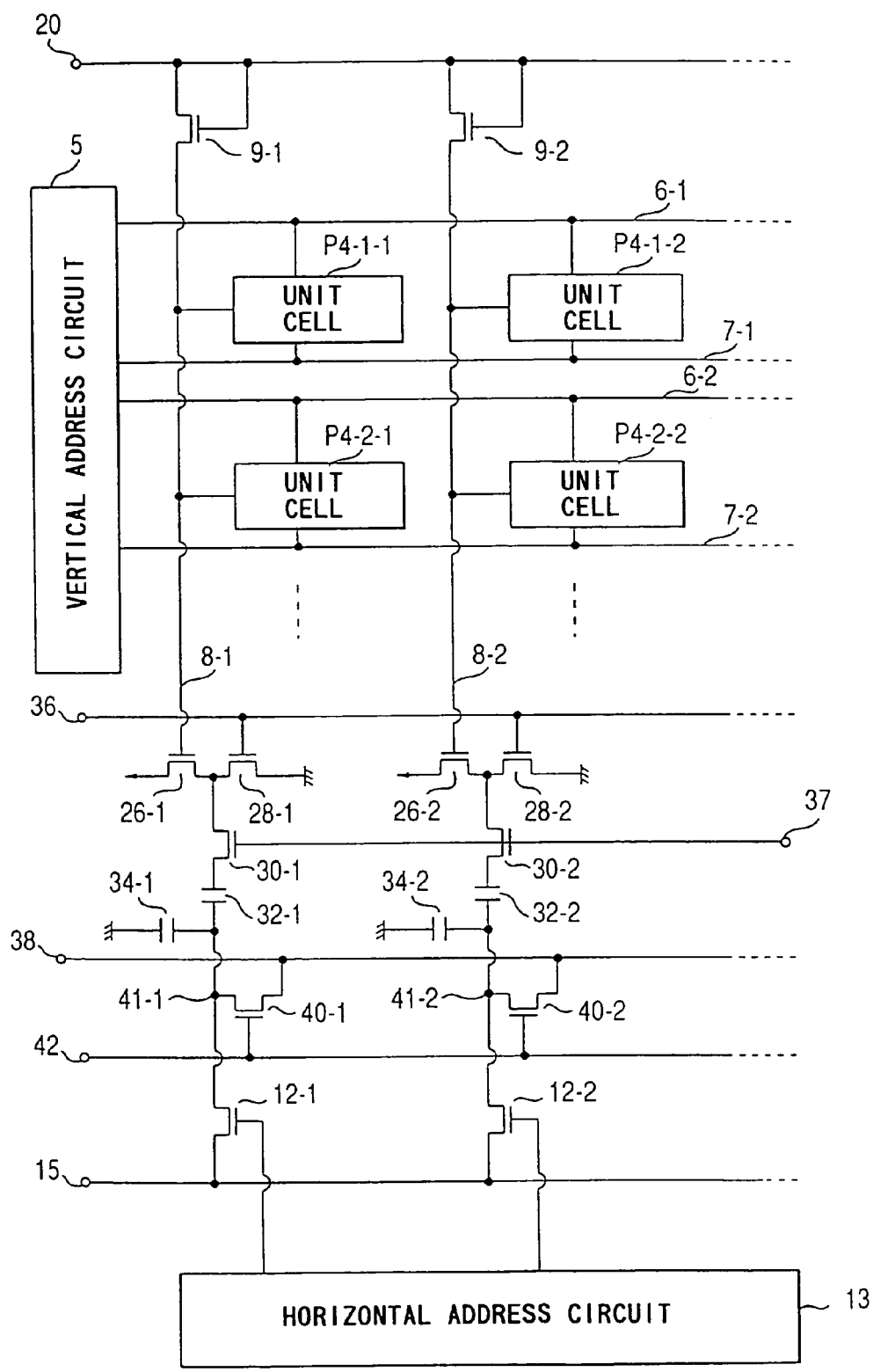
FIG. 17 is a circuit diagram showing the arrangement of an MOS-type solid-state imaging device according to a twelfth embodiment of the present invention.
Figure 21:
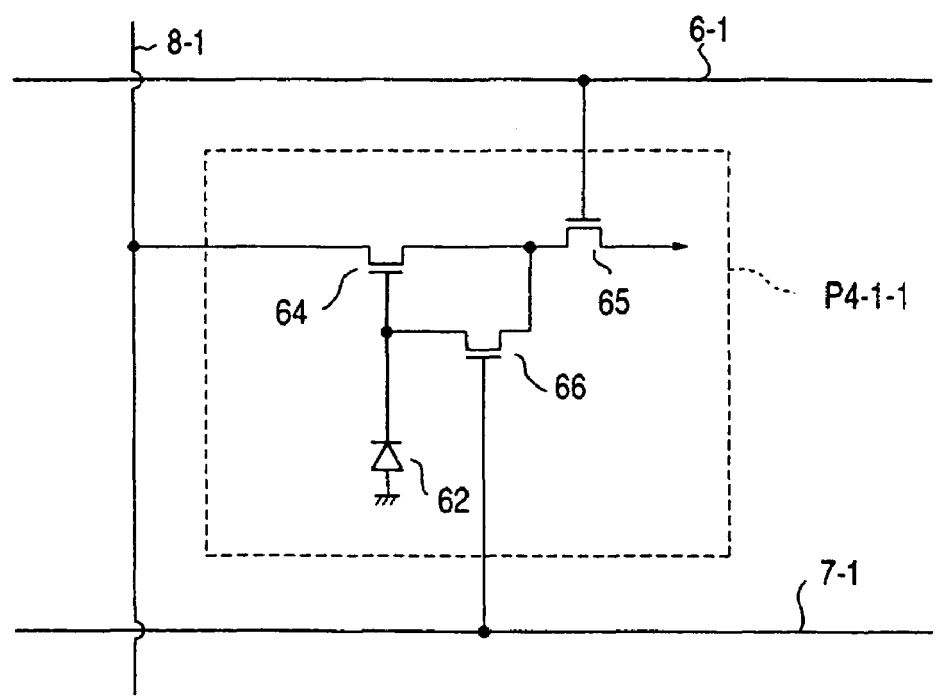
FIG. 21 a circuit diagram of the unit cell of the twelfth embodiment.

FIG. 17 shows the arrangement of an MOS-type solid-state imaging device according to a twelfth embodiment of the present invention. Unit cells P4-i-j are arranged in the form of a two-dimensional matrix. Although FIG. 17 shows only a 2×2 matrix, the actual apparatus has several thousand cells×several thousand cells. Reference symbol denotes a variable in the horizontal (row) direction; and, a variable in the vertical (column) direction. The details of the unit cell P4-i-j are shown in FIG. 21.

The field of applications of the solid-state imaging device of the present invention includes video cameras, electronic still cameras, digital cameras, facsimile apparatuses, copying machines, scanners, and the like.

Vertical address lines 6-1, 6-2, . . . horizontally extending from a vertical address circuit 5 are connected to the unit cells in the respective rows to determine horizontal lines for reading out signals. Similarly, reset lines 7-1, 7-2, . . . horizontally extending from the vertical address circuit 5 are connected to the unit cells in the respective rows.

The unit cells in the respective columns are connected to vertical signal lines 8-1, 8-2, . . . arranged in the column direction. Each of load transistors 9-1, 9-2, . . . is connected to one end of a corresponding one of the vertical signal lines 8-1, 8-2 . . . . The gates and drains of the load transistors 9-1, 9-2, . . . are commonly connected to a drain voltage terminal 20.

The other end of each of the vertical signal lines 8-1, 8-2, . . . is connected to a gate of MOS transistors 26-1, 26-2, . . . . Sources of the MOS transistors 26-1, 26-2, . . . are connected to drains of MOS transistors 28-1, 28-2, . . . . The MOS transistors 26-1, 26-2, . . . and 28-1, 28-2, . . . operate as source follower circuits. The gates of the MOS transistors 28-1, 28-2, . . . are connected to a common gate terminal 36.

Connection points between the MOS transistors 26-1, 26-2, . . . and 28-1, 28-2, . . . are connected to one ends of clamp capacitors 32-1, 32-2, . . . through sample/hold transistors 300-1, 30-2 . . . . Sample/hold capacitors 34-1, 34-2, . . . and clamp transistors 40-1, 40-2, . . . are connected in parallel to the other ends of the clamp capacitors 32-1, 32-2 . . . . The other ends of the sample/hold transistors 30-1, 30-2, . . . are grounded. The other ends of the clamp capacitors 32-1, 32-2, . . . are connected to a signal output terminal (horizontal signal line) 15 through a horizontal selection transistors 12-1, 12-2, . . . .

Figure 18:
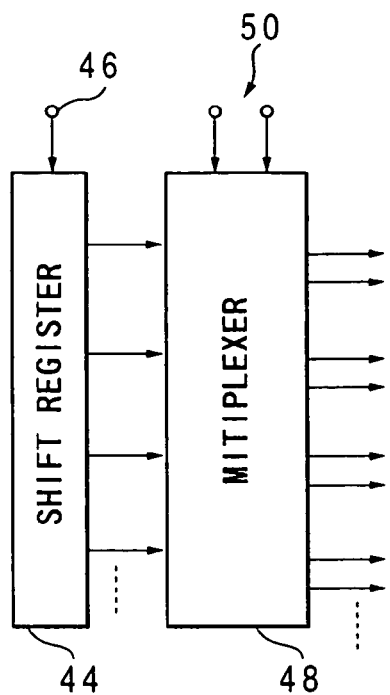
FIG. 18 is a view showing a circuit arrangement of a vertical address circuit in the twelfth embodiment.
Figure 19:
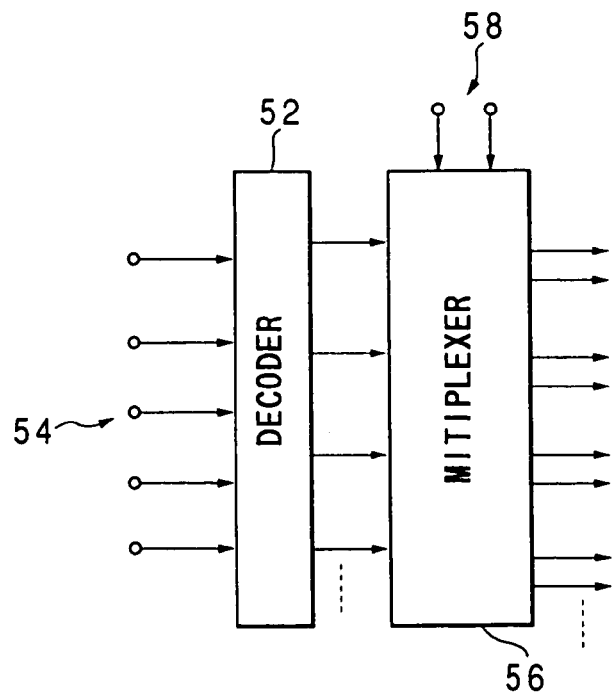
FIG. 19 is a view showing another circuit arrangement of the vertical address circuit in the twelfth embodiment.
Figure 20:
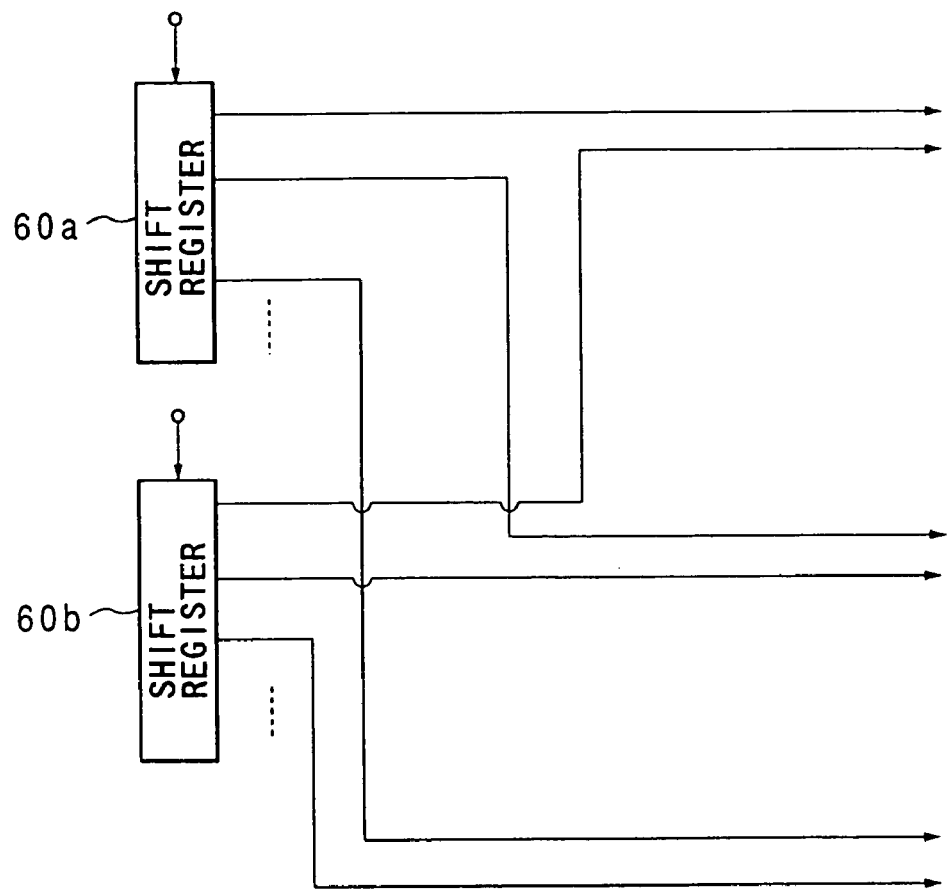
FIG. 20 is a view showing a still another circuit arrangement of the vertical address circuit in the twelfth embodiment.

The vertical address circuit 5 is a circuit for shifting a plurality of signals, two signals in this case, together, and is realized by one of the circuits shown in FIGS. 18, 19, and 20. In the case shown in FIG. 18, outputs from many output terminals of a shift register 44 for sequentially shifting and outputting an input signal 46 are synthesized with two input signals 50 by a multiplexer 48. In the case shown in FIG. 19, outputs from a decoder 52 for decoding an encoded input 54 are synthesized with two input signals 58 by a multiplexer 56. In the case shown in FIG. 20, the outputs of two shift registers 60a and 60b are synthesized into control signal lines in the respective rows.

FIG. 21 shows an arrangement of the unit cell P4-i-j in FIG. 17. Although FIG. 21 shows only the arrangement of the unit cell P4-1-1, the same arrangement is used for each of the remaining unit cells P4-1-2, . . . .

As shown in FIG. 21, each unit cell of the MOS-type solid-state imaging device of this embodiment is constituted by a photodiode 62 for detecting incident light, an amplification transistor 64 having a gate to which the cathode of the photodiode 62 is connected and serving to amplify a detection signal from the photodiode 62, a reset transistor 66 arranged between the gate and drain of the amplification transistor 64 and serving to perform a feedback operation, and a vertical selection transistor 65 connected to the drain of the amplification transistor 64 to select a horizontal line from which a signal is to be read out.

The vertical address line 6-1 horizontally extending from the vertical address circuit 5 is connected to the gate of the vertical selection transistor 65 to select a line from which a signal is to be read out. Similarly, the reset line 7-1 horizontally extending from the vertical address circuit 5 is connected to the gate of the reset transistor 66.

In general, in the amplification-type MOS-type solid-state imaging device, since variations in the threshold voltages of the amplification transistors 64 are superimposed on signals, even if the potentials of the photodiodes 62 are the same, the output signals vary. When a picked-up image is reproduced, therefore, two-dimensional noise (called fixed pattern noise because the noise is fixed to a specific place) corresponding to the threshold variations of the amplification transistors 64 is generated. Even if the light receiving portion is uniformly irradiated with light, the output signals from the pixels are different. Noise distributed two-dimensionally in the image is fixed with respect to the position of the pixels and is called a fixed pattern noise.

Figure 1:
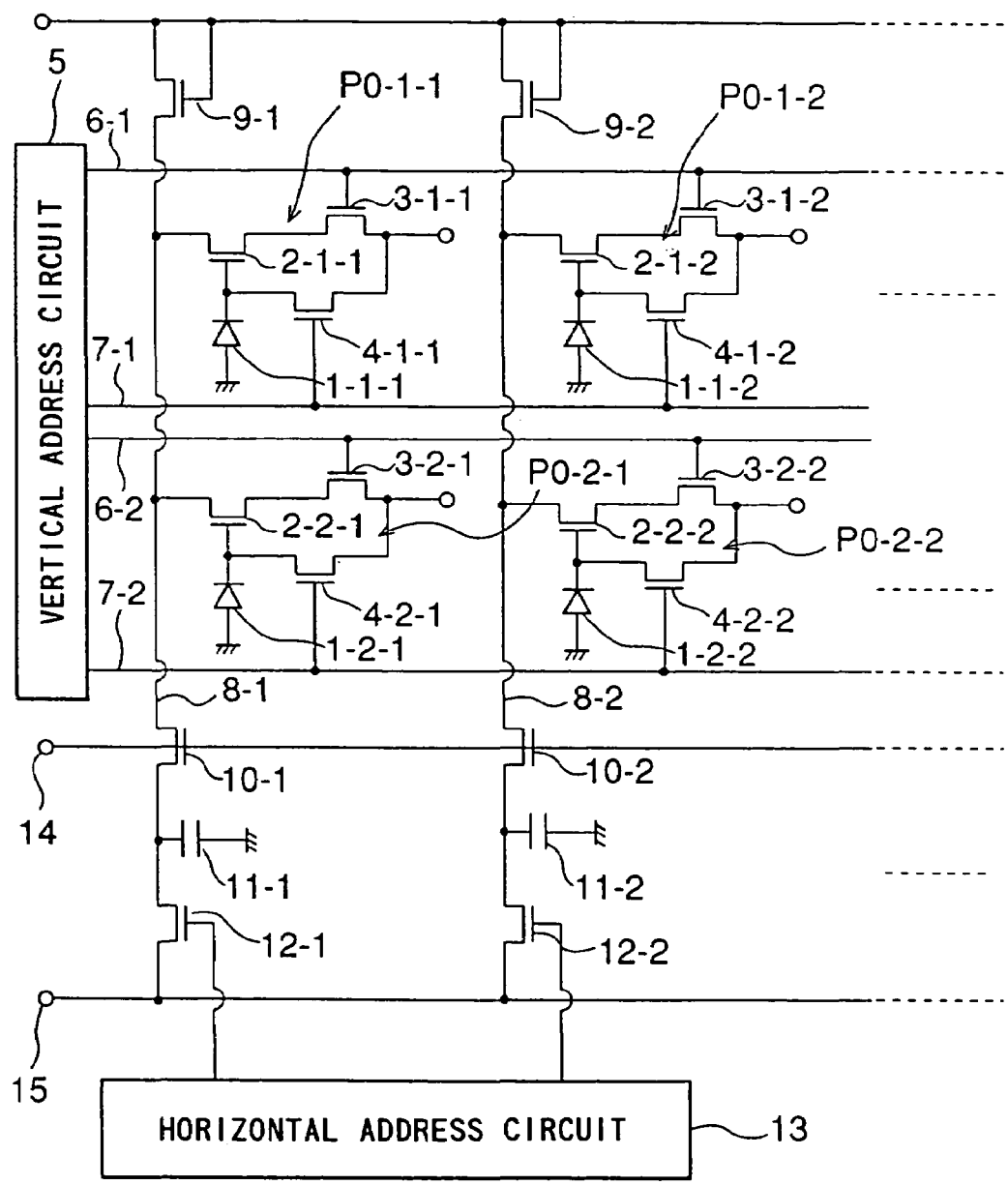
FIG. 1 is a circuit diagram of a conventional MOS-type solid-state imaging device.
Figure 2:
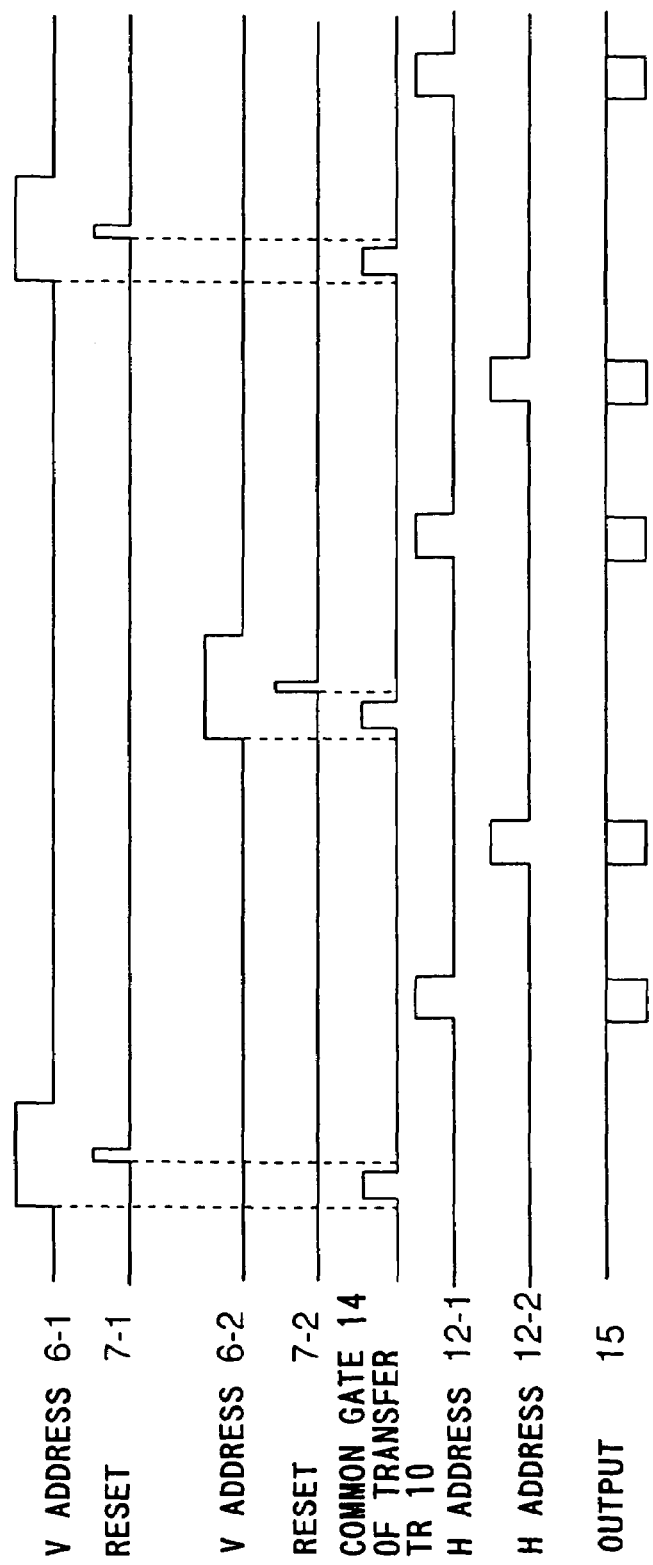
FIG. 2 is a timing chart showing an operation of the conventional device shown in FIG. 1.

Therefore, in this embodiment, a reset transistor (4-i-j (i, j=1, 2, 3, 4, . . . ) in the prior art shown in FIG. 1, 66 in FIG. 21) in each unit cell is caused to perform a feedback operation so as to reduce fixed pattern noise. In addition, a noise reduction circuit for further suppressing the reduced fixed pattern noise is arranged in a preceding stage of the horizontal selection transistor 12 in FIG. 17.

FIG. 17 shows a correlation double sampling type noise reduction circuit for obtaining the difference between a signal and noise in a voltage domain. However, the noise reduction circuit is not limited to the correlation double sampling type, and various types of noise reduction circuits can be used.

The principle of threshold voltage correction performed for the amplification transistor 64 by the feedback operation of the unit cell, which is a characteristic feature of this embodiment, will be described first with reference to FIGS.

Figure 22A:
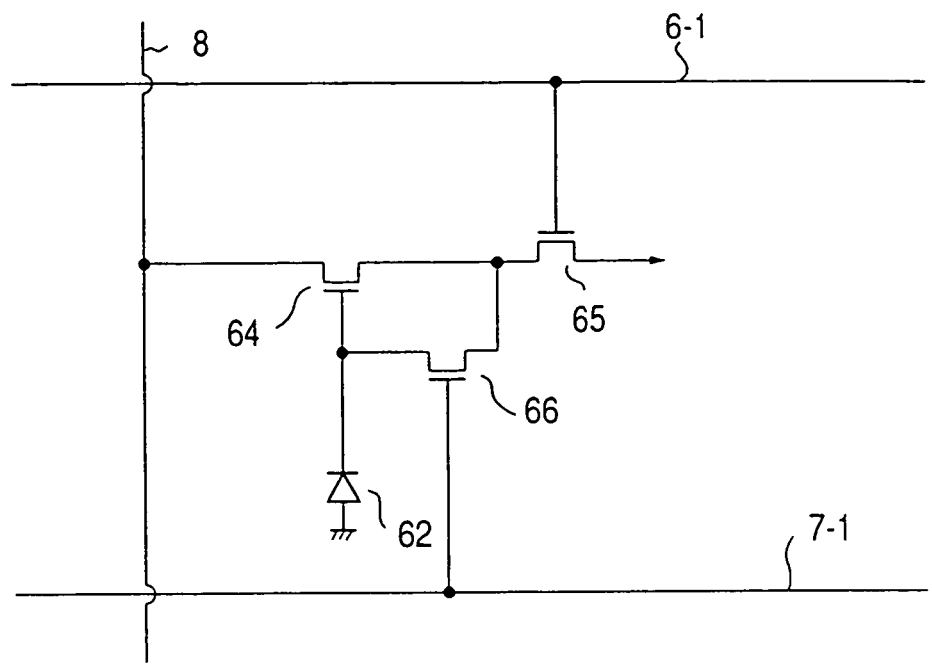
FIGS. 22A, 22B and 22C are views showing a principle of correcting the threshold variation of the amplification transistors in the unit cell according to the twelfth embodiment.
Figures 22B, 22C:
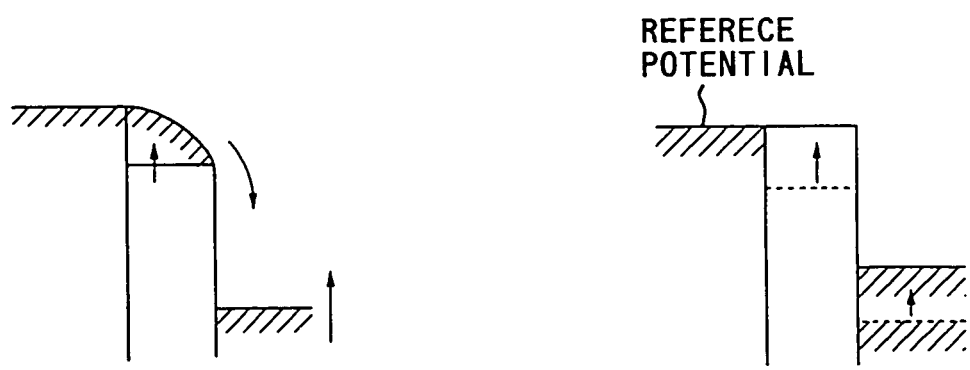

22A to 22C. FIG. 22A is a circuit diagram of the unit cell. FIGS. 22B and 22C are the potential charts of the amplification transistor 64.

FIG. 22B shows the potential set when a reference voltage is applied to the vertical signal line 8 while the vertical selection transistor 65 is off, and the reset transistor 66 is on. As electrons flow into the drain through the gate channel, the drain voltage drops.

Since the drain-gate path is conductive due to the ON state of the reset transistor 66, the gate voltage also drops, and the number of electrons flowing into the drain decreases. Finally, as shown in FIG. 22C, the reference voltage applied to the source becomes almost equal to the channel potential. In this state, the channel potential is set to an external voltage, and no variations appear in terms of the structures of transistors.

As described above, according to this embodiment, threshold variations can be corrected by inserting the feedback transistor (reset transistor 66) between the gate and drain of the amplification transistor 64, and performing a feedback operation with a constant voltage being applied to the source.

Figure 23:
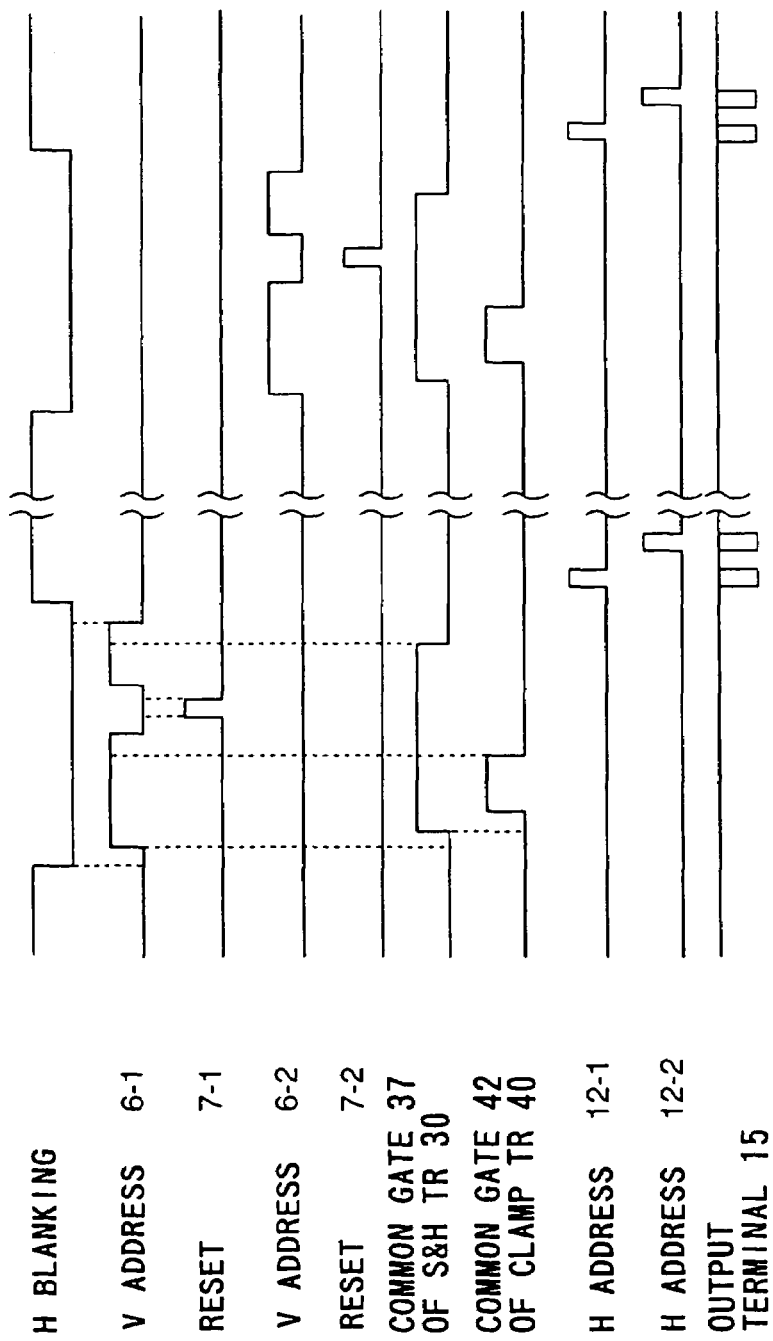
FIG. 23 is a timing chart showing the operation of the twelfth embodiment.

The operation of the MOS-type solid-state imaging device having the above arrangement will be described next with reference to the timing chart of FIG. 23. Since the common drain terminal 20 of the load transistors 9, the common gate terminal 36 of the transistors 28 of impedance converters, and the common source terminal 38 of clamp transistors 40 are DC-driven, their operations are omitted from the timing chart.

When a high-level address pulse is applied to the vertical address line 6-1, the vertical selection transistors 65 of the unit cells P4-1-1, P4-1-2, . . . connected to the vertical address line 6-1 are turned on. As a result, source follower circuits are constituted by the amplification transistors 64 and the load transistors 9-1, 9-2, . . . .

The common gate 37 of the sample/hold transistors 30-1, 30-2, . . . is set at high level to turn on the sample/hold transistors 30-1, 30-2, . . . . Thereafter, the common gate 42 of the clamp transistors 40-1, 40-2, . . . is set at high level to turn on the clamp transistors 40-1, 40-2, . . . .

Subsequently, the common gate 42 of the clamp transistors 40-1, 40-2, . . . is set at low level to turn off the clamp transistors 40-1, 40-2, . . . . With this operation, the signals plus noise components appearing on the vertical signal lines 8-1, 8-2, . . . are stored in the clamp capacitors 32-1, 32-2, . . . .

When a high-level reset pulse is applied to the reset line 7-1 after the vertical address pulse is returned to low level, the reset transistors 66 of the unit cells P4-1-1, P4-1-2, . . . connected to the reset line 7-1 are turned on. As a result, the charge at the input terminal of an output circuit 68 is reset.

When a high-level address pulse is applied to the vertical address line 6-1 again, the vertical selection transistors 65 of the unit cells P4-1-1, P4-1-2, . . . connected to the vertical address line 6-1 are turned on, and source follower circuits are constituted by the amplification transistors 64 and the load transistors 9-1, 9-2, . . . . As a result, only the noise components obtained after the signal components are reset appear on the vertical signal lines 8-1, 8-2, . . . .

As described above, since the signals plus noise components are stored in the clamp capacitors 32-1, 32-2, . . . , voltage changes on the vertical signal lines 8-1, 8-2, . . . , i.e., only the signal voltages without fixed pattern noise, obtained by subtracting the noise components from the signal components plus noise components, appear on the clamp nodes 41-1, 41-2, . . . .

The common gate 37 of the sample/hold transistors 30-1, 30-2, . . . is set at low level to turn off the sample/hold transistors 30-1, 30-2, . . . . With this operation, the voltages without noise, appearing on the clamp nodes 41-1, 41-2, . . . , are stored in the sample/hold capacitors 34-1, 34-2, . . . .

By sequentially applying a horizontal address pulse to the horizontal selection transistors 12-1, 12-2, . . . , the signals from the photodiodes 62, which are stored in the sample/hold capacitors 34-1, 34-2, . . . and contain no noise, are read out from the output terminal (horizontal signal line) 15.

By repeating the above operation for the vertical address lines 6-2, 6-3, . . . in the same manner as described above, the signals in all the cells arranged two-dimensionally can be output.

A sequence in the timing chart of FIG. 23 will be described below. The following two sequences are required:

Rise of vertical address pulse, rise of sample/hold pulse, and rise of clamp pulse→Rise of reset pulse→Fall of reset pulse→Fall of sample/hold pulse→Fall of vertical address pulse Although the order of the rise of the vertical address pulse, the rise of the sample/hold pulse, and the rise of the clamp pulse can be arbitrarily set, the above order is preferable.

As described above, according to the operation in FIG. 23, since a voltage corresponding to the difference between the voltage set when a signal (plus noise) is present and the voltage set when the gate of the amplification transistor is reset and no signal is present, appears on the clamp node 41, fixed pattern noise caused by threshold variation of the amplification transistors 64, which cannot be completely removed by the feedback operation of the unit cell for some reason, is compensated. That is, a circuit constituted by the clamp transistor 30, the clamp capacitor 31, the sample/hold transistor 40, and the sample/hold capacitor 34 serves as a noise canceler.

Note that the noise canceler in this embodiment is connected to the vertical signal line 8 through the impedance converter 26 and 28 constituted by a source follower circuit. That is, the vertical signal line is connected to the gate of the transistor 26. Since this gate capacitor is very small, the amplification transistor 64 of the unit cell charges only the vertical signal line 8-1, 8-2, . . . . Therefore, the time constant of each CR circuit is small, and a steady state is quickly set. The application timing of a reset pulse can therefore be quickened to perform a noise canceling operation within a short period of time. When a television signal is to be handled, a noise canceling operation must be performed in a horizontal blanking interval. The ability to perform accurate noise cancellation within a short period of time is a great advantage. In addition, since the impedance of the noise canceler apparently remains the same, viewing from the unit cell, in a signal pulse noise output operation and in a noise output operation included in a noise canceling operation, noise can be accurately canceled.

The impedance of the noise canceler apparently remains the same, viewing from the unit cell, in a signal pulse noise output operation and in a noise output operation included in a noise canceling operation. Therefore, the noise components in a signal pulse noise output operation and in a noise output operation are the same. When the subtraction of two outputs is performed, the noise component can be exactly canceled so that only the signal component can be output. The impedance of the noise canceler is regarded as only a gate capacitance viewed from the unit cell and thus is very small. Therefore, it is possible to exactly cancel the noise in a short period of time.

The structure of this embodiment will now be described.

As is apparent from the circuit arrangement shown in FIG. 17, since the clamp capacitors 32 and the sample/hold capacitors 34 are directly connected to each other and arranged near, they can be stacked on the same surface. The size of each noise canceler portion can therefore be reduced.

Figure 24:
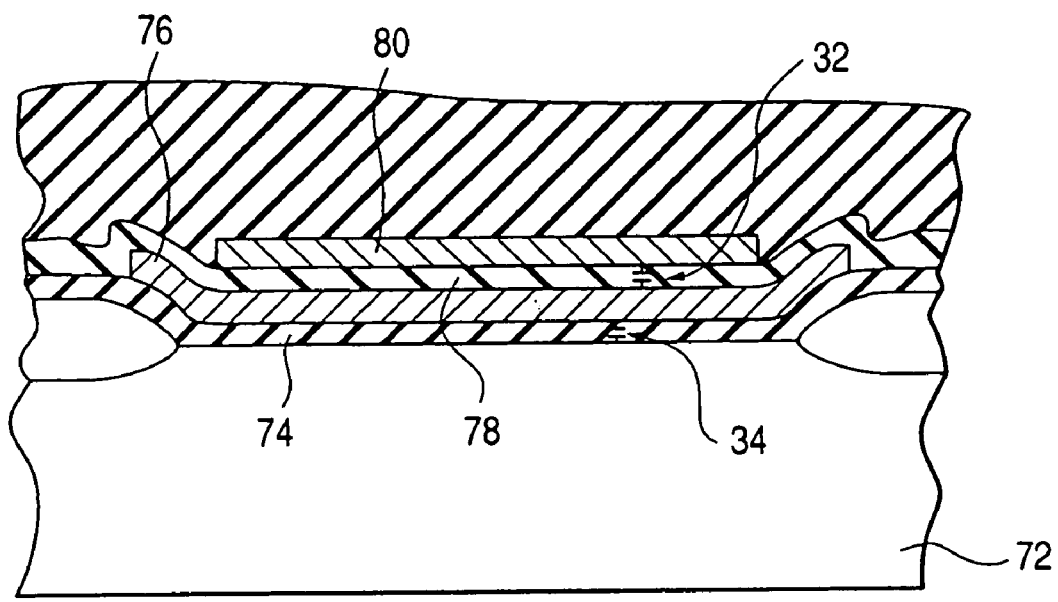
FIG. 24 is a sectional view showing the device structure of a noise canceler in the twelfth embodiment.

More specifically, as shown in FIG. 24, a first electrode 76 is formed on a silicon substrate 72 through a first insulating film 74 to form the sample/hold capacitor 34. In addition, a second electrode 80 is formed on the first electrode 76 through a second insulating film 78 to form the clamp capacitor 32.

As is also obvious from FIG. 24, since the first electrode 76 serves as a common electrode, and the clamp capacitor 32 and the sample/hold capacitor 34 are stacked on each other, the same capacitance value as that obtained when these components are formed separately can be obtained with ½ the area.

In this embodiment, the unit cells P4-1-1, P4-1-2, . . . and peripheral circuits such as the vertical address circuit 5 and the horizontal address circuit 13 are formed on a semiconductor substrate having a $p^+$-type impurity layer formed on a $p^-$-type substrate.

Figures 25A, 25B:
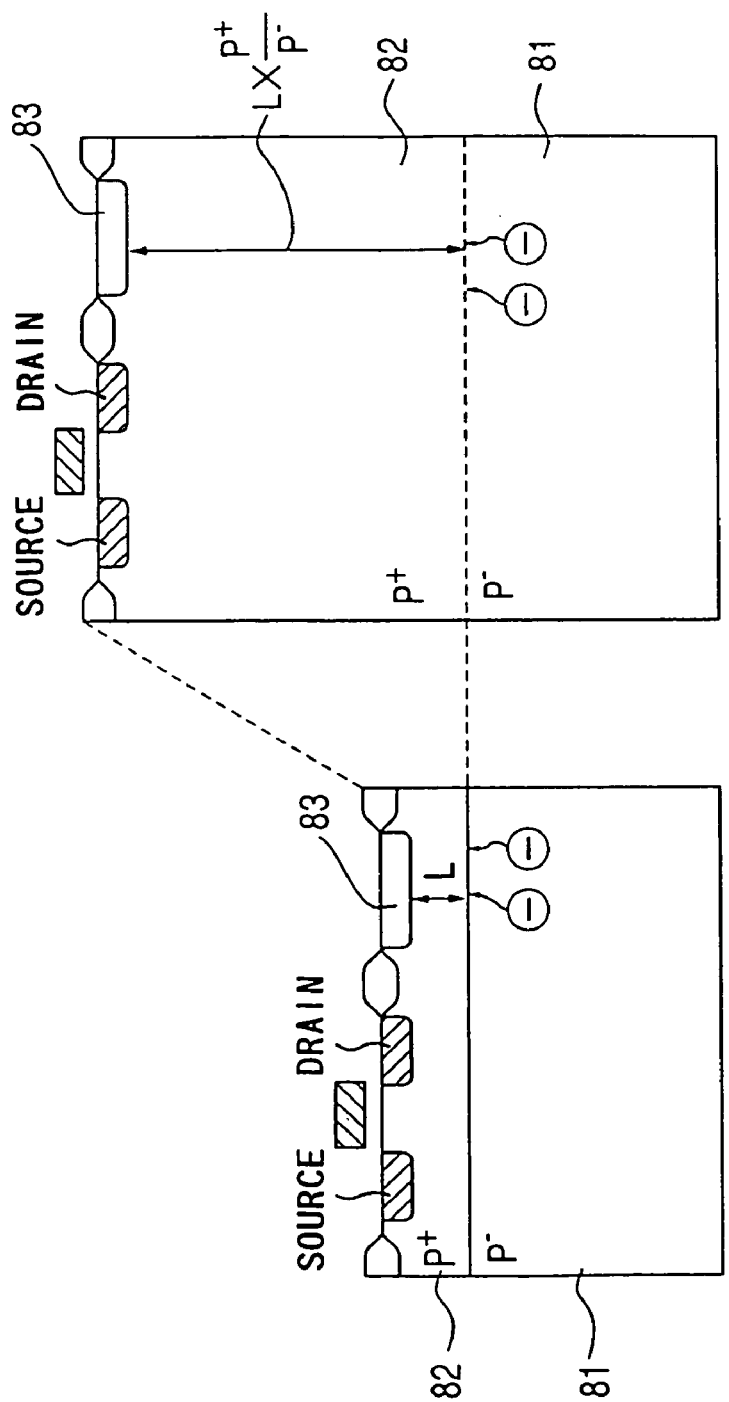
FIGS. 25A and 25B are sectional views showing the device structure of the unit cell in the twelfth embodiment.

FIGS. 25A and 25B are sectional views showing such a semiconductor substrate.

As shown in FIG. 25A, cell elements such as photodiodes 83 are formed on a semiconductor substrate having a $p^+$-type impurity layer 82 formed on a $p^-$-type substrate 81.

With this structure of the semiconductor substrate, the diffusion potential at the $p^-/p^+$ boundary can partly prevent a dark current generated in the $p^-$-type substrate 81 from flowing to the $p^+$ layer side.

The result of a detailed analysis of the flows of electrons will be briefly described below. Apparently, a thickness L of the $p^+$-type impurity layer 82 is increased by $p^+/p^-$ concentration ratio times, i.e., to $L \cdot p^+/p^-$, from the viewpoint of an electron generated on the $p^-$ side.

As shown in FIG. 25B, apparently, the distance from the $p^-$-type substrate 81 as a dark current source to the photodiode 83 is increased $p^+/p^-$ times. In addition to the dark current flowing from a deep part of the substrate, a dark current is generated in a depletion layer near the photodiode 83. This dark current generated in the depletion layer is almost equal in magnitude to the dark current flowing from the deep part of the substrate. The thickness of the depletion layer is about 1 μm, and the dark current flowing from the deep part of the substrate also flows from a depth of about 100 μm. This depth is called the diffusion length of an electron in a substrate. The reason why these dark currents are almost equal in magnitude regardless of this thickness difference is that the probability of occurrence of a dark current per unit volume is higher in the depletion layer. In this case, since the dark current generated in the depletion layer cannot be theoretically separated from a signal current, the dark current is reduced by reducing a component flowing from the deep part of the substrate.

In addition, since cells are formed on the semiconductor substrate having the $p^+$-type impurity layer 72 formed on the $p^-$-type substrate 71, variations in substrate potential due to the dark current can be prevented. The p-type substrate is thick and hence has a high resistance. As will be described later, a noise reduction circuit can be reliably operated.

When the element temperature rises, the component from the deep part of the substrate abruptly increases. This is therefore important. It suffices if the component from the deep part of the substrate is sufficiently smaller than the component generated in the depletion layer. More specifically, it suffices if the dark current from the deep part of the substrate is about 1/10 or less of the dark current from the depletion layer. That is, $p^+/p^-$ may be set to 10 to set the component from the deep part of the substrate to about 1/10.

In a semiconductor substrate constituted by an n-type substrate and a p-type well, there is almost no dark current from a deep part of the substrate. To set the dark current to the same level as in such a semiconductor substrate, $p^+/p^-$ must be set to 100 to set the dark current from the deep part of the substrate to about 1/100.

In a conventional practical CCD, the impurity concentration of an n-type buried channel is about $10^{16}$ cm$^{-3}$, and the impurity concentration of a p-type layer (p-type substrate in this case) surrounding the buried channel, which is set to stably manufacture the diffusion layer of the buried channel, is about $10^{15}$ cm$^{-3}$.

When $p^+/p^-$ is set to 10, the impurity concentration of the $p^+$-type layer becomes about $10^{16}$ cm$^{-3}$. When $p^+/p^-$ is set to 100, the impurity concentration of the $p^+$-type layer becomes about $10^{17}$ cm$^{-3}$. That is, the impurity concentration of the $p^+$-type layer becomes almost equal to that of the n-type buried channel, i.e., about $10^{16}$ cm$^{-3}$, or becomes higher than that by one order in magnitude.

Therefore, in a conventional practical CCD, the use of a $p^+$-type layer having such an impurity concentration has not been considered. If the impurity concentration of the $p^-$-type layer is decreased, the sheet resistance of the substrate undesirably increases.

In contrast to this, in an amplification-type MOS imaging device, since the buried channel of a CCD is not formed, the value of $p^+/p^-$ can be arbitrarily set to a certain degree without decreasing the impurity concentration of the $p^-$-type layer.

Cells can also be formed by improving the structure of a semiconductor substrate constituted by an n-type substrate and a p-type well by decreasing the resistance of the p-type well.

Figure 26:
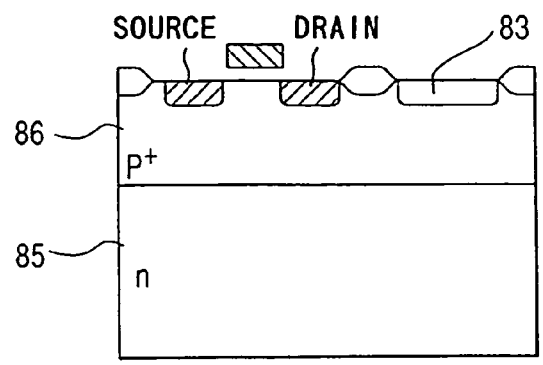
FIG. 26 is a view showing a modification of the semiconductor substrate of a portion of the unit cell in the twelfth embodiment.
Figure 27:
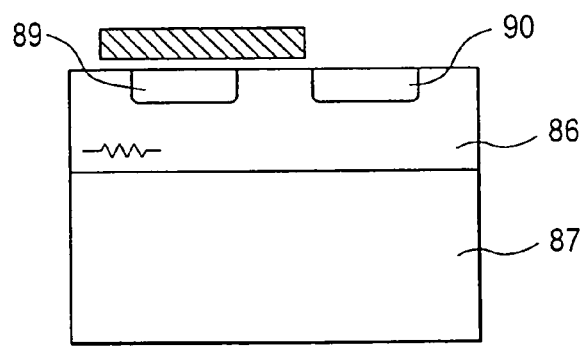
FIG. 27 is a sectional view showing a conventional cell of a CCD-type solid-state imaging device.

FIG. 26 is a sectional view showing a unit cell using a $p^+$-type well 86 having a low sheet resistance on an n-type substrate 85. FIG. 27 is a sectional view showing a unit cell of a CCD.

To stably manufacture a CCD, the impurity concentrations of an n-type substrate 87, a p-type well 86, and an n-type buried channel 89 of the unit cell are respectively set to about $10^{14}$ cm$^{-3}$, about $10^{15}$ cm$^{-3}$, and about $10^{16}$ cm$^{-3}$.

Since the impurity concentration of an n-type photodiode 90 can be arbitrarily set to a certain degree, not many limitations are imposed in terms of manufacture. With the above impurity concentrations, the sheet resistance of the $p^+$-type well 86 is about 100 kΩ/□. As described above, with such a large value, the noise caused in the CCD is very small.

When a noise reduction circuit is to be used in an amplification-type MOS imaging device, the sheet resistance of the p-type well is very important. This is because, the time taken to suppress disturbances in the potential of the p-type well 86 due to a reset pulse needs to match a system to which this apparatus is to be applied.

According to the NTSC scheme, which is the existing television scheme, the noise reduction circuit is operated in an interval of about 11 [μs], which is a horizontal blanking interval. Disturbances in the potential of the p-type well 86 must be suppressed to about 0.1 (mV) within this interval.

Such a small value as 0.1 (mV) is set because the noise voltage output of the CCD corresponds to this. According to a detailed analysis, to settle the disturbances to a value as small as 0.1 (mV) within the very short time interval of 11 [μs], the sheet resistance of the p$^+$-type well 86 must be set to 1 kΩ/□ or less. This is about ¹⁄₁₀₀ the sheet resistance of the conventional CCD.

For this purpose, the impurity concentration of the p$^+$-type well 86 must be increased to about 100 times. Such a concentration cannot be set in the CCD, as described above with reference to the p-type substrate. Furthermore, in the high-vision television scheme, the horizontal blanking interval is 3.77 (μs), and hence the sheet resistance of the p$^+$-type well 86 must be set to 300 kΩ/□ or less.

As another modification, a semiconductor substrate may be obtained by forming a heavily doped p$^+$-type sandwich layer on a substrate, and forming a lightly doped p-type layer on the surface of the sandwich layer.

Figure 28:
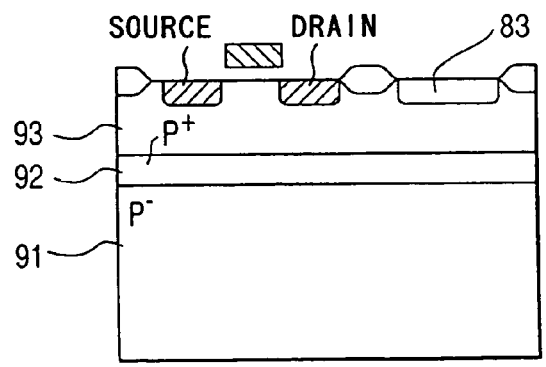
FIG. 28 is a view showing another modification of the semiconductor substrate of the portion of the unit cell in the twelfth embodiment.
Figure 29:
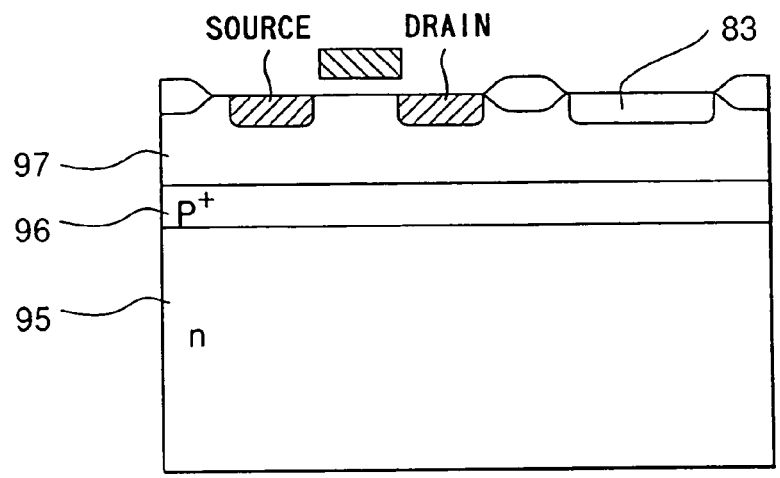
FIG. 29 is a view showing still another modification of the semiconductor substrate of the portion of the unit cell in the twelfth embodiment.

FIG. 28 shows the structure of a semiconductor substrate having a p$^+$-type sandwich layer 92 formed between a p$^-$-type substrate 91 and a p-type layer 93. FIG. 29 shows a semiconductor substrate having a p$^+$-type sandwich layer 96 formed between an n-type substrate 95 and a p-type layer 97.

Such a p$^+$-type sandwich layer can be formed by a high-acceleration megavolt ion implantation apparatus.

In addition to photodiodes 83, transistors, and the like as the constituent elements of unit cells, peripheral circuits such as a horizontal address circuit and a vertical address circuit are also formed on the above p-type layer.

Figure 30:
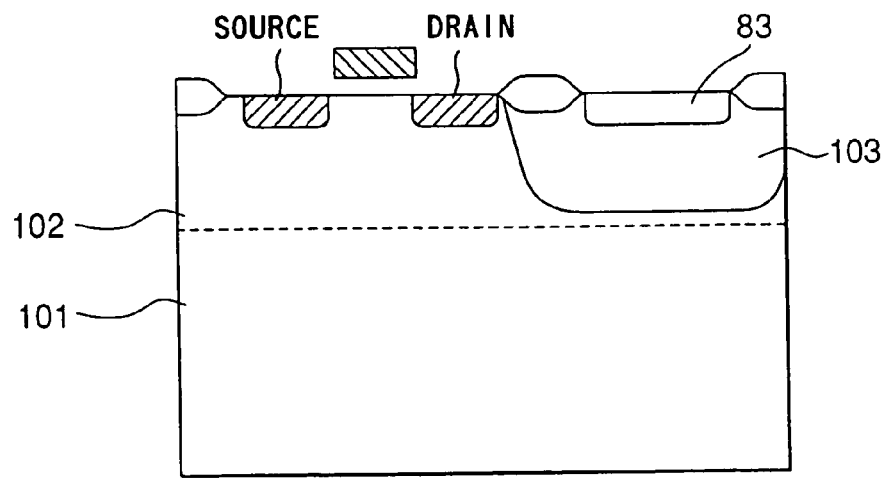
FIG. 30 is a view showing still another modification of the semiconductor substrate of the portion of the unit cell in the twelfth embodiment.

FIG. 30 shows the structure of a semiconductor substrate obtained by surrounding a photodiode 83 with a heavily doped p-type well 103 and forming other portions on an n-type substrate 101 using another p-type well 102.

The use of this structure can prevent a dark current from leaking into the photodiode 83. Note that the semiconductor substrate 101 may be a p$^-$-type substrate.

The impurity concentration of the p-type well, which forms some or all of the horizontal and vertical address circuits around the cell, is determined in terms of circuit design, and differs from the optimum value of the cell. Therefore, a p-type layer may be formed independently of the p-type well which forms the imaging region.

Figure 31:
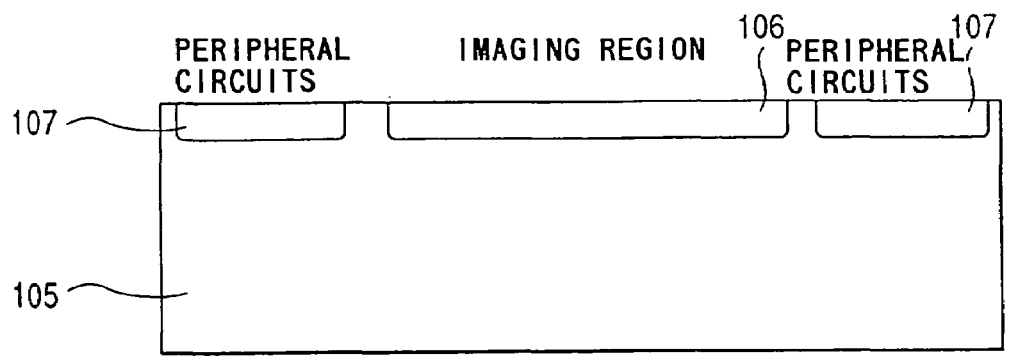
FIG. 31 is a view showing still another modification of the semiconductor substrate of the portion of the unit cell in the twelfth embodiment.

FIG. 31 shows the structure of a semiconductor substrate obtained by forming a p-type well 106, which forms an imaging region, on an n-type substrate 105, and separately forming another p-type well 107, which forms peripheral circuits.

With this structure, p-type wells suited for the respective constituent elements can be formed. Note that the n-type substrate 105 may be a p$^-$-type substrate.

Figure 32:
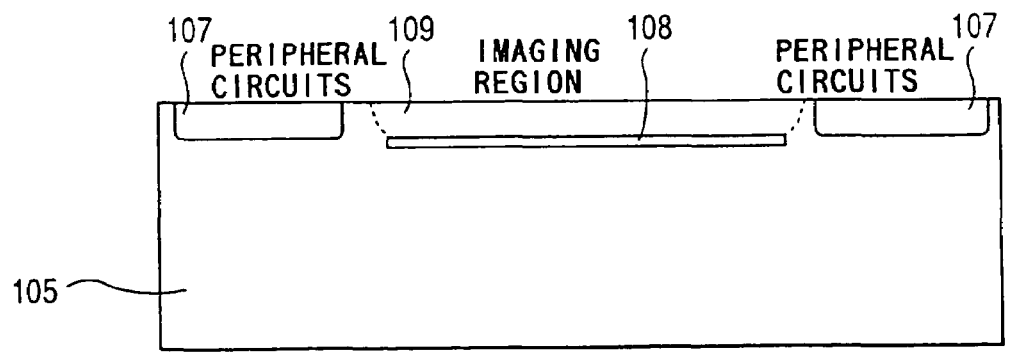
FIG. 32 is a view showing still another modification of the semiconductor substrate of the portion of the unit cell in the twelfth embodiment.

FIG. 32 shows a structure in which a p$^+$-type sandwich layer 108, which forms an imaging region, and a lightly doped p-type layer 109 are formed on an n-type substrate 105, and another p-type well 107 is formed on a peripheral circuit portion.

With this structure, p-type wells suited for the respective constituent elements can be formed, and leakage of a dark current into the photodiode can be prevented. Note that the n-type substrate 105 may be a p$^-$-type substrate.

As described above, according to this embodiment, the feedback transistor (reset transistor 66) is connected between the gate and the drain of the amplification transistor 64 and the source of the feedback transistor is applied with a constant potential so that the threshold variation can be corrected by the feedback operation.

In addition, since an output from each unit cell is output through the noise canceler, fixed pattern noise due to threshold variations of the amplification transistor of each unit cell can be suppressed. In the noise canceler, the clamp capacitor 32-1, 32-2, . . . (simply referred to 32, the same is applied to other reference numerals having appendixes) and the sample/hold capacitor 34 are directly and closely connected to each other so that they can be stacked on the same portion. Therefore, the capacitors can be smell in size.

Further, the output of the unit cell is supplied to the noise canceler through the impedance converter so that the impedance of the noise canceler substantially remains the same, viewing from the unit cell, in a signal pulse noise output operation and in a noise output operation. Therefore, the noise components in a signal pulse noise output operation and in a noise output operation are the same. When the subtraction of two outputs is performed, the noise component can be exactly canceled so that only the signal component can be output. The impedance of the noise canceler is regarded as only a gate capacitance viewed from the unit cell and thus is very small. Therefore, it is possible to exactly cancel the noise in a short period of time.

Furthermore, as a semiconductor substrate on which unit cells are formed, a substrate constituted by a p$^-$-type impurity substrate and a p$^+$-type impurity layer formed thereon is used to reduce a dark current flowing into each unit cell. In addition, since the potential at the substrate surface can be stabilized, the noise reduction circuit can be reliably operated.

Embodiments in which the noise canceler circuit portion of the twelfth embodiment is modified will be described next.

Thirteenth Embodiment

Figure 33:
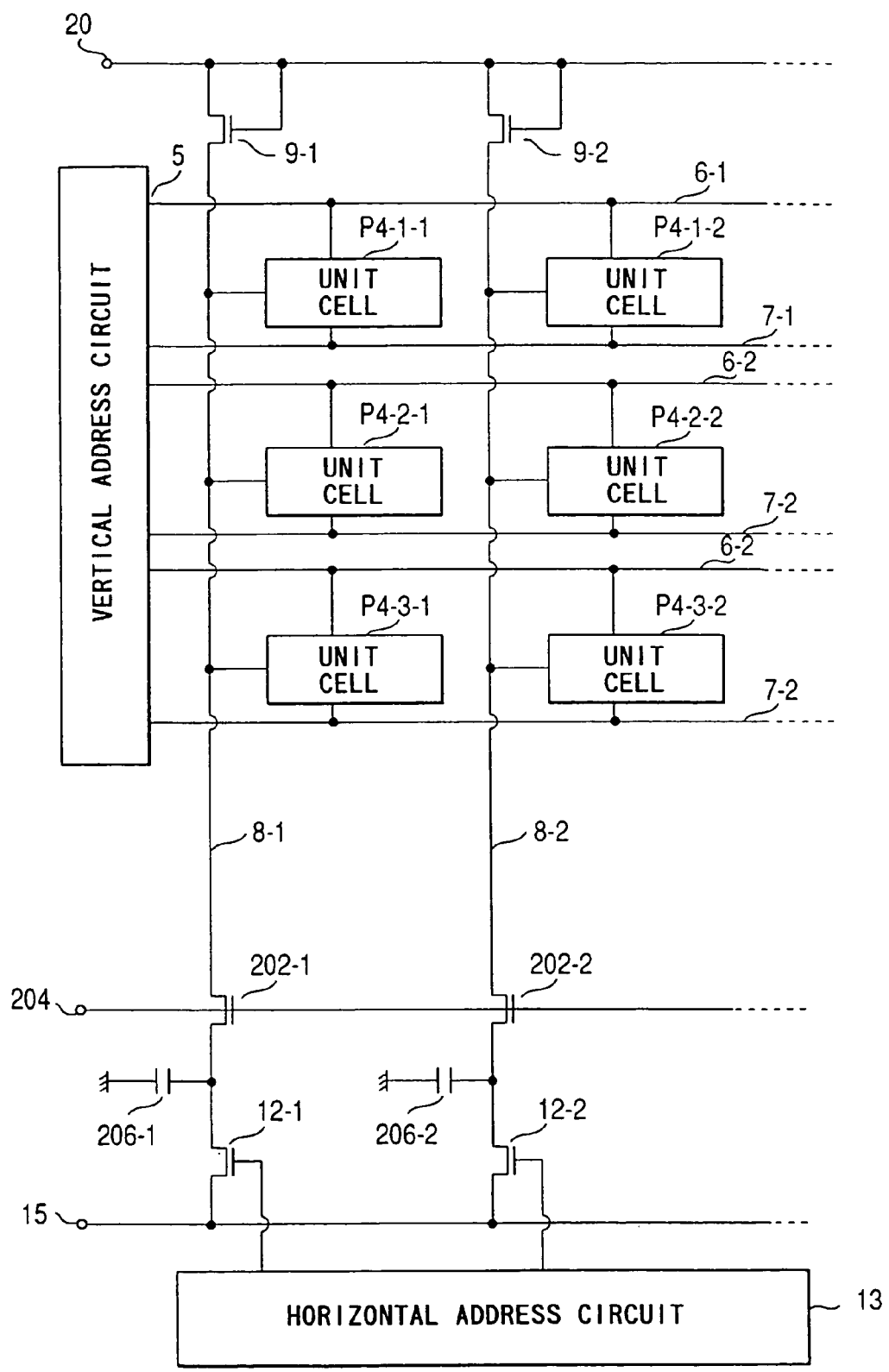
FIG. 33 is a diagram for explaining a thirteenth embodiment of the present invention and showing the arrangement of an MOS-type solid-state imaging device.

FIG. 33 is a circuit diagram showing the arrangement of an imaging device using an amplification-type MOS sensor according to the thirteenth embodiment of the present invention. The circuit arrangement of each unit cell P4-i-j is the same as that in the twelfth embodiment.

Separation transistors 202-1, 202-2, . . . are connected in series with the vertical signal lines 8-1, 8-2, . . . . Amplification capacitors 206-1, 206-2, . . . are arranged between the separation transistors 202-1, 202-2, . . . and the horizontal selection transistors 12-1, 12-2, . . . . In this embodiment, no noise cancelers are arranged in the preceding stage of the horizontal selection transistors, but amplification capacitors for adjusting amplification factors are arranged instead.

Figure 34:
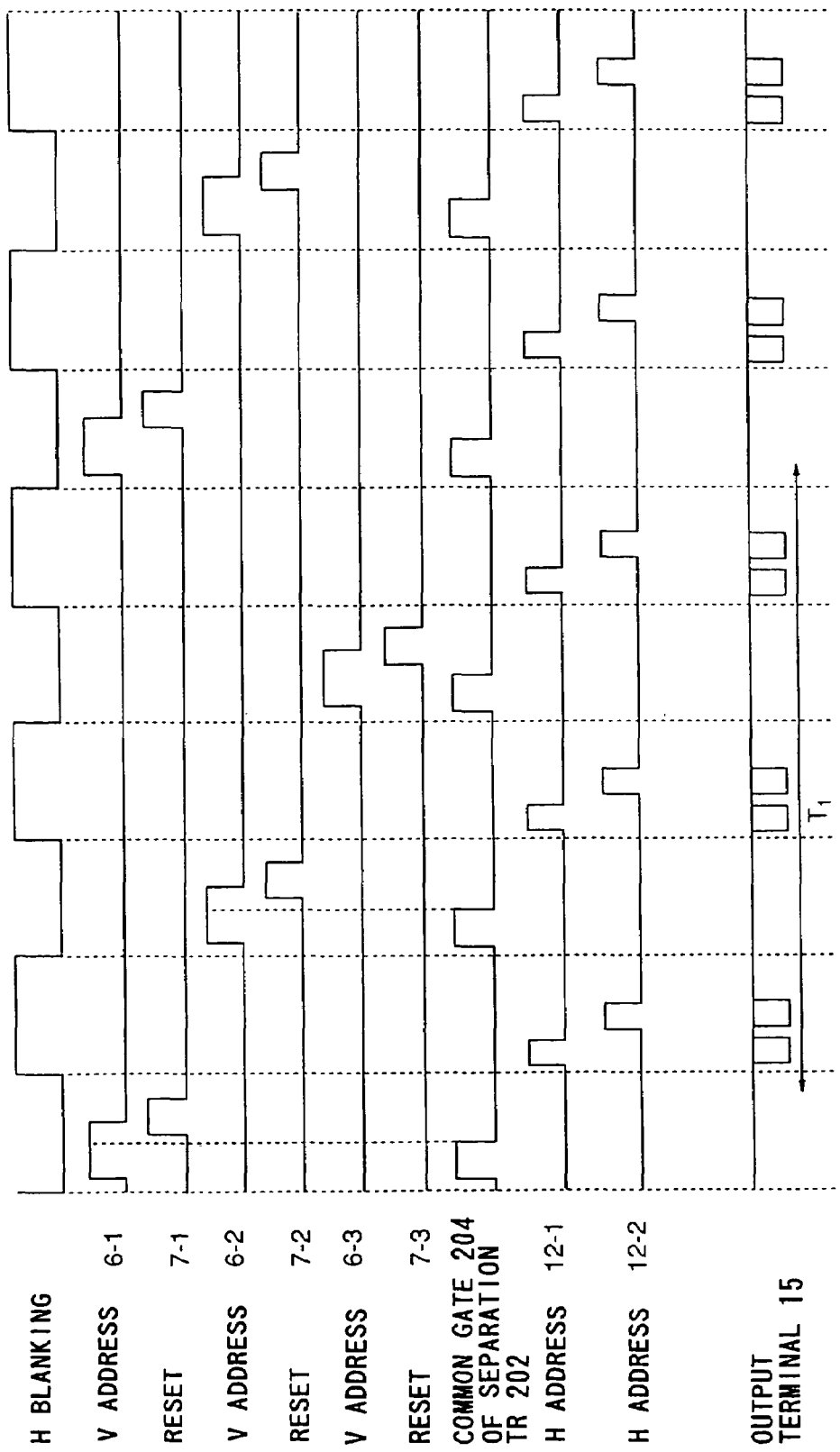
FIG. 34 is a timing chart showing the operation of the thirteenth embodiment.

The operation of this embodiment will be described with reference to FIG. 34.

A high-level address pulse is applied to the vertical address line 6-1, and at almost the same time, a high-level pulse is applied to the common gate 204 of the separation transistors 202 to turn on the separation transistors. With this operation, outputs from the amplification transistors 64 of the unit cells are transferred to the amplification capacitors 206 through the vertical signal lines 8, and the amplified signal charges are stored therein.

Subsequently, the common gate 204 of the separation transistors 202 is returned to low level to turn off the separation transistors 202.

A reset pulse of a high level is applied to the reset line 7-1 to turn on the reset transistors 66. The vertical address line 6-1 is then returned to low level to turn off the vertical selection transistor 65. As a result, the channel potential of each amplification transistor 64 becomes equal to the reference voltage. Thereafter, horizontal selection transistors 12 are sequentially turned on to sequentially read out the amplified signal voltages stored in amplification capacitors 206.

Letting Ca be the capacitance value of the amplification capacitor 206, and Cs be the capacitance value of the photodiode 62, the amplification factor of the signal charge at this time is given by Ca/Cs. To set the amplification factor to be equal to or higher than that in the conventional apparatus, the value of Ca is set to be equal to or larger than the capacitance Cv of the vertical signal line 8.

A sequence in the timing chart of FIG. 34 will be described below. The following two sequences are required:

(1) Rise of vertical address pulse Fall→of gate pulse for separation transistor→Rise of reset pulse→Fall of vertical address pulse→Fall of reset pulse (2) Rise of gate pulse for separation transistor→Fall of gate pulse for separation transistor→Rise of reset pulse→Fall of reset pulse Although the order of the rise of the vertical address pulse and the rise of the gate pulse for the separation transistor can be arbitrarily set, the above order is preferable.

Fourteenth Embodiment

Figure 35:
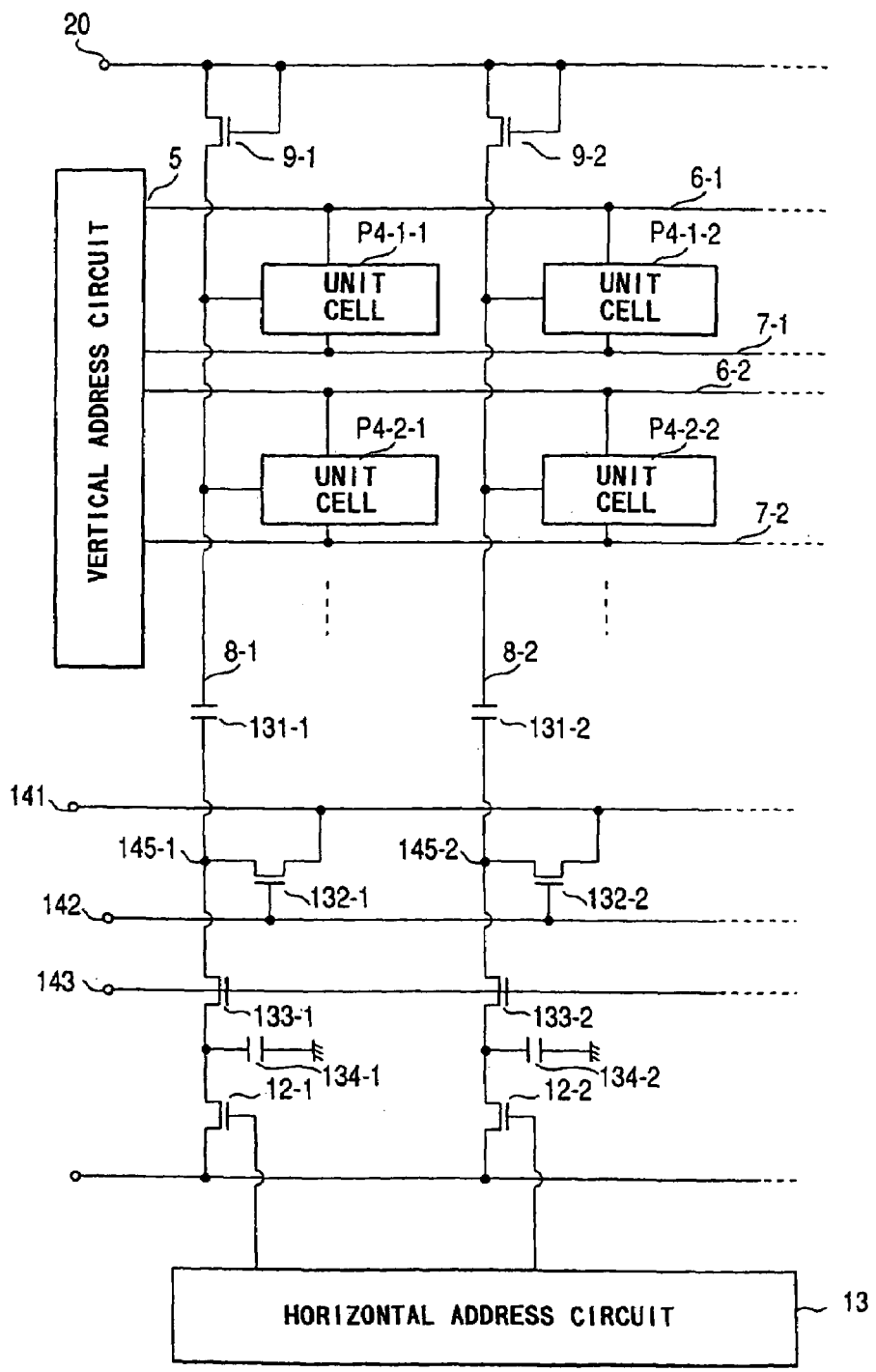
FIG. 35 is a diagram for explaining a fourteenth embodiment of the present invention and showing a circuit diagram showing the arrangement of an MOS-type solid-state imaging device.

FIG. 35 is a circuit diagram showing the arrangement of an imaging device using an amplification-type MOS sensor according to the fourteenth embodiment of the present invention. The circuit arrangement of each unit cell P4-i-j is the same as that in the twelfth embodiment.

The other end of each of vertical signal lines 8-1, 8-2, ... is connected to the signal output terminal (horizontal signal line) 15 through a corresponding one of clamp capacitors 131-1, 131-2, ..., a corresponding one of sample/hold transistors 133-1, 133-2, ..., and a corresponding one of the horizontal selection transistors 12-1, 12-2, .... The drains of the clamp transistors 132-1, 132-2, ... are connected to the connection points (clamp nodes 145-1, 145-2, ...) between the clamp capacitors 131-1, 131-2, ... and the sample/hold transistors 133-1, 133-2, ....

The sources of the clamp transistors 132-1, 132-2, ... are connected to a common source terminal 141. The gates of the clamp transistors 132-1, 132-2, ... are connected to a common gate terminal 142. The connection points between the sample/hold transistors 133-1, 133-2, ... and the horizontal selection transistors 12-1, 12-2, ... are grounded through sample/hold capacitors 134-1, 134-2, ....

Figure 36:
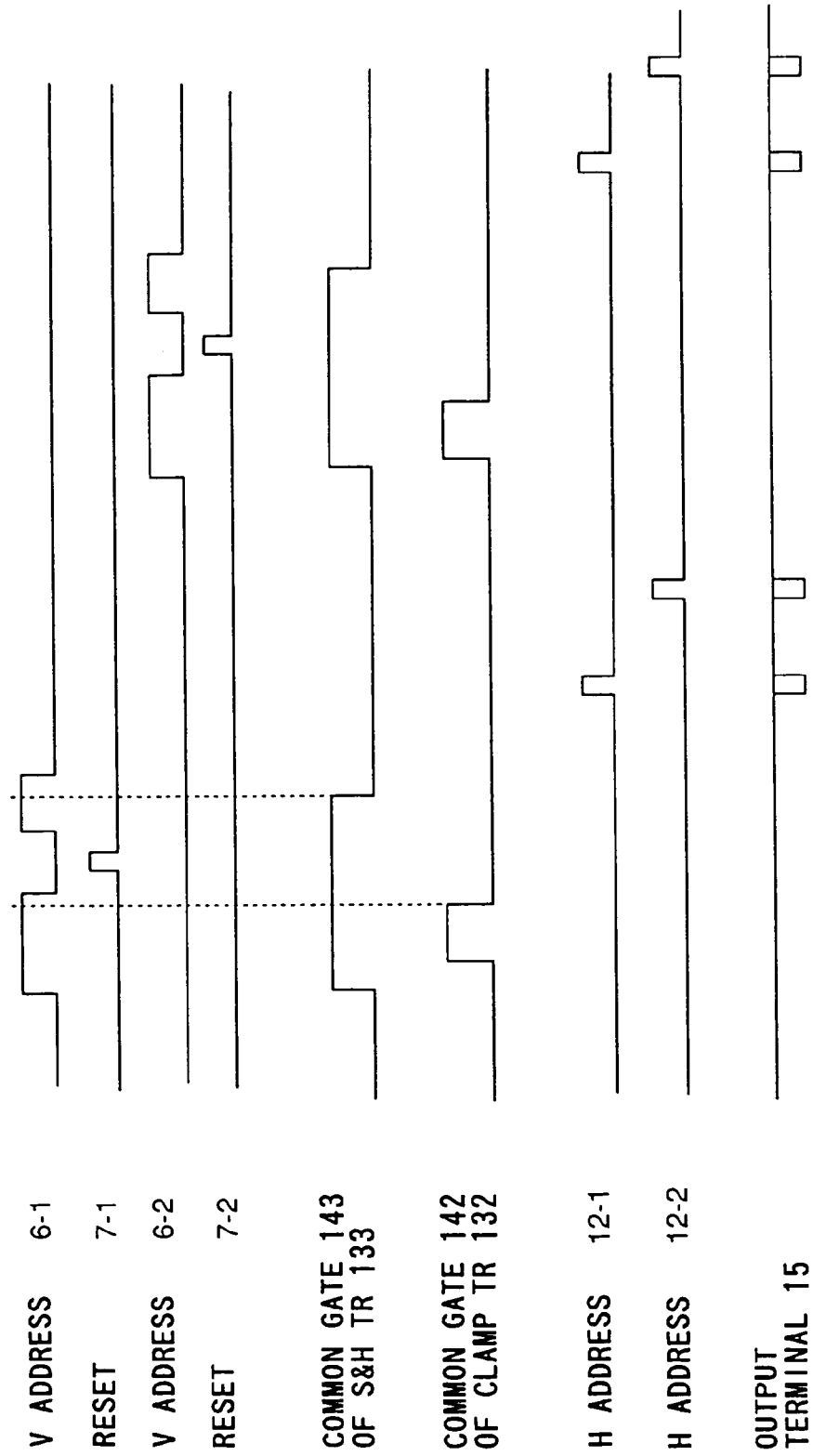
FIG. 36 is a timing chart showing the operation of the fourteenth embodiment.

FIG. 36 is a timing chart in this embodiment. The noise canceling operation principle is the same as that shown in FIG. 23.

Fifteenth Embodiment

Figure 37:
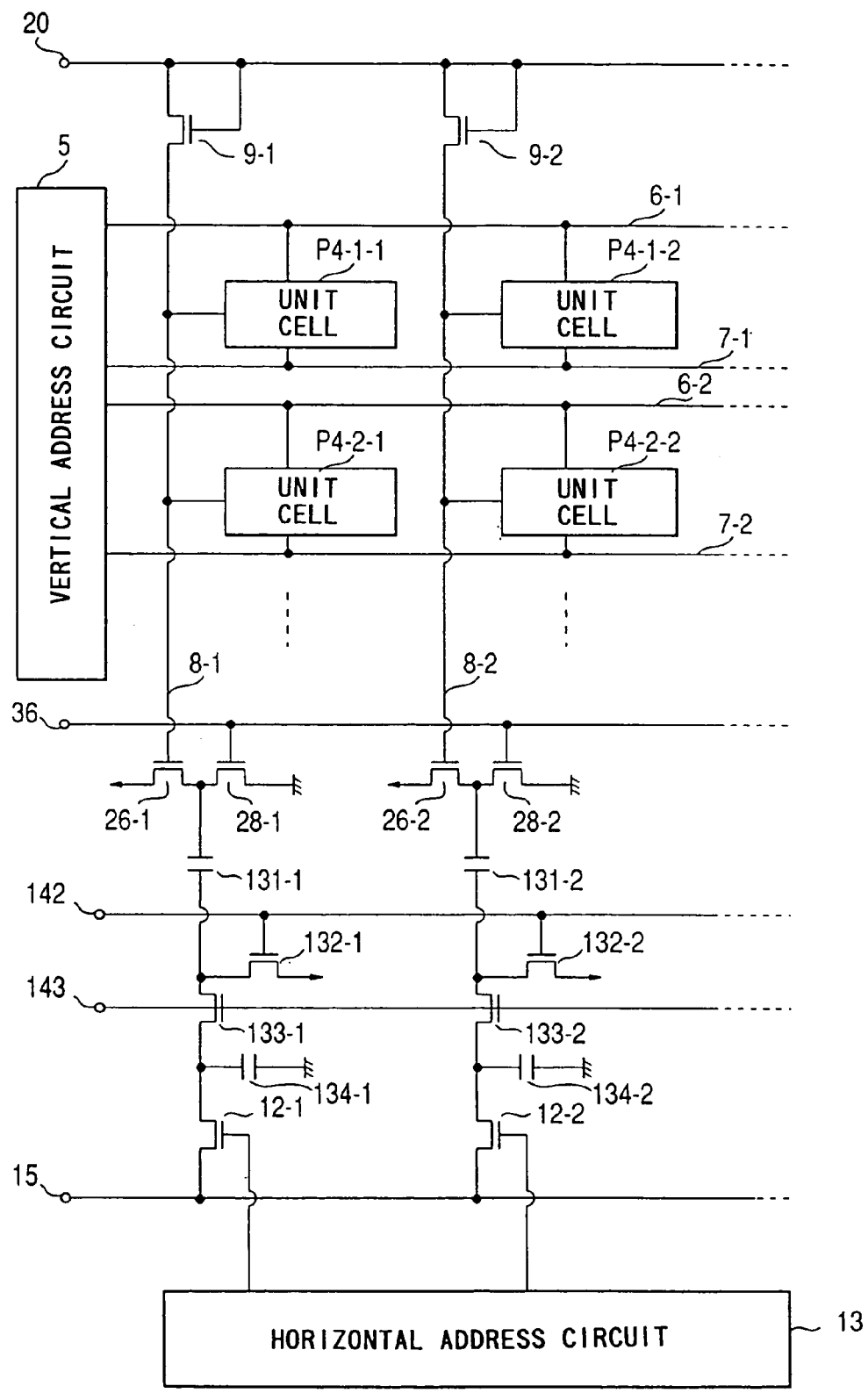
FIG. 37 is a diagram for explaining a fifteenth embodiment of the present invention and showing the arrangement of an MOS-type solid-state imaging device.

FIG. 37 is a circuit diagram showing the arrangement of an imaging device using an amplification-type MOS sensor according to the fifteenth embodiment of the present invention. The circuit arrangement of each unit cell P4-i-j is the same as that in the twelfth embodiment.

In the fifteenth embodiment, the impedance converters in the twelfth embodiment are connected to the noise cancelers in the fourteenth embodiment. Note that the common source of the clamp transistors 132 is DC-driven in this embodiment.

Sixteenth Embodiment

Figure 38:
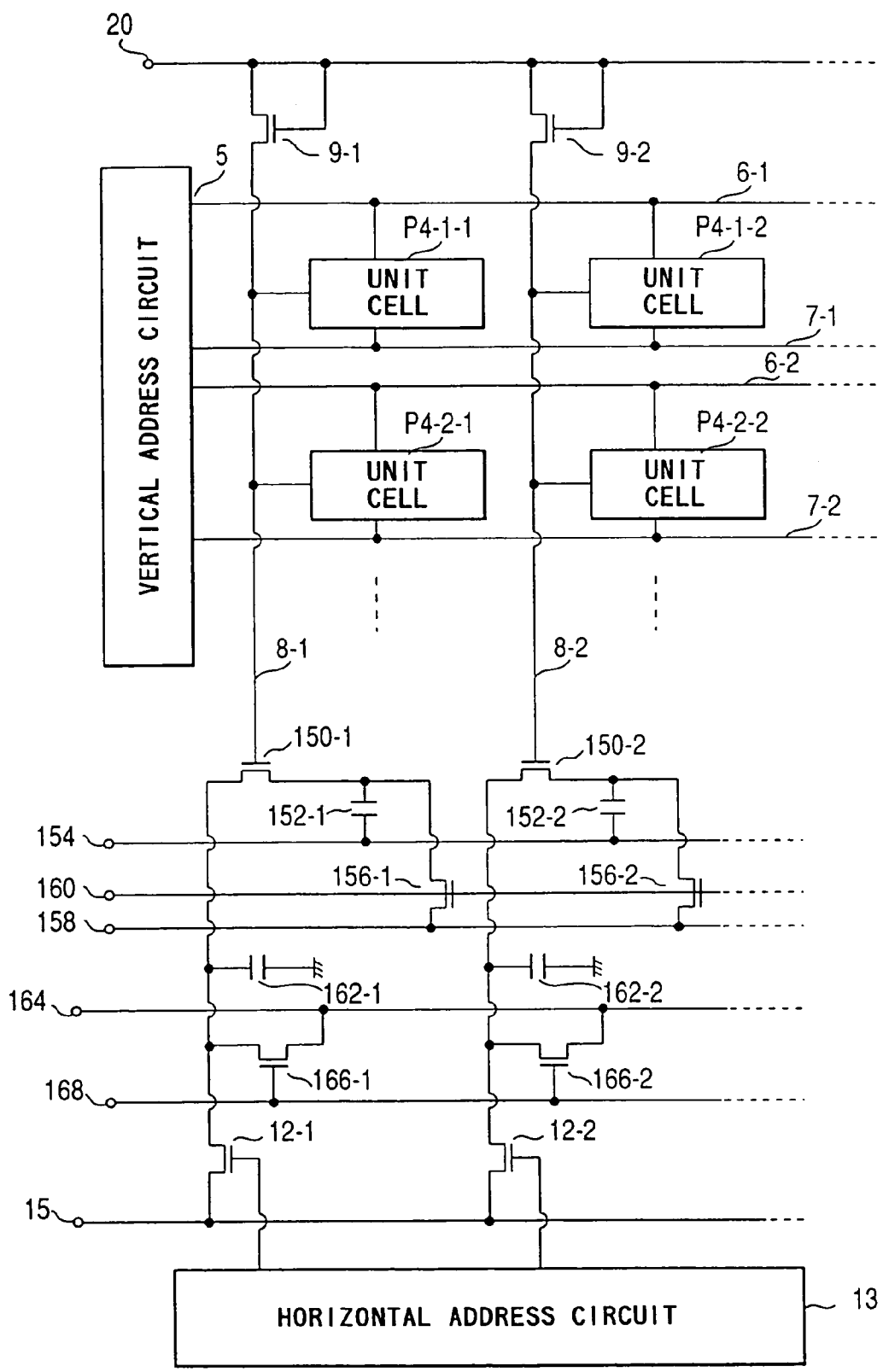
FIG. 38 is a diagram for explaining a sixteenth embodiment of the present invention and showing a circuit diagram showing the arrangement of an MOS-type solid-state imaging device.

FIG. 38 is a circuit diagram showing the arrangement of an imaging device using an amplification-type MOS sensor according to the sixteenth embodiment of the present invention. The circuit arrangement of each unit cell P4-i-j is the same as that in the twelfth embodiment.

The end portions of vertical signal lines 8-1, 8-2, ... on the opposite side to the load transistors 9-1, 9-2, ... are respectively connected to the gates of slice transistors 150-1, 150-2, .... One end of each of slice capacitors 152-1, 152-2, ... is connected to the source of a corresponding one of the slice transistors 150-1, 150-2, .... The other end of each of the slice capacitors 152-1, 152-2, ... is connected to a slice pulse supply terminal 154. To reset the source potentials of the slice transistors 150-1, 150-2, ..., slice reset transistors 156-1, 156-2, ... are connected between the sources of the slice transistors 150-1, 150-2, and a slice power supply terminal 158. A slice reset terminal 160 is connected to the gates of the slice reset transistors 156-1, 156-2, ....

Slice charge transfer capacitors 162-1, 162-2, ... are connected to the drains of the slice transistors 150-1, 150-2, .... To reset the drain potentials of the slice transistors 150-1, 150-2, ..., reset transistors 166-1, 166-2, ... are arranged between the drains of the slice transistors 150-1, 150-2, ... and a storage drain power supply terminal 164. A drain reset terminal 168 is connected to the gates of the reset transistors 166-1, 166-2 .... In addition, the drains of the slice transistors 150-1, 150-2, ... are connected to a signal output terminal 15 through the horizontal selection transistors 12-1, 12-2, ... which are driven by horizontal address pulses supplied from the horizontal address circuit 13.

As described above, the arrangement of each unit cell P4-i-j of the CMOS sensor in the sixteenth embodiment is the same as that in the twelfth embodiment shown in FIG. 17, but the arrangement of each noise canceler differs from that in the twelfth embodiment. The noise cancelers in the sixteenth embodiment are characterized in that voltages appearing on the vertical signal lines 8-1, 8-2, ... are converted into charges through the gate capacitors of slice transistors 150, and noise is suppressed by performing subtraction in the charge domain.

In this device, if the value of the slice capacitor 152 is represented by Csl, the charge (second slice charge) to be finally output to the horizontal signal line 15 is given by:

$$Csl \times (Vsch - V0ch)$$

That is, the device is characterized in that fixed pattern noise due to the threshold variation of the amplification transistors 64 in the unit cells is suppressed because the charge proportional to the difference between the voltage set when a signal is present and the voltage set when no signal is present after a reset operation, appears on the signal line. The circuit arrangement for converting a voltage appearing on the vertical signal line 8 into a charge, and performing subtraction in the charge domain in this manner can also be called a noise canceler.

Seventeenth Embodiment

Figure 39:
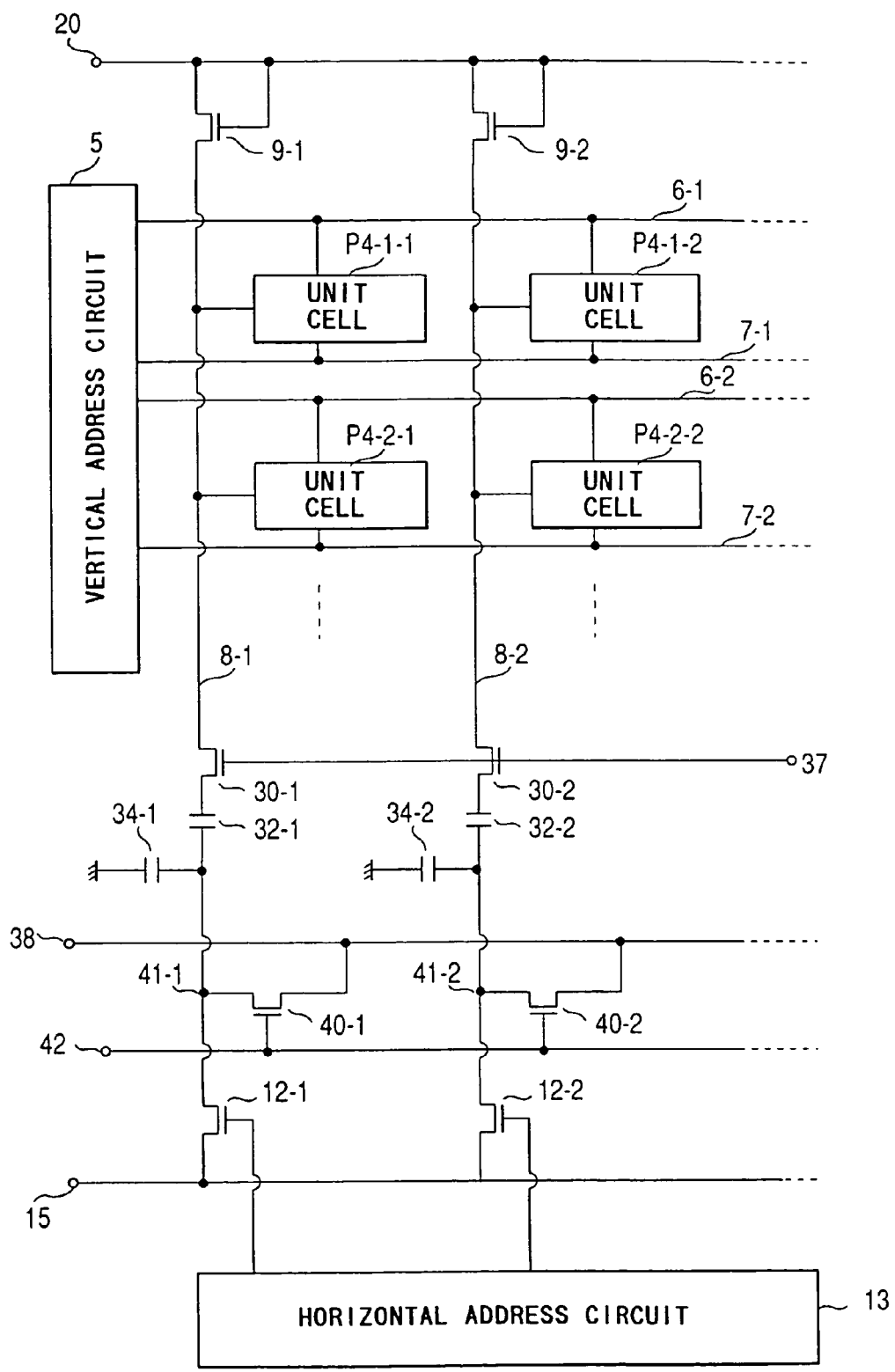
FIG. 39 is a diagram for explaining a seventeenth embodiment of the present invention and showing a circuit diagram showing the arrangement of an MOS-type solid-state imaging device.

FIG. 39 is a circuit diagram showing the arrangement of an imaging device using an amplification-type MOS sensor according to the seventeenth embodiment of the present invention. The circuit arrangement of each unit cell P4-i-j is the same as that in the twelfth embodiment.

The seventeenth embodiment is equivalent to the twelfth embodiment shown in FIG. 17 from which the impedance converter constituted by the source follower transistors is omitted.

Eighteenth Embodiment

Figure 40:
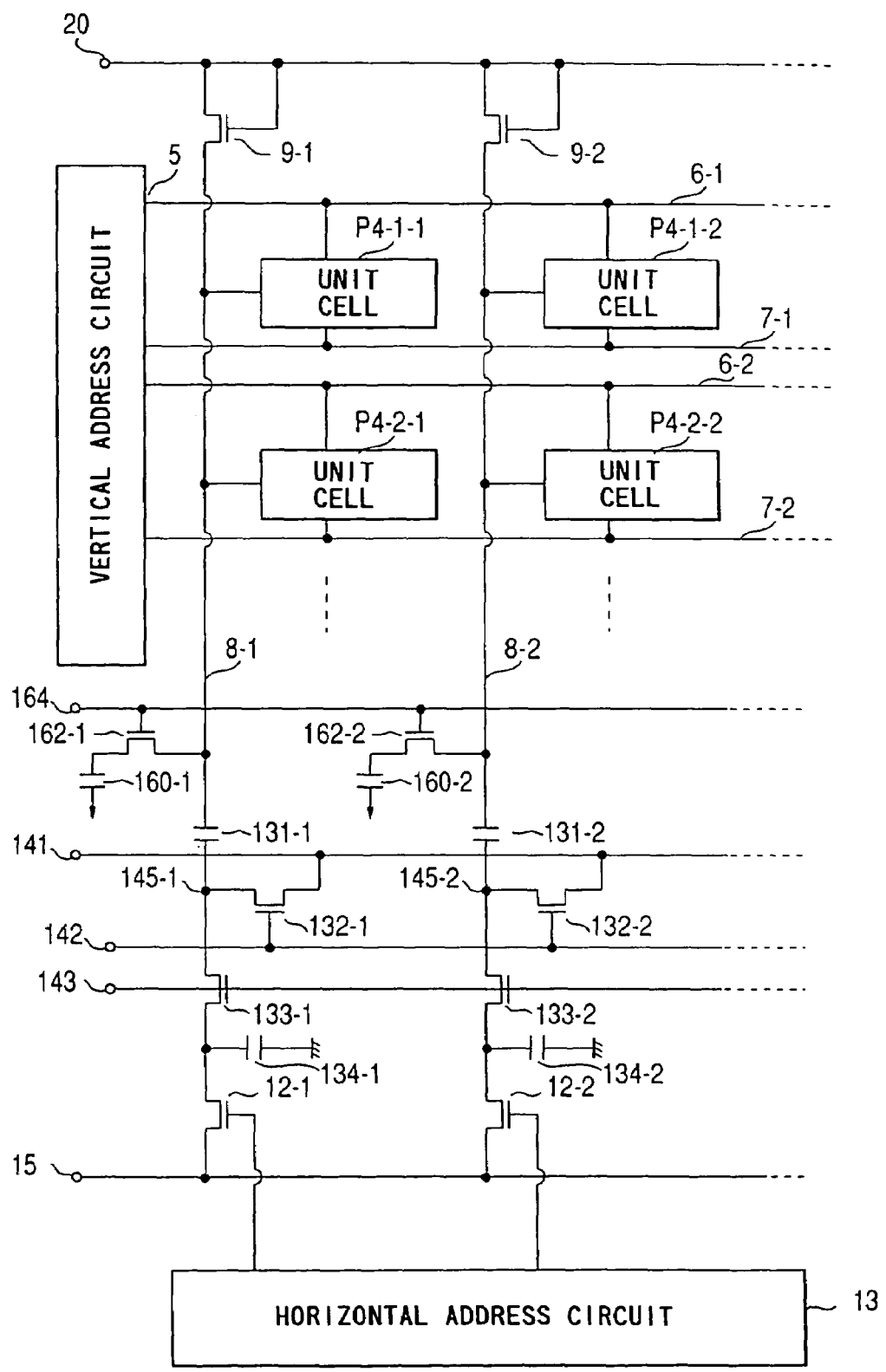
FIG. 40 is a diagram for explaining an eighteenth embodiment of the present invention and showing a circuit diagram showing a first arrangement of an MOS-type solid-state imaging device.
Figure 41:
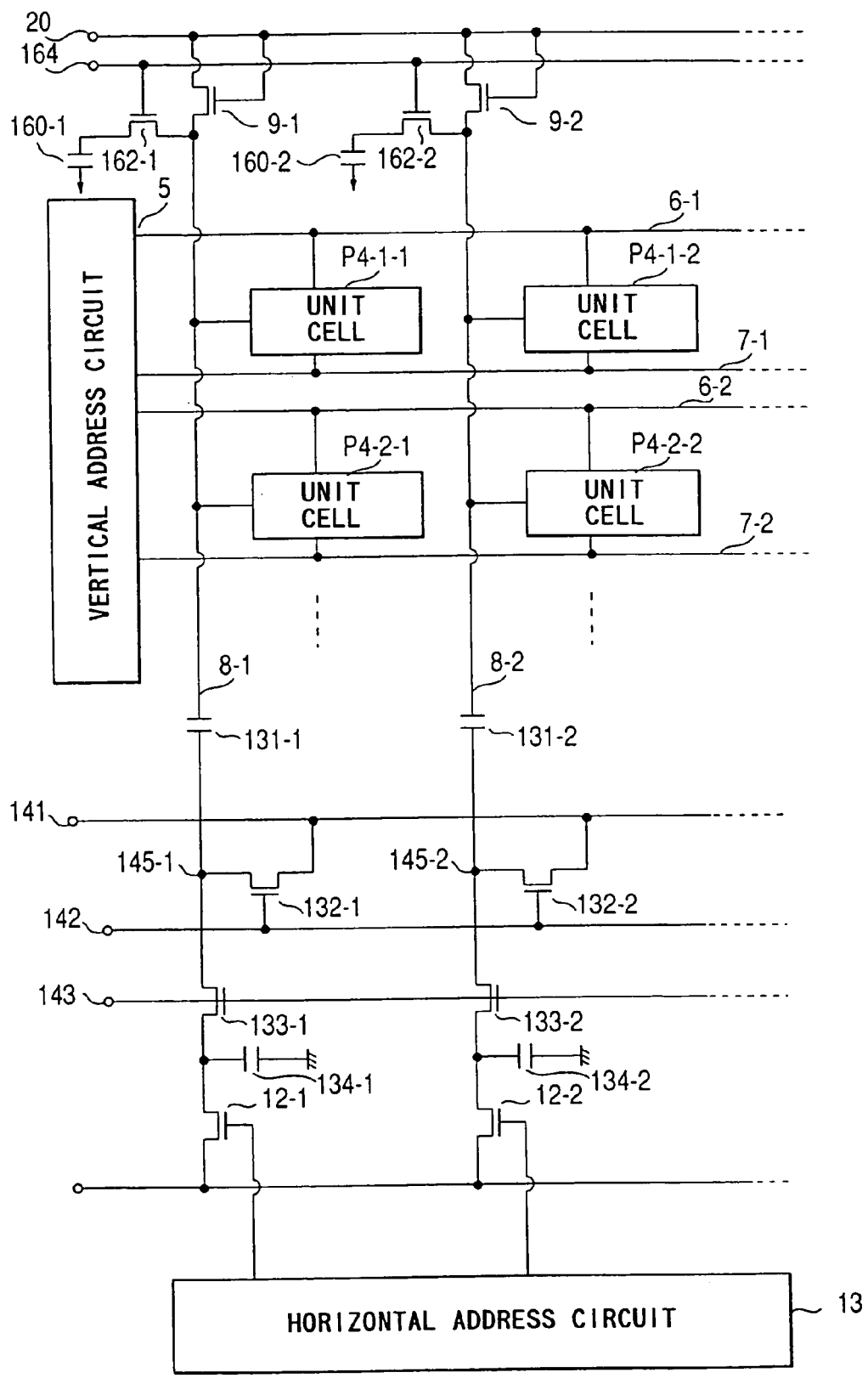
FIG. 41 is a diagram for explaining the eighteenth embodiment of the present invention and showing a circuit diagram showing a second arrangement of the MOS-type solid-state imaging device.

Each of FIGS. 40 and 41 is a circuit diagram showing the arrangement of an imaging device using an amplification-type MOS sensor according to the eighteenth embodiment of the present invention. The circuit arrangement of each unit cell P4-i-j is the same as that in the twelfth embodiment.

Although this embodiment and the fourteenth embodiment in FIG. 35 have many common parts, they differ in that capacitors Ccmp 160-1, 160-2, . . . for correcting the differences between the impedances of the noise cancelers, viewed from the unit cell side, in a signal pulse noise output operation and in a noise output operation are connected in parallel with the vertical signal lines 8-1, 8-2, . . . through switches 162-1, 162-2, . . . so as to be located on the imaging region (unit cell) side with respect to the clamp capacitors 131-1, 131-2, . . . . In the case shown in FIG. 40, the correction capacitors 160 and the switches 162 are connected between the clamp capacitor 131 and the imaging region. In the case shown in FIG. 41, the correction capacitor 160 and the switch 162 are connected between the imaging region and the load transistor 9.

As described above, according to this embodiment, in the MOS-type solid-state imaging device with the noise reduction circuits, the correction capacitors 160 are connected to the vertical signal lines 8 to suppress capacitance changes in a noise removing operation which are the cause of noise, thus further contributing to noise reduction. That is, since the impedance viewed from each cell remains the same in a signal plus noise output operation after selection of a photodiode and a noise output operation after a reset operation, noise canceling can be accurately performed.

Modifications of the eighteenth embodiment may be made such that correction capacitors are connected to the noise cancelers in the twelfth embodiment in FIG. 17, the fifteenth embodiment in FIG. 37, and the seventeenth embodiment in FIG. 39.

The thirteenth to eighteenth embodiments described above differ from the twelfth embodiment in the noise canceler portions. Other embodiments which differ from the twelfth to eighteenth embodiments in the structure of each unit cell will be described next.

Nineteenth Embodiment

Figure 42:
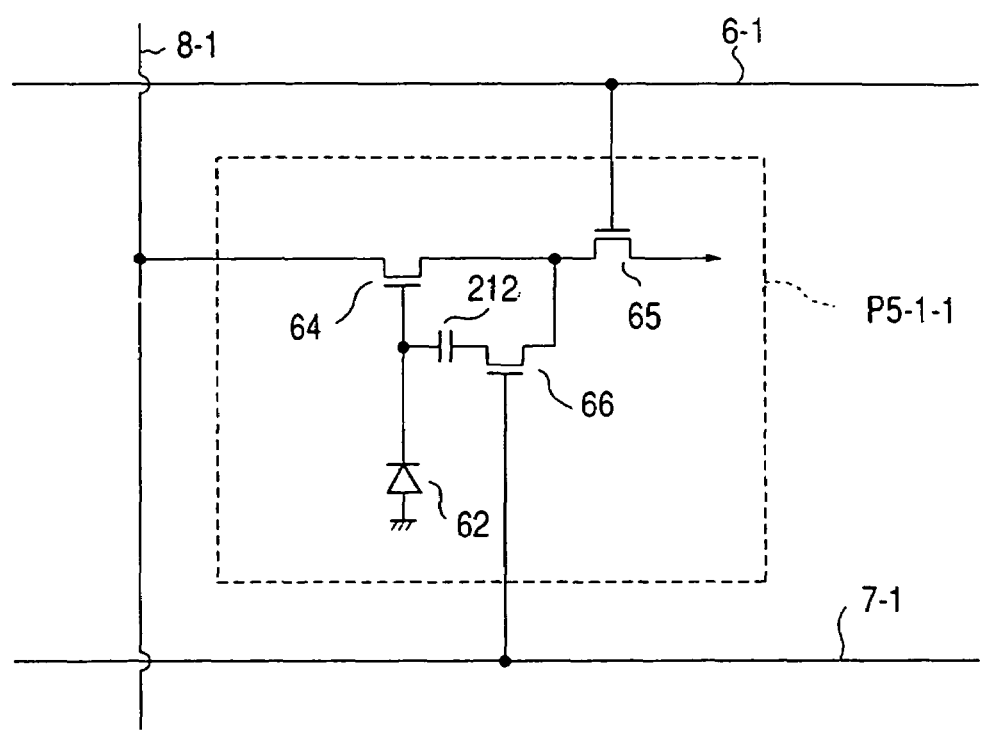
FIG. 42 is a diagram for explaining a nineteenth embodiment of the present invention and showing a circuit diagram showing the arrangement of the unit cell of an MOS-type solid-state imaging device.

Since the overall arrangement of this embodiment is the same as that of the twelfth embodiment shown in FIG. 17, an illustration of the arrangement will be omitted. Note that this embodiment is characterized in that a unit cell P5 shown in FIG. 42 is used in place of the unit cell P4 in FIG. 17.

In the unit cell P5 of this embodiment, a feedback transistor (reset transistor) 66 is connected to the gate of the amplification transistor 64 through a feedback capacitor 212.

Twentieth Embodiment

Figure 43:
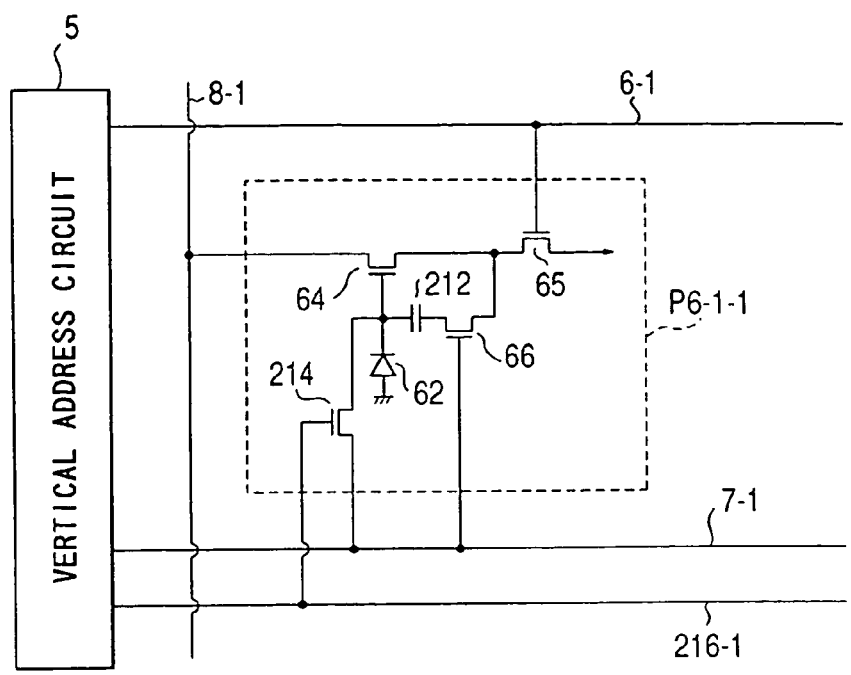
FIG. 43 is a diagram for explaining a twentieth embodiment of the present invention and showing a circuit diagram showing the arrangement of the unit cell of an MOS-type solid-state imaging device.

Since the overall arrangement of this embodiment is the same as that of the twelfth embodiment shown in FIG. 17, an illustration of the arrangement will be omitted. Note that this embodiment is characterized in that a unit cell P6 shown in FIG. 43 is used in place of the unit cell P4 in FIG. 17.

In addition to the arrangement in the nineteenth embodiment, the unit cell P6 in this embodiment has a discharge transistor 214 connected between the gate of the amplification transistor 64 and the reset line 7-1. The gate of the discharge transistor 214 is connected to the vertical address circuit 5 through a common gate line 216-1.

Twenty-first Embodiment

Figure 44:
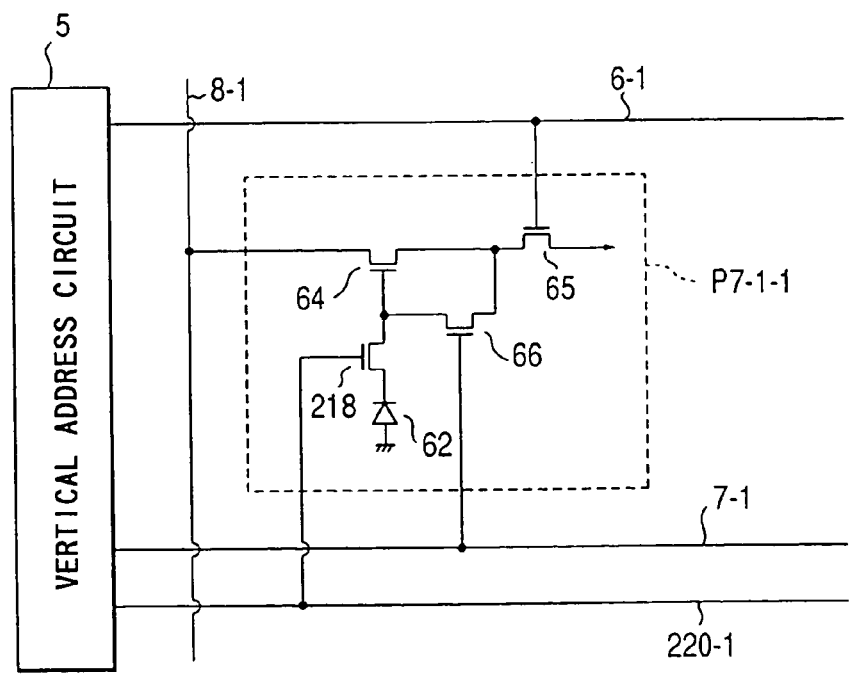
FIG. 44 is a diagram for explaining a twenty-first embodiment of the present invention and showing a circuit diagram showing the arrangement of the unit cell of an MOS-type solid-state imaging device.

Since the overall arrangement of this embodiment is the same as that of the twelfth embodiment shown in FIG. 17, an illustration of the arrangement will be omitted. Note that this embodiment is characterized in that a unit cell P7 shown in FIG. 44 is used in place of the unit cell P4 in FIG. 17.

In addition to the arrangement in the twelfth embodiment, the unit cell P7 in this embodiment has a transfer transistor 218 connected between the gate (the connection point between the gate and the reset transistor) of the amplification transistor 64 and the photodiode 62. The gate of the transfer transistor 218 is connected to the vertical address circuit 5 through a common gate line 220-1.

In the nineteenth to twenty-first embodiments, as in the twelfth embodiment, the noise canceler can be modified. That is, the description made with reference to FIGS. 17 to 41 applies to the nineteenth to twenty-first embodiments.

The present invention is not limited to the above embodiments, and can be variously modified. If, for example, the amplification transistors of the unit cells can be manufactured without any threshold variation, since no fixed pattern noise is caused, the noise canceler can be omitted. If fixed pattern noise exerts no influence on the image quality, the noise canceler can also be omitted.

Although the gate and source of each load transistor are connected to the same power supply line, they may be connected to different power supplies. With this arrangement, a current flowing in each transistor can be controlled, and the power consumption can be reduced.

Figure 45:
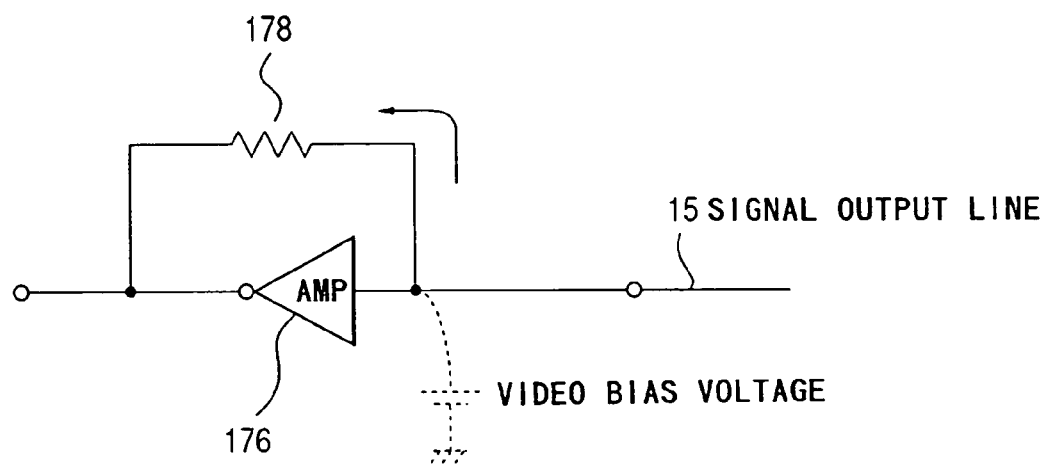
FIG. 45 is a diagram showing a circuit diagram showing a video amplifier connected to a horizontal signal line in a modification of the present invention.

In each noise canceler of each embodiment, since noise decreases as the signal current (only the noise component) read out in the absence of an input signal decreases, the voltage applied to the storage drain power supply terminal is preferably set to be almost equal to a video bias voltage. The video bias voltage is a voltage to which the horizontal signal line 15 is almost fixed when a signal is read out from the horizontal signal line 15 with a current. FIG. 45 shows a modification which realizes this arrangement. An operational amplifier 176 is connected to an output signal line 15, and a load resistor 178 is connected between the input and output terminals of the operational amplifier 176. According to this arrangement, a signal current is forcibly supplied to the load resistor 178, so that the horizontal signal line 15 is fixed to a virtual voltage, i.e., a video bias voltage.

In each embodiment described above, the unit cells are arranged in the form of a two-dimensional matrix. As is obvious, however, the present invention can be applied to an imaging device having a one-dimensional array of unit cells.

Twenty-second Embodiment

The twenty-second embodiment is characterized by a noise canceler circuit in which voltage appeared on the vertical signal lines 8-1, 8-2, is converted into charges via a gate capacitor of a slice transistor 150 and a noise is suppressed by performing a subtraction in the charge domain. That is, the noise is canceled in the charge domain and the noise canceler is called a slice noise cancel type circuit.

Figure 46:
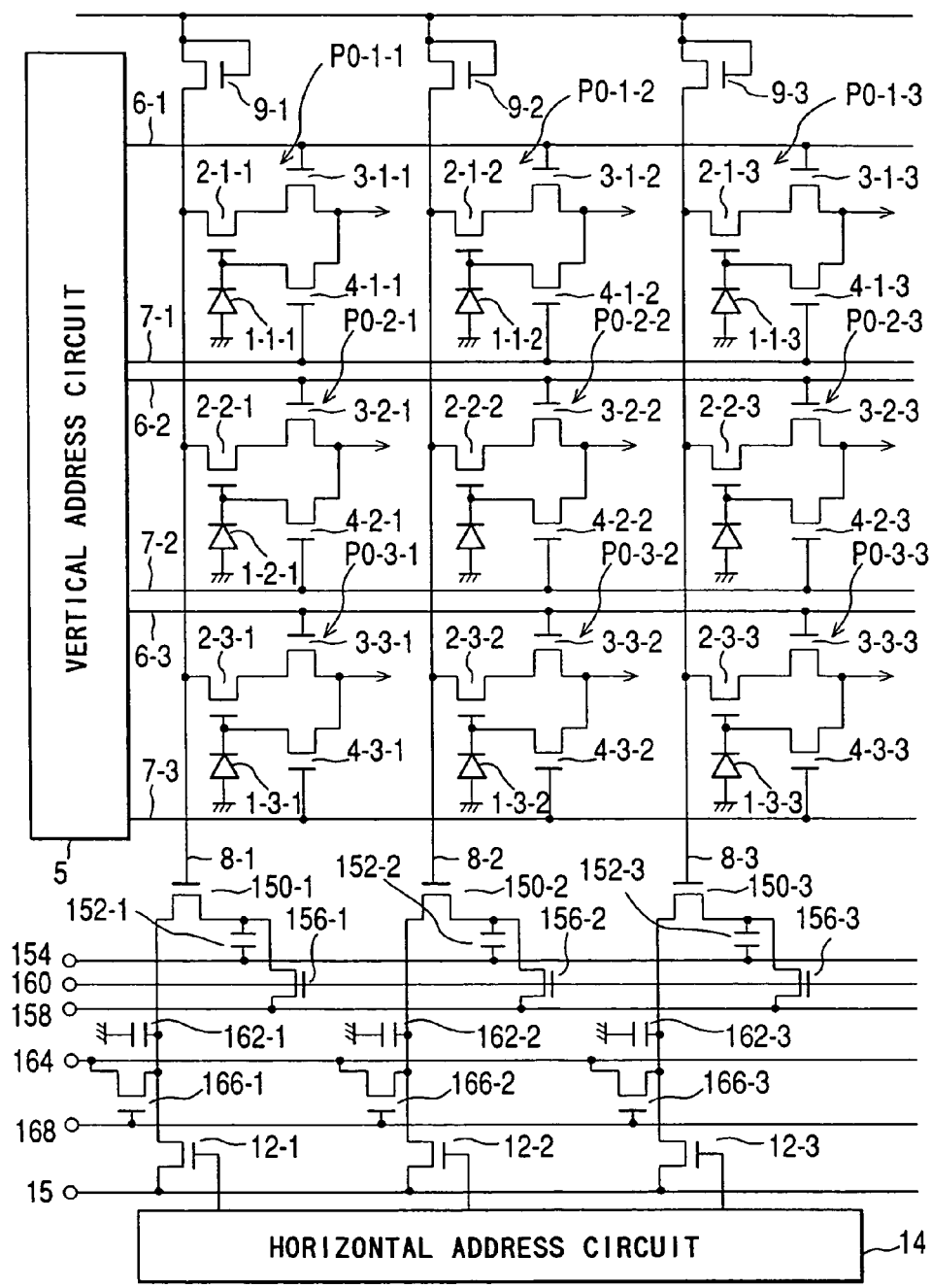
FIG. 46 is a diagram for explaining a twenty-second embodiment of the present invention and showing a circuit diagram showing the arrangement of the unit cell of an MOS-type solid-state imaging device.

FIG. 46 is a circuit diagram showing the arrangement of a solid-state imaging apparatus using an amplification-type MOS sensor. Unit cells P0-i-j (P0-1-1, P0-1-2, . . . ) are arranged in the form of a two-dimensional matrix. Each unit cell P0-i-j has a photodiode 1 which is a light receiving portion constituting a pixel. Reference numeral 1-1-1 denotes a photodiode for the unit cell P1-1-1, 1-1-2 denotes a photodiode for the unit cell P1-1-2, . . . , and 1-3-3 denotes a photodiode for the unit cell P1-3-3.

Each unit cell P0-i-j has an amplification transistor 2 (2-1-1, 2-1-2, . . . , 2-3-3) amplifying the detection signal of the photodiode 1 (1-1-1, 1-1-2, . . . , 1-3-3), a vertical selection transistor 3 (3-1-1, 3-1-2, . . . , 3-3-3) selecting a line for reading out the signal, and a reset transistor 4 (4-1-1, 4-1-2, . . . , 4-3-3) resetting the signal charge.

These unit cells having the above construction are arranged in a two-dimensional matrix. Although FIG. 46 shows only a 3×3 matrix, a matrix of many cells×many cells is used in the actual apparatus.

The vertical address lines 6 (6-1, 6-2, 6-3) horizontally extending from the vertical address circuit 5 are connected to the gates of the vertical selection transistors 3 to determine the horizontal line for reading out a signal. Similarly, the reset lines 7 (7-1, 7-2, 7-3) horizontally extending from the vertical address circuit 5 are connected to the gates of the reset transistors 4. The sources of the amplification transistors 2 are connected to the vertical signal lines 8 (8-1, 8-2, 8-3). Load transistors 9 (9-1, 9-2, 9-3) are connected to one ends of the vertical signal lines 8.

The other ends of the vertical signal lines 8 (8-1, 8-2, 8-3) are connected to the gates of slice transistors 150 (150-1, 150-2, 150-3). Slice capacitors 152 (152-1, 152-2m 152-3) are connected to the sources of the slice transistors 150. The other ends of the slice capacitors 152 are connected to a slice pulse supply terminal 154. In order to reset the source potentials of the slice transistors 150, slice reset transistors 156 (156-1, 156-2, 156-3) are connected between the sources of the slice transistors 150 and a slice power source terminal 158. A slice rest terminal 160 is connected to the gates of the slice reset transistors 156.

Slice charge transfer capacitors 162 (162-1, 162-2, 162-3) are connected to the drains of the slice transistors 150. To reset the drain potentials of the slice transistors 150, drain reset transistors 155 (166-1, 166-2, 166-3) are connected between the drains of the slice transistors 150 and a storage drain power supply terminal 164. A drain reset terminal 168 is connected to the gates of the drain reset transistors 166. In addition, the drains of the slice transistors 150 are connected to a signal output terminal 15 through horizontal selection transistors 12 (12-1, 12-2, 12-3) which are driven by horizontal address pulses supplied from a horizontal address circuit 14.

The above-mentioned noise canceler is a characteristic feature of the present invention. The noise canceler converts the voltage appeared on the vertical signal lines 8 into the charges and performs subtraction of charges to suppress the noise.

Figure 47:
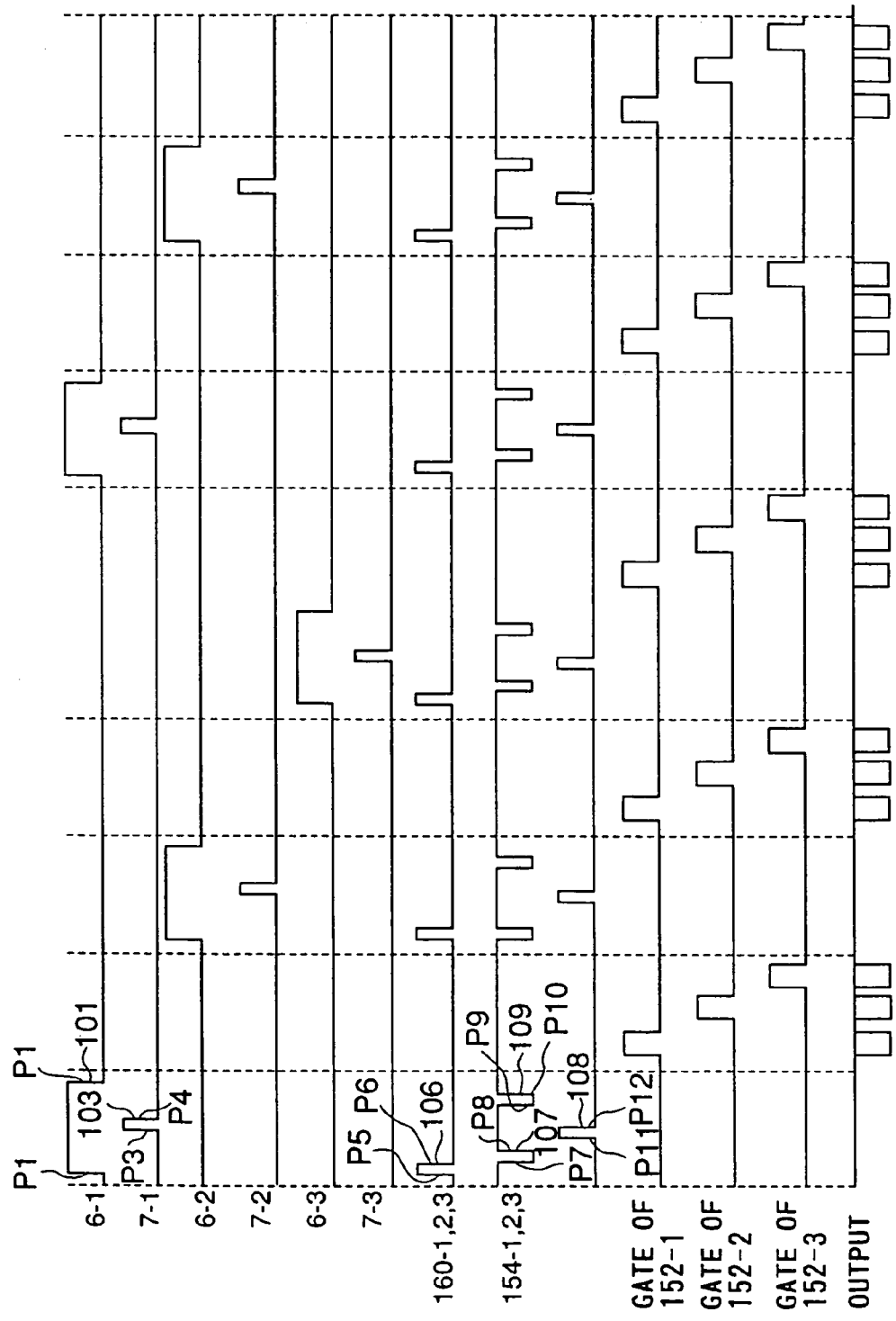
FIG. 47 is a timing chart showing the operation of the embodiment shown in FIG. 46.
Figure 48:
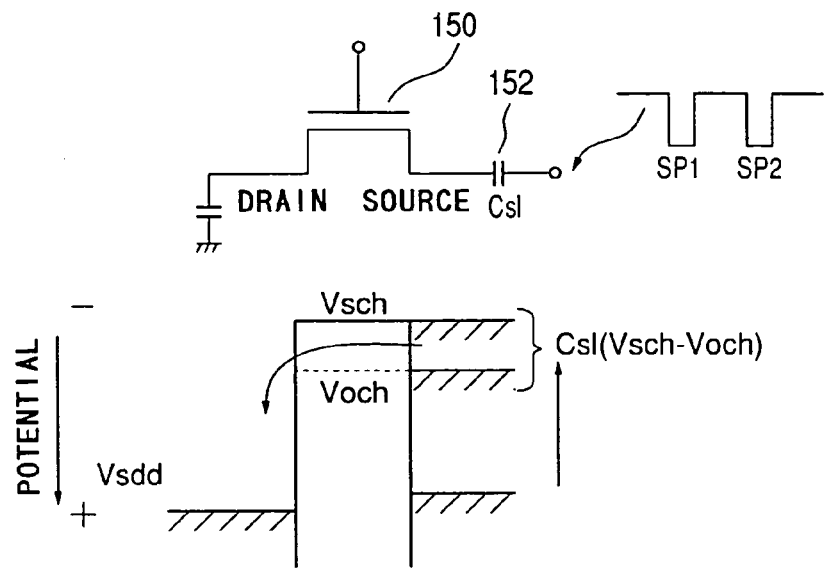
FIG. 48 shows a potential of the slice transistor of the solid-state imaging device shown in FIG. 46.

A method of driving this embodiment will be described next. FIG. 47 is a timing chart showing the operation of the embodiment. FIG. 48 is a potential chart of the slice transistors 150.

With reference to FIG. 47, when an address pulse 101 for making the vertical address line 6-1 high-level is applied, only the vertical selection transistors 3 in this line are turned on, and source follower circuits are formed by the amplification transistors 2 in this line and the load transistors 9. The gate voltage of the amplification transistor 2, i.e., the voltage substantially equals the voltage of the photodiode is applied to the vertical signal lines 8 and the gate of the slice rest transistor 150.

Subsequently, a slice reset pulse 106 is applied to the slice reset terminal 160 to turn on the slice reset transistors 156 and initialize the charges in the slice capacitors 152. Further, the slice reset transistors 156 are turned off and a first slice pulse 107 is applied to the slice pulse supply terminal 154. With this operation, the first slice charge exceeds a channel potential $V_{sch}$ under the gate of the slice transistor 150 to which the signal voltage is applied, and is transferred to the drain. In this case, since a drain reset pulse 108 is applied to the drain reset terminal 168 to turn on the drain reset transistor 166, the drain potential is fixed to a voltage $V_{sdd}$ of the storage drain power supply terminal 164. The first slice charge is therefore discharged through the drain reset transistor 166.

After turning off the drain reset transistors 166, a reset pulse 103 for making the reset line 7-1 high level is applied.

The reset transistors in this line are turned on to reset the signal charges. With this operation, voltage (corresponding to the noise component without signal component) set when there is no signal charges in the vertical signal lines 8 and the slice transistors 150 appears. A second slice pulse 109 is applied to the slice pulse supply terminal 154. With this operation, the second slice charge (corresponding to the noise component) exceeds a channel potential $V_{och}$ under the gate of the slice transistor 150 in the absence of a signal, and is transferred to the drain. In this case, since the drain reset transistors 166 are turned off, the second slice charge is therefore transferred to the slice charge transfer capacitor 162 connected to the drain thereof.

When horizontal selection pulses 105 (105-1, 105-2, 105-3) are sequentially supplied from the horizontal address circuit 14 to the horizontal selection transistors to sequentially output signals of one line from the horizontal signal line (signal output terminal) 15. By sequentially performing this operation for the subsequent lines, all the signals in the two-dimensional matrix can be read out.

In this device, if the value of the slice capacitor 152 is represented by $C_{s1}$, the charge (second slice charge) to be finally output to the horizontal signal line 15 is given by:

$$C_{s1} \times (V_{sch} - V_{och})$$

That is, the charge proportional to the difference between the voltage set when a signal is present and the voltage set when no signal is present after a reset operation, appears on the signal line. Therefore, the noise due to the threshold variation of the amplification transistors 2 can be suppressed and this embodiment can operate as the noise canceler.

It is sufficient for the amplification transistor 2 of the unit cell to drive the vertical signal line 8 and the gate of the slice transistor 150. Since the gate capacitance of the gate of the slice transistor 150 is much smaller than the clamp capacitor as in the conventional device, it is possible to shorten the time required for suppressing noise. Therefore, it is possible to surely suppress noise during a horizontal blanking period in a case of a television signal processing.

According to the present embodiment, the impedance viewing from the unit cell at the noise output period and that at the noise plus signal output period are the same. Only the signal can be output by performing a subtraction processing between two outputs to accurately cancel the noise output. Therefore, it is possible to accurately cancel the noise. Further, when the noise canceler circuit is viewed from the unit cell, its impedance can be regarded as the gate capacitance. Since the gate capacitance is very small, the noise can be canceled in a short period of time.

Note that the second slice pulse 109 may be influenced by the immediately preceding first slice pulse 107. The operations of the first and second slice pulses 107 and 109 can be effectively equalized by inserting a dummy slice pulse immediately before the first slice pulse 107. The operations mean that whether or not preceding pulse is included. In this case, in order to equalize the operation of the first pulse with that of the second pulse which has a preceding pulse, a dummy pulse is added preceding to the first pulse.

If the first and second slice pulses 107 and 109 have the same amplitude, the signal charge in a small signal region cannot be read out or a deterioration in linearity occurs, therefore, for stable operations, the amplitude of the second slice pulse 109 is preferably set to be larger than that of the first slice pulse 107 to add a bias charge to the charge to be read out with the second slice pulse 109. A method of setting the width of the second slice pulse 109 to be larger than that of the first slice pulse 107 can also be used effectively.

It is assumed that the leading edge of the high-level vertical address pulse at the horizontal address line 6-1 is indicated by P1, the trailing edge of the high-level vertical address pulse at the horizontal address line 6-1 by P2, the leading edge of the pulse at the reset line 7-1 by P3, the trailing edge of the pulse at the reset line 7-1 by P4, the leading edge of the slice reset pulse applied to the slice reset terminal 160 by P5, the trailing edge of the slice reset pulse by P6, the leading edge of the first slice pulse 107 applied to the slice pulse supplying terminal 154 by P7, the trailing edge of the first slice pulse 107 by P8, the leading edge of the second slice pulse 109 applied to the slice pulse supplying terminal 154 by P9, the trailing edge of the second slice pulse 109 by P10, the leading edge of the drain reset pulse applied to the drain reset terminal 168 by P11, and the trailing edge of the drain reset pulse by P12. The timing relationship between these timings should be as follows:

P1<P6<P7<P8<P3<P4<P9<P10<P2;
P8<P11<P12<P3<P4; and preferably
P11<P12<P3<P4

The sequential orders between P1 and P5; P3 and P11; and P4 and P12 can be arbitrarily set.

Figure 49:
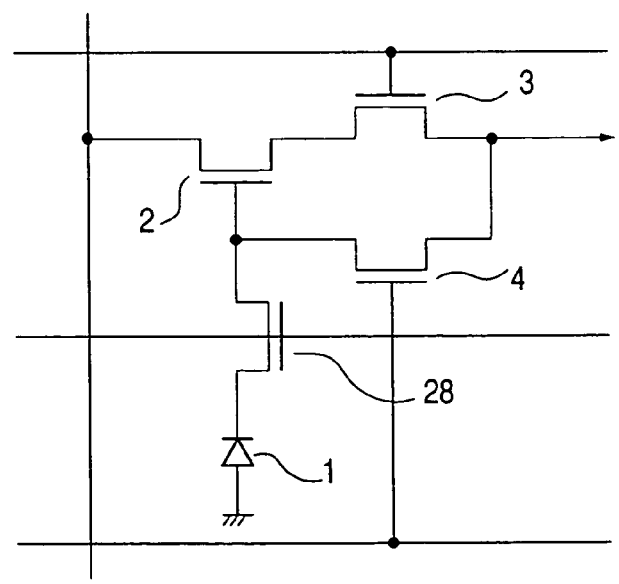
FIG. 49 is a circuit diagram showing a cell using a transfer transistor.

The structure of the unit cell is not limited to that shown in FIG. 46 but can be modified as shown in FIG. 49 in which a transfer transistor 28 is connected between the photodiode 1 and the amplification transistor 2. According to the unit cell having the transfer transistor 28 as shown in FIG. 49, it is possible to output a voltage obtained when the signal is not present to the vertical signal line 8 and then to output a voltage obtained when the signal is present. In this case, it is desirable to form the slice transistor 150 with a semiconductor of a conductivity which is opposite to that of the unit cell. If the unit cell is formed of an n-channel type transistor, the slice transistor 150 is formed of a p-channel type transistor. Further, the unit cell is not limited to those shown in FIGS. 46 and 49, the present invention can be applied to a unit cell in which the detection signal is output through a transistor.

Where the signal current which is read when the input signal is not present is small, the noise is also small. Therefore, it is desirable to set the voltage applied to the storage drain power source terminal 164 and the video bias voltage substantially the same level. The video bias voltage is a voltage to which the horizontal signal line 15 is almost fixed when a signal is read out from the horizontal signal line 15 with a current. As shown in FIG. 45, if the video amplifier in which the load resistor 29 is connected between the input and output terminals of the operational amplifier 31 is used, the signal current is forcibly flowed through the load resistor 29, so that the horizontal signal line 15 is fixed to the video bias voltage.

The present invention is not limited to the above embodiments. It can be modified within the scope and spirit thereof.

According to the present embodiment, an amplifying type MOS sensor has a noise canceler, between an edge of the vertical signal line and the horizontal selection transistor, for suppressing the noise by converting a voltage appeared at the vertical signal line into a charge and performing a subtraction processing in a charge domain. Therefore, the noise due to the threshold variation of the amplification transistors can be suppressed in a short period of time. It is possible to surely suppress noise during a horizontal blanking period in a case of a television signal processing.

The impedance viewing from the unit cell at the noise output period and that at the noise plus signal output period are substantially the same. Only the signal can be output by performing a subtraction processing between two outputs to accurately cancel the noise output. Therefore, it is possible to accurately cancel the noise. Further, when the noise canceler circuit is viewed from the unit cell, its impedance can be regarded as the gate capacitance. Since the gate capacitance is very small, the noise can be canceled in a short period of time.

According to the present embodiment, there can be provided a solid-state imaging device in which the noise due to the threshold variation of the amplification transistors can be suppressed in a short period of time and it is possible to surely suppress noise during a horizontal blanking period in a case of a television signal processing.

Twenty-third Embodiment

Another embodiment of the noise canceler circuit will be described as the twenty-third embodiment. In the noise canceler circuit of this embodiment, a parallel clamp transistor, a parallel sample/hold capacitor, a serial clamp capacitor, and a serial sample/hold transistor are connected to the horizontal selection transistor in this order to form a superimposing type noise canceler.

The solid state imaging device according to the twenty-third embodiment includes an imaging region formed of a two dimensionally array of unit cells, each having a semiconductor substrate, a photodiode formed on the substrate, an amplification transistor having a gate to which the output of the photodiode is supplied, a vertical selection transistor connected in series to the amplification transistor, and a reset transistor for discharging a signal from the photodiode; vertical selection lines arranged in a row direction and connected to the gates of the vertical selection transistors; a vertical address circuit for driving the vertical selection lines; vertical signal lines arranged in a column direction along which the current of the amplification transistor is read out; load transistors connected to one ends of the vertical signal lines; horizontal selection transistors connected to the other ends of the vertical signal lines; a horizontal selection shift register for sequentially supplying a selection pulse signal to the gates of the horizontal selection transistors; a horizontal signal line for reading a signal current from the vertical signal lines through the horizontal selection transistors; and a noise canceler circuit connected between the horizontal signal lines and the horizontal selection transistors. The noise canceler circuit is formed such that a parallel clamp transistor, a parallel sample/hold capacitor, a serial clamp capacitor, and a serial sample/hold transistor are connected to the horizontal selection transistor in this order.

The present invention is characterized in that the clamp capacitor and the sample/hold capacitor are formed in the same area on the semiconductor substrate in a partially or completely overlapping manner. It may be desirable to set the reset drain power source voltage substantially equal to the video bias voltage.

Since the clamp capacitor and the sample/hold capacitor can be directly and closely connected to each other, it is possible to form these capacitors on the same area in an overlapping manner. Therefore, the same capacitance value as that obtained when the clamp capacitor and the sample/hold capacitor are formed separately can be obtained with ½ the area. The size of the device can be reduced.

Figure 50:
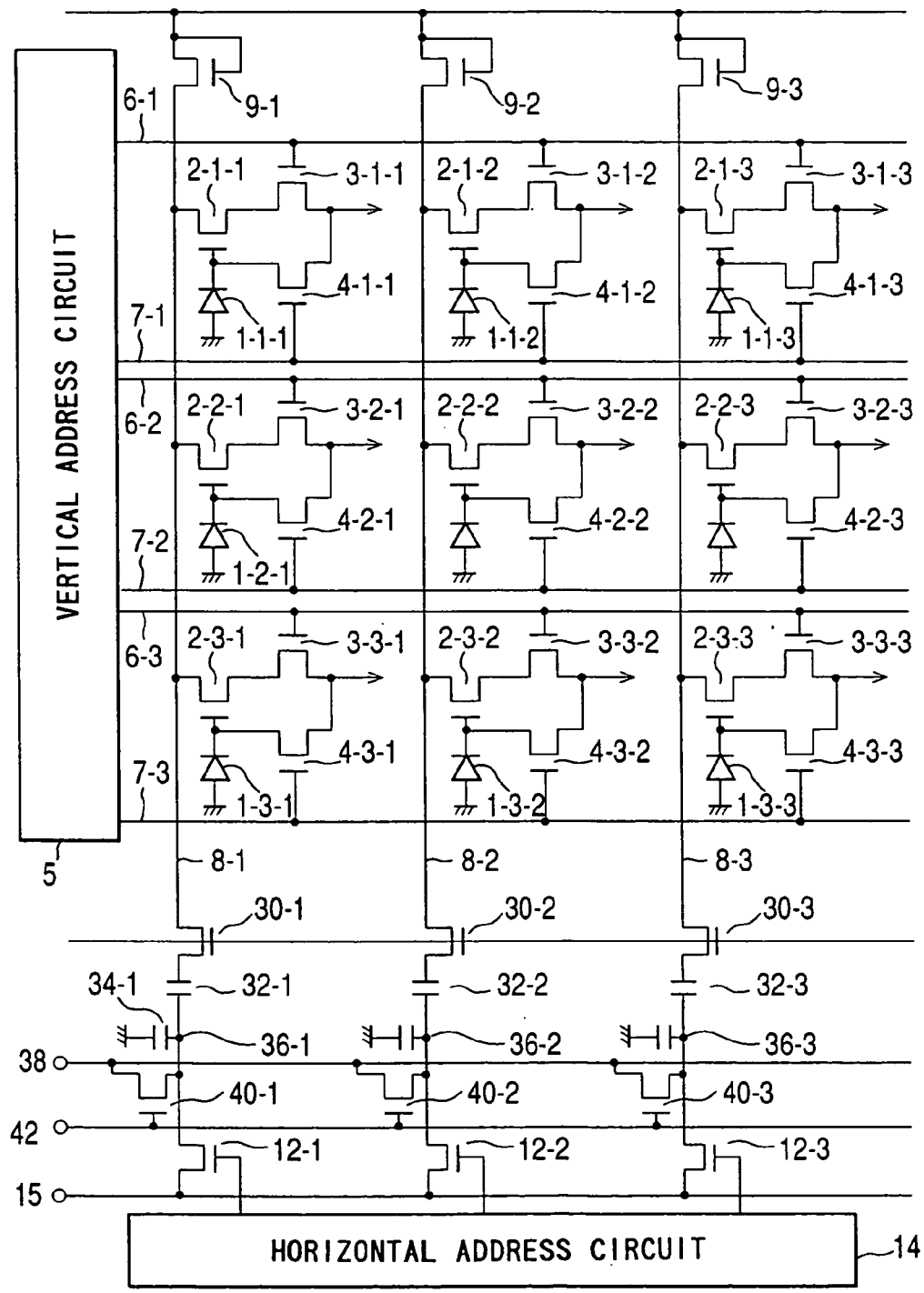
FIG. 50 is a diagram for explaining a twenty-third embodiment of the present invention and showing a circuit diagram showing the arrangement of the unit cell of an MOS-type solid-state imaging device.

FIG. 50 shows the arrangement of a solid-state imaging apparatus using an amplification type MOS sensor according to the twenty-third embodiment. The same parts as those shown in FIG. 46 will be indicated in the same reference numerals and their detailed description will be omitted.

Only the noise canceler circuit of this embodiment differs from the device shown in FIG. 46. In the noise canceler circuit, sample/hold transistors 30(30-1, . . . , 30-3) and clamp capacitors 32(32-1, . . . , 32-3) are serially connected to the vertical signal lines 8(8-1, . . . , 8-3) and sample/hold capacitors 34(34-1, . . . , 34-3) and clamp transistors 40(40-1, . . . , 40-3) are connected in parallel to connection points between the clamp capacitors 32 and the horizontal selection transistors 12 (12-1, . . . , 12-3).

Figure 51:
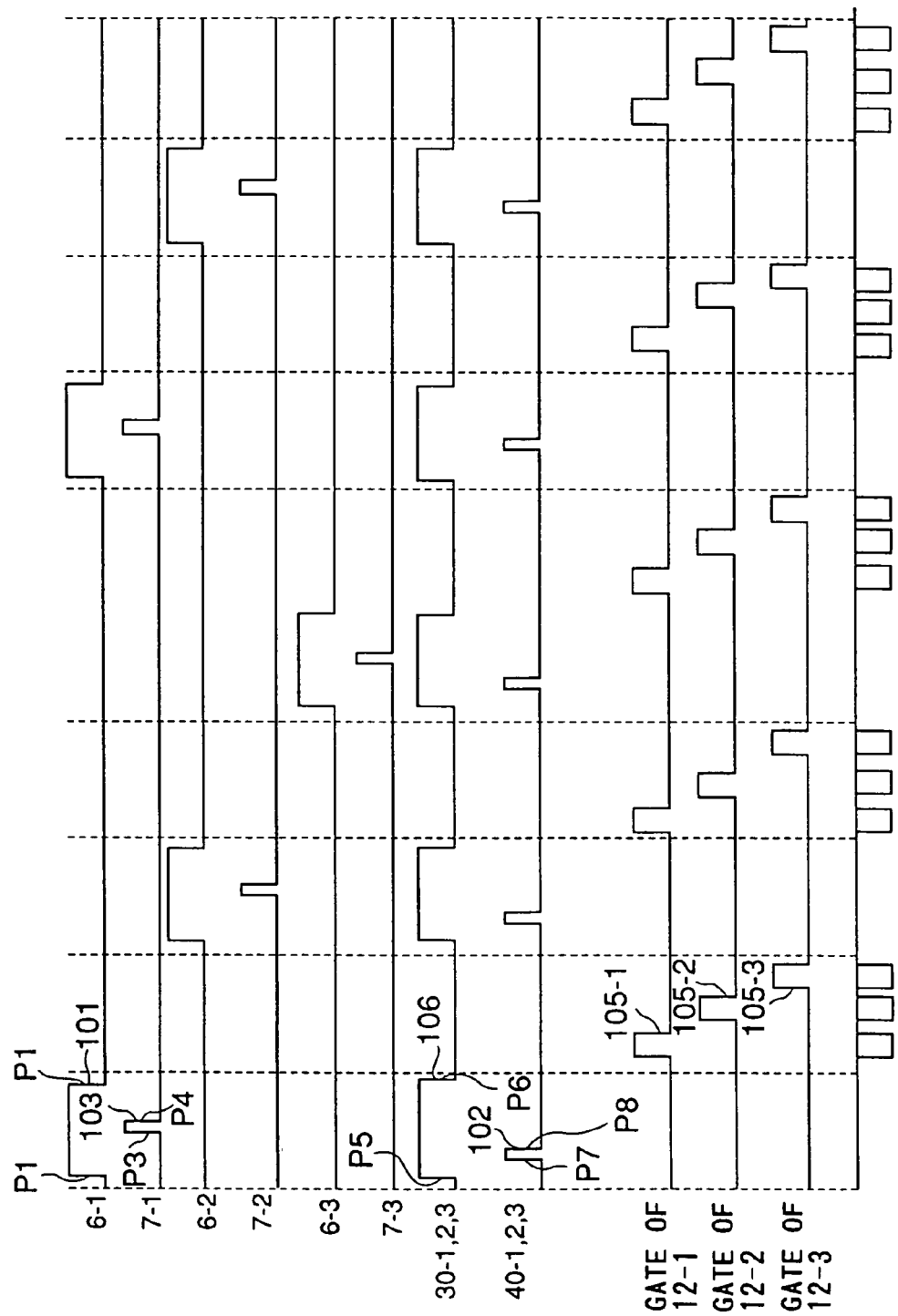
FIG. 51 is a timing chart showing the operation of the embodiment shown in FIG. 46.

The driving method of this embodiment will be described. FIG. 51 is a timing chart showing an operation of this embodiment.

The operation of this embodiment will be described with reference to FIG. 51. A sampling pulse 106 is supplied to a sample/hold transistor 30 to turn on the sample/hold transistor 30 during a noise suppress period. An address pulse 101 is generated from a vertical address circuit 5 to make the horizontal address line 6, e.g., the horizontal address line 6-1 high and is applied to the horizontal address line 6-1.

Only selection transistors 3(3-1-1, 3-1-2, . . . , 3-1-n) of unit cells P1-1-1, P1-1-2, . . . , P1-1-n arrayed in the first row whose gates are connected to the horizontal address line 6-1 are turned on. Source follower circuits are formed by amplification transistors 2 (2-1-1, 2-1-2, . . . , 2-1-n) connected to the selection transistors 3(3-1-1, 3-1-2, 3-1-n) and load transistors 9-1-1, 9-1-2, . . . , 9-1-n.

Gate voltages of the amplification transistors 2-1-1, 2-1-2, . . . , 2-1-n, i.e., substantially same voltages of the photodiode voltages appear on the vertical signal lines 8-1, 8-2, . . . , 8-n. A clamp pulse 102 is applied to the gates of the clamp transistors 40(40-1, 40-2, . . . , 40-n) to turn on the clamp transistors 40(40-1, 40-2, . . . , 40-n). The clamp nodes 36(36-1, 36-2, . . . , 36-n) are fixed to the same voltage as a clamp power source 38.

After the clamp transistors 40(40-1, 40-2, . . . , 40-n) are turned off, a reset pulse 103 is generated from the vertical address circuit 5 to make the reset line 7-1 high and is applied to the reset line 7-1. The reset transistors 4(4-1-1, 4-1-2, . . . , 4-1-n) of the unit cells P1-1-1, P1-1-2, . . . , P1-1-n arrayed in the first row which are connected to the reset line 7-1 are turned on to reset the signal charge. A sum of voltages obtained by dividing differential voltages between the voltages set when the signal charges are present at the photodiodes 1-1-1, 1-1-2, . . . , 1-1-n and the voltages set when the signal charges are not present with a ratio between the clamp capacitor 32 and the sample/hold capacitor 34 and the voltage of the clamp power source 38 appear on the clamp nodes 36-1, 36-2, . . . , 36-n.

When the capacitance of the clamp capacitor 32 is Cc1, the capacitance of the sample/hold capacitor 34 is Csh, the charge set when the photodiode 1 includes a signal charge is Esn, and the charge set when the photodiode 1 is reset is En, a sum of the voltage obtained by dividing the difference charge between Esn and En with a ratio of Cc1 and Csh and the voltage of the clamp power source 38 appears. That is, the signal voltage is multiplied by Cc1/(Cc1+Csh).

Thus, the signal component is multiplied by Cc1/(Cc1+Csh).

Horizontal selection pulses 105(105-1, . . . , 105-3) are sequentially supplied to the horizontal selection transistors 12-1, 12-2, . . . , 12-n from the horizontal address circuit 14 to sequentially output signal of one line. By sequentially performing this operation for the subsequent lines, all the signals in the two-dimensional matrix arrayed unit cells can be read out.

It is assumed that the leading edge of the high-level vertical address pulse at the horizontal address line 6-1 is indicated by P1, the trailing edge of the high-level vertical address pulse at the horizontal address line 6-1 by P2, the leading edge of the pulse at the reset line 7-1 by P3, the trailing edge of the pulse at the reset line 7-1 by P4, the leading edge of the sampling pulse 106 applied to the sample/hold transistor 30 by P5, the trailing edge of the sampling pulse 106 by P6, the leading edge of the clamp pulse 102 applied to the gate of the clamp transistors 40 by P7, and the trailing edge of the clamp pulse 102 by P8. The timing relationship between these timings should be as follows:

P1<P8<P3<P4<P6<P2

Though the sequential orders among P1, P5 and P7 can be arbitrarily set, the following relationship is preferable:

P1<P5<P7

Where the signal current which is read when the input signal is not present is small, the noise is also small. Therefore, it is desirable to set the voltage applied to the clamp power source 38 and the video bias voltage substantially the same level. The video bias voltage is a voltage to which the horizontal signal line 15 is almost fixed when a signal is read out from the horizontal signal line 15 with a current. As shown in FIG. 45, if the video amplifier in which the load resistor 178 is connected between the input and output terminals of the operational amplifier 176 is used, the signal current is forcibly flowed through the load resistor 178, so that the horizontal signal line 15 is fixed to a virtual voltage which is the video bias voltage.

According to the present invention, though the structure of the noise canceler circuit differs from that of the twenty-second embodiment, the fixed pattern noise can be similarly suppressed as in the twenty-second embodiment. As understood from the circuit configuration, the clamp capacitor 32 and the sample/hold capacitor 34 are directly and closely connected to each other so that they can be stacked on the same surface.

More specifically, as shown in FIG. 24, a first electrode 76 is formed on a silicon substrate 72 through a first insulating film 74 to form the sample/hold capacitor 34. In addition, a second electrode 80 is formed on the first electrode 76 through a second insulating film 78 to form the clamp capacitor 32.

As is also obvious from FIG. 24, since the first electrode 76 serves as a common electrode, and the clamp capacitor 32 and the sample/hold capacitor 34 are stacked on each other, the same capacitance value as that obtained when these components are formed separately can be obtained with ½ the area.

This invention is not limited to the above embodiments. The structure of the unit cell is not limited to that shown in FIG. 50. The unit cell may be formed such that a transfer transistor is connected between the photodiode 1 and the amplification transistor 2. The selection transistor or the reset transistor can be omitted. The present invention can be applied to the unit cell provided if the detection signal of the photodiode is output through a transistor.

As described above in detail, according to the present embodiment, the area needed for the clamp capacitor and the sample/hold capacitor can be reduced and the device can be miniaturized by suitably connecting the elements of the noise canceler.

Twenty-fourth Embodiment

Figure 52:
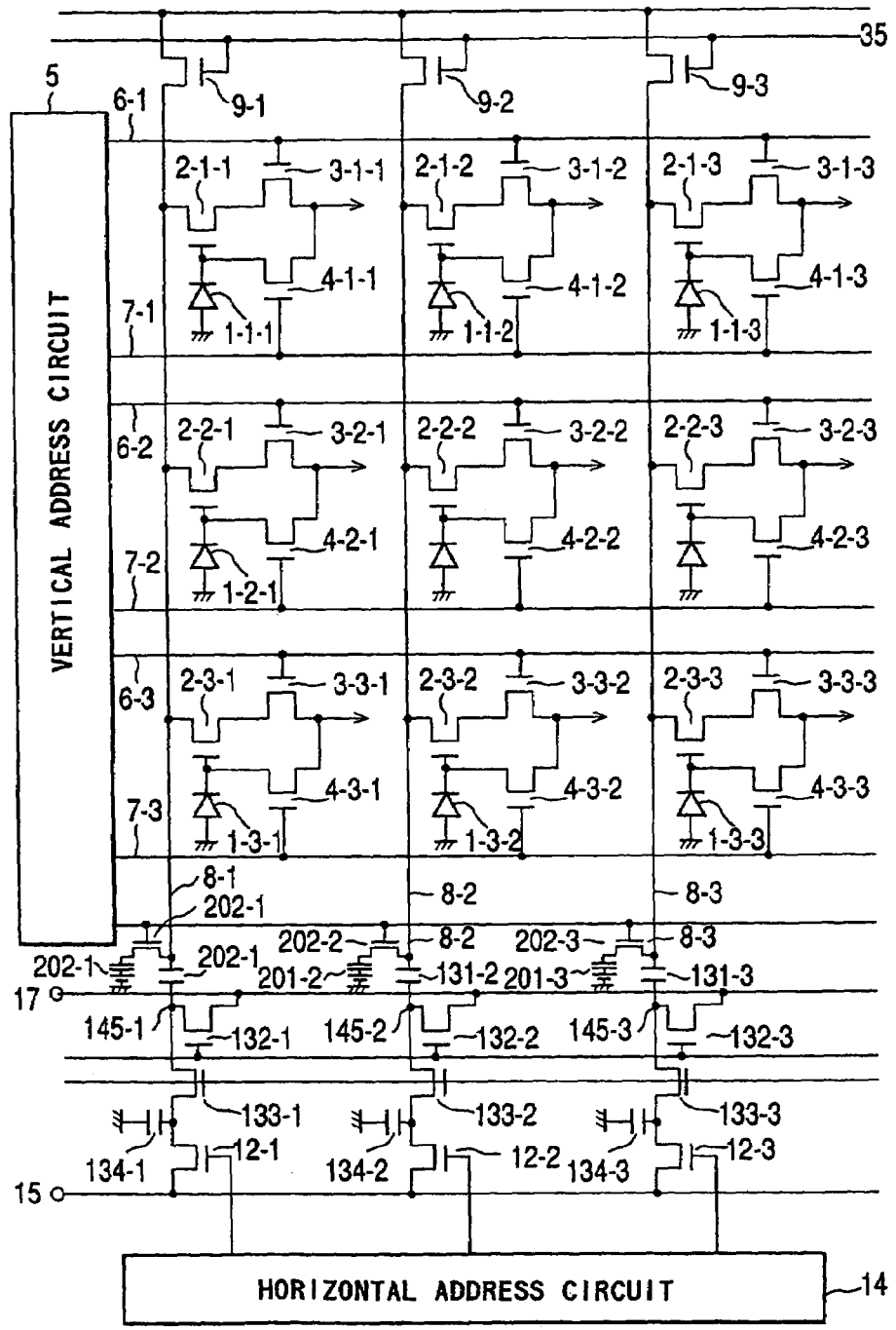
FIG. 52 is a diagram for explaining a twenty-fourth embodiment of the present invention and showing a circuit diagram showing the arrangement of the unit cell of an MOS-type solid-state imaging device.
Figure 53:
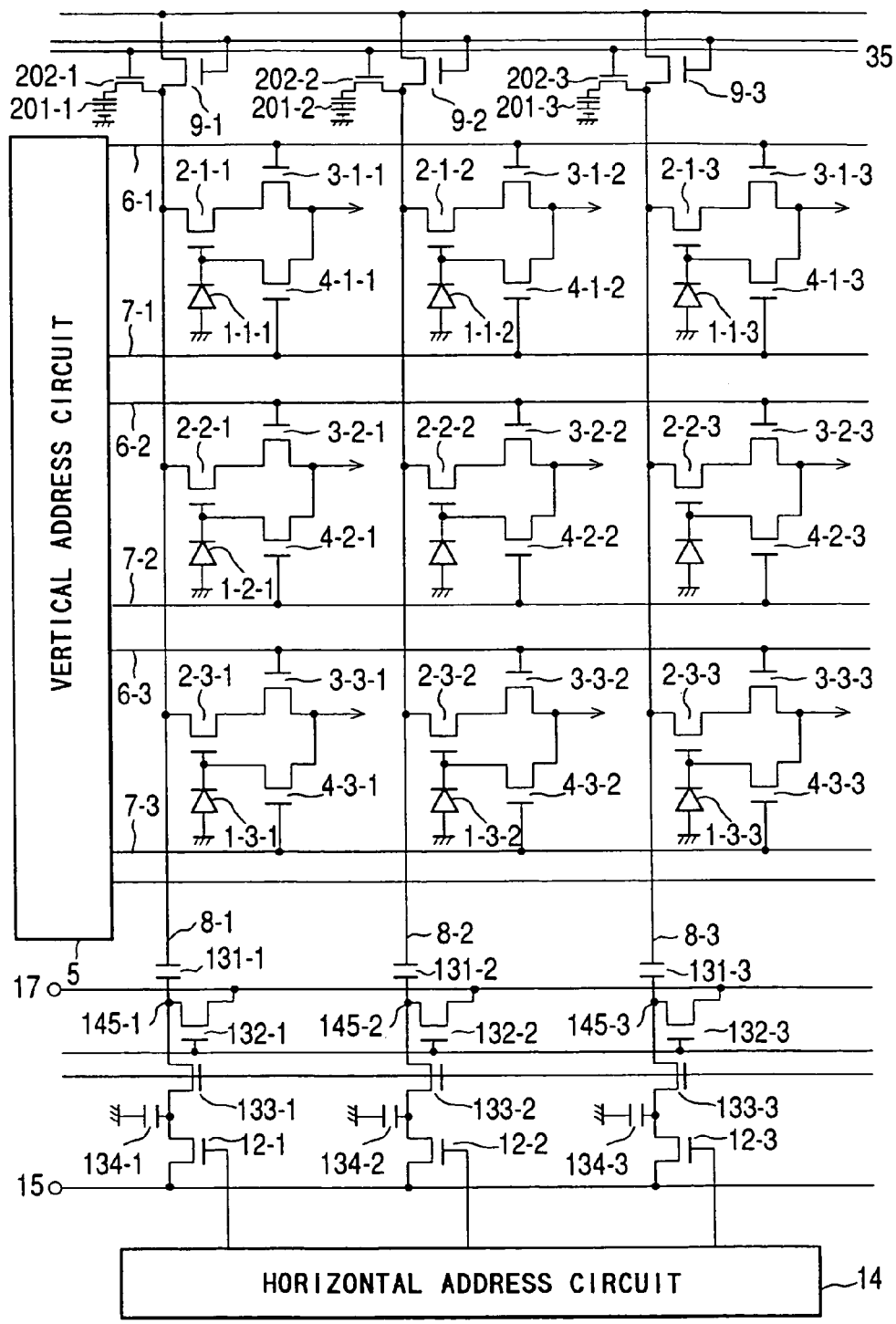
FIG. 53 is a diagram for explaining a twenty-fourth embodiment of the present invention and showing a circuit diagram showing the modified arrangement of the MOS-type solid-state imaging device shown in FIG. 52.

FIGS. 52 and 53 are illustrations showing a circuit construction of a solid-state imaging device according to a twenty-fourth embodiment used in the present invention.

A construction of FIG. 52 will be described for the purpose of reducing a fixed pattern noise. In FIG. 52, unit cells comprising amplifying transistor 2 (2-1-1, 2-1-2, ..., 2-3-3) for selecting a line which reads out a signal of photodiodes 1 (1-1-1, 1-1-2, ..., 1-3-3), vertical selection transistors 3 (3-1-1, 3-1-2, ..., 3-3-3) for selecting a line which reads out a signal and reset transistors 4 (4-1-1, 4-1-2, ..., 4-3-3) for resetting a signal electric charge, are arranged in a two-dimensional 3×3 matrix. Of course, a larger number of unit cells are arranged in the actual apparatus.

Horizontal address lines 6 (6-1, 6-2, 6-3) arranged in a horizontal direction from a vertical address circuit 5 are connected to gates of the vertical selection transistors 3 for selecting a line which reads out a signal. Similarly, reset lines 7 (7-1, 7-2, 7-3) arranged in a horizontal direction from the vertical address circuit 5 is connected to gates of the reset transistors 4. Sources of the amplification transistors 2 are connected to vertical signal lines 8 (8-1, 8-2, 8-3) arranged in a column direction, and one ends of the amplification transistors 2 are connected to load transistors 9 (9-1, 9-2, 9-3).

Gates of the load transistors 9 are connected to a load transistor driving line 35. The load transistors 8 are not necessarily driven by the driving line 35, and gates of the load transistors 8 may be connected to the sources thereof.

Connected to the other ends of the vertical signal lines 8 are noise canceler circuit comprising clamp capacitors 131 (131-1, 131-2, 131-3), clamp transistors 132 (132-1, 132-2, 132-3), sample/hold transistors 133 (133-1, 133-2, 133-3), sample/hold capacitors 134 (134-1, 134-2, 134-3). The noise canceler circuits are connected to a horizontal signal line 15 through horizontal selection transistors 12 (12-1, 12-2, 12-3) which are selected by a selection pulse supplied from a horizontal address circuit 14.

In the present device, capacitors 201 (201-1, 202-2, 202-3) for correction are disposed nearer the imaging region than the clamp capacitors next to the vertical signal line through switches 202 (202-1, 202-2, 202-3). The correction capacitor 201 and the switch 202 are disposed between the clamp capacitor 131 and the imaging region in FIG. 52, and are disposed between the imaging region and the load transistor 9 in FIG. 53. A bias having a predetermined voltage is applied to the correction capacitor 201.

A capacitance value of the correction capacitor 201 is represented by $C_{CMP}$, a capacitance value of the clamp capacitor 131 is represented by $C_{CL}$, and a capacitance value of the sample/hold capacitor 134 is represented by $C_{SH}$. In the present embodiment, the switch 202 is brought into ON state during a sample/hold period. In this case, a capacitor C connected to the vertical signal line 8 at the time of sample/hold is given by:

$$C = C_{CMP} + C_{SH}$$

Therefore, the capacitance value $C_{CMP}$ of the correction capacitor 201 is set in a range of $2\{C_{CL} - C_{CL} \cdot C_{SH}/(C_{CL} + C_{SH})\} > 0$. By setting in this range, a capacitor connected to the vertical signal line 8 at the time of sample/hold approaches a magnitude of the capacitance value $C_{CL}$ of the clamp capacitor 131 as compared with a case where the correction capacitor 201 does not exit. Therefore, a difference $V_{CL}$ becomes smaller and thus, the noise is reduced.

Figure 54:
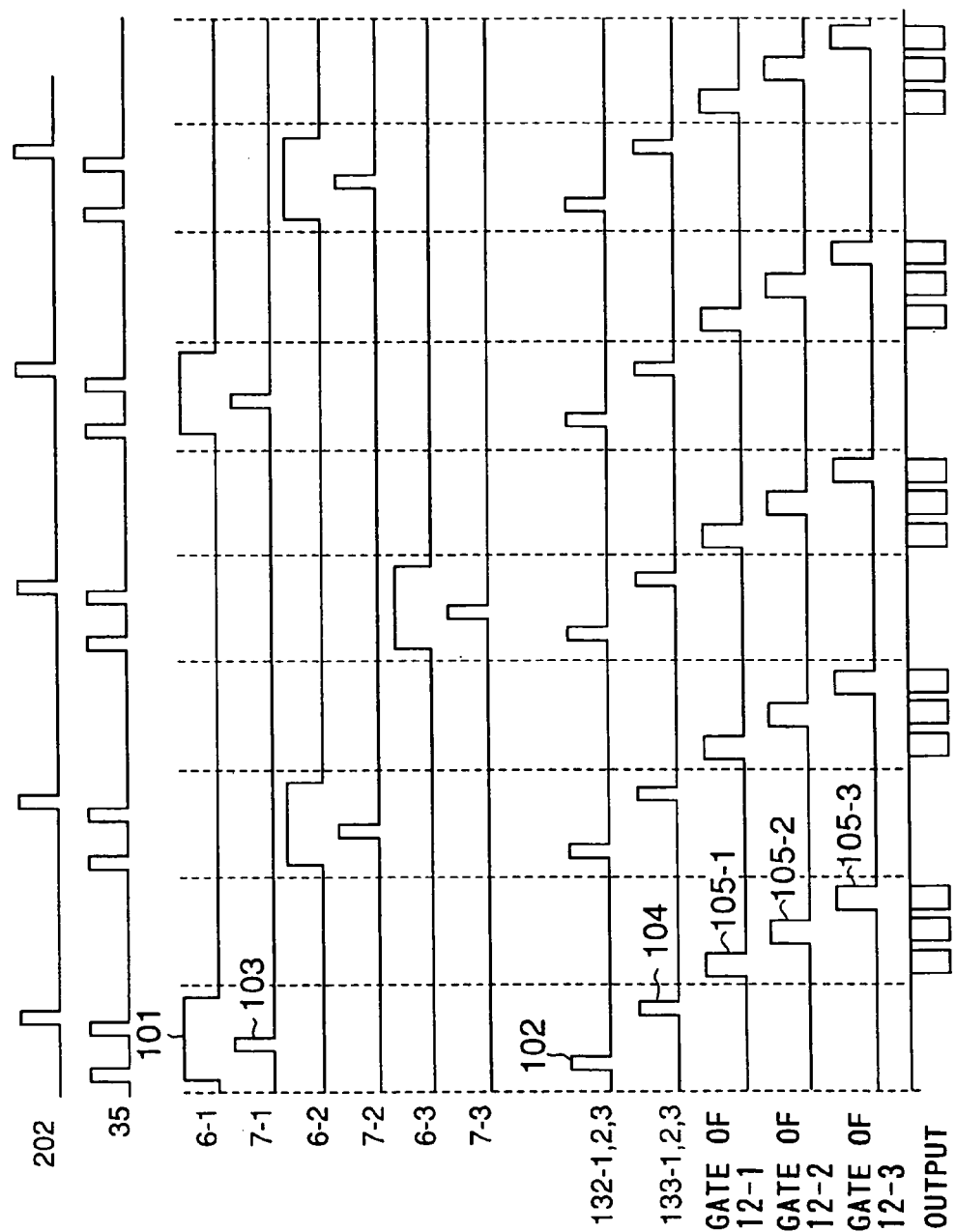
FIG. 54 is a timing chart showing the operation of the twenty-fourth embodiment shown in FIGS. 52 and 53.

A detailed operation will be described. FIG. 54 is a timing chart showing an operation of this device. In the present embodiment, the correction capacitors 201 (201-1, 201-2, 201-3) are disposed nearer the imaging region than the clamp capacitors, and are disposed side by side with the vertical signal line 8 through the switches 202 (202-1, 202-2, 202-3). The correction capacitor 201 and the switch 202 are disposed between the clamp capacitor 131 and the imaging region in FIG. 52, and are disposed between the imaging region and the load transistor 9 in FIG. 53. The switch 202 is brought into ON state during the sample/hold period.

Now, it is supposed that an address pulse 101 for setting the horizontal address line 6-1 at high level is applied. Then, only the vertical selection transistor 3 on this line is turned on. Subsequently, if the load transistor driving line 35 is made high level, a source follower circuit is constituted by the amplification transistor 2 on the selected line and the load transistor 8. And substantially the same voltage as the gate voltage of the amplification transistor 2, i.e., as the voltage of the photodiode 1 appears on the vertical signal line 8. At this time, the clamp pulse 102 is applied to the gate of the clamp transistor 132, the clamp transistor 132 is turned on, and the clamp node 145 is fixed at the same voltage as the clamp electric source 17.

Next, the clamp transistor 132 is turned off and then, the load transistor driving line 35 is made low level. Subsequently, a reset pulse 103 which makes the reset line 7-1 high level is applied, and the reset transistor 4 is turned on to reset the signal charge. Then, if the load transistor driving line 35 is made high level again, a voltage to which a difference in voltage between a case where a signal charge exists in the photodiode 1 and a case where the signal charge is reset is added appears on the clamp node 145.

Subsequently, a sample/hold pulse 104 is applied to the gate of the sample/hold transistor 133, the sample/hold transistor 133 is turned on, and such a signal is transmitted to the sample/hold capacitor 134. Then, horizontal selection pulses 105 (105-1, 105-2, 105-3) are sequentially applied from the horizontal address circuit 14 to the horizontal selection transistor 12, and a signal corresponding to one line is sequentially taken out from the horizontal signal line 15.

By sequentially continuing this operation from the next line and its subsequent lines, it is possible to read out all of the two-dimensional signals.

In this device, a difference in voltage between a case where there finally exists a signal and a case where a reset is conducted and there exists no signal appears on the clamp node 145 and therefore, a noise due to a variation in threshold value of the amplification transistor 2 is suppressed. More specifically, a circuit comprising the clamp capacitor 131, the clamp transistor 132, the sample/hold transistor 133 and the sample/hold capacitor 134 functions as a noise canceler circuit, and the fixed pattern noise which is a two-dimensional noise is suppressed from being generated.

More specifically, impedance in the noise canceler circuit as viewed from the unit is substantially the same between a case where the noise component is output and a case where signal component and noise component are output. Therefore, the noise components in both the cases are substantially the same, and if a difference between both the cases is subtracted, it is possible to accurately eliminate the noise output, and to take out only the signal component. Therefore, it is possible to accurately cancel the noise.

In the case of the construction of the twenty-fourth embodiment, if there exists a circuit which can secure the clamp pulse having a time width of 200 (ns) or more, a sufficient noise cancellation capability can be secured even if the correction capacitor 201 and the switch 202 are not provided.

That is, in the noise canceler circuit, a signal charge which is accumulated to the sample/hold capacitor is in accordance with the product of the magnitude of the sample/hold capacitor and a difference in voltage between the electrodes. The difference in voltage between the electrodes is in accordance with a ratio of the capacitance value $C_{SH}$ of the sample/hold capacitor 134 to the capacitance value $C_{CL}$ of the clamp capacitor 131. Therefore, in order to increase the signal charge appearing on the sample/hold capacitor, it is necessary to increase the sample/hold capacitor, and at the same time, to increase the clamp capacitor correspondingly. As a result, in order to obtain a sufficient signal charge, a considerably large clamp capacitor is required. However, if the clamp pulse can secure a sufficient pulse wide, there is no problem.

Further, the amplification transistor 2 of the unit cell is required to drive not only the capacitor of the vertical signal line 8 but also a larger clamp capacitor. However, this will not cause any problem when a sufficient time can be secured for suppressing the noise. This problem will be caused when the MOS-type solid-state imaging device is used as a television camera. Practically, when the television signal is supplied, it is necessary to supply the television signal during a short horizontal blanking period. There is not enough time for suppressing the noise within such a short horizontal blanking period, and the noise can not be eliminated.

Furthermore, if a magnitude of the capacitor connected to the vertical signal line 8, i.e., the capacitance value $C_{CL}$ of the clamp capacitor 131 when there is a signal in photodiode 1 and the vertical signal line 8 is clamped, and a magnitude C of the capacitor connected to the vertical signal line 8 at the time of sample/holding (wherein $C=C_{CL} \cdot C_{SH}/(C_{CL}+C_{SH})$) are different from each other, there is caused a problem that the noise can not be canceled for this reason. In the present invention, the correction capacitor 201 is connected to the vertical signal line 8 during the sample/hold period, so that the capacitor connected to the vertical signal line 8 corresponds to a value of outside of the sample/hold period.

In the present invention, the switch 202 carries out this operation by turning the switch 202 on during the sample/hold period. With this operation, the capacitor C connected to the vertical signal line 8 at the time of sample/hold is given by:

$$C=C_{CMP}+C_{SH}$$

If a magnitude of the correction capacitor $C_{CMP}$ is set in a range of $2\{C_{CL}-C_{CL} \cdot C_{SH}/(C_{CL}+C_{SH})\}>C_{CMP}>0$, the capacitor (the sample/hold capacitor 134 and the clamp capacitor 131) connected to the vertical signal line 8 during the sample/hold period approaches a magnitude of the capacitor connected to the vertical signal line 8 outside the sample/hold period, i.e., the capacitance value $C_{CL}$ in a state where only the clamp capacitor 131 (=capacitance value $C_{CL}$) exists. Therefore, the difference $V_{CL}$ becomes smaller and thus, the noise also becomes smaller.

FIG. 55 shows a variation of the vertical signal line potential and the clamp node potential with time elapse. In the present embodiment, when a potential in which the vertical signal line potential returns at the time of clamping and a potential in which the vertical signal line potential returns at the time of sample/hold are the same, as in a dark time when the signal is zero, the potential of the clamp node when the sample/hold is completed does not return to a, value which is approximate to the $\Delta V_{CL}$ and becomes zero. Therefore, there is no inconvenience such as a signal corresponding to $\Delta V_{CL}$ being generated even if it is a dark time and the signal is zero. Therefore, it is possible to prevent the noise due to the variation in $\Delta V_{CL}$ from being generated.

When there are no construction elements for the correction capacitor 201 and the switch 202, if a magnitude of the capacitor connected to the vertical signal line 8, i.e., the capacitance value $C_{CL}$ of the clamp capacitor 131 when there is a signal in photodiode 1 and the vertical signal line 8 is clamped, and a magnitude C of the capacitor connected to the vertical signal line 8 at the time of sample/holding (wherein $C=C_{CL} \cdot S_{CH}/(C_{CL}+C_{SH})$) are different from each other, there is caused a problem that the noise can not be canceled for this reason. This will be described below.

In order to see the operation of the device under a low illumination state which is an imaging condition in which a noise is found most remarkably, attention is paid to a case in which a signal is zero, i.e., a case in which photo transistor potentials before and after the photo transistor is reset are the same. FIG. 56 shows a variation of the vertical signal potential and the clamp node potential.

The vertical signal potential after turning on the clamp transistor 132 when the signal voltage appears on the vertical signal line 8 becomes a clamp voltage upon the clamp as shown in FIG. 56, and thereafter, it returns to signal line potential again. The reason why the potential does not becomes the signal line potential immediately is that a potential is varied with a time constant which is represented by $\tau$ (which is the product of resistance $R_{TR}$ of the load transistor 9 by the clamp capacitor $C_{CL}$)=$R_{TR} \cdot C_{CL}$. In a value of actual element, $R_{TR}$ is about 10 (k$\Omega$), $C_{CL}$ is about 1 (pF), $\tau$ is about 10 (nS). In order to be sufficiently saturated, $\tau$ is required to be 200 (nS) or more.

On the other hand, since it is necessary to carry out all of the operations shown in FIG. 54 within one horizontal blanking period, the clamp pulse can not be set to 200 (nS) or more in many cases. Therefore, in an actual element, the clamp transistor is turned off in a state where the vertical signal line potential is not sufficiently saturated to the signal potential at the time of clamping. Therefore, after the clamp transistor is turned off, the potential of the clamp node does not become the clamp potential, and is offset by the amount of $\Delta V_{CL}$.

Variations with time elapse of the clamp note potential and the vertical signal line potential at the time of sample/hold are shown in FIG. 56. At this time, capacitor connected to the vertical signal line is serially composed capacitors of the clamp capacitor and the sample/hold capacitor, and its value C is given by:

$$C=C_{SH}+C_{CL}/(C_{SH}+C_{CL})$$

A delay time constant $\tau'$ at this time is given by:

$$\tau'=R_{TR} \cdot C=R_{TR} \cdot C_{SH} \cdot C_{CL}/(C_{SH}+C_{CL})$$

This is remarkably smaller than a delay time constant $\tau$ at the time of clamping. Therefore, a time in which the vertical signal line potential returns to the original potential at the time of sample/hold is faster than a time required at the time of clamping.

Therefore, as in a dark time case in which the signal is zero, even if potentials in which the vertical signal line potential returns at the time of clamping and the vertical signal line potential returns at the time of sample/hold are the same, the potential of the clamp node when the sample/hold is completed does not become zero, and returns to a value which is approximate to $\Delta V_{CL}$. That is, even though it is a dark time in which the signal is zero, a signal corresponding to $\Delta V_{CL}$ appears, and furthermore, the $\Delta V_{CL}$ is varied. Therefore, this remains as a noise which could not eliminated by the noise circuit.

In the present embodiment, the switch 202 is turned on during the sample/hold period. With this operation, the capacitor C connected to the vertical signal line at the time of sample/hold is given by:

$$C = C_{CMP} + C_{SH}$$

If a magnitude of the correction capacitor $C_{CMP}$ is set in a range of $2\{C_{CL} - C_{CL} \cdot C_{SH}/(C_{CL}+C_{SH})\} > C_{CMP} > 0$, the capacitor C approaches the magnitude of $C_{CL}$ as compared with a case in which the correction capacitor does not exist. Therefore, the difference $V_{CL}$ becomes smaller and thus, the noise also becomes smaller.

FIG. 55 shows a variation with time elapse of the vertical signal line potential and the clamp node potential. In the present embodiment, as in a dark time case in which the signal is zero, even if potentials in which the vertical signal line potential returns at the time of clamping and the vertical signal line potential returns at the time of sample/hold are the same, the potential of the clamp node when the sample/hold is completed does not return to a value which is approximate to $\Delta V_{CL}$ and becomes zero. Therefore, there causes no inconvenience that even though it is a dark time in which the signal is zero, a signal corresponding to $\Delta V_{CL}$ may appear. Therefore, it is possible to prevent noises due to variation of $\Delta V_{CL}$ from being generated.

The above description is for the present embodiment of the MOS-type solid-state imaging device in which various noise canceler circuits are composed on the MOS sensor having one photodiode per a unit cell.

Next, a description will be made for an embodiment of the MOS-type solid-state imaging device having a structure in which various noise canceler circuits are combined on the MOS sensor of a plurality of photodiode structures having two or more photodiodes per a unit cell.

Twenty-fifth Embodiment

The twenty-fifth embodiment is an example of a structure in which various noise canceler circuits are combined on the MOS sensor of a plurality of photodiode structures having two or more photodiodes per a unit cell.

Figure 57:
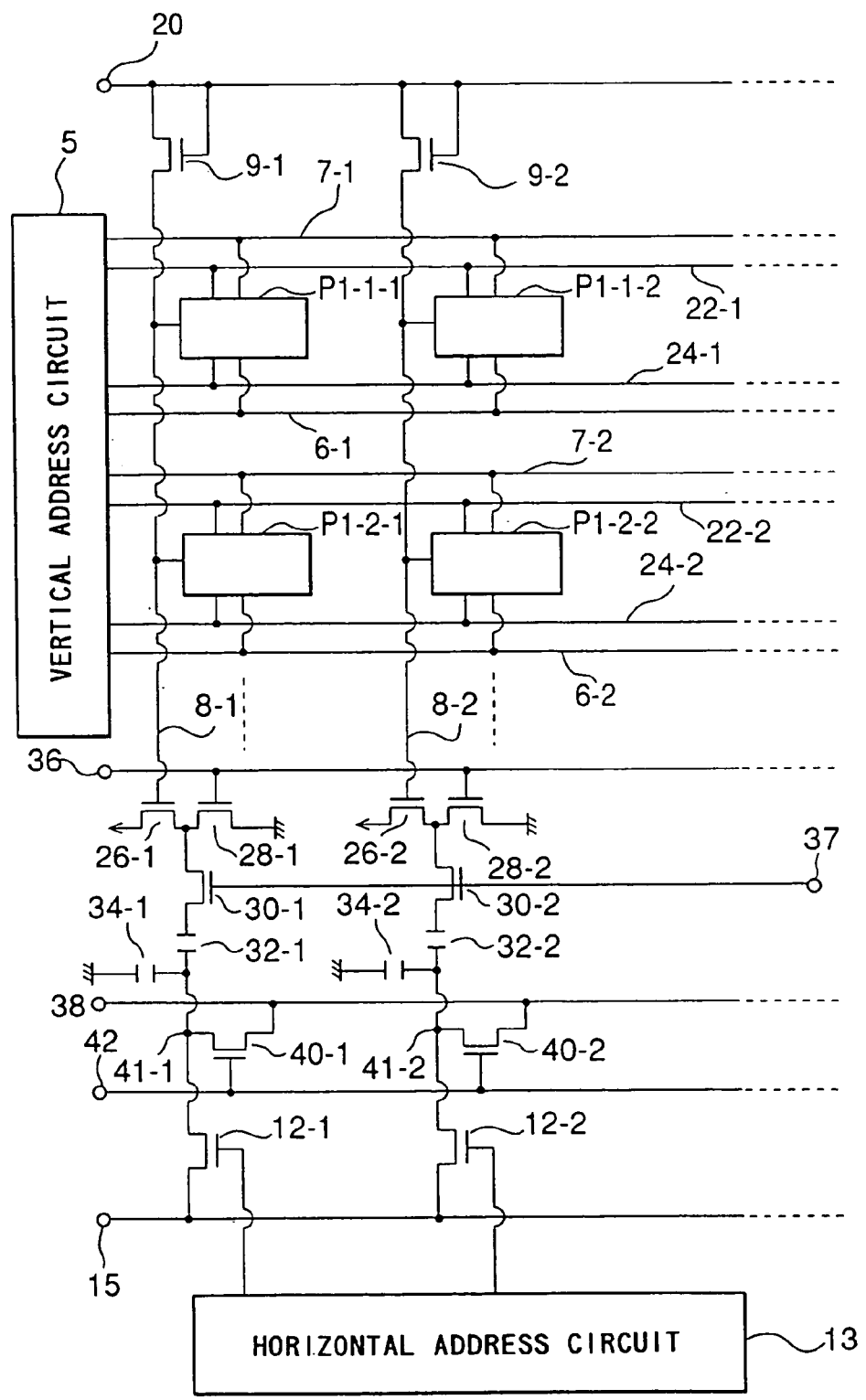
FIG. 57 is a diagram for explaining a twenty-fifth embodiment of the present invention and showing a circuit diagram showing the MOS-type solid-state imaging device.
Figure 61:
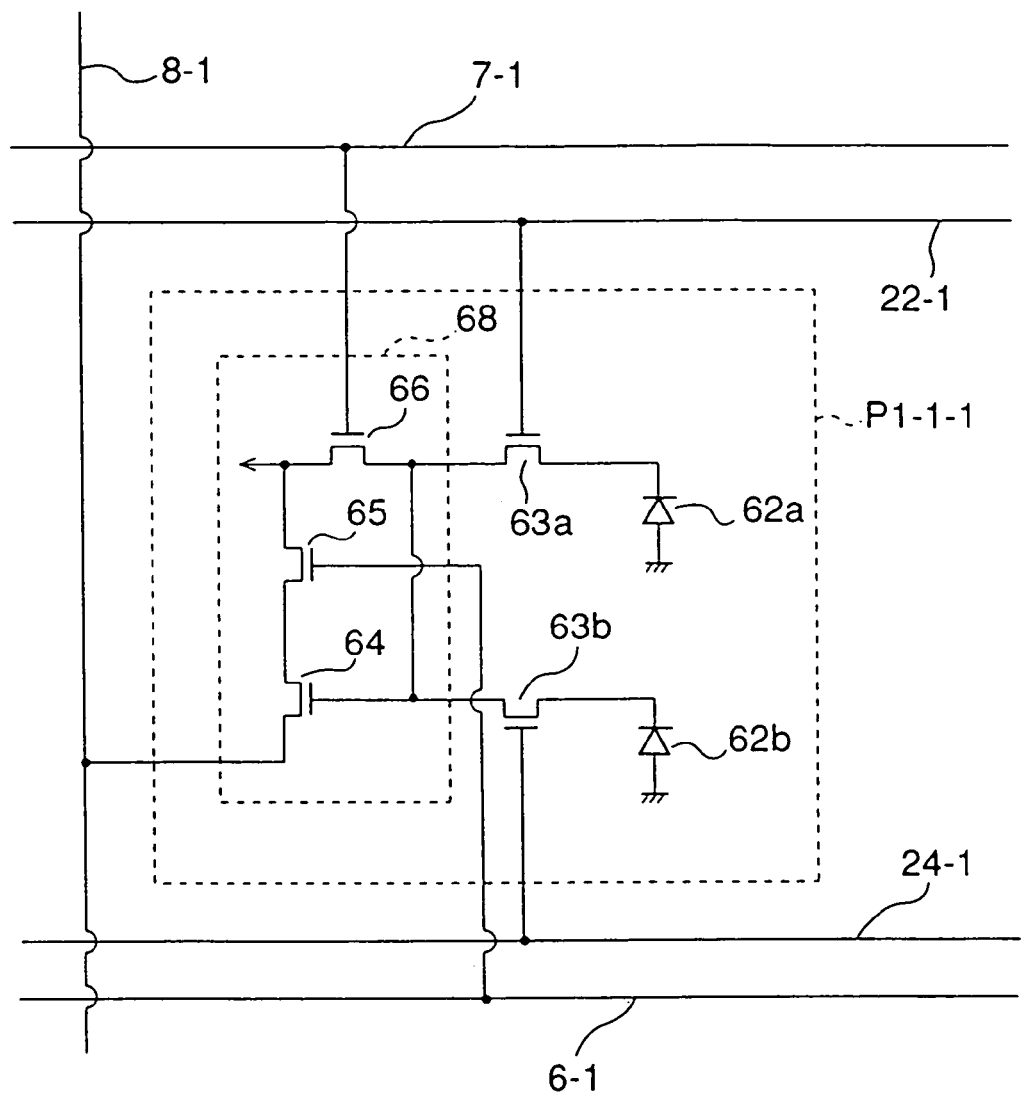
FIG. 61 a circuit diagram of the unit cell of the twenty-fifth embodiment.
Figure 62:
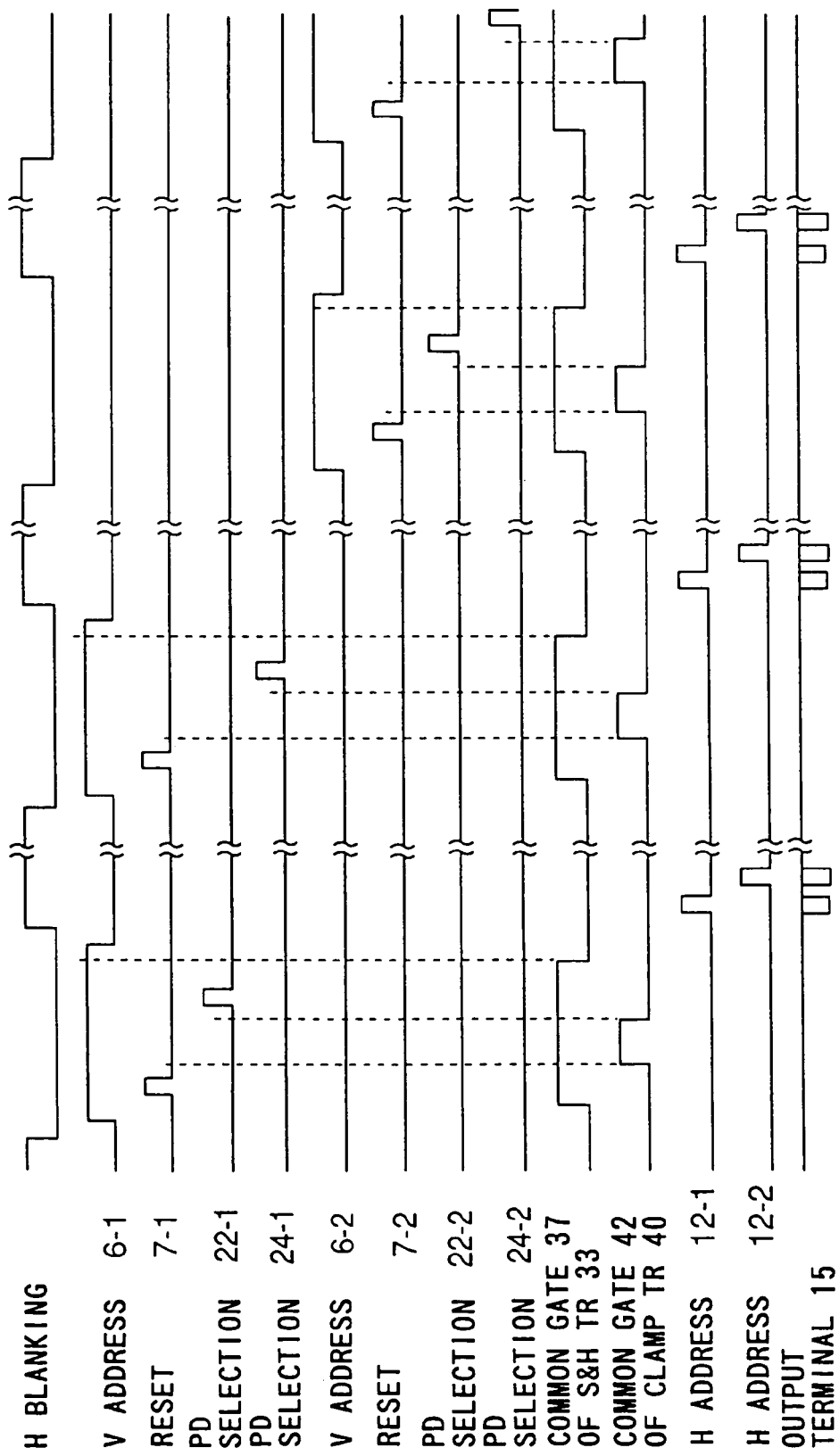
FIG. 62 is a timing chart showing the operation of the twenty-fifth embodiment.

FIG. 57 is a schematic view showing a structure of the MOS-type solid-state imaging device according to the twenty-fifth embodiment used in the present invention. Unit cells P1-i-j corresponding to pixels are arranged vertically and horizontally in the form of a two-dimensional matrix. Although FIG. 57 shows only a 2×2 matrix, the actual device has several thousand cells×several thousand cells vertically and horizontally. Reference symbol i denotes a variable in the horizontal (row) direction, and j denotes a variable in the vertical (column) direction. In the present invention, each of the unit cells P1-i-j comprises two photodiodes instead of one photodiode which are light receiving portions. By providing the unit cell with two photodiodes, each of the unit cells practically functions as two pixels. FIGS. 61 and 62 show details of each of the unit cells P1-i-j.

The field of applications of the solid-state imaging device includes video cameras, electronic still cameras, digital cameras, facsimile machines, copying machines, scanners and the like.

The horizontal (row) address lines 6-1, 6-2, . . . which are extending in a horizontal direction (row direction) from the vertical (column) address circuit 5 are connected to unit cells of each of the lines to determine the horizontal line (line in row direction) for reading out a signal. Similarly, the reset lines 7-1, 7-2, . . . which are extending in a horizontal direction (row direction) from the vertical address circuit 5 are connected to unit cells of each of the lines. As will be described later, since the unit cell of the present embodiment includes two photodiodes, first photodiode selection lines 22-1, 22-2, . . . and second photodiode selection lines 24-1, 24-2, . . . are output in a horizontal direction from the vertical address circuit 5, and these selection lines are also connected to the unit cells of each of the lines.

The unit cells of the lines are connected to vertical signal lines 8-1, 8-2, . . . disposed in a direction of array. One ends of the vertical signal lines 8-1, 8-2, . . . are provided with load transistors 9-1, 9-2, . . . . Gates and drains of the load transistors 9-1, 9-2, . . . are commonly connected to a drain voltage terminal 20.

The other ends of the vertical signal lines 8-1, 8-2, . . . are connected to a noise canceler circuit. That is, the noise canceler circuit used in the present invention comprises MOS transistors 26-1, 26-2, . . . , 28-1, 28-2, . . . , sample hold transistors 30-1, 30-2, . . . , clamp capacitors 32-1, 32-2, . . . , sample hold capacitors 34-1, 34-2, . . . , clamp transistors 40-1, 40-2, . . . , and horizontal (row) selection transistors 12-1, 12-2, . . . .

The other ends of the vertical signal lines 8-1, 8-2, . . . are connected to gates of MOS transistor 26-1, 26-2, . . . which are construction elements of the noise canceler circuit. Sources of the MOS transistors 26-1, 26-2, . . . which are constituent elements of the noise canceler circuit are connected to drains of the MOS transistors 28-1, 28-2, . . . , and the MOS transistors 26-1, 26-2, . . . , 28-1, 28-2, . . . function as source follower circuit. Gates of the MOS transistors 28-1, 28-2, . . . are connected to a common gate terminal 36.

Connections points between the MOS transistors 26-1, 26-2, . . . and the MOS transistors 28-1, 28-2, . . . are connected to one ends of the clamp capacitors 32-1, 32-2, . . . through the sample/hold transistors 30-1, 30-2, . . . which are also constituent elements of the noise canceler circuit. The sample/hold capacitors 34-1, 34-2, . . . and the clamp transistors 40-1, 40-2, . . . are connected in parallel to the other ends of the clamp capacitors 32-1, 32-2, . . . which are constituent elements of the noise canceler circuit.

The other ends of the sample/hold capacitors 34-1, 34-2, . . . which are constituent elements of the noise canceler circuit are grounded. The other ends of the clamp capacitors 32-1, 32-2, . . . are also connected to a signal output terminal (horizontal signal line) 15 through the horizontal selection transistors 12-1, 12-2, . . . .

The horizontal (row) selection transistors 12-1, 12-2, . . . are connected to the signal output terminal (horizontal signal line) 15 through the horizontal (row) selection transistors 12-1, 12-2, . . . which are selected by horizontal address pulses supplied from the selection horizontal address circuit 13 which is a circuit whose horizontal (row) addresses are sequentially changed over.

The vertical address circuit 5 is a circuit for collectively shifting a plurality of signals (four signals in the illustrated embodiment). More specifically, the vertical address circuit 5 includes n sets of four terminals, and switches the four terminals one set by one set sequentially so as to bring them into active states. This is realized by a circuit shown in any of FIGS. 58, 59 and 60.

Figure 58:
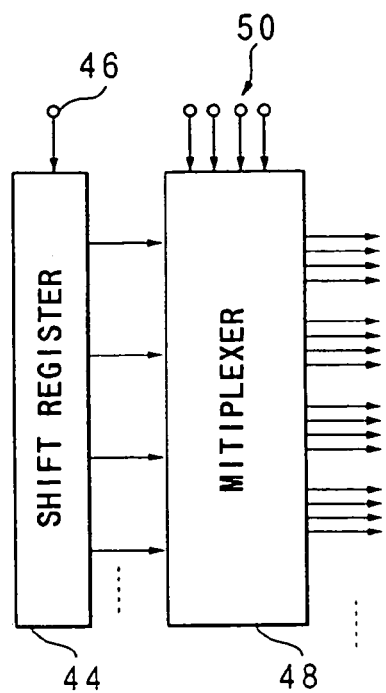
FIG. 58 is a view showing a circuit arrangement of a vertical address circuit in the twenty-fifth embodiment.

In the case shown in FIG. 58, outputs of the shift resistor 44 which sequentially shifts and outputs the input signal 46 from a large number of output terminals are synthesized with four input signals 50 by a multiplexer 48.

Figure 59:
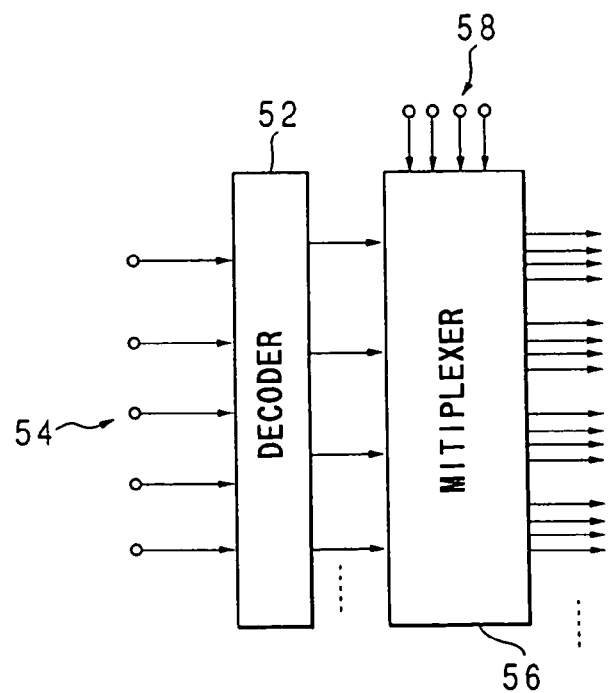
FIG. 59 is a view showing another circuit arrangement of the vertical address circuit in the twenty-fifth embodiment.

In the case shown in FIG. 59, outputs from the decoder 52 for decoding an encoded input 54 are synthesized with four input signals 58 by the multiplexer 56.

Figure 60:
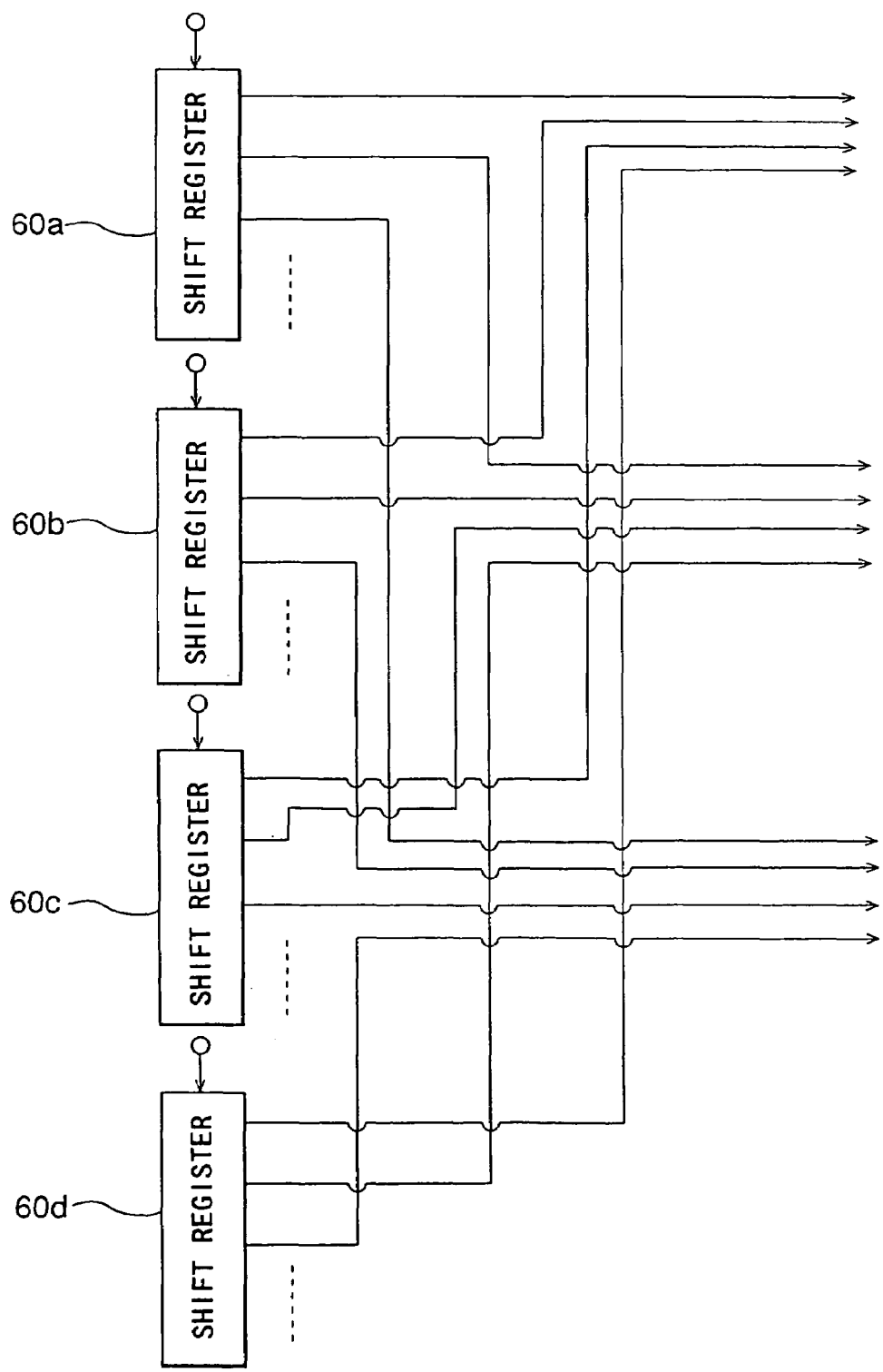
FIG. 60 is a view showing a still another circuit arrangement of the vertical address circuit in the twenty-fifth embodiment.

In the case shown in FIG. 60, using four shift resistors 60a, 60b, 60c and 60d each having a plurality of terminals, among the outputs thereof, outputs of the same terminal position are tied up in a bundle into a control signal line for each of the lines.

FIG. 61 shows one example of a structure of unit cell P1-1-1 shown in FIG. 57. Although FIG. 61 shows only the arrangement of the unit cell P1-1-1, the same arrangement is used for each of the remaining unit cells P1-1-2, . . . .

As shown in FIG. 61, the unit cell of the MOS-type solid-state imaging device of the present embodiment comprises two photodiodes 62a, 62b which are adjacent to each other in a vertical direction (column direction), two photodiode selection transistors 63a, 63b for selecting one of detection signals of the photodiodes 62a, 62b as an output of the unit cell, and an output circuit 68 for outputting an output signal of the photodiode 62a or 62b selected by the selection transistors 63a, 63b.

The selection switches 63a and 63b are independently on/off-controlled. By turning the switches on, it is possible to supply the electric charge accumulated in the photodiodes 62a and 62b to the output circuit 68 in a timely divided manner.

The output circuit 68 is constituted by the following elements, i.e., an amplification transistor 64 having a gate to which an electric charge signal from the photodiodes 62a and 62b are supplied and amplified, a vertical selection transistor 65 for selecting a unit cell which reads out the signal, and a reset transistor 66 for charging and discharging the electric charge applied to the gate of the amplification transistor 64.

The horizontal address line 6-1 extending from the vertical address circuit 5 in a horizontal direction (row direction) is connected to a gate of the vertical (column) selection transistor 65 for selecting a line which reads out the signal. Similarly, the reset line 7-1, the photodiode selection lines 22-1, 24-1 are respectively connected to gates of the reset transistor 66 and the photodiode selection transistors 63a and 63b.

As described above, the unit cell of the MOS-type solid-state imaging device of the present embodiment is of a structure having a plurality of photodiodes per a unit cell, unlike the conventional device of a structure having one photodiode per a unit cell. In the described embodiment, the device is of a structure in which two photodiodes which are adjacent to each other in the vertical (column) direction commonly includes one output circuit 68. That is, the structure having one photodiode per a unit cell only can provide one pixel per a unit cell, whereas, the structure having a plurality of photodiodes per a unit cell can provide a plurality of pixels per a unit cell because the latter structure includes a plurality of photodiodes which are light receiving portions and the light receiving portions can serve as pixels.

In the present embodiment, each of the unit cells comprises two photodiodes, and each of the unit cells is provided therein with five transistors including two transistors for selecting these photodiodes. More specifically, the structure of the unit cell of the MOS-type solid-state imaging device of the present embodiment requires only 2.5 transistors per one photodiode which corresponds to one pixel. Therefore, the present embodiment having 2.5 transistors per one pixel can reduce 0.5 transistors per one pixel, as compared with a conventional device shown in FIG. 1 which requires three transistors per one photodiode. Therefore, it is possible to reduce an occupation area per one pixel, the present invention can provide a smaller solid-state imaging device even if it has the same number of pixels.

Further, the unit cell of the MOS-type solid-state imaging device according to the present embodiment is characterized in that the two photodiodes 62a and 62b are connected to the output circuit 68 through the selection transistors 63a and 63b, respectively. That is, the photodiodes 62a and 62b are connected in parallel. Of course, as a method for providing a plurality of photodiodes 62 with a single output circuit 68, there are other possible methods. One of the possible methods is a so-called serially connected method in which only one of the photodiodes is connected to the output circuit 68, and the other photodiode is connected to the output circuit 68 through the former photodiode connected to the output circuit 68. According to this serially connected method, however, it is difficult to independently read out output signals of a plurality of photodiodes without destroying detection signal accumulated on the other photodiode. Therefore, it is preferable to use the structure described in the present embodiment.

In general, in the amplification-type MOS-type solid-state imaging device, an output signal of the photodiode which is a light receiving portion corresponding to the pixel in each of the unit cells is amplified and taken out through the amplification transistor 64 provided in the unit cell. Therefore, at the time of such amplification, a variation in threshold voltage of the amplification transistor 64 is added to the signal. Therefore, even if the potentials of the photodiodes 62 of the unit cells are the same, the amplification transistor is different depending on unit cell to which the photodiode belongs, and the threshold voltages of the amplification transistors 64 are different from each other. Therefore, the output signals are not the same, and if an image is reproduced, noise is generated in corresponding to a variation in threshold value of the amplification transistor 64.

As described above, the threshold voltages of the amplification transistors 64 in the unit cells are different, and each of the threshold voltage is particular or unique depending on the unit cell. Therefore, there is generated noise which is locally fixed and distributed to the reproduced image, i.e., two-dimensional noise. As previously described, such noise is called fixed-pattern noise because the noise is locally fixed on a screen which is a two-dimensional space.

Therefore, in the present embodiment, there is provided a noise reduction circuit (noise canceler circuit) for suppressing the fixed-pattern noises, instead of a circuit comprising the signal transmitting transistor and the accumulation capacitor of the output portion in the circuit shown in FIG. 1 which shows the conventional structure. Although FIG. 57 shows a correlation double sampling type noise reduction circuit (noise canceler circuit) in which a difference between a signal and a noise in an voltage region, the type of the noise reduction circuit is not limited to the correlation double sampling type, and various noise reduction circuit may be used.

Next, with reference to a timing chart shown in FIG. 62, an operation of the MOS-type solid-state imaging device used in the present invention provided with such a noise canceler circuit will be described. The common drain terminal 20 of the load transistor 9, the common gate terminal 36 of the transistor 28 of the impedance conversion circuit, and the common source terminal 38 of the clamp transistor are driven by direct current and therefore, these elements are omitted in the timing chart.

More specifically, the voltage of the common gate terminal 36 of the transistors 28-1, 28-2, . . . , which constitute the impedance conversion circuit is brought into high level when the MOS-type solid-state imaging device is operated, and is normally turned on. The voltage of the common source terminal 38 of the clamp transistors 40-1, 40-2, . . . is always brought into low level when the MOS-type solid-state imaging device is operated. Because the common source terminal 36 is brought into high level, the transistors 28-1, 28-2, . . . are always brought into ON state, and the transistors 26-1, 26-2, . . . are driven so as to correspond to the signal level (voltage level) transmitted by the vertical signal lines 8-1, 8-2, . . . . Therefore, the voltage signal is output such as to correspond to the signal level transmitted by the vertical signal lines 8-1, 8-2, . . . from the circuits of the transistors 26-1, 26-2, . . . and the transistors 28-1, 28-2, . . . . As shown in FIG. 62, corresponding pairs of the transistors 26-1, 26-2, . . . and the transistors 28-1, 28-2, . . . are connected at the positive side of the system electric source (DC voltage of a predetermined level) and at the side of the ground level such as to serially connect between the source and the drain. If the transistors 28-1, 28-2, . . . are turned on, the transistors 26-1, 26-2, . . . are driven such as to correspond to the signal level transmitted by the vertical signal lines 8-1, 8-2, . . . , so that a voltage in a range of DC voltage of a predetermined level. That is, the impedance is converted by the transistors 26-1, 26-2, . . . and the transistors 28-1, 28-2, . . . , thereby providing the noise canceler circuit with a voltage signal corresponding to the signal level transmitted by the vertical signal lines 8-1, 8-2, . . . .

The output from the impedance conversion circuit which is constituted by the transistors 26-1, 26-2, . . . and the transistors 28-1, 28-2, . . . is transmitted to the clamp capacitors 32-1, 32-2, . . . respectively connected to the vertical signal lines 8-1, 8-2, . . . through the sample/hold transistors 30-1, 30-2, . . . respectively mounted to the vertical signal lines 8-1, 8-2, . . . . When the sample/transistors 30-1, 30-2, . . . are turned on, the output from the impedance conversion circuit is transmitted to the corresponding clamp capacitors 32-1, 32-2, . . . , and is accumulated therein. By turning off the sample/hold transistors 30-1, 30-2, . . . , the transmission of the output from the vertical signal lines 8-1, 8-2, . . . can be stopped.

In the present device, during the imaging operation, the voltage of the common gate terminal 36 of the transistors 28-1, 28-2, . . . which constitute the impedance conversion circuit is brought into high level state, and are always in ON-state. The voltage of the common source terminal 38 of the clamp transistors 40-1, 40-2, . . . are always in low level. In this state, if an address pulse of high level (theoretical signal level "H") is applied to the horizontal (row) address line 6-1, the vertical selection transistor 65 of the unit cells P1-1-1, P-1-1-2, . . . connected to the horizontal address line 6-1 is turned on, so that the amplification transistor 64 and the load transistor 9-1, 9-2, . . . constitute the source follower circuit.

A voltage of any one of the photodiodes 62a and 62b which is selected by the selection transistors 63a and 63b can be applied to the gate of the amplification transistor 64. The amplification transistor 64 amplifies the voltage applied to its gate and outputs the same to the drain. Therefore, by selecting the photodiode 62a or 62b by the selection transistors 63a and 63b, the unit cell can output a voltage corresponding to a light receiving amount of its own photodiodes to the vertical (column) signal line 8-1 or 8,2 corresponding to the unit cell.

In the noise canceler circuit, the common gate 37 of the sample/hold transistors 30-1, 30-2, . . . which are constituent elements of the noise canceler circuit is brought into high level, thereby turning on the sample/hold transistors 30-1, 30-2, . . . . With this operation, the output from the vertical signal lines 8-1, 8-2, . . . , more strictly, the output from the vertical signal lines 8-1, 8-2, . . . which is impedance-converted through the impedance conversion circuit is transmitted to the clamp capacitors 32-1, 32-2, . . . .

In the noise canceler circuit, the common gate 42 of the clamp transistors 40-1, 40-2, . . . which are constituent elements of the noise canceler circuit is brought into high level by an amount of a predetermined time width at a predetermined cycle, thereby turning on the clamp transistors 40-1, 40-2, . . . . With this operation, the connection points of the clamp capacitors 32-1, 32-2, . . . and the sample/hold capacitors 34-1, 34-2, . . . which are constituent elements of the noise canceler circuit are brought into low level which is an application voltage level of the common source terminal 38 for the above-mentioned predetermined time width by the clamp transistors 40-1, 40-2, . . . , and the sample/hold capacitors 34-1, 34-2, . . . are lowered to a voltage level of the common source terminal 38. More specifically, one ends of the sample/hold capacitors 34-1, 34-2, are grounded and brought into ground level. In this state, the electric charge of the sample/hold capacitors 34-1, 34-2, . . . are at low level which is a voltage level of the common source terminal 38 and therefore, the accumulated electric charge of the sample/hold capacitors 34-1, 34-2, . . . are discharged and are stabilized at such a low level. This is the level in the reset state. If the above-mentioned predetermined time width is elapsed, the reset state is canceled.

Next, when a reset pulse of high level is applied to the reset line 7-1, the reset transistor 66 of the unit cells P1-1-1, P1-1-2, . . . connected to the reset line 7-1 is turned on. The reset transistor 66 is a circuit for resetting the electric charge at the input side of the amplification transistor 64. Therefore, with this resetting operation of the reset transistor 66, the electric charge of the input terminal of the output circuit 68 is reset. That is, the input of the output circuit 68 becomes zero.

Therefore, only the output component of the amplification transistor 64 which is the constituent element of the output circuit 68 is output. The output component of the amplification transistor 64 in this state is a noise component corresponding to a variation in threshold value of the amplification transistor 64 itself.

In this manner, by resetting the unit cells P1-1-1, P1-1-2, . . . , the output circuit 68 outputs, as an output signal, an output component of the amplification transistor 64 when there is no signal electric charge in the photodiode 62, i.e., a noise component corresponding to the variation in threshold value of the amplification transistor 64.

Next, the common gate 42 of the clamp transistors 40-1, 40-2, . . . which are constituent element of the noise canceler circuit is brought into low level (theoretical signal level "L"), and the clamp transistors 40-1, 40-2, . . . are turned off. By turning off the clamp transistors 40-1, 40-2, . . . , the connection points of the clamp capacitors 32-1, 32-2, . . . and the sample/hold capacitors 34-1, 34-2, . . . which are constituent elements of the noise canceler circuit are electrically separated or cut off, which makes a state in which the sample/hold capacitors 34-1, 34-2, . . . are capable of transmitting the output from the vertical signal lines 8-1, 8-2 . . . .

Therefore, the noise components appearing in the vertical signal lines 8-1, 8-2, . . . are accumulated in the serial capacitor which is constituted by the clamp capacitors 32-1, 32-2, . . . and the sample/hold capacitors 34-1, 34-2, . . . . A timing for being clamped is when the clamp pulse is turned off, which corresponds to a timing between the reset pulse and the PD selection pulse.

When the accumulation of the noise component is completed, the procedure is advanced to a sequence for reading out a signal component next. In the unit cells P1-1-1, P1-1-2, . . . , the signal electric charge is accumulated in the photodiodes 62a and 62b after resetting, and next, the signal electric charge is read out. This reading out operation is alternatively carried out for every accumulation sequence of the noise component in the following manner for example: the first reading is carried out for the photodiode 62a, then for the photodiode 62b after the accumulation sequence of the next noise component, and then for the photodiode 62a after the accumulation sequence of the next but one noise component.

For reading out the signal electric charge accumulated in the photodiode 62a, a selection pulse of high level is applied to the photodiode selection line 22-1. With this operation, an output signal of the photodiode 62a (i.e., signal electric charge component and noise component) is output from the output circuit 68 in the unit cells P1-1-1, P1-1-2, . . . , and are amplified by the amplification transistors 64 in the unit cells P1-1-1, P1-1-2, . . . , and output to the vertical signal lines 8-1, 8-2, . . . which correspond to the unit cells.

As described above, the noise component is always accumulated in the serial capacitor which is constituted by the clamp capacitors 32-1, 32-2, . . . and the sample/hold capacitors 34-1, 34-2, . . . . Therefore, appearing on the clamp nodes 41-1, 41-2, . . . which are the connection points of the serial capacitor is only a voltage of amount of variation of the vertical signal lines 8-1, 8-2, . . . , i.e., a signal obtained by subtracting noise component from signal component and noise component, i.e., a signal component voltage which is a detection output corresponding to a light receiving amount of the photodiode 62a.

By reading out only the noise component first and then, by reading out the signal component and noise component, it is also possible to simultaneously eliminate a random noise which is generated by the resetting operation.

Next, if the common gate 37 of the sample/hold transistors 30-1, 30-2, . . . is brought into low level. With this operation, these sample/hold transistors 30-1, 30-2, . . . are turned off, and with such off conditions, the output signal from the vertical signal lines 8-1, 8-2, . . . to the noise canceler circuit is cut off.

Therefore, the sampling operation in the serial capacitor constituted by the clamp capacitors 32-1, 32-2, . . . and the sample/hold capacitors 34-1, 34-2, . . . are completed, and an electric charge which has been accumulated up to the current time is held in the serial capacitor constituted by the clamp capacitors 32-1, 32-2, . . . and the sample/hold capacitors 34-1, 34-2, . . . . Therefore, the voltage with no noise appearing on the clamp nodes 41-1, 41-2, . . . is accumulated in the sample/hold capacitors 34-1, 34-2, . . . , and is held.

Thereafter, by sequentially applying the horizontal address pulse to the horizontal selection transistors 12-1, 12-2, . . . , a signal of the photodiode 62a (or 62b) which is accumulated in the sample/hold capacitors 34-1, 34-2, . . . and which has no noise is read out from the signal output terminal (horizontal signal line) 15.

As described above, a pixel signal having the fixed-pattern noise can be obtained, by first reading out only the noise component, then reading out the signal component and noise component to obtain only pixel signal component for each of the unit cells, and by outputting the pixel signal component to the signal output terminal 15, through the transistors 12-1, 12-2, . . . which are on/off controlled in a reading out sequence in accordance with a sequence of the television scanning by the horizontal address circuit 13.

The reading out operation of the signal of the photodiode 62a is completed.

An operation after the reading out operation of the signal of the photodiode 62a is to read out a signal of the photodiode 62b.

First, an address pulse of high level is applied to the vertical (column) address line 6-1. At this time, a selection pulse of high level is applied to the photodiode selection line 24-1 instead of the photodiode selection line 22-1, and an output signal of the photodiode 62b is output from the output circuit 68. Other operations are the same as the above-described series of operations when the signal of the photodiode 62a is read out.

After that, by similarly repeating the above-described operations for each of the horizontal address lines 6-2, 6-3, . . . , it is possible to take out the signals of all of the cells which are arranged in the form of the two-dimensional matrix.

If one unit cell corresponds to one pixel as in the conventional device and thus, the operation sequence reads out the detection signal of the photodiode in the unit cell during one frame period only once, an output circuit of the unit cell of a MOS-type solid-state imaging device as used in the present invention whose unit cell corresponds to a plurality of pixels can read out only one pixel, i.e., a detection signal of only one photodiode, and can not read out detection signals of a plurality of photodiodes in the unit cell within one frame period.

However, according to the driving method of the MOS-type solid-state imaging device of the present embodiment, the vertical selection transistor 65 is turned once for every horizontal blanking period of each of an odd field and an even field during one frame period in the television scheme, thereby operating the output circuit 68. At the first turning-on operation (horizontal blanking period in a raster scanning position corresponding to pixel in the odd field), a detection signal of the photodiode 62a can be read out, and at the second turning-on operation (horizontal blanking period in a raster scanning position corresponding to pixel in the even field), a detection signal of the photodiode 62b can be read out. Therefore, it is possible to drive the MOS-type solid-state imaging device in which the unit cell is finely divided.

As described above, if the output circuit is not operated twice or more during one frame period, detection signals of all of the photodiodes can not be read out. Further, if a detection signal is once read out, and the output circuit is not reset before a detection signal is read out next time, a signal read out at the previous time will be superposed on a signal which is to be read out next time.

Further, the MOS-type solid-state imaging device of the present embodiment has a feature that a reset transistor 66 for charging/discharging electricity is connected to the gate of the amplification transistor 64, and a potential of the photodiode is reset through the photodiode selection transistor 63. This feature exhibits a merit that the number of transistors per one unit cell can be reduced as compared with a case in which one amplification transistor 64 is connected to each of the photodiodes 62a and 62b.

Furthermore, in the present embodiment, the unit cell is provided therein with two photodiodes which constitute light receiving portions, and the two photodiodes commonly include one set of output circuits. Therefore, when the MOS-type solid-state imaging device of the present embodiment is applied for imaging of a television, the number of reading out an electric charge signal using the amplification transistor 64 during one horizontal blanking period is one and thus, it is easy to drive the drive. In short, the feature of the present embodiment is that a direction of reading out and a direction of commonly possession are different from each other.

A sequence in the timing chart of FIG. 62 will be described below. The following three sequences are required:

(1) Rise of vertical address→Fall of reset pulse→Fall of clamp pulse→Rise of photodiode selection pulse→Fall of photodiode selection pulse→Fall of sample/hold pulse→Fall of vertical address (2) Rise of sample/hold pulse→Rise of photodiode selection pulse (3) Rise of clamp pulse→Rise of photodiode selection pulse Although the order of the rise of vertical address, the rise of sample/hold pulse, the rise of clamp pulse and the rise of reset pule can be arbitrarily set, the following order is preferable:

Rise of vertical address→Rise of sample/hold pulse→Rise of clamp pulse→Rise of reset pule In this manner, according to the operation in FIG. 62, appearing on the clamp node 41 is a voltage corresponding to a difference between a voltage when there is no signal due to a reset operation (i.e., when there is no photodiode output signal component and only the noise component exists) and a voltage when there is a signal (i.e., when there exist photodiode output signal component+noise component). Therefore, a fixed-pattern noise due to a variation in threshold value of the amplification transistor 64 is compensated. That is, a circuit comprises the clamp transistor 30, the clamp capacitor 31, the sample/hold transistor 40 and the sample/hold capacitor 34 functions as the noise canceler circuit.

The noise canceler circuit of the present embodiment is connected to the vertical signal line 8 through the impedance conversion circuits 26 and 28 comprising the source follower circuit. That is, the vertical signal line 8 is connected to the gate of the transistor 26. A gate capacitor of the transistor 26 is extremely small, and in a practical sense, a charging of only vertical signal line will suffice for the amplification transistor 64 of the cell. Therefore, the time constant of CR is short, and CR will immediately be brought into normal state. Therefore, it is possible to quicken the timing for applying the reset pulse and the photodiode selection pulse, and to carry out the noise canceling operation in a short period of time.

In the case of television signal, it is necessary to carry out the noise canceling operation within a horizontal blanking period of the television scanning, and the ability to accurately cancel the noise in a short period of time as in the present embodiment is a great merit. Further, impedances of the noise canceler circuit as viewed from the unit cell are the same between a case when noise component is output and a case when signal component and noise component are output, both included in the noise canceling operation. Therefore, it is possible to accurately cancel the noise.

That is, impedances of the noise canceler circuit as viewed from the unit cell are substantially the same between a case when noise component is output and a case when signal component and noise component are output, both included in the noise canceling operation. Therefore, the noise components of both the cases are substantially the same, and if a difference in noise component between both the cases is eliminated, it is possible to accurately eliminate the noise output and to take out only the signal component. Further, if the noise canceler circuit is viewed from the unit cell, only the gate capacitor can be seen in view of impedance, and its volume is extremely small. Therefore, it is possible to reliably cancel the noise in a short period of time.

A device structure of the MOS-type solid-state imaging device of the present embodiment will be described next.

As is apparent from the circuit structure shown in FIG. 57, because the clamp capacitor 32 and the sample/hold capacitor 34 are directly connected and are close to each other, they can be stacked on the same surface, and the unit cell can be reduced in size.

More specifically, as shown in FIG. 24, a first electrode 76 is formed on a silicon substrate 72 through a first insulating film 74 to form the sample/hold capacitor 34. Further, a second electrode 80 is formed on the first electrode 76 through a second insulating film 78 to form the clamp capacitor 32.

As is also apparent from FIG. 24, the first electrode 76 serves as a common electrode, and the clamp capacitor 32 and the sample/hold capacitor 34 are stacked on each other, the same capacitance value as that obtained when these components are formed separately can be obtained with ½ the area.

In this embodiment, the unit cells P1-1-1, P1-1-2, . . . and peripheral circuits such as the vertical address circuit 5 and the horizontal address circuit 13 are formed on a semiconductor substrate having a p$^+$-type impurity layer formed on a p$^-$-type substrate.

FIGS. 25A and 25B are sectional views showing such a semiconductor substrate. As shown in these drawings, cell elements such as photodiodes 83 are formed on a semiconductor substrate having a p$^+$-type impurity layer 82 formed on a p$^-$-type substrate 81.

With this structure of the semiconductor substrate, the diffusion potential at the p$^-$/p$^+$ boundary can partly prevent a dark current generated in the p$^-$-type substrate 81 from the flowing to the p$^+$-layer side.

The result of a detailed analysis of the flows of electrons will be briefly described below. Apparently, a thickness L of the p$^+$-type impurity layer 82 is increased by p$^+$/p$^-$ concentration ratio times, i.e., to L·p$^+$/p$^-$, from the viewpoint of an electron generated on the p$^-$ side.

As shown in FIG. 25B, apparently, the distance from the p$^-$-type substrate 81 as a dark current source to the photodiode 83 is increased p$^+$/p$^-$ times. In addition to the dark current flowing from a deep part of the substrate, a dark current is generated in a depletion layer near the photodiode 83. This dark current generated in the depletion layer is almost equal to magnitude to the dark current flowing from the deep part of the substrate. The thickness of the depletion layer is about 1 μm, and the dark current flowing from the deep part of the substrate also flows from a depth of about 100 μm. This depth is called the diffusion length of an electron in a p-type semiconductor. The reason why these dark currents are almost equal in magnitude regardless of this thickness difference is that the probability of occurrence of a dark current per unit volume is high in the depletion layer. In this case, since the dark current generated in the depletion layer cannot be theoretically separated from a signal current, the dark current is reduced by reducing a component flowing from the deep part of the substrate.

In addition, since cells are formed on the semiconductor substrate having the p$^+$-type impurity layer 72 formed on the p$^-$-type substrate 71, variations in substrate potential due to the dark current can be prevented and as a result, the noise reduction circuit (noise canceler circuit) can normally be operated. The p-type substrate is thick and hence has a high resistance. As will be described later, a noise reduction circuit can be reliably operated.

When the element temperature rises, the component from the deep part of the substrate abruptly increases. This is therefore important. It suffices if the component from the deep part of the substrate is sufficiently smaller that the component generated in the depletion layer. More specifically, it suffices if the dark current from the deep part of the substrate is about $1/10$ or less of the dark current from the depletion layer. That is, $p^+/p^-$ may be set to 10 to set the component from the deep part of the substrate to about $1/10$.

In a semiconductor substrate constituted by an n-type substrate and a p-type well, there is almost no dark current from a deep part of the substrate. To set the dark current to the same level as in such a semiconductor substrate, $p^+/p^-$ must be set to 100 to set the dark current from the deep part of the substrate to about $1/100$.

In a conventional practical CCD, the impurity concentration of an n-type buried channel is about $10^{16}$ cm$^{-3}$, and the impurity concentration of a p-type layer (p-type substrate in this case) surrounding the buried channel, which is set to stably manufacture the diffusion layer of the buried channel, is about $10^{15}$ cm$^{-3}$.

When $p^+/p^-$ is set to 10, the impurity concentration of the $p^+$-type layer becomes about $10^{16}$ cm$^{-3}$. When $p^+/p^-$ is set to 100, the impurity concentration of the $p^+$-type layer becomes about $10^{17}$ cm$^{-3}$. That is, the impurity concentration of the $p^+$-type layer becomes almost equal to that of the n-type buried channel, i.e., about $10^{16}$ cm$^{-3}$, or becomes higher than that by one order in magnitude.

Therefore, in a conventional practical CCD, the use of a $p^+$-type layer having such an impurity concentration has not been considered. If the impurity concentration of the $p^-$-type layer is decreased, the sheet resistance of the substrate undesirably increased.

However, there is no buried channel of CCD in the amplification-type MOS imaging device, the value of $p^+/p^-$ can be arbitrarily set to a certain degree without decreasing the impurity concentration of the $p^-$-type layer.

Cells can also be formed by improving the structure of a semiconductor substrate constituted by an n-type substrate and a p-type well by decreasing the resistance of the p-type well.

FIG. 26 is a sectional view showing a unit cell using a $p^+$-type well 86 having a low sheet resistance on an n-type substrate 85. FIG. 27 is a sectional view showing a unit cell of a CCD.

To stably manufacture a CCD, the impurity concentrations of an n-type substrate 87, a p-type well 86, and an n-type buried channel 89 of the unit cell are respectively set to about $10^{14}$ cm$^{-3}$, about $10^{15}$ cm$^{-3}$, and about $10^{16}$ cm$^{-3}$.

Since the impurity concentration of an n-type photodiode 90 can be arbitrarily set to a certain degree, no many limitations are imposed in terms of manufacture. With the above impurity concentrations, the sheet resistance of the p-type well 86 is about 100 kΩ/□. As described above, with such a large value, the noise caused in the CCD is very small.

When a noise reduction circuit (noise canceler circuit) is to be used in an amplification-type MOS imaging device, the sheet resistance of the p-type well is very important. This is because, the time taken to suppress disturbances in the potential of the p-type well 86 due to a reset pulse needs to match a system to which this apparatus is to be applied.

In the case of the television scheme, a horizontal blanking interval is provided, and an image signal is not sent during this interval. Therefore, it is necessary to suppress, to a certain level, the disturbances in the potential of the p-type well 86 due to the above-mentioned reset pulse. Accordingly, in the NTSC scheme, which is the existing television scheme, the noise reduction circuit (noise canceler circuit) is operated in an interval of about 11 (μs), which is a horizontal blanking interval. Disturbances in the potential of the p-type well 86 must be suppressed to about 0.1 (mV) within this interval.

Such a small value as 0.1 (mV) is set because the noise voltage output of the CCD corresponds to this. According to a detailed analysis, to settle the disturbances to a value as small as 0.1 (mV) within the very short time interval of 11 (μs), the sheet resistance of the p-type well 86 must be set to 1 kΩ/□ or less. This is about $1/100$ the sheet resistance of the conventional CCD.

For this purpose, the impurity concentration of the p-type well 86 must be increased to about 100 times. Such a concentration can not be set in the CCD, as described above with reference to the p-type substrate. Furthermore, in the high-vision television scheme, the horizontal blanking interval is 3.77 (μs), and hence the sheet resistance of the p-type well 86 must be set to 300 kΩ/□ or less.

As another modification, a semiconductor substrate may be obtained by forming a heavily doped $p^+$-type sandwich layer on a substrate, and forming a lightly doped p-type layer on the surface of the sandwich layer.

FIG. 28 shows the structure of a semiconductor substrate having a $p^+$-type sandwich layer 92 formed between a $p^-$-type substrate 91 and a p-type layer 93. FIG. 29 shows a semiconductor substrate having a $p^+$-type sandwich layer 96 formed between an n-type substrate 95 and a p-type layer 97.

Such a $p^+$-type sandwich layer can be formed by a high-acceleration megavolt ion implantation apparatus.

In addition to photodiodes 83, transistors, and the like as the constituent elements of unit cells, peripheral circuits such as a horizontal address circuit and a vertical address circuit are also formed on the above p-type layer.

FIG. 30 shows the structure of a semiconductor substrate obtained by surrounding a photodiode 83 with a heavily doped p-type well 103 and forming other portions on an n-type substrate 101 using another p-type well 102.

The use of this structure can prevent a dark current from leaking into the photodiode 83. Note that the semiconductor substrate 101 may be a $p^-$-type substrate.

The concentration of the p-type well, which forms some or all of the horizontal and vertical address circuits around the cell, is determined in terms of circuit design, and differs from the optimum value of the cell. Therefore, a p-type layer may be formed independently of the p-type well which forms the imaging region.

Figure 63:
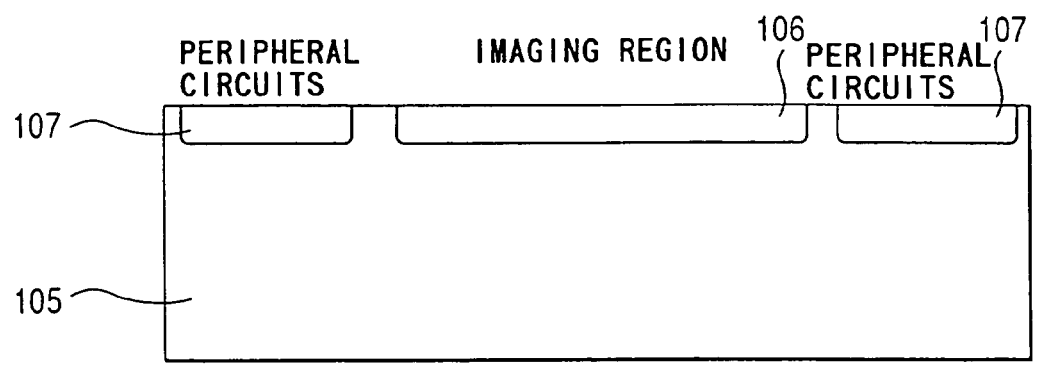
FIG. 63 is a circuit diagram of the semiconductor substrate of the unit cell of a modification of the twenty-fifth embodiment.

FIG. 63 shows the structure of a semiconductor substrate obtained by forming a p-type well 106, which forms an imaging region, on an n-type substrate 105, and separately forming another p-type well 107, which forms peripheral circuits.

With this structure, p-type wells suited for the respective constituent elements can be formed. Note that the n-type substrate 105 may be a $p^-$-type substrate.

Figure 64:
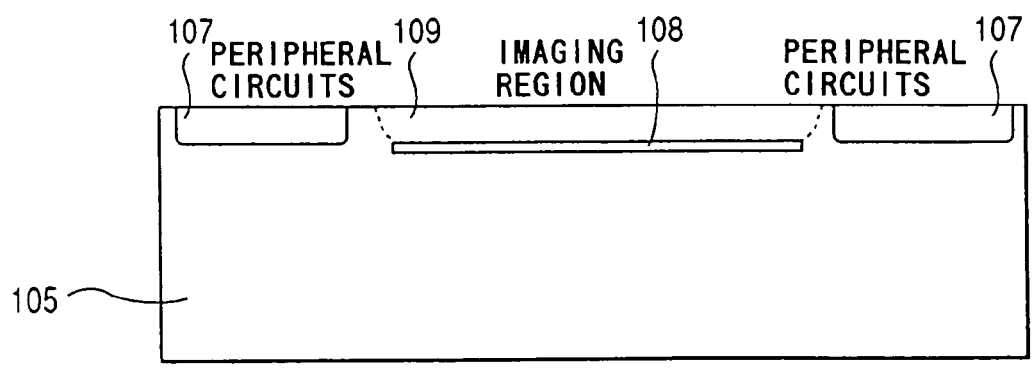
FIG. 64 is a circuit diagram of the semiconductor substrate of the unit cell of another modification of the twenty-fifth embodiment.

FIG. 64 shows a structure in which a $p^+$-type sandwich layer 108, which forms an imaging region, and a lightly doped p-type layer 109 are formed on an n-type substrate 105, and another p-type well 107 is formed on a peripheral circuit portion.

With this structure, p-type wells suited for the respective constituent elements can be formed, and leakage of a dark current into the photodiode can be prevented. Note that the n-type substrate 105 may be a $p^-$-type substrate.

As described above, according to the present embodiment, a plurality of (two, in the illustrate embodiment)

photodiodes disposed adjacent to each other in a vertical (column) direction commonly possess a single output circuit and hence, it is possible to finely divide an area of a unit cell. The number of photodiodes which commonly possess the output circuit is not limited to two, and the number may be three or more.

Figure 65:
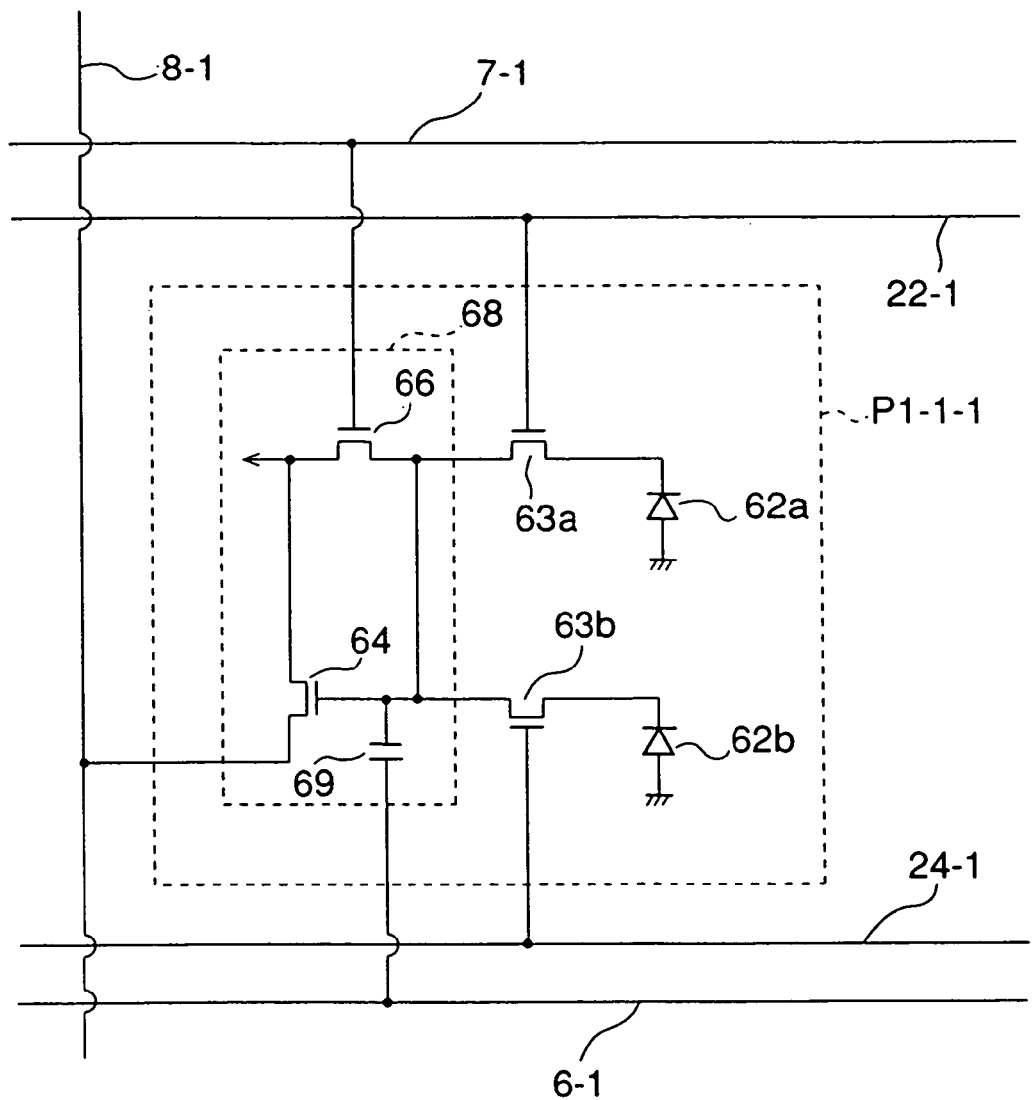
FIG. 65 is a circuit diagram of a modification of an output circuit of the unit cell of the twenty-fifth embodiment.

Further, as a modification of the output circuit 68, a vertical selection capacitor 69 may be provided instead of the vertical selection transistor 66 as shown in FIG. 65. With this structure, it is possible to further reduce the number of the constituent transistors per a unit cell. Therefore, the number of transistors required per a pixel can be reduced, which is advantageous for finely divide the cell.

If a high level voltage is applied to the address line 6-1, the gate voltage of the amplification transistor is shifted to the side of high voltage. Because gate voltages of the amplification transistors of unit pixels which are adjacent to each other remain low, which is address to the vertical signal line 8-1 so that a signal of the amplification transistor appears.

In addition, since an output from each unit cell is output through the noise canceler circuit, fixed pattern noise due to threshold variations of the amplification transistor of each unit cell can be removed. In the present embodiment, an output of the unit cell is output through the noise canceler circuit of the present invention which is capable of operating at high speed. Therefore, even if the MOS sensor is applied to an animation imaging device, it is possible to remove the fixed-pattern noise due to the threshold variations of the amplification transistor of the unit cell within every frame of within a time period limited for every frame. Therefore, it is possible to provide an amplification-type MOS solid-state imaging device which is sufficiently utilized even for the television scheme. Further, in the noise canceler circuit, the clamp capacitor 32-1, 32-2, . . . (simply referred to 32, the same is applied to other reference numerals having appendixes) and the sample/hold capacitor 34 are directly and closely connected to each other so that they can be stacked on the same portion. Therefore, the capacitors can be small in size.

Further, the noise canceler circuit is provided with the impedance conversion circuit, and the output of the unit cell is supplied to the noise canceler circuit through the impedance conversion circuit so that the impedance of the noise canceler circuit substantially remains the same, viewing from the unit cell, at the time of outputting noise component and at the time of outputting signal component and noise component. Therefore, the noise components of both the cases are substantially the same, and if the subtraction of the two outputs is performed, the noise output can be exactly canceled so that only the signal component can be output. Therefore, it is possible to accurately cancel the noise. The impedance of the noise canceler circuit is regarded as only a gate capacitance viewed from the unit cell and thus is very small. Therefore, it is possible to exactly cancel the noise in a short period of time.

More specifically, according to the noise canceler circuit described in the present embodiment, in the impedance conversion circuit constituted by the transistors 26-1 and 28-1, 26-2 and 28-2, and 26-3 and 28-3, the transistors 28-1, 28-2, 28-3, . . . function as switches for turning on or off the operation of the impedance conversion circuit, and the transistors 26-1, 26-2, 26-3, . . . function to transmit the output signals from the vertical signal lines 8-1, 8-2, 8-3, . . . . The transistors 26-1, 26-2, 26-3, . . . are finely formed on the semiconductor substrate so that the gate capacitor can be mad small. Because the gate capacitor can be made small, the time constant of CR can be shortened when the noise canceler circuit operates. Timing for applying the reset pulse and the photodiode selection pulse can be quickened. This is advantageous for operate the noise cancellation in a short period of time, and is also advantageous when the noise cancellation operation needs to be completed within a horizontal blanking period of the television scanning, like the television signal.

When the noise canceler circuit indicated in the present embodiment is formed into an integrated circuit, if a substrate comprising a p$^-$-type impurity substrate and a p$^+$-type impurity substrate formed on the p$^-$-type impurity substrate is used as a semiconductor substrate forming the unit cell, it is possible to reduce the dark current following into the unit cell, and to stabilize a potential on a surface of the substrate. Therefore, it is possible to reliably operate the noise cancer circuit to reliably eliminate a noise.

Therefore, according to the present embodiment, it is possible to provide a reliable noise canceler circuit which can be made small in size, can operate at high speed and can reliably eliminate a noise. By incorporating this noise canceler circuit into an amplification-type MOS sensor, it is possible to provide a reliable amplification-type MOS solid-state imaging device which can be made small in size, can operate at high speed and can reliably eliminate a noise.

Twenty-sixth Embodiment

A twenty-sixth embodiment will be described next. This is an embodiment in which a portion of the noise canceler circuit in twenty-fifth embodiment is modified.

Figure 66:
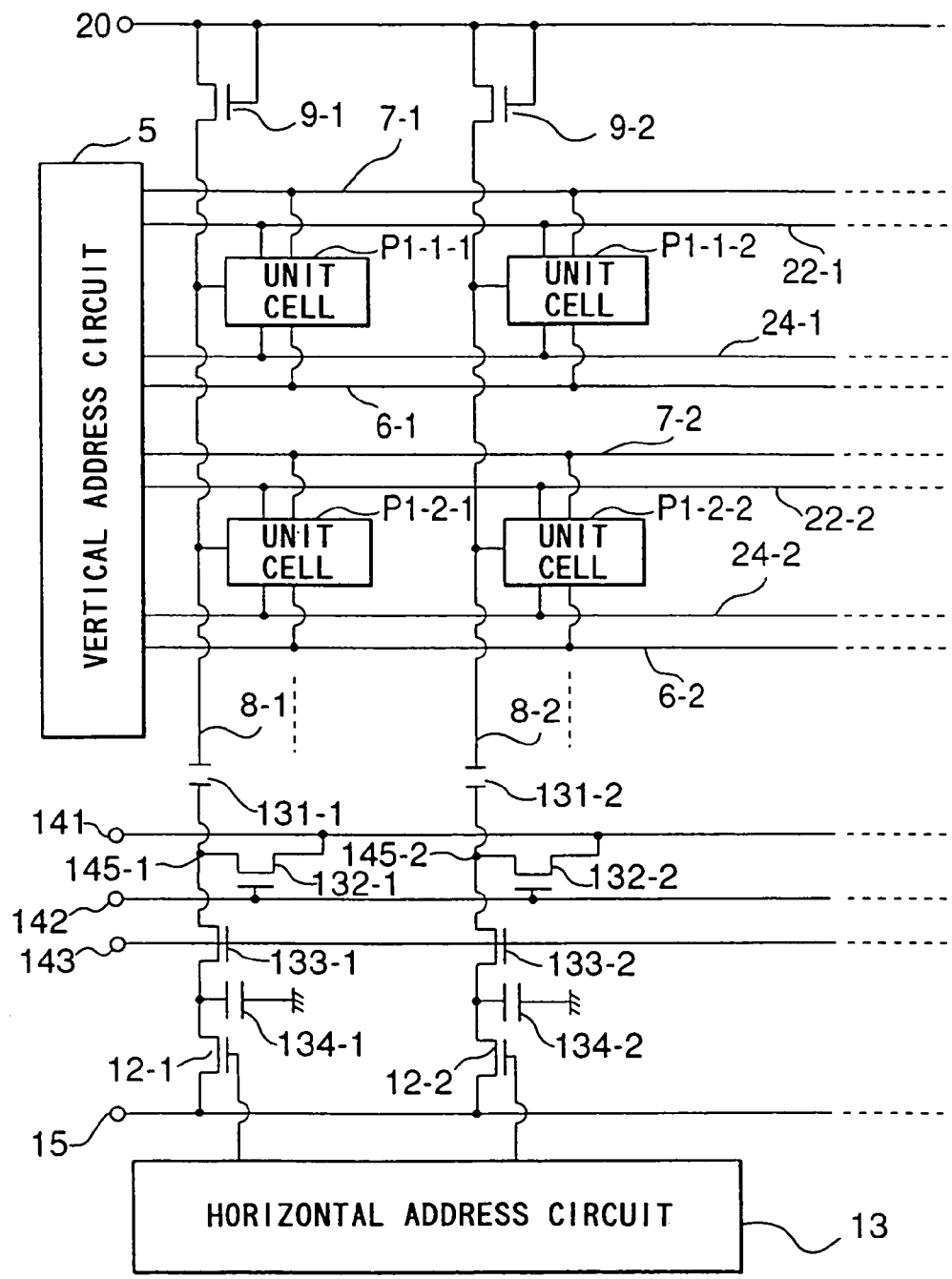
FIG. 66 is a circuit diagram showing the arrangement of an MOS-type solid-state imaging device according to a twenty-sixth embodiment of the present invention.

FIG. 66 is a circuit diagram showing the arrangement of an imaging device using an amplification-type MOS sensor according to the twenty-sixth embodiment of the present invention. In the present embodiment, the circuit arrangement in the vicinity of a unit cell P1-i-j is the same as that in the twenty-fifth embodiment.

Other ends of the vertical signal lines 8-1, 8-2, . . . are connected to the signal output terminal (horizontal signal line) 15 through the clamp capacitors 131-1, 131-2, . . . , the clamp transistors 132-1, 132-2, . . . and the horizontal selection transistors 12-1, 12-2, . . . which are respectively mounted to the vertical signal lines 8-1, 8-2, . . . .

Unlike the noise canceler circuit of twenty-fifth embodiment, in the present embodiment, the clamp capacitors 131-1, 131-2, . . . are directly connected to the corresponding vertical signal lines 8-1, 8-2, . . . . Drains of the clamp transistors 132-1, 132-2, . . . are connected to portions between the clamp capacitors 131-1, 131-2, . . . and the sample/hold transistors 133-1, 133-2, . . . .

Sources of the clamp transistors 132-1, 132-2, . . . are connected to the common source terminal 141, and the gates are connected to the common gate terminal 142. Connection points between the sample/hold transistors 133-1, 133-2, . . . and the horizontal selection transistors 12-1, 12-2, . . . are grounded through the sample/hold capacitors 134-1, 134-2, . . . .

Figure 67:
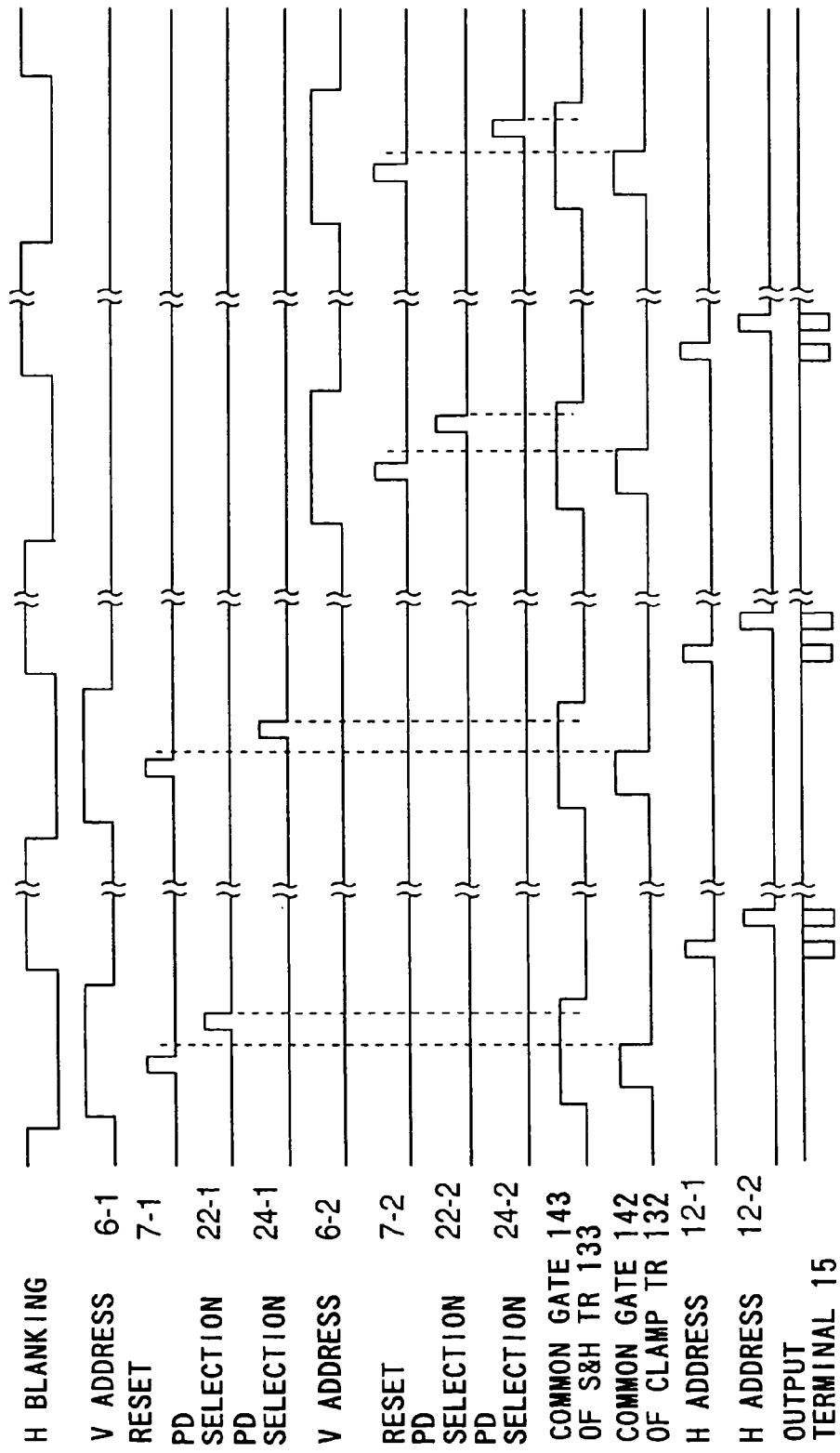
FIG. 67 is a timing chart showing the operation of the twenty-sixth embodiment.

With reference to a timing chart in FIG. 67, an operation of the MOS-type solid-state imaging device arranged as described above will be explained next. The common source terminal 141 of the clamp transistor is driven by direct current and therefore, these elements are omitted in the timing chart.

The unit cells are the same as those shown in FIG. 61.

If an address pulse of high level is applied to the horizontal address line 6-1, the vertical selection transistors 66 of the unit cells P1-1-1, P1-1-2, . . . connected to the address line 6-1 are turned on to form a source follower circuit by the amplification transistor 62 and the load transistors 9-1, 9-2, . . . .

The common gate 143 of the sample/hold transistors 133-1, 133-2, . . . are brought into high level to turn on the sample/hold transistors 133-1, 133-2, . . . . After that, the common gate 142 of the clamp transistors 132-1, 132-2, . . . are brought into high level to turn on the clamp transistors 132-1, 132-2, . . . .

Next, when a reset pulse of high level is applied to the reset line 7-1, the reset transistors 66 of the unit cells P1-1-1, P1-1-2, . . . are turned on to reset an electric charge of the input terminal of the output circuit 68. Therefore, the output circuit 68 outputs noise components corresponding to threshold variations of the amplification transistor 64 when there is no signal electric charge in the photodiode 62.

Then, the common gate 142 of the clamp transistors 132-1, 132-2, . . . are brought into low level to turn off the clamp transistors 132-1, 132-2, . . . .

Therefore, the noise components appearing on the vertical signal lines 8-1, 8-2, . . . are accumulated in the clamp capacitors 131-1, 131-2, . . . . In each of the unit cells P1-1-1, P1-1-2, . . . , the photodiode 62a is accumulating the signal electric charge after resetting operation, and this is read out next. For this purpose, a selection pulse of high level is applied to the photodiode selection line 22-1. Then, an output signal (i.e., signal electric charge component and noise component) of the photodiode 62a from the output circuit 68.

As described above, because noise component has already been accumulated in each of the clamp capacitors 131-1, 131-2, . . . , appearing on the clamp node 145 is only voltage of an amount corresponding to variations of the vertical signal lines 8-1, 8-2, . . . , i.e., only signal voltage free from a fixed-pattern noise obtained by subtracting noise component from signal component and noise component. the sample/hold transistors 133-1, 133-2, . . . have been turned on, and the same signal voltages have appeared on the ends of the sample/hold capacitors 134-1, 134-2, . . . .

The common gate 143 of the sample/hold transistors 133-1, 133-2, . . . is brought into low level to turn off the sample/hold transistors 133-1, 133-2, . . . . Therefore, the voltage which is free from noises appearing on the clamp node is accumulated in the sample/hold capacitors 134-1, 134-2, . . . .

Thereafter, by sequentially applying a horizontal address pulse to the horizontal selection transistors 12-1, 12-2, . . . , signals of the photodiode 62a which are accumulated in the sample/hold capacitors 134-1, 134-2, . . . and which are free from noises are read out from the signal output terminal (horizontal signal line) 15.

Next, when an address pulse of high level is applied to the horizontal address line 6-1, a selection pulse of high level is applied to the photodiode selection line 24-1 instead of the photodiode selection line 22-1, thereby outputting an output signal from the output circuit 68 to the photodiode 62b. Other operations are the same as those described above.

Thereafter, by repeating the above-described operations for each of the horizontal address lines 6-2, 6-3, . . . , signals of all of the cells arranged into the form of two-dimensional matrix can be taken out.

In the noise canceler circuit of twenty-sixth embodiment, even if an accuracy of the noise cancel is not sufficient, it is possible to provide a noise canceler circuit which is capable of canceling noise with high accuracy, by providing the impedance conversion circuit of twenty-fifth embodiment, thereby impedance-converting an output of a unit cell, so as to substantially equalize the impedance of the noise canceler circuit as viewed from the unit cell at the time of outputting only noise component and at the time of outputting signal component and noise component, so that the noise components of both the cases become substantially the same.

Twenty-seventh Embodiment

Figure 68:
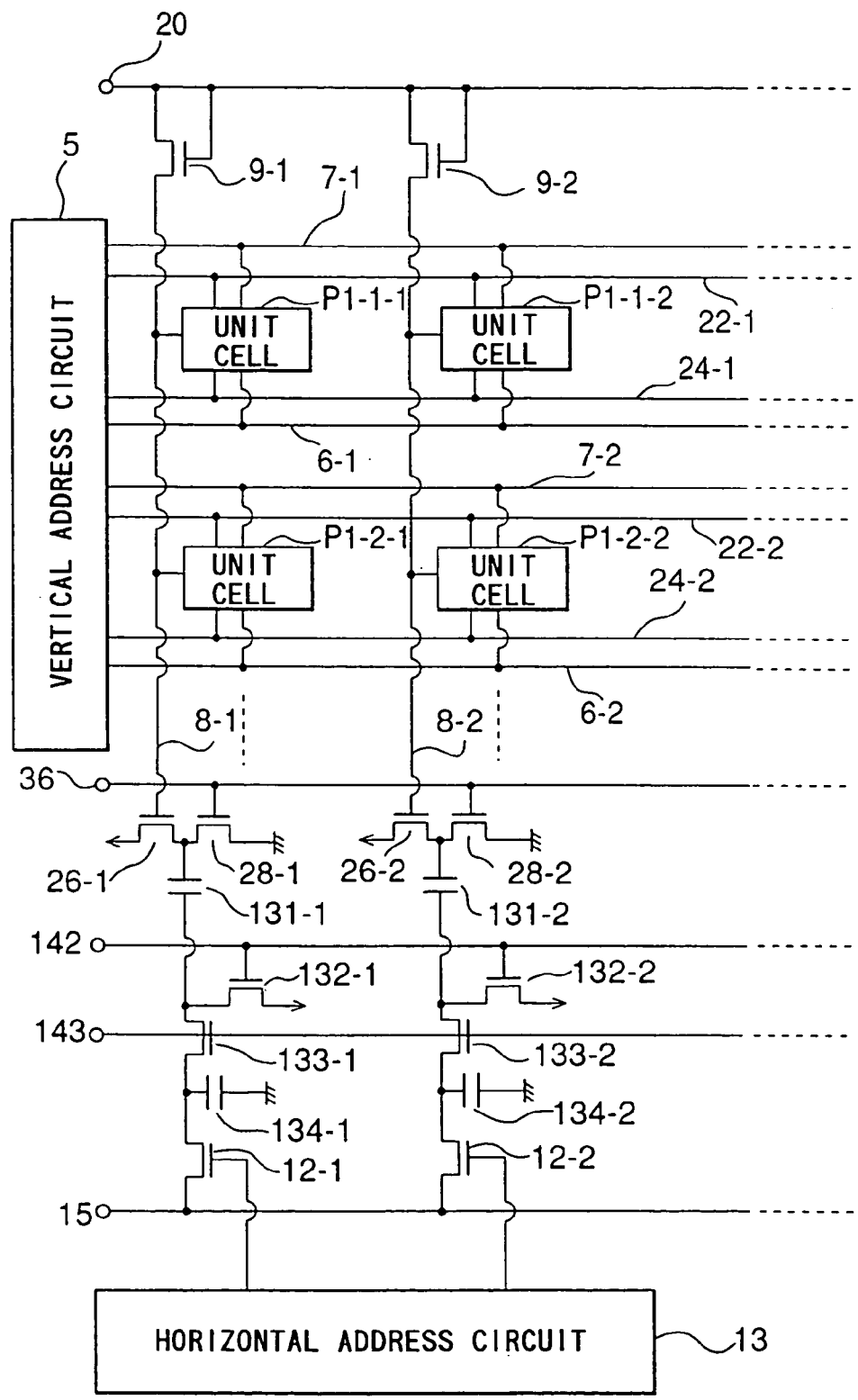
FIG. 68 is a circuit diagram showing the arrangement of an MOS-type solid-state imaging device according to a twenty-seventh embodiment of the present invention.

FIG. 68 is a circuit diagram showing the arrangement of an imaging device using an amplification-type MOS sensor according to the twenty-seventh embodiment of the present invention. In the present embodiment, the circuit arrangement in the vicinity of a unit cell P1-i-j is the same as that in the twenty-fifth embodiment.

In the present twenty-seventh embodiment, the impedance conversion circuit of twenty-fifth embodiment is connected to the noise canceler circuit of twenty-sixth embodiment. In the present embodiment, the common source of the clamp transistors 132 is driven by direct current.

In the noise canceler circuit of twenty-sixth embodiment, even if an accuracy of the noise cancel is not sufficient, it is possible to provide a noise canceler circuit which is capable of canceling a noise with high accuracy, by providing the impedance conversion circuit of twenty-fifth embodiment, thereby impedance-converting an output of a unit cell, so as to substantially equalize the impedance of the noise canceler circuit as viewed from the unit cell at the time of outputting only noise component and at the time of outputting signal component and noise component, so that the noise components of both the cases become substantially the same.

Twenty-eighth Embodiment

Figure 69:
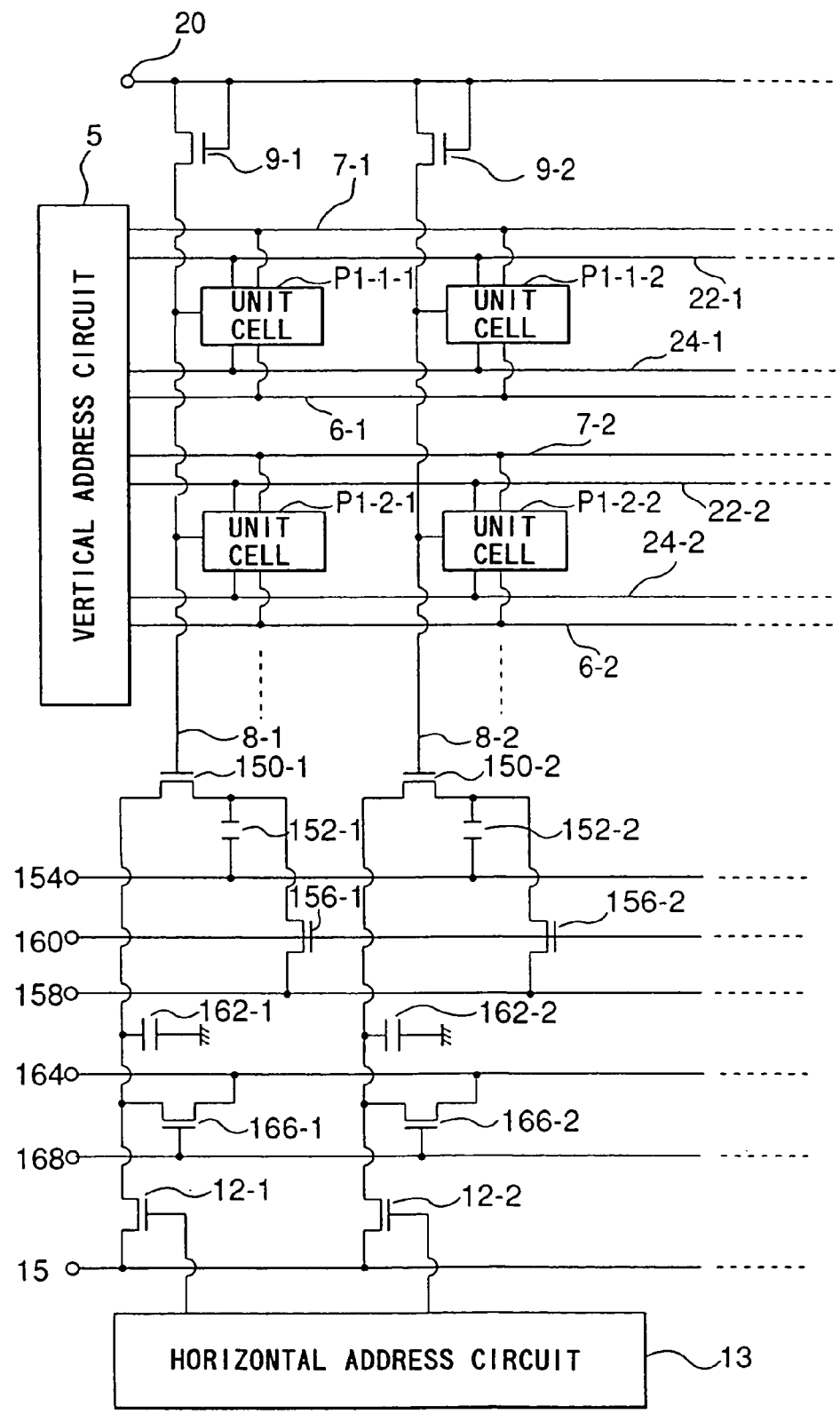
FIG. 69 is a circuit diagram showing the arrangement of an MOS-type solid-state imaging device according to a twenty-eighth embodiment of the present invention.

FIG. 69 is a circuit diagram showing the arrangement of an imaging device using an amplification-type MOS sensor according to the twenty-eighth embodiment of the present invention, in which a structure of the noise canceler circuit is changed. In the noise canceler circuit of the present twenty-eighth embodiment, voltages appearing on the vertical signal lines 8-1, 8-2, . . . are converted into electric charges through a gate capacitor of the slice transistor 150, and a subtraction is performed in an electric charge region, thereby suppressing noises.

That is, in twenty-fifth embodiment, noises are canceled in a voltage region, whereas, in twenty-eighth embodiment, noises are canceled in an electric charge region. The circuit arrangement in the vicinity of a unit cell P1-i-j is the same as that in the twenty-fifth embodiment.

In twenty-eighth embodiment, as shown in FIG. 69, the noise canceler circuit comprises the slice transistors 150-1, 150-2, . . . , slice capacitors 152-1, 152-2, . . . , slice reset transistors 156-1, 156-2, . . . , slice electric charge transmitting capacitors 162-1, 162-2, . . . , drain reset transistors 166-1, 166-2, . . . , and horizontal selection transistors 12-1, 12-2, . . . .

The slice transistors 150-1, 150-2, . . . are provided such as to respectively correspond to the vertical signal lines 8-1, 8-2, . . . , and each forming a pair. Portions of the slice transistors 150-1, 150-2, . . . at the side of the gates are connected to the corresponding vertical signal lines 8-1, 8-2, . . . , respectively. Each of the slice transistors 150-1, 150-2, . . . is connected to one of two ends of each of the vertical signal lines 8-1, 8-2, . . . which is opposite from the connection side with the load transistors 9-1, 9-2, . . . .

One ends of the slice capacitors 152-1, 152-2, . . . are connected to the corresponding slice transistors 150-1, 150-2, . . . at their source sides, respectively, and the other ends of the slice capacitors 152-1, 152-2, . . . are connected to the slice pulse supply terminals 154.

The slice transistors 150-1, 150-2, . . . are connected at their ends near the drain to the signal output terminal (horizontal signal line) 15 through source-drain of the corresponding horizontal (row) selection transistors 12-1, 12-2, . . . , respectively. The horizontal selection transistors 12-1, 12-2, . . . are driven by horizontal address pulses supplied from the horizontal address circuit 13.

In order to reset the source potentials of the slice transistors 150-1, 150-2, . . . , the slice reset transistors 156-1, 156-2, . . . are provided between the sources of the slice transistors 150-1, 150-2, . . . and the slice electric power source terminal 158. A slice reset terminal 160 is connected to gates of the transistors 156-1, 156-2, . . . . That is, the source sides of the slice transistors 150-1, 150-2, . . . are connected to the slice electric power source terminal 158 through source drains of the corresponding transistors 156-1, 156-2, . . . , respectively. The gate sides of the slice reset transistors 156-1, 156-2, . . . are connected to the slice reset terminal 160. The slice reset transistors 156-1, 156-2, . . . are turned on at the timing of the slice reset pulse supplied from the slice reset terminal 160, and the source potentials of the slice transistors 150-1, 150-2, . . . are reset.

One ends of the slice electric charge transmitting capacitors 162-1, 162-2, . . . are connected to the drains of the slice transistors 150-1, 150-2, . . . , respectively. The other ends of the slice electric charge transmitting capacitors 162-1, 162-2, . . . are grounded.

In order to reset the potential of the drains of the slice transistors 150-1, 150-2, . . . , drain reset transistors 166-1, 166-2, . . . respectively are connected to the slice transistors 150-1, 150-2, . . . between their drains and the accumulation drain electric power source terminal 164. That is, the slice transistors 150-1, 150-2, . . . are connected to the accumulation drain electric power source terminal 164 by the corresponding drain reset transistors 166-1, 166-2, . . . , respectively, between sources and drains of the drain reset transistors. Gates of the transistors 166-1, 166-2, . . . are connected to the drain reset terminal 168.

In this manner, the noise canceler circuit of the MOS sensor of twenty-eighth embodiment is characterized in that voltages appearing on the vertical signal lines 8-1, 8-2, . . . are converted to electric charges through gate capacitors of the slice transistors 150-1, 150-2, . . . , and a subtraction is performed in the electric charge region, thereby suppressing the noise. The noise canceler circuit having a system in which the noise are canceled in the electric charge region is connected to the unit cell P1-i-j which is the same as that of the twenty-seventh embodiment, thereby constituting a solid-state imaging device.

A driving method of the present embodiment will be described next.

Figure 70:
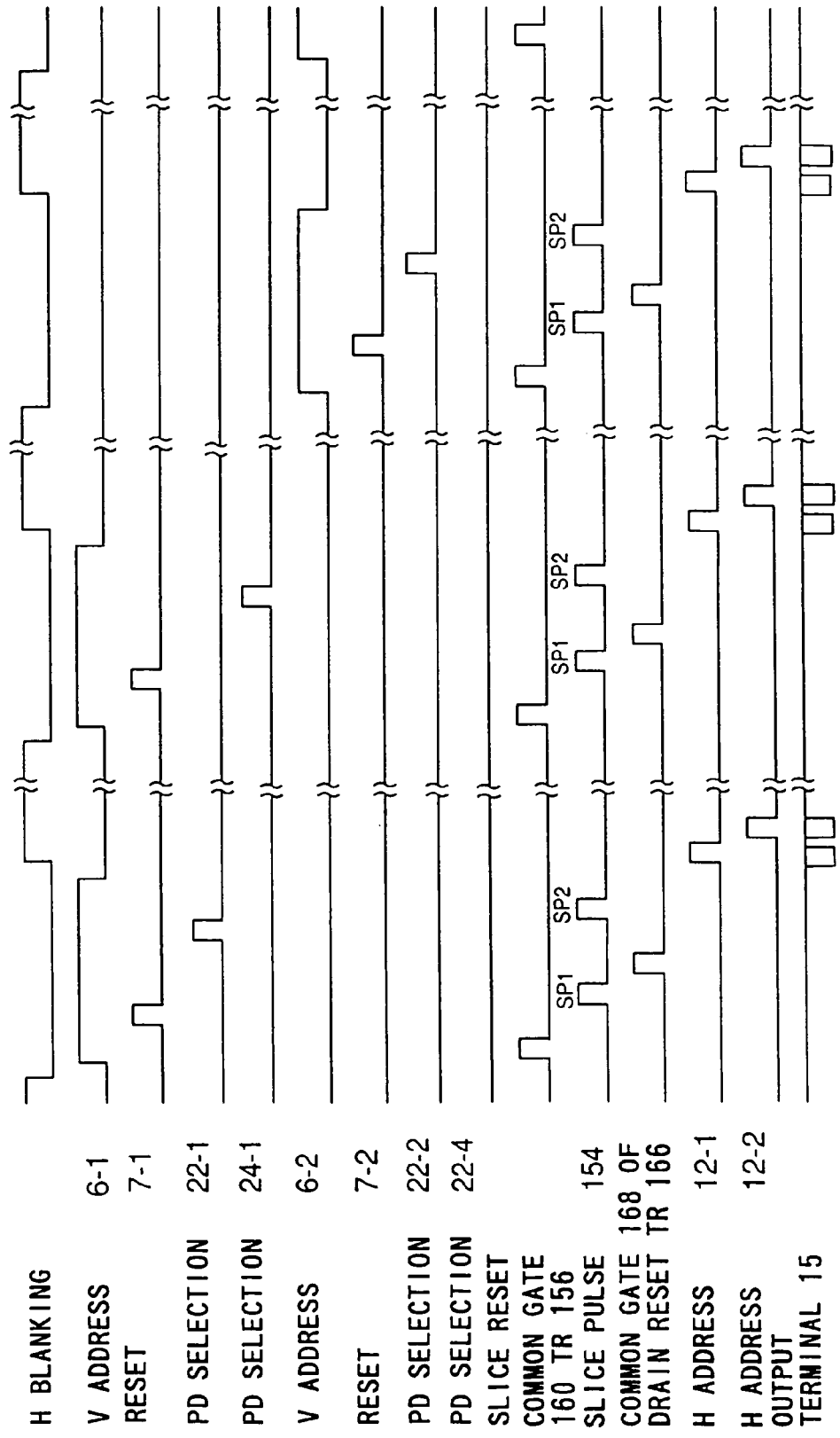
FIG. 70 is a timing chart showing the operation of the twenty-eighth embodiment.
Figure 71:
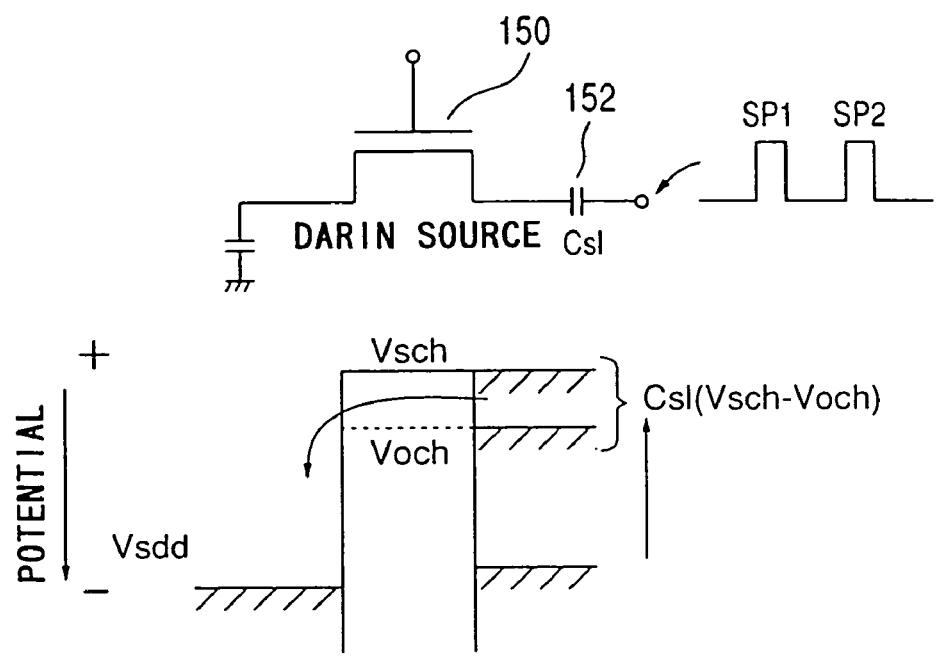
FIG. 71 is a potential chart of the slice transistor of the twenty-eighth embodiment.

FIG. 70 is a timing chart showing an operation of this embodiment. FIG. 71 shows potentials of the slice transistors 150-1, 150-2, . . . . Here, each of the slice transistors 150-1, 150-2, . . . is of a p-channel type.

First, a vertical address pulse of high level is applied to the horizontal address line 6-1 of the first line. With this operation, in each of the units cells of this line, the vertical selection transistor 66 belonging to each of the unit cells is turned on to form a source follower circuit by the amplification transistor 64 belonging to the corresponding to the unit cell and the load transistors 9-1, 9-2, . . . .

Next, a slice reset pulse is applied to the slice reset terminal 160 of the noise canceler circuit to turn on the slice reset transistors 156-1, 156-2, . . . , thereby initializing electric charges of the slice capacitors 152-1, 152-2, . . . .

When the slice reset pulse of the slice reset terminal 160 disappears, the slice reset transistors 156-1, 156-2, . . . are turned off, and the slice capacitors 152-1, 152-2, . . . are brought into a state where they can be electrically charged. Then, a first slice pulse SP1 is applied to the slice pulse supply terminal 154.

A reset pulse of high level is applied to the reset line 7-1 before or after the initialization of the slice capacitors 152-1, 152-2 . . . . With this operation, the reset transistor 66 of the unit cells P1-1-1, P1-1-2, . . . connected to the reset line 7-1 receives this reset pulse, and is turned on. Therefore, the output circuit 68 outputs a noise component corresponding to the threshold variation of the amplification transistor 64 when there is no signal electric charge in the photodiode 62. In the time charge in FIG. 70, this operation is carried out after the slice capacitors 152-1, 152-2, . . . are initialized, so that the noise component corresponding to the threshold variation of the amplification transistor 64 is output.

Because the slice reset transistors 156-1, 156-2, . . . are turned off, and the first slice pulse SP1 is applied to the slice pulse supply terminal 154, in each of the slice transistors 150-1, 150-2, . . . , the first slice electric charge is transmitted to the drain beyond a channel potential $V_{och}$ of own gate when no signal is presented (i.e., when there exists only noise component). At this time, a drain reset pulse is applied to the drain reset terminal 168. With this operation, the drain reset transistor 166 is turned on for a time period corresponding to the time width of the drain reset pulse and therefore, the drain potential is fixed to a potential $V_{sdd}$ for a time period corresponding to a time width of the accumulation drain electric power source terminal 164. Hence, during this time, the first slice electric charge is discharged into the accumulation drain electric power source terminal 164 through the drain reset transistor 166.

Thereafter, if a selection pulse of high level is applied to the photodiode selection line 22-1, the output circuit 68 of the unit cell outputs an output signal (i.e., signal electric charge component and noise component) of the photodiode 62a of the corresponding unit cell.

Then, a second slice pulse SP2 is applied to the slice pulse supply terminal 154. With this operation, in each of the slice transistors 150-1, 150-2, . . . , a second electric charge is transmitted to the drain beyond a channel potential $V_{och}$ of own gate to which a voltage when there exists a signal electric charge (voltage when there exist signal electric charge component and noise component) is added. At this time, because each of the drain reset transistors 166-1, 166-2, . . . are turned off, the second slice electric charge is transmitted to the slice electric charge transmitting capacitors 162-1, 162-2, . . . which are respectively connected to drains of the drain reset transistors 166-1, 166-2, . . . .

Next, horizontal selection pulses are sequentially applied to the horizontal selection transistors 12-1, 12-2, . . . from the horizontal address circuit 13, and a signal corresponding to one line is sequentially taken out from the signal output terminal (horizontal signal line) 15.

Then, the horizontal selection pulses are sequentially applied to the horizontal selection transistors 12-1, 12-2, . . . from the horizontal address circuit 13. With this operation, among the horizontal selection transistors 12-1, 12-2, . . . , those which received the horizontal selection pulse are turned on, and a signal corresponding to the accumulated electric charge of each of the slice electric charge transmitting capacitors 162-1, 162-2, . . . is output to the signal output terminal (horizontal signal line) 15. Because the horizontal selection pulses are sequentially applied to the horizontal selection transistors 12-1, 12-2, . . . from the horizontal address circuit 13 in this manner, signals corresponding to the electric charges accumulated in the slice electric charge transmitting capacitors 162-1, 162-2, . . . are sequentially output to the signal output terminal (horizontal signal line) 15. As a result, it is possible to output the signal of one line from the signal output terminal 15.

It is assumed that the leading edge position of the high level vertical address pulse of the horizontal address line 6-1 is indicated by P1, its trailing edge position by P2, the leading edge position of a signal of the reset line 7-1 by P3, its trailing edge position by P4, the leading edge position of the slice reset pulse applied to the slice reset terminal 160 by P5, its trailing edge position by P6, the leading edge position of the first slice pulse SP1 among the first and second slice pulses SP1 and SP2 applied to the slice pulse supply terminal 154 by P7, its trailing edge position by P8, the leading edge position of the second slice pulse SP2 by P9, its trailing edge position by P10, the leading edge position of the drain reset pulse applied to the drain reset terminal 168 by P11, and its trailing edge position by P12. The timing relationship between these signal positions are as follows:

P1<P6<P7<P8<P3<P4<P9<P10<P2, and
P8<P11<P12<P9, and more preferably,
P11<P12<P3<P4.

The sequential orders between P1 and P5, between P3 and P11, and between P4 and P12 can be arbitrarily set.

By sequentially repeating this operation for the next line and for subsequent lines, all the signals in the two-dimensional matrix arrayed unit cells can be read out.

In this device, if a value of the slice capacitor 152 is represented by $C_{s1}$, an electric charge (second slice electric charge) which is finally read out to the signal output terminal 15 is represented by $C_{s1} \times (V_{sch} - V_{och})$, and there appears an electric charge which is proportional to a difference between a case where there exists a signal electric charge and a case where a reset operation is conducted and there exists no signal electric charge. Therefore, a fixed-pattern noise due to the threshold variations of the amplification transistor 62 in the unit cell is suppressed.

A circuit which converts a voltage appearing on the vertical signals 8-1, 8-2, . . . into an electric charge, and performs a subtraction in the electric charge region can also be called as a noise canceler circuit.

A noise canceling operation in the circuit of this type is different from that in twenty-fifth embodiment shown in FIG. 57. According to twenty-fifth embodiment, in the clamp node 41, a noise is canceled in the electric charge region. On the other hand, in twenty-eighth embodiment, a noise is not canceled in the electric charge region at the source end of the slice transistor 150, and when the second slice pulse SP2 is applied, an electric charge in which the noise is canceled is transmitted to the drain. That is, the noise is canceled in the electric charge region. With this method also, it is possible to cancel noises accurately, and to extract the signal component only.

As described above, according to twenty-eighth embodiment, because an output of the unit cell is output through the noise canceler circuit, it is possible to eliminate fixed-pattern noise corresponding to the threshold variations of the amplification transistor of the unit cell.

In the present embodiment, an output from the unit cell is supplied to the noise canceler circuit through the gate capacitor of the slice transistor. Therefore, even if the noise component is output or the signal component and noise component is output, the impedance of the noise canceler circuit as viewed from the unit cell is substantially the same.

For this reason, the noise components of both the cases are substantially the same, and if the subtraction of the two outputs is performed, the noise output can be exactly canceled so that only the signal component can be output.

That is, it is possible to accurately cancel the noise, and to output only the signal component. The impedance of the noise canceler circuit is regarded as only a gate capacitance viewed from the unit cell and thus is very small. Therefore, it is possible to exactly cancel the noise in a short period of time.

It should be noted that the second slice pulse SP2 may be influenced by the first slice pulse SP1 which is immediately in front of the second slice pulse SP2. Therefore in order to equalize the influences of the first and second slice pulses with respect to the actions of the first and second transistors, it is effective to incorporate a dummy slice pulse immediately in front of the first slice pulse SP1.

If amplitudes of the first and second slice pulses are the same, a signal electric charge may not be read out in an extremely small signal region, or a linearity may be deteriorated. In this case, it is effective to stabilize the operation to make the amplitude of the second slice pulse greater than that of the first slice pulse, thereby adding a bias electric charge to an electric charge which is read out by the second slice pulse. Further, it is also effective to make a width of the second slice pulse wider than that of the first slice pulse.

Twenty-ninth Embodiment

Figure 72:
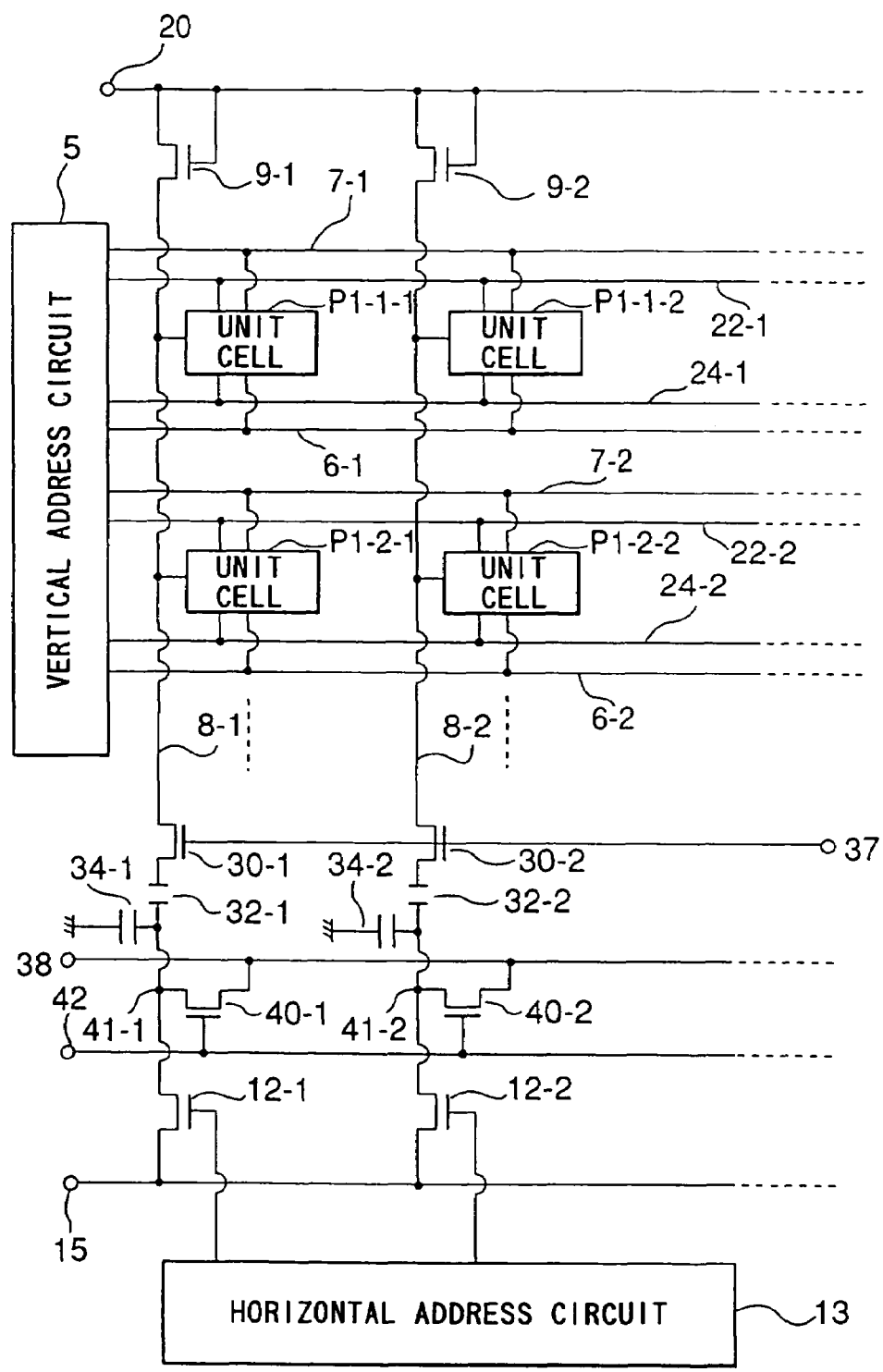
FIG. 72 is a circuit diagram showing the arrangement of an MOS-type solid-state imaging device according to a twenty-ninth embodiment of the present invention.

FIG. 72 is a circuit diagram showing the arrangement of an imaging device using an amplification-type MOS sensor according to the twenty-ninth embodiment of the present invention. The circuit arrangement in the vicinity of a unit cell P1-i-j is the same as that in the twenty-fifth embodiment.

Twenty-ninth embodiment is an embodiment in which the impedance conversion circuit comprising the transistors 26-1, 28-1, 26-2, . . . and the transistors 28-2, 26-3, 28-3, . . . in twenty-fifth embodiment is omitted. Because in the impedance conversion circuit provided in twenty-fifth embodiment, a gate capacitor of the transistor 26 is small, it is possible to shorten the CR time constant when the noise canceler circuit is operated. Because the time constant can be shortened, it is possible to quicken the timing for applying the photodiode selection pulse, which is effective for canceling noises in a short period of time. This is effective when the noise canceling operation needs to be done within a horizontal blanking period of a television scanning, like the television signal. However, if a high speed operation to such a degree is not required, the above described system will be over spec.

Therefore, if there is enough time for such a noise canceling operation, a structure in which the impedance conversion circuit is omitted as in twenty-ninth embodiment is sufficiently practical.

Thirtieth Embodiment

Figure 73:
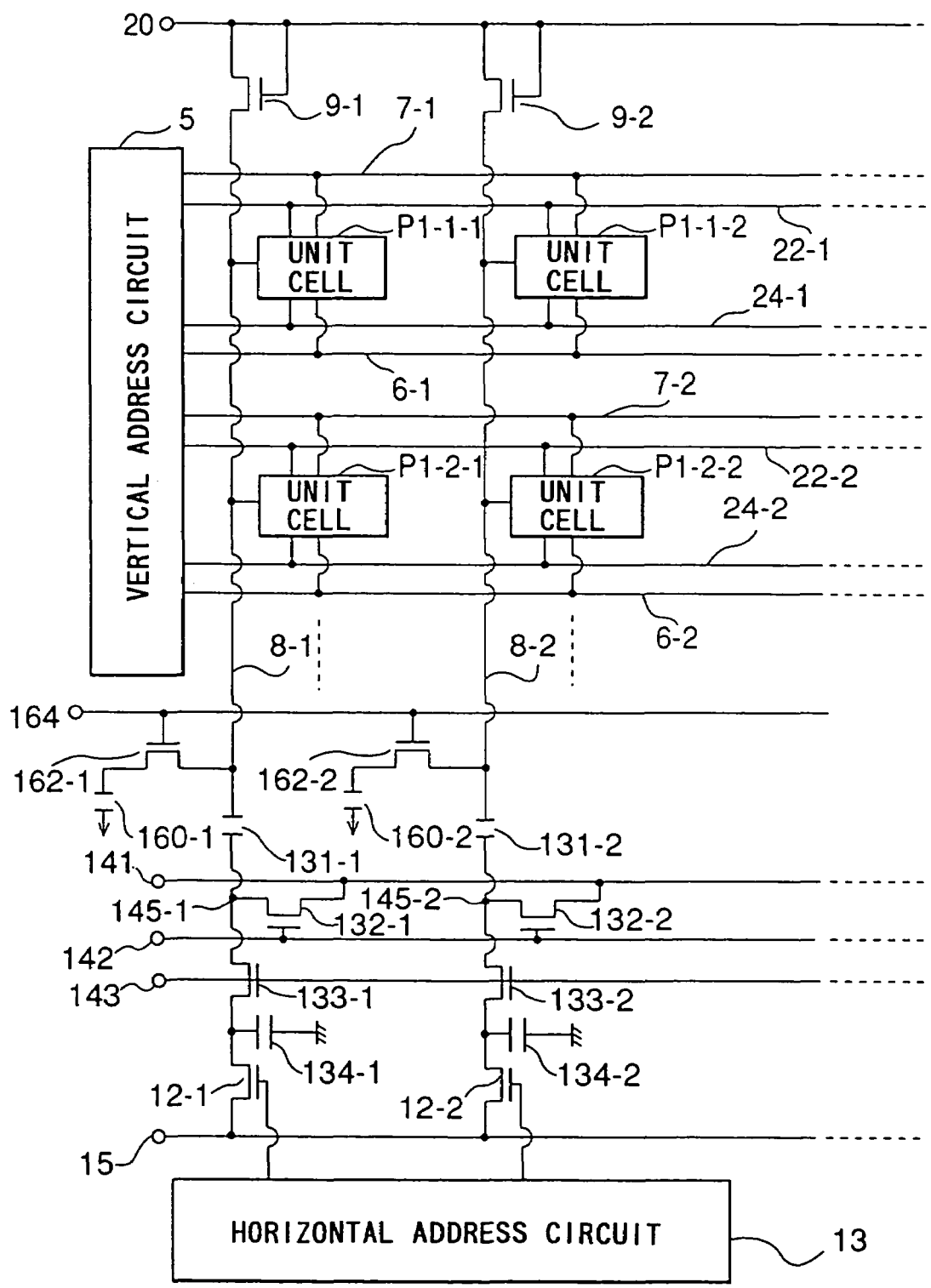
FIG. 73 is a diagram for explaining a thirtieth embodiment of the present invention and showing a circuit diagram showing a first arrangement of an MOS-type solid-state imaging device.
Figure 74:
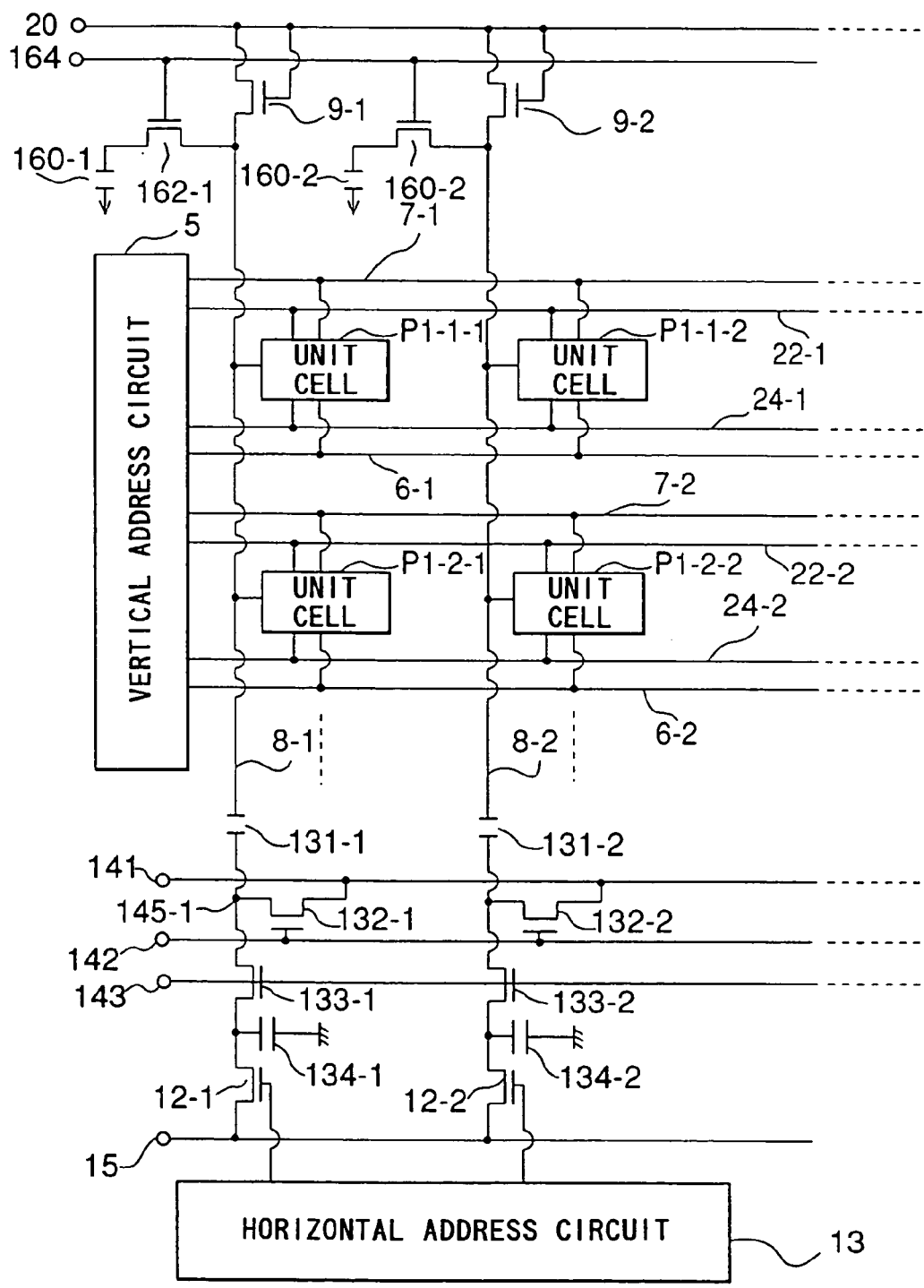
FIG. 74 is a diagram for explaining the thirtieth embodiment of the present invention and showing a circuit diagram showing a second arrangement of an MOS-type solid-state imaging device.

FIGS. 73 and 74 are circuit diagrams each showing the arrangement of an imaging device using an amplification-type MOS sensor according to thirtieth embodiment of the present invention. The circuit arrangement in the vicinity of a unit cell P1-i-j is the same as that in twenty-fifth embodiment.

In the present embodiment, there are many portions which are the same as those in twenty-sixth embodiment. The present embodiment is different from twenty-sixth embodiment in that correction capacitors 160-1, 160-2, . . . are provided for correcting a difference in impedance of the noise canceler as viewed from the unit cell between a case where signal component and noise component is output and a case where only noise component is output. Each of these correction capacitors is provided with a capacity value represented by $C_{CMP}$. These correction capacitors 160-1, 160-2, . . . are disposed nearer the imaging region (unit cell) than the positions of the clamp capacitors 131-1, 131-2, . . . , and connected in parallel to the vertical signal lines 8-1, 8-2, . . . through the switches 162-1, 162-2, . . . , respectively. These features are different from twenty-sixth embodiment.

The correction capacitors 160-1, 160-2, . . . and the switches 162-1, 162-2, . . . provided such as to corresponding thereto are connected, in the case of FIG. 73, to portions between the clamp capacitors 131 and the imaging regions, and in the case of FIG. 74, to portion between the imaging regions and the load transistors 9.

Figure 75:
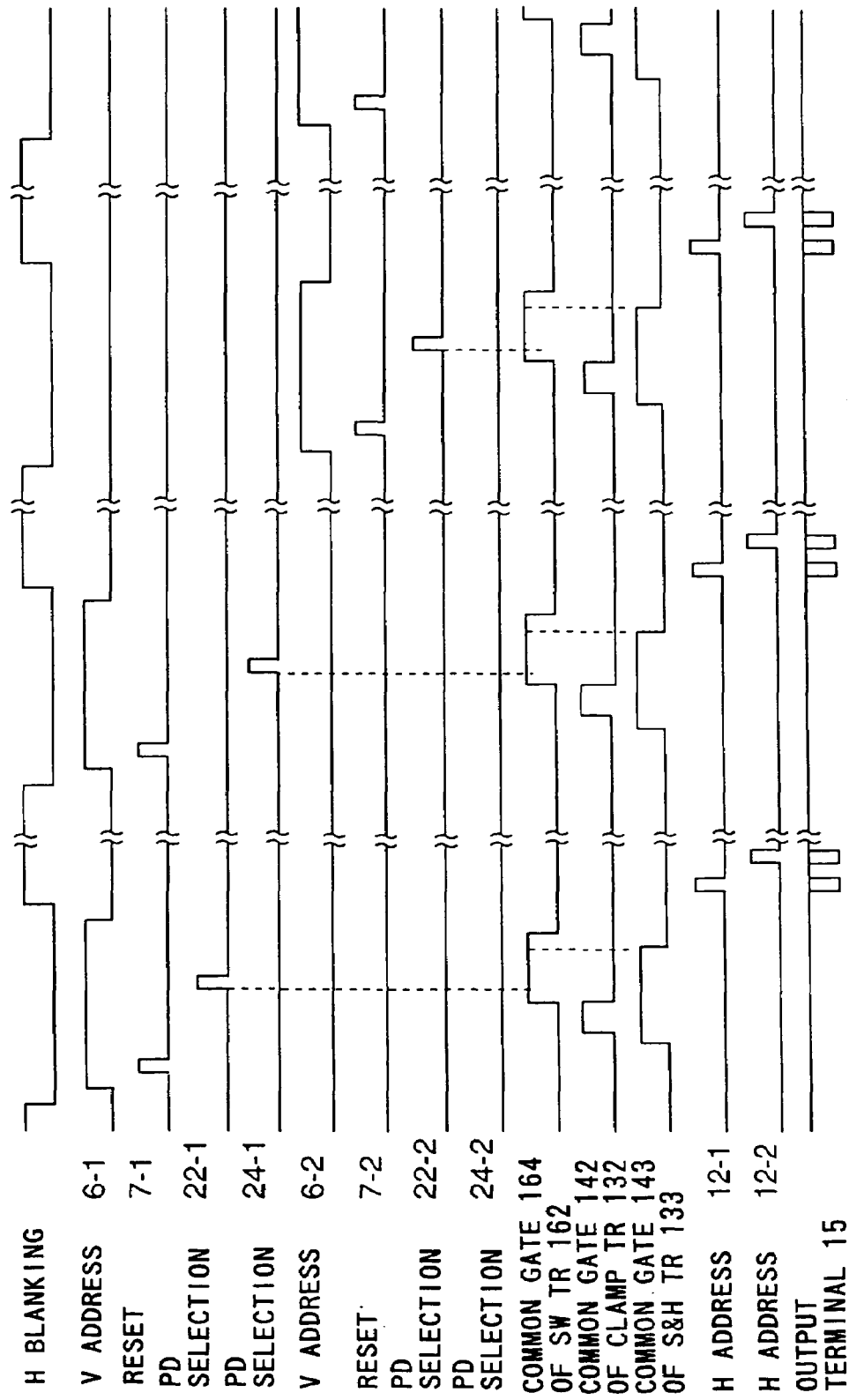
FIG. 75 is a timing chart showing the operation of the thirtieth embodiment.

FIG. 75 shows a timing of operation of the present embodiment. The switch 162 is turned on during a time period when the clamping operation by the clamp transistor 132 is completed and a signal is output from the vertical signal line. With this operation, if the sample/hole capacitor 134 is represented by $C_{SH}$, and if the capacity value of the clamp capacitors 131-1, 131-2, . . . is represented by $C_{CL}$, capacity connected to the vertical signal line 8-1, 8-2, . . . at the time of sample/hold is given by:

$$C = C_{CMP} + C_{SH} \cdot C_{CL} / (C_{CL} + C_{SH})$$

Therefore, if a size of the correction capacitor $C_{CMP}$ is set in a range of $2\{C_{CL} - C_{CL} \cdot C_{SH}(C_{CL} + C_{SH})\} > C_{CMP} > 0$, the capacity connected to the vertical signal line at the time of sample/hold approaches a size of the capacity $C_{CL}$ of the clamp capacitors 131-1, 131-2, . . . . Therefore, a difference VCL in voltage generated due to this difference in capacity becomes smaller and thus, noise is also reduced.

In other word, a fact that impedances as viewed from the cell are the same when the signal is transmitted and when the noise is transmitted is equal to a fact that the capacity C during the sample/holding approaches $C_{CL}$.

FIG. 76 shows a variation with time elapse of potentials of the vertical signal lines 8-1, 8-2, . . . and potentials of the clamp nodes 145. In the present embodiment, as in a case where a signal becomes zero in the dark, if levels of potential of the vertical signal lines 8-1, 8-2, . . . when they return to the clamping time and when they return to the sample/holing time are the same, the potential of the clamp node when the sample/hold is completed does not return to a value near the $\Delta V_{CL}$, and becomes zero. Therefore, there causes no inconvenience that it is in the darkness, and even if the signal is zero, a signal corresponding to $\Delta V_{CL}$ may inconveniently appear. Therefore, it is possible to prevent noises due to variations of $\Delta V_{CL}$ from being generated.

According to the present embodiment, as described above, in the MOS-type solid-state imaging element having a noise eliminating circuit, it is possible to suppress the variations in capacity during the noise eliminating operation which is the causes for generating noise, by providing the vertical signal line 8 with the correction capacitors 160-1, 160-2, . . . , which contributes to reduce the noise. That is, the impedances as viewed from the cell becomes the same between a case where signal component and noise component is output and a case where noise component is output, and noise can accurately be canceled. In this case, it should be noted that noise component is output, when the reset operation is completed, and signal component and noise component is output after PD (photodiode) is selected.

In the present embodiment, the impedances of the noise canceler circuit as viewed from the cell becomes substantially the same between a case where signal component and noise component is output and a case where noise component is output. For this reason, the noise components of both the cases are substantially the same, and if the subtraction of the two outputs is performed, the noise output can be exactly canceled so that only the signal component can be output. Therefore, it is possible to accurately cancel the noise.

As a modification of this thirtieth embodiment, the correction capacitor may be connected to the noise canceler circuit in any of twenty-fifth embodiment shown in FIG. 57, twenty-seventh embodiment shown in FIG. 68, and twenty-ninth embodiment shown in FIG. 72.

Each of twenty-sixth to thirtieth embodiments has been described based on twenty-fifth embodiment but each having the different noise canceler circuit. Next, another embodiment will be described as thirty-first embodiment in which a structure of the unit cell is different based on twenty-sixth to thirtieth embodiments.

Thirty-first Embodiment

Figure 77:
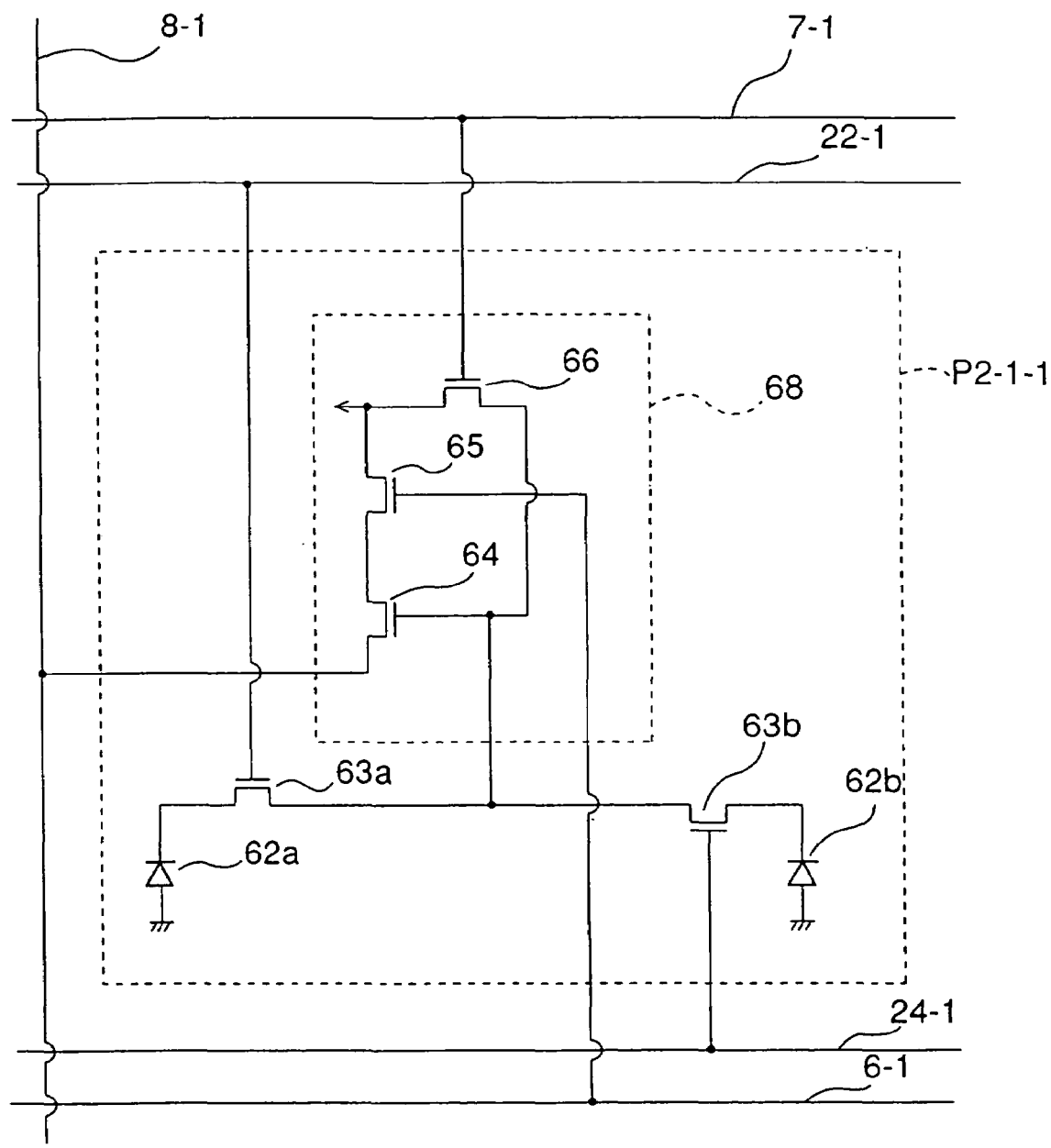
FIG. 77 is a diagram for explaining the thirty-first embodiment of the present invention and showing a circuit diagram showing an arrangement of an MOS-type solid-state imaging device.

The thirty-first embodiment has unit cells whose structures are different from those in twenty-sixth to thirtieth embodiments. The entire structure is the same as that in twenty-fifth embodiment shown in FIG. 57 and thus, the entire structure is not illustrated here. Thirtieth-first embodiment is characterized in that a unit cell P2 shown in FIG. 77 is used instead of the unit cell P1 in FIG. 57.

Although the photodiodes 62a and 62b are disposed in the vertical direction in twenty-fifth embodiment, the feature of the unit cell P2 of the present invention is that they are disposed side by side in a horizontal direction. The photodiodes 62a and 62b are connected to a source of the reset transistor 66 and a gate of the amplification transistor 64 through the photodiode selection transistors 63a and 63b, respectively, and commonly possess a single output circuit 68.

Figure 78:
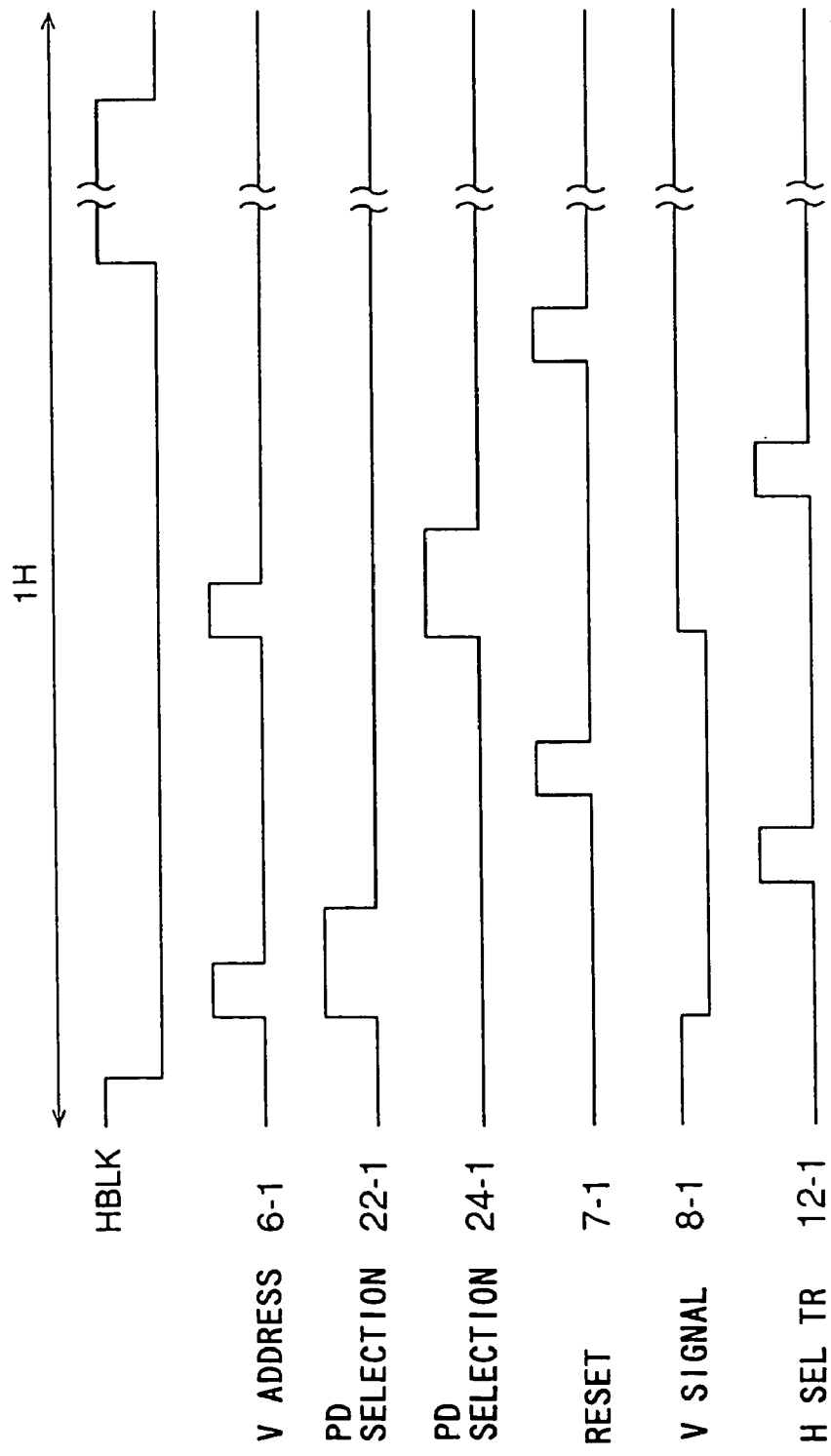
FIG. 78 is a timing chart showing the operation of the thirty-first embodiment.

Next, an operation will be described with reference to a timing chart in FIG. 78. First, during the horizontal blanking period, the horizontal address line 6-1 and the photodiode selection line 22-1 are first brought into high level to turn on the vertical selection transistor 65 and the photodiode selection transistor 63a.

As a result, a voltage which is substantially equal to that of the photodiode 62a appears on the gate of the amplification transistor 64. Further, a source follower is formed by the amplification transistor 64 and the load transistor 9-1, and a voltage which is substantially equal to the gate voltage of the amplification transistor 64 appears on the vertical signal line 8-1.

Next, the vertical address pulse 6-1 is brought into low level to turn off the vertical selection transistor 65. As a result, the source follower is not operated, but a potential of the vertical signal line 8-1 is not immediately changed and thus, a voltage which is substantially equal to the gate voltage of the amplification transistor 64 before reset is maintained.

Then, the reset line 7-1 is brought into high level to turn on the reset transistor 66, thereby initializing potentials of the gate of the amplification transistor 64 and the photodiode 62a.

A horizontal address pulse is applied to the horizontal selection transistor 12-1 from the horizontal address circuit 13, and a signal of the photodiode 63a is output from the signal output terminal 15.

Next, during the same horizontal blanking period, the photodiode selection transistor 63b instead of the photodiode selection transistor 63a is turned on by the same operation as that described above. As a result, a signal of the photodiode 63b is output from the signal output terminal 15.

Although it is not illustrated in the drawing, during this horizontal blanking period, signals of one line are sequentially output by sequentially changing the horizontal addresses under the same vertical address. During the next horizontal blanking period, the same operation is carried out for the next vertical address, thereby sequentially outputting signals of each of the lines.

As described above, according to the MOS-type solid-state imaging device of the present embodiment, in addition to the effect of twenty-fifth embodiment, the vertical address line is turned on or off during only one horizontal period within one frame period. Therefore, there is a merit that it is easy to control the vertical address line. This merit also exhibit an effect that the vertical address circuit and the multiplexer circuit are simplified.

In this thirtieth-first embodiment also, the noise canceler circuit can be changed as in twenty-fifth embodiment. That is, the descriptions made for FIGS. 57 to 76 can equally be applied to the present thirtieth-first embodiment. Further, the number of photodiodes which are included in the unit cell of thirtieth-first embodiment and which are adjacent to each other in the horizontal direction is not limited to two, and three or more photodiodes may be provided. As shown in FIG. 65, the output circuit may use the vertical selection capacitor instead of the vertical selection transistor.

Thirty-second Embodiment

Figure 79:
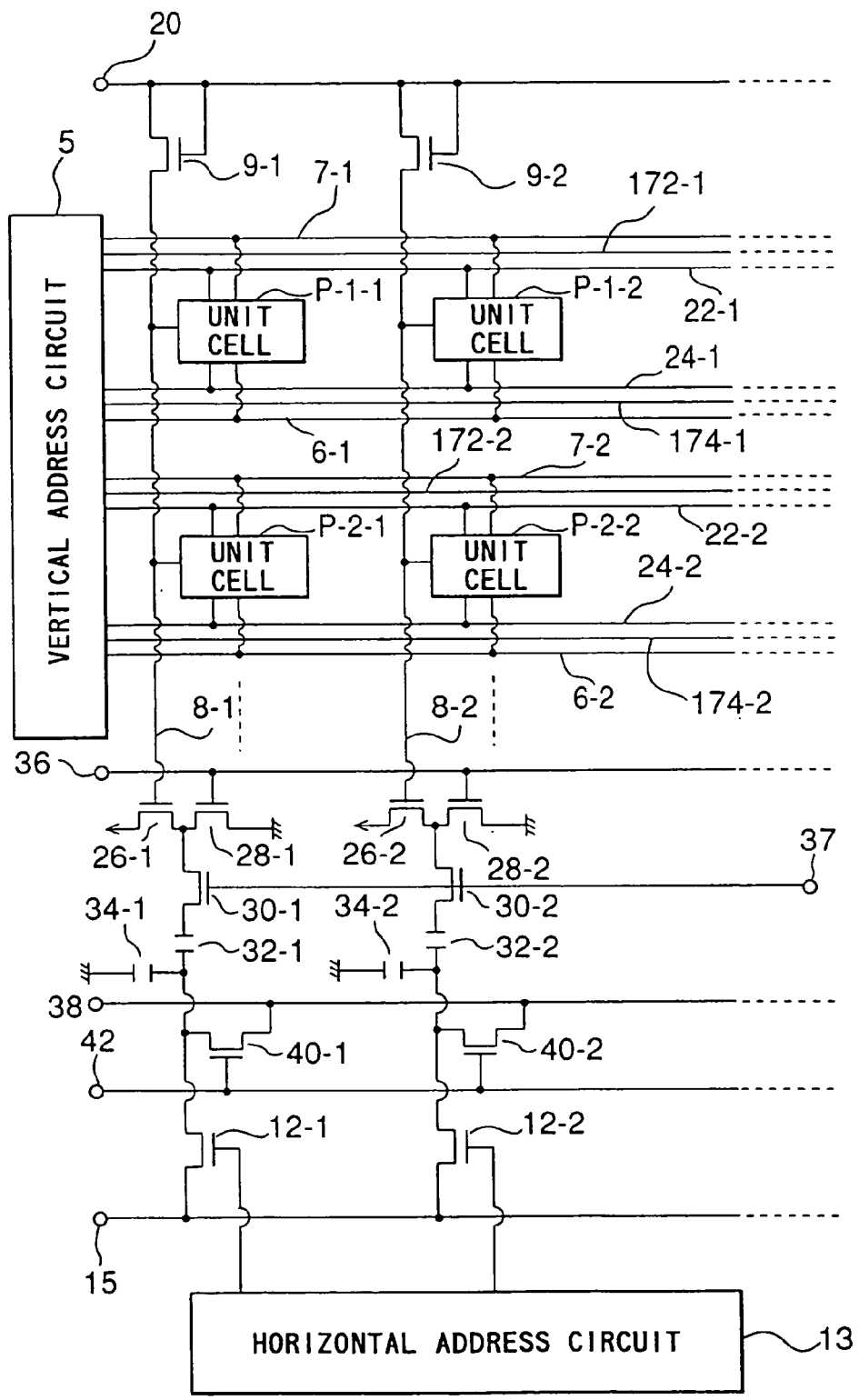
FIG. 79 is a diagram for explaining the thirty-second embodiment of the present invention and showing a circuit diagram showing an arrangement of an MOS-type solid-state imaging device.

FIG. 79 shows a structure of an MOS-type solid-state imaging device according to thirty-second embodiment. Unit cells P3-i-j are arranged vertically and horizontally in the form of a two-dimensional matrix.

Figure 80:
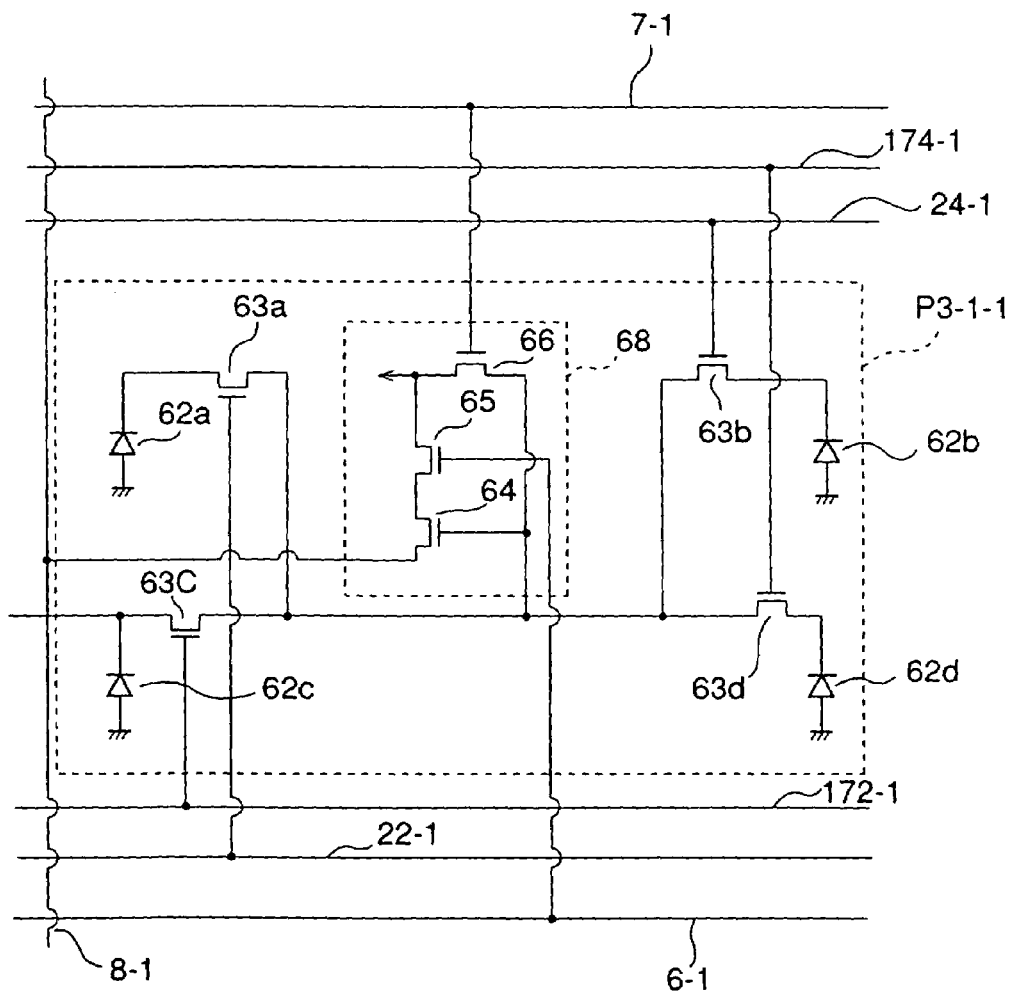
FIG. 80 is a circuit diagram showing a unit cell of the thirty-second embodiment.

FIG. 80 shows a structure of the unit cell P3-1-1 shown in FIG. 79. Although the structure of only the unit cell P3-1-1 is indicated here, the same structures are employed for other unit cells P3-1-2, . . . .

As shown in FIG. 79, the unit cell of the MOS-type solid-state imaging device of the present embodiment is constituted by four photodiodes 62a to 62d, four photodiode selection transistors 63a to 63d and a single output circuit 68. The four photodiodes are disposed in the form of 2×2 matrix.

The photodiodes 62a to 62d are connected to a common output circuit 68 through the selection transistors 63a to 63d, respectively. The selection transistors 63a to 63d are independently on-off controlled respectively by photodiode selection lines 22-1, 24-1, 172-1, and 174-1 which are disposed in horizontal directions from the vertical address circuit 5.

Because the common output circuit 64 is connected to the four photodiodes 62a to 62d to form the unit cell P1-1-1 in this manner and therefore, it is possible to omit three output circuit as compared with a unit cell of the conventional MOS-type solid-state imaging device.

According to the MOS-type solid-state imaging device, a combined effect of both twenty-fifth and twenty-sixth embodiments can be obtained.

In the thirty-second embodiment also, the noise canceler circuit can be changed as in twenty-fifth embodiment. That is, the descriptions made for FIGS. 57 to 76 can equally be applied to thirty-second embodiment. Further, the number of photodiodes which are included in the unit cell of thirty-second embodiment is not limited to 2×2 matrix, and three or more matrix may be provided, and such matrix may not be square. As shown in FIG. 65, the output circuit may use the vertical selection capacitor instead of the vertical selection transistor.

Further, the present is not limited to the above described embodiments, and various modifications may be made. For example, if the amplification transistor of the unit cell can be manufactured so that the threshold value is not varied, a fixed-pattern noise is not generated and therefore, the noise canceler circuit can be omitted. Even if the fixed-pattern noise is generated, if there is no influence on picture quality, the noise canceler circuit can likewise be omitted.

Although the gate and the source of the load transistor are connected to the same electric power source line, they may be connected to separate electric power sources. The latter case can provide an effect that the flowing electric current can be controlled and electricity consumption can be lowered.

In the noise canceler circuit in each of the embodiments, when a signal electric current (noise component only) which is read out when there is no input signal is small, noise are lower. Therefore it is preferable to substantially equalize a voltage applied to the accumulation drain electric power source terminal and a video bias voltage. The video bias voltage is a voltage at which the signal output terminal 15 is substantially fixed when a signal is read out in the form of electric current from the signal output terminal 15. Such a modification is shown in FIG. 45. An operational amplifier 176 is connected to the signal output terminal 15, and a load resistance 178 is connected between input and output end portions of the operational amplifier 176. With this arrangement, a signal electric current is forcibly flowed to the load resistance 178, and the horizontal signal line 15 is fixed to an imaginary certain voltage, i.e., a video bias voltage.

In the described embodiments, the unit cells are disposed in the two-dimensional matrix, the present invention can be applied to an imaging device in which unit cells are arranged in the form of one-dimensional array, of course. In this case, irrespective of the array of the unit cells, the photodiodes in the unit cell can be arrayed in a matrix in a vertical direction, a horizontal direction or both the directions.

Various examples which can obtain picture signals free from noise by combining the amplification-type MOS-type sensor and the noise canceler have been described above.

Meanwhile, as transistors included in a unit cell of the above described amplification-type MOS-type sensor, at least three transistors, i.e., an amplification transistor, a vertical selection transistors and a reset transistor are required. In order to finely divide a cell and to lower the electricity consumption, it is necessary to reduce the number of transistors which constitute the cell. In an MOS sensor which does not belong to the amplification type, a cell is constituted by a photodiode and one transistor. However, a level of sensitivity is lower than the amplification-type MOS sensor.

In the amplification-type MOS sensor, it is possible to the cell can be divided more finely. An example of a MOS-type solid-state imaging device (solid-state imaging device by amplification-type MOS sensor) which can lower the electricity consumption will be described next.

Thirty-third Embodiment

Figure 81:
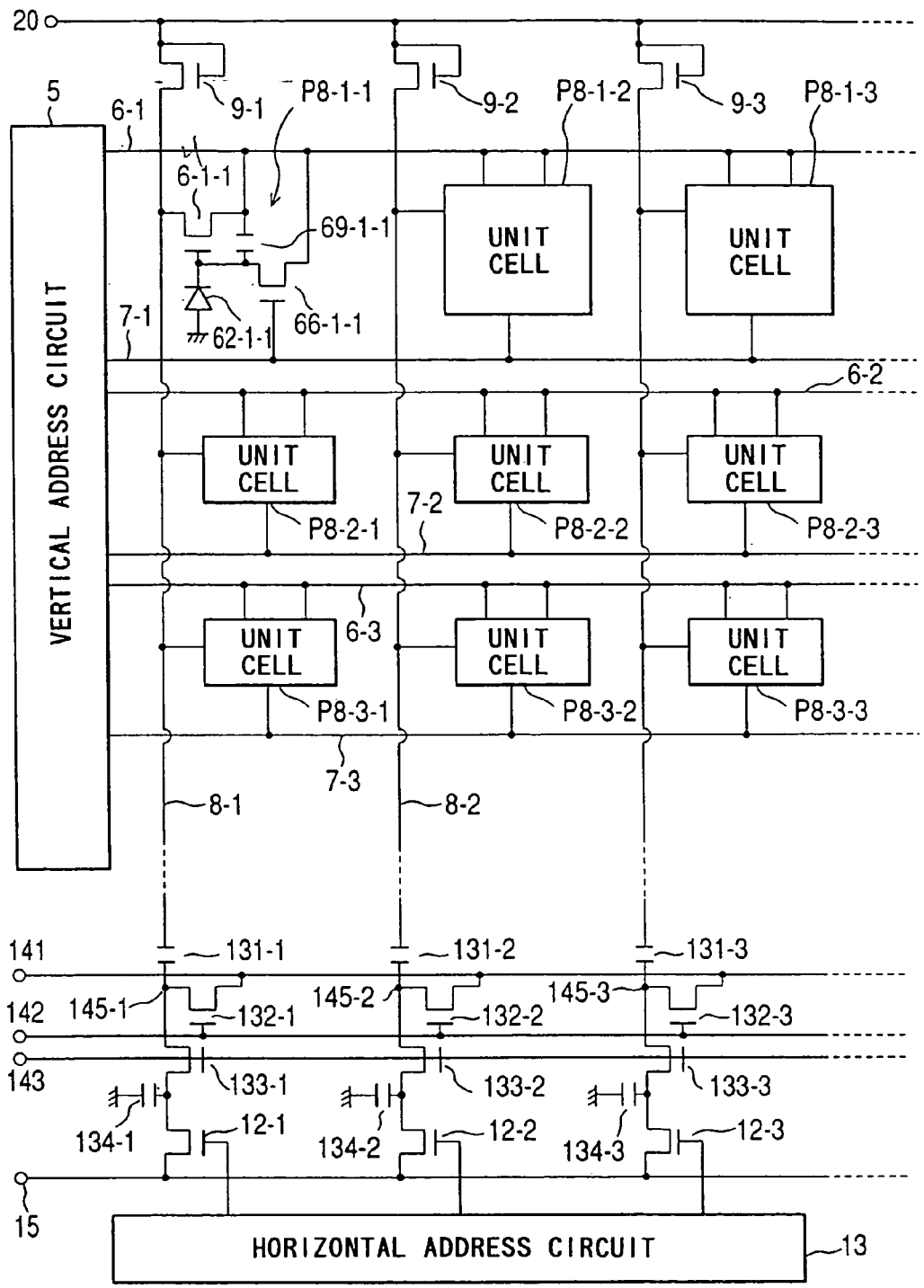
FIG. 81 is a diagram for explaining the thirty-third embodiment of the present invention and showing a circuit diagram showing an arrangement of an MOS-type solid-state imaging device.
Figure 82:
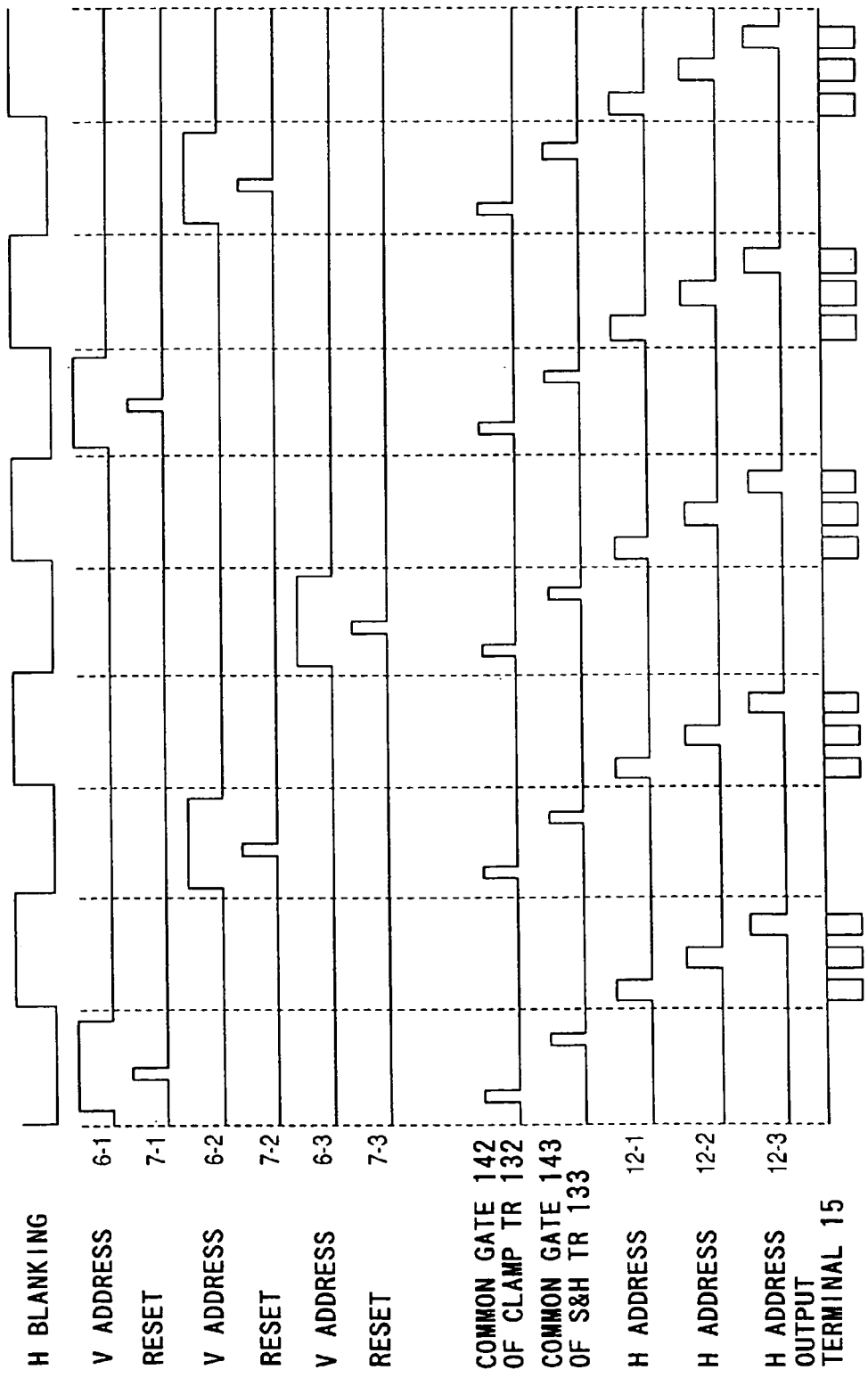
FIG. 82 is a timing chart showing the operation of the thirty-third embodiment.

With reference to FIGS. 81 and 82, a thirty-third embodiment of the present invention will be described. FIG. 81 shows a structure of a MOS-type solid-state imaging device of thirty-third embodiment of the present invention. Unit cells P8-i-j are arrayed in the form of two-dimensional matrix in vertical and horizontal directions. Although FIG.

81 shows only a 3×3 matrix, the actual device has several thousand cells×several thousand cells vertically and horizontally. Reference symbol i denotes a variable in the horizontal (row) direction, and j denotes a variable in the vertical (column) direction.

The range of applications of the solid-state imaging device of the present invention includes video cameras, electronic still cameras, digital cameras, facsimile machines, copying machines, scanners and the like.

A basic cell P8-i-j of the present embodiment comprises a photodiode 62-i-j for detecting an incident light, an amplification transistor 64-i-j having a gate to which a cathode of the photodiode 62-i-j is connected for amplifying the detection signal therefrom, a reset transistor 66-i-j to which the cathode of the photodiode 62-i-j (the gate of the amplification transistor 64-i-j) is connected for resetting a signal electric charge, and an address capacitor 69-i-j connected between a drain and the gate of the amplification transistor 64-i-j. In the present embodiment, the vertical selection transistor 3-i-j provided in the conventional device (FIG. 1) is omitted, and the address capacitor 69-i-j is newly added.

Vertical address lines 6-1, 6-2, . . . extending in a horizontal direction from the vertical address circuit 5 are connected to the drain of the amplification transistor 64-i-j and the drain of the reset transistor 60 of the unit cell of each of the lines so as to determine a horizontal line for reading out a signal. Similarly, reset lines 7-1, 7-2, . . . extending in a horizontal direction from the vertical address circuit 5 are connected to the gate of the reset transistor 66-i-j of the unit cell of each of the lines.

The source of the amplification transistor 64-i-j of the unit cell of each of the lines is connected to the vertical signal lines 8-1, 8-2, . . . extending in a row direction. The vertical signal lines 8-1, 8-2, . . . are provided at their one ends with load transistors 9-1, 9-2 . . . . A gate and a drain of the load transistors 9-1, 9-2, . . . are commonly connected to a drain voltage terminal 20.

Other ends of the vertical signal lines 8-1, 8-2, . . . are connected to a signal output terminal (horizontal signal line) 15 through the clamp capacitors 131-1, 131-2, . . . , the sample/hold transistors 133-1, 133-2, . . . , and horizontal selection transistors 12-1, 12-2, . . . . Connection points of the clamp capacitors 131-1, 131-2, . . . and the sample/hold transistors 133-1, 133-2, . . . are connected to drains of the clamp transistors 132-1, 132-2, . . . . A source of the clamp transistors 132-1, 132-2, . . . is connected to a common source terminal 141, and a gate thereof is connected to a common gate terminal 142. Connection points of the sample/hold transistors 133-1, 133-2, . . . and the horizontal selection transistors 12-1, 12-2, . . . are grounded through the sample/hold capacitors 134-1, 134-2, . . . . An address pulse is supplied to the horizontal selection transistors 12-1, 12-2, . . . from the horizontal address circuit 13.

The vertical address circuit 5 is a circuit which shifts a plurality of (two, in this illustrated embodiment) signals at a time, and is realized by a circuit shown in any of FIGS. 18, 19 and 20. In the case of FIG. 18, an output from an address circuit 44 which sequentially shifts and outputs input signals 46 from a large number of output terminals are synthesized with two input signals 50 by a multiplexer 48. In the case of FIG. 19, an output from a decoder 52 which decodes an encoded input 54 is synthesized with two input signals 58 by a multiplexer 56. In the case of FIG. 20, outputs from two address circuits 60a and 60b are bundled together to form a control signal line for each of the lines.

FIG. 82 is a timing chart showing an operation of the present embodiment. If an address pulse of high level is applied to the vertical address line 6-1 during a horizontal blanking period, this high level address pulse is supplied to a gate of the amplification transistor 64 of a unit cell connected to this line through an address capacitor 69. A potential of a channel under this gate becomes higher than a channel potential under a gate of the amplification transistor 64 of a unit cell connected to another line to establish an ON-state. Therefore, a source follower circuit is constituted by the load transistor 9 and the amplification transistor 64 of the unit cell connected to the vertical address line 6-1. A gate voltage of the amplification transistor 64, i.e., a voltage substantially equal to a voltage of the photodiode 64 appears on the vertical signal line 8. In this manner, only the gate potential of the amplification transistor 64 on an addressed line appears on the vertical signal lines 8-1, 8-2, . . . , and gate potentials of amplification transistors 64 on other lines do not appear. Therefore even if the vertical selection transistor is omitted, it is possible to address a vertical address line.

A clamp pulse is applied to the common gate 142 of the clamp transistors 132-1, 132-2, . . . to turn on the clamp transistors 132-1, 132-2, . . . , thereby fixing the clamp nodes 145-1, 145-2, . . . to a voltage which is the same as that of the clamp electric power source 141.

Next, after the clamp transistors 132-1, 132-2, . . . are turned off, a reset pulse of high level is applied to the reset line 7-1, thereby turning off the reset transistors 66-1, 66-2, . . . , to reset a signal electric charge of the photodiode 62. With this operation, there appears on the clamp nodes 145-1, 145-2, . . . , a voltage obtained by adding to the clamp electric power source 141, a difference in voltage of the vertical signal lines 8-1, 8-2, . . . between a case where a signal electric charge is present in the photodiode 62 and a case where the signal is reset and there is no signal electric charge.

Next, a sample/hold pulse is applied to the common gate 143 of the sample/hold transistors 133-1, 133-2, . . . to turn on the sample/hold transistors 133-1, 133-2, . . . , and the signals are transmitted to the sample/hold capacitors 134-1, 134-2, . . . .

Thereafter, a horizontal address pulse is sequentially applied to the horizontal selection transistors 12-1, 12-2, . . . from the horizontal address circuit 13, thereby outputting a signal of one line from the horizontal signal line 15.

By sequentially repeating this operation for the next line, and the subsequent lines, it is possible to read out all of the two-dimensional signals.

In generally, in the amplification-type MOS-type solid-state imaging device, because variations of threshold voltage of the amplification transistor 64 is superposed on a signal, even if a potential of the photodiode 62 is the same, an output signal may vary. Therefore, if a photographed picture is reproduced, two-dimensional noise (which means that noise are locally fixed, and this is called fixed-pattern noise) corresponding to threshold variations of the amplification transistor 64 is generated. However, according to the present embodiment, as described above, a voltage corresponding to a difference between a case where there is a signal electric charge in the unit cell and a case where the signal is reset and there is no signal electric charge finally appears on the clamp nodes 145-1, 145-2, . . . , and therefore, a fixed-pattern noises due to threshold variation of the amplification transistor 64 is suppressed. That is, the circuit comprising the clamp capacitor 131, the clamp transistor 132, the sample/hold transistor 133 and the sample/hold capacitor 134 serves as a noise canceler.

Next, a structure of the present embodiment will be described.

In this embodiment, the unit cells P8-1-1, P8-1-2, . . . and peripheral circuits such as the vertical address circuit 5 and the horizontal address circuit 13 are formed on a semiconductor substrate having a p$^+$-type impurity layer formed on a p$^-$-type substrate.

As shown in FIG. 25A, cell elements such as photodiodes 83 are formed on a semiconductor substrate having a p$^+$-type impurity layer 82 formed on a p$^-$-type substrate 81.

With this structure of the semiconductor substrate, the diffusion potential at the p$^-$/p$^+$ boundary can partly prevent a dark current generated in the p$^-$-type substrate 81 from the flowing to the p$^+$-layer side.

The result of a detailed analysis of the flows of electrons will be briefly described below. Apparently, a thickness L of the p$^+$-type impurity layer 82 is increased by p$^+$/p$^-$ concentration ratio times, i.e., to L·p$^+$/p$^-$, from the viewpoint of an electron generated on the p$^-$-layer side.

As shown in FIG. 25B, apparently, the distance from the p$^-$-type substrate 81 as a dark current source to the photodiode 83 is increased p$^+$/p$^-$ times. In addition to the dark current flowing from a deep part of the substrate, a dark current is generated in a depletion layer near the photodiode 83. This dark current generated in the depletion layer is almost equal to magnitude to the dark current flowing from the deep part of the substrate. The thickness of the depletion layer is about 1 μm, and the dark current flowing from the deep part of the substrate also flows from a depth of about 100 μm. This depth is called the diffusion length of an electron in a p-type semiconductor. The reason why these dark currents are almost equal in magnitude regardless of this thickness difference is that the probability of occurrence of a dark current per unit volume is high in the depletion layer. In this case, since the dark current generated in the depletion layer cannot be theoretically separated from a signal current, the dark current is reduced by reducing a component flowing from the deep part of the substrate.

In addition, since cells are formed on the semiconductor substrate having the p$^+$-type impurity layer 72 formed on the p$^-$-type substrate 71, variations in substrate potential due to the dark current can be prevented. The p-type substrate is thick and hence has a high resistance. As will be described later, a noise reduction circuit can be reliably operated.

When the element temperature rises, the component from the deep part of the substrate abruptly increases. This is therefore important. It suffices if the component from the deep part of the substrate is sufficiently smaller that the component generated in the depletion layer. More specifically, it suffices if the dark current from the deep part of the substrate is about ¹⁄₁₀ or less of the dark current from the depletion layer. That is, p$^+$/p$^-$ may be set to 10 to set the component from the deep part of the substrate to about ¹⁄₁₀.

In a semiconductor substrate constituted by an n-type substrate and a p-type well, there is almost no dark current from a deep part of the substrate. To set the dark current to the same level as in such a semiconductor substrate, p$^+$/p$^-$ must be set to 100 to set the dark current from the deep part of the substrate to about ¹⁄₁₀₀.

In a conventional practical CCD, the impurity concentration of an n-type buried channel is about $10^{16}$ cm$^{-3}$, and the impurity concentration of a p-type layer (p-type substrate in this case) surrounding the buried channel, which is set to stably manufacture the diffusion layer of the buried channel, is about $10^{15}$ cm$^{-3}$.

When p$^+$/p$^-$ is set to 10, the impurity concentration of the p$^+$-type layer becomes about $10^{16}$ cm$^{-3}$. When p$^+$/p$^-$ is set to 100, the impurity concentration of the p$^+$-type layer becomes about $10^{17}$ cm$^{-3}$. That is, the impurity concentration of the p$^+$-type layer becomes almost equal to that of the n-type buried channel, i.e., about $10^{16}$ cm$^{-3}$, or becomes higher than that by one order in magnitude.

For this reason, in a conventional practical CCD, the use of a p$^+$-type layer having such an impurity concentration has not been considered. If the impurity concentration of the p$^+$-type layer is decreased, the sheet resistance of the substrate undesirably increased.

However, there is no buried channel of CCD in the amplification-type MOS imaging device, the value of p$^+$/p$^-$ can be arbitrarily set to a certain degree without decreasing the impurity concentration of the p-type layer.

Cells can also be formed by improving the structure of a semiconductor substrate constituted by an n-type substrate and a p-type well by decreasing the resistance of the p-type well.

FIG. 26 is a sectional view showing a unit cell using a p$^+$-type well 86 having a low sheet resistance on an n-type substrate 85. FIG. 27 is a sectional view showing a unit cell of a CCD.

To stably manufacture a CCD, the impurity concentrations of an n-type substrate 87, a p-type well 86, and an n-type buried channel 89 of the unit cell are respectively set to about $10^{14}$ cm$^{-3}$, about $10^{15}$ cm$^{-3}$, and about $10^{16}$ cm$^{-3}$.

Since the impurity concentration of an n-type photodiode 90 can be arbitrarily set to a certain degree, no many limitations are imposed in terms of manufacture. With the above impurity concentrations, the sheet resistance of the p$^+$-type well 86 is about 100 kΩ/□. As described above, with such a large value, the noise caused in the CCD is very small.

When a noise reduction circuit is to be used in an amplification-type MOS imaging device, the sheet resistance of the p-type well is very important. This is because, the time taken to suppress disturbances in the potential of the p-type well 86 due to a reset pulse needs to match a system to which this apparatus is to be applied.

In the NTSC scheme, which is the existing television scheme, the noise reduction circuit is operated in an interval of about 11 (μs), which is a horizontal blanking interval. Disturbances in the potential of the p-type well 86 must be suppressed to about 0.1 (mV) within this interval.

Such a small value as 0.1 (mV) is set because the noise voltage output of the CCD corresponds to this. According to a detailed analysis, to settle the disturbances to a value as small as 0.1 (mV) within the very short time interval of 11 (μs), the sheet resistance of the p$^+$-type well 86 must be set to 1 kΩ/□ or less. This is about ¹⁄₁₀₀ the sheet resistance of the conventional CCD.

For this purpose, the impurity concentration of the p$^+$-type well 86 must be increased to about 100 times. Such a concentration can not be set in the CCD, as described above with reference to the p-type substrate. Furthermore, in the high-vision television scheme, the horizontal blanking interval is 3.77 (μs), and hence the sheet resistance of the p$^+$-type well 86 must be set to 300 kΩ/□ or less.

As another modification, a semiconductor substrate may be obtained by forming a heavily doped p$^+$-type sandwich layer on a substrate, and forming a lightly doped p-type layer on the surface of the sandwich layer.

FIG. 28 shows the structure of a semiconductor substrate having a p$^+$-type sandwich layer 92 formed between a p$^-$-type substrate 91 and a p-type layer 93. FIG. 29 shows a semiconductor substrate having a p$^+$-type sandwich layer 96 formed between an n-type substrate 95 and a p-type layer 97.

Such a p$^+$-type sandwich layer can be formed by a high-acceleration megavolt ion implantation apparatus.

In addition to photodiodes 83, transistors, and the like as the constituent elements of unit cells, peripheral circuits such as a horizontal address circuit and a vertical address circuit are also formed on the above p-type layer.

FIG. 30 shows the structure of a semiconductor substrate obtained by surrounding a photodiode 83 with a heavily doped p-type well 103 and forming other portions on an n-type substrate 101 using another p-type well 102.

The use of this structure can prevent a dark current from leaking into the photodiode 83. Note that the semiconductor substrate 101 may be a p$^-$-type substrate.

The concentration of the p-type well, which forms some or all of the horizontal and vertical address circuits around the cell, is determined in terms of circuit design, and differs from the optimum value of the cell. For this reason, a p-type layer may be formed independently of the p-type well which forms the imaging region.

FIG. 63 shows the structure of a semiconductor substrate obtained by forming a p-type well 106, which forms an imaging region, on an n-type substrate 105, and separately forming another p-type well 107, which forms peripheral circuits.

With this structure, p-type wells suited for the respective constituent elements can be formed. Note that the n-type substrate 105 may be a p$^-$-type substrate.

FIG. 64 shows a structure in which a p$^+$-type sandwich layer 108, which forms an imaging region, and a lightly doped p-type layer 109 are formed on an n-type substrate 105, and another p-type well 107 is formed on a peripheral circuit portion.

With this structure, p-type wells suited for the respective constituent elements can be formed, and leakage of a dark current into the photodiode can be prevented. Note that the n-type substrate 105 may be a p$^-$-type substrate.

According to the present embodiment, as described above, the source of the amplification transistor 64 is directed connected to the vertical address line 6, and the address capacitor 69 is inserted between the vertical address line 6 and the gate of the amplification transistor 64 instead of the vertical selection transistor, and the addressed amplification transistor 64 is turned on, so that only the gate potential is output to the vertical signal line 8. That is, it is possible to address the vertical address line even if there is no vertical selection transistor and therefore, the cell can be divided finely.

Further, because an output of the unit cell is output through the noise canceler, it is possible to suppress the fixed-pattern noise corresponding to the threshold variations of the amplification transistor of the unit cell.

Further, if a substrate comprising a p$^-$-type impurity substrate and a p$^+$-type impurity substrate formed on the p$^-$-type impurity substrate is used as a semiconductor substrate forming the unit cell, it is possible to reduce the dark current following into the unit cell, and to stabilize a potential on a surface of the substrate. Therefore, it is possible to reliably operate the noise canceler circuit.

Next, another embodiment in which the noise canceler circuit is modified in thirty-third embodiment will be described.

Thirty-fourth Embodiment

Figure 83:
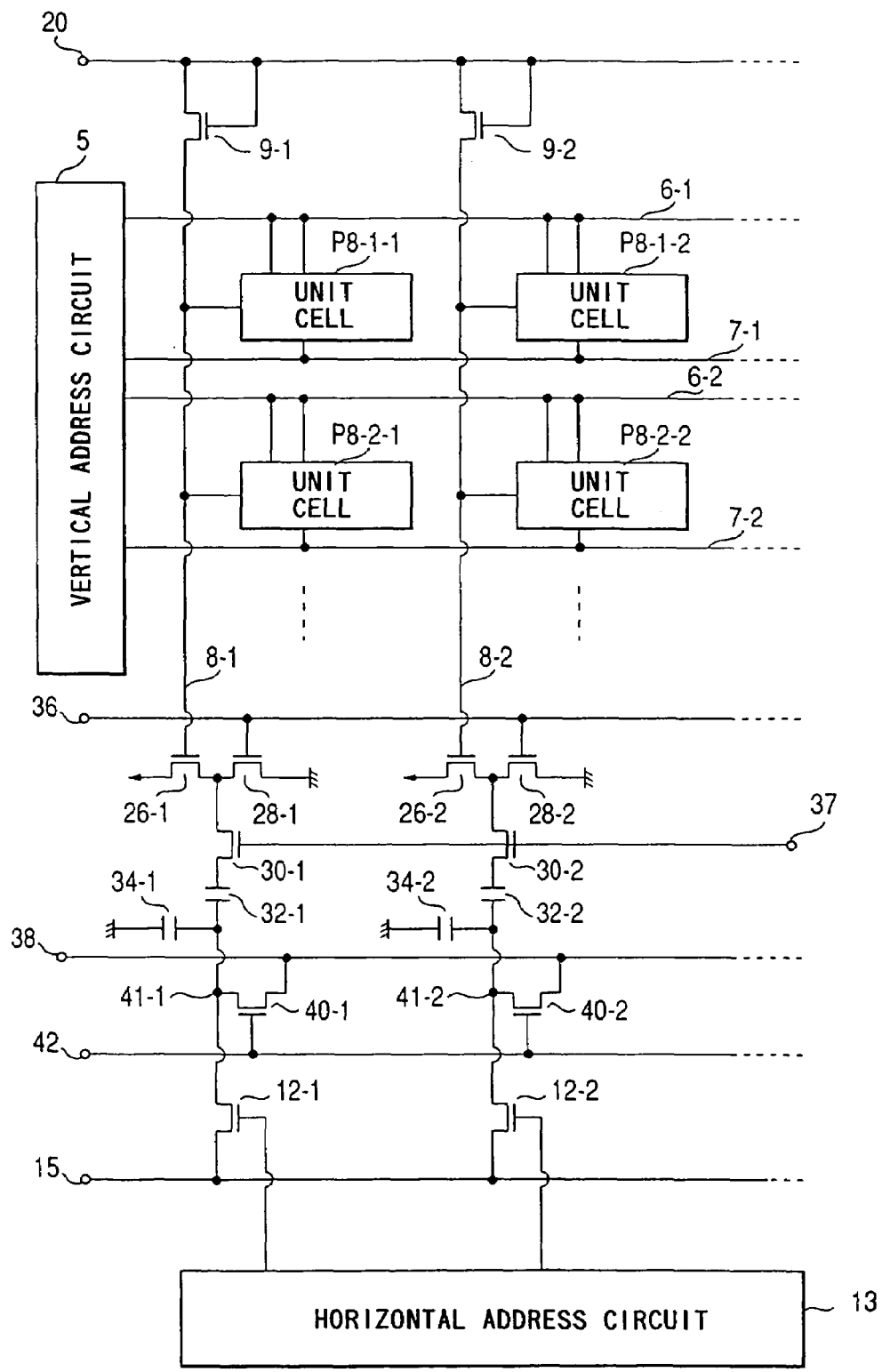
FIG. 83 is a diagram for explaining the thirty-fourth embodiment of the present invention and showing a circuit diagram showing an arrangement of an MOS-type solid-state imaging device.
Figure 84:
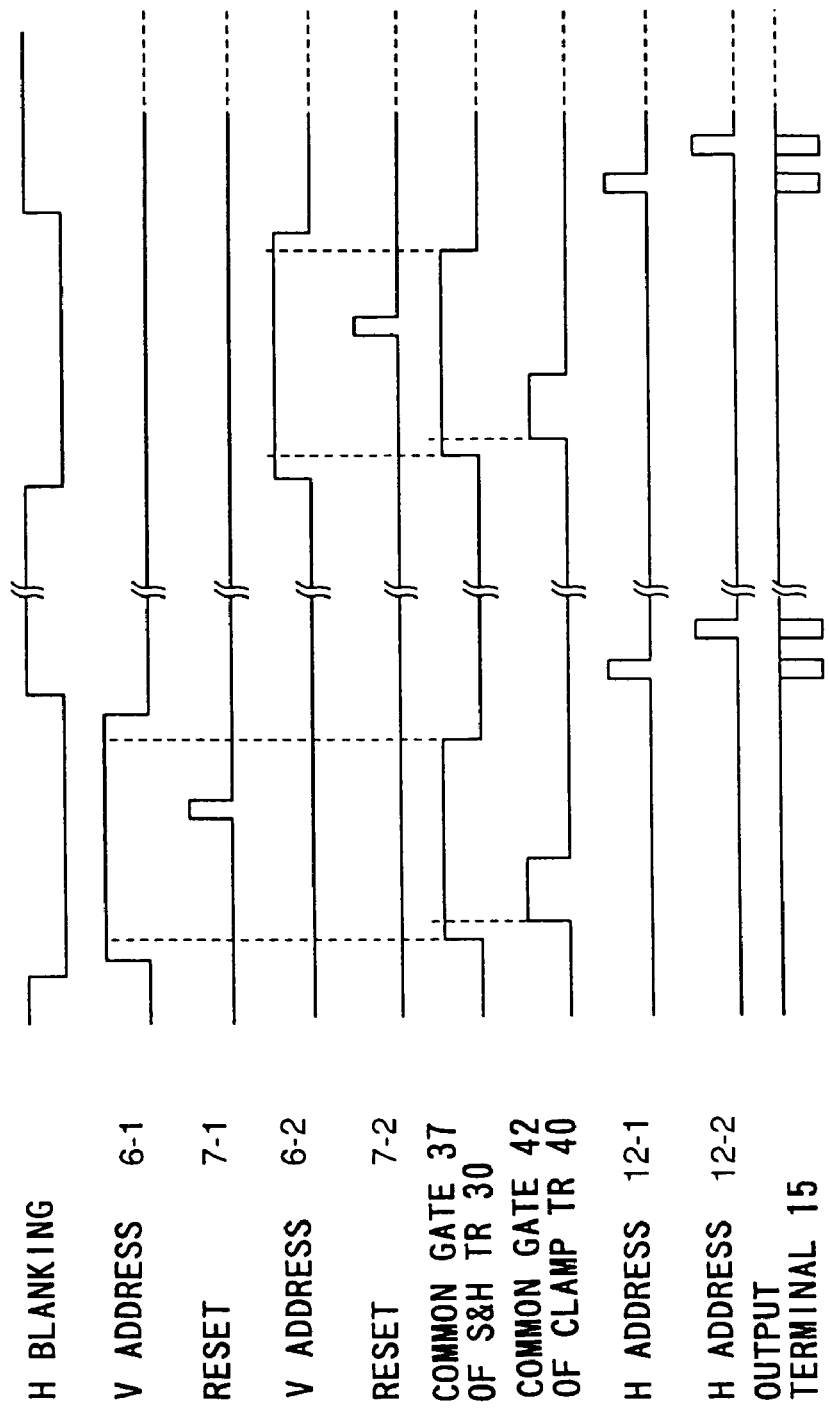
FIG. 84 is a timing chart showing the operation of the thirty-fourth embodiment.

With reference to FIGS. 83 and 84, thirty-fourth embodiment of the present invention will be described. FIG. 83 is a circuit diagram showing of an imaging device using an amplification-type MOS sensor according to the thirty-fourth embodiment of the present invention. The circuit arrangement in the vicinity of a unit cell P8-i-j is the same as that in the thirty-third embodiment.

Other ends of the vertical signal lines 8-1, 8-2, . . . are connected to gates of the MOS transistors 26-1, 26-2, . . . . Sources of the MOS transistors 26-1, 26-2, . . . 28-1, 28-2, . . . are connected to the drains of the MOS transistors 28-1, 28-2, . . . , and the MOS transistors 26-1, 26-2, . . . are operated as a source follower circuit. Gates of the MOS transistors 28-1, 28-2, . . . are connected to a common gate terminal 36.

Connection points of the MOS transistors 26-1, 26-2, . . . and the MOS transistors 28-1, 28-2, . . . are connected to one ends of the clamp capacitors 32-1, 32-2, . . . through the sample/hold transistors 30-1, 30-2, . . . . The sample/hold capacitors 34-1, 34-2, . . . and the clamp transistors 40-1, 40-2, . . . are connected to the other ends of the clamp capacitors 32-1, 32-2 . . . . The other ends of the sample/hold capacitors 34-1, 34-2, . . . are grounded. The other ends of the clamp capacitors 32-1, 32-2, . . . are also connected to a signal output terminal (horizontal signal line) 15 through the horizontal selection transistors 12-1, 12-2, . . . .

A structure of the present embodiment will be described next.

As is apparent from the circuit diagram in FIG. 83, because the clamp capacitor 32 and the sample/hold 34 are directly and closely connected to each other, they can be stacked on the same surface, and the unit cell can be reduced in size.

More specifically, as shown in FIG. 24, a first electrode 76 is formed on a silicon substrate 72 through a first insulating film 74 to form the sample/hold capacitor 34. Further, a second electrode 80 is formed on the first electrode 76 through a second insulating film 78 to form the clamp capacitor 32.

As is also apparent from FIG. 24, the first electrode 76 serves as a common electrode, and the clamp capacitor 32 and the sample/hold capacitor 34 are stacked on each other, the same capacitance value as that obtained when these components are formed separately can be obtained with ½ the area.

Next, with reference to a timing chart shown in FIG. 84, an operation of the MOS-type solid-state imaging device arranged as described above. The common drain terminal 20 of the load transistor 9, the common gate terminal 36 of the transistor 28 of the impedance conversion circuit, and the common source terminal 38 of the clamp transistor 40 are driven by direct current and therefore, these elements are omitted in the timing chart.

During the horizontal blanking period, if an address pulse of high level is applied to the vertical address line 6-1, the amplification transistor 64 of the unit cells P8-1-1, P8-1-2, . . . connected to the vertical address line 6-1 is turned on, and a source follower circuit is constituted by the amplification transistor 64 and the load transistors 9-1, 9-2, . . . .

The common gate 37 of the sample/hold transistors 30-1, 30-2, . . . are brought into high level to turn on the sample/hold transistors 30-1, 30-2, . . . . Then, the common gate 42 of the clamp transistors 40-1, 40-2, . . . are brought into high level to turn on the clamp transistors 40-1, 40-2, . . . .

Next, the common gate 42 of the clamp transistors 40-1, 40-2, . . . are brought into low level to turn off the clamp transistors 40-1, 40-2, . . . . With this operation, the signal component and noise component appearing on the vertical signal lines 8-1, 8-2, . . . are accumulated in the clamp capacitors 32-1, 32-2, . . . .

Thereafter, if a reset pulse of high level is applied to the reset line 7-1, the reset transistor 66 of the unit cells P8-1-1, P8-1-2, . . . connected to the reset line 7-1 is turned on, and an electric charge of the input terminal of the output circuit 68 is reset. Then, only the noise whose signal component has been reset appears on the vertical signal lines 8-1, 8-2, . . . .

As described above, because the signal component and noise component are accumulated in the clamp capacitors 32-1, 32-2, . . . , appearing on the clamp nodes 41-1, 41-2, . . . is only signal voltage of an amount corresponding to variations of the vertical signal lines 8-1, 8-2, . . . , i.e., only signal voltage free from a fixed-pattern noise obtained by subtracting the noise component from the signal component and noise component.

Then, the common gate 37 of the sample/hold transistors 30-1, 30-2, . . . is brought into low level to turn off the sample/hold transistors 30-1, 30-2 . . . . With this operation, voltages free from noise appearing on the clamp nodes 41-1, 41-2, . . . are accumulated in the sample/hold capacitors 34-1, . . . .

After that, by sequentially applying the horizontal address pulses to the horizontal selection transistors 12-1, 12-2, . . . , signals of the photodiode 62 accumulated in the sample/hold capacitors 34-1, 34-2, . . . are read out from the output terminal (horizontal signal line) 15.

Thereafter, by repeating the above-described operations for each of the horizontal address lines 6-2, 6-3, . . . , signals of all of the cells arranged into the form of two-dimensional matrix can be output.

A sequence in the timing chart of FIG. 84 will be described below. The following two orders are required.

(1) Rise of sample/hold pulse→Fall of clamp pulse→Fall of first address pulse→Rise of second vertical address pulse→Fall of sample/hold pulse→Fall of second vertical address pulse (2) Fall of clamp pulse→Rise of reset pulse→Fall of reset pulse Although the order of rise of the first vertical address pulse, fall of the sample/hold pulse and rise of the clamp pulse can be arbitrarily set, the above described order is preferable. Further, although the order of fall of the first vertical address pulse and rise of the reset pulse can be arbitrarily set, the described order is preferable.

In this manner, according to the operation in FIG. 84, appearing on the clamp node 41 is a voltage corresponding to a difference between a voltage when there is a signal and noise and when there is no signal because the gate of the amplification transistor is reset. Therefore, a fixed-pattern noise due to a variation in threshold value of the amplification transistor 64 is compensated. That is, a circuit comprises the clamp transistor 30, the clamp capacitor 31, the sample/hold transistor 40 and the sample/hold capacitor 34 functions as the noise canceler.

The noise canceler of the present embodiment is connected to the vertical signal line 8 through the impedance conversion circuit 26 and 28 comprising a source follower circuit. That is, the vertical signal line is connected to the gate of the transistor 26. Because this gate capacitor is very small, and the amplification transistor 64 charges only vertical signal lines 8-1, 8-2, . . . , the time constant of CR is short and CR is brought into a normal state immediately. For this reason, it is possible to quicken a timing for applying a reset pulse, and the noise canceling operation can be carried out in a short period of time. In the case of television signal, it is necessary to carry out the noise canceling operation within a horizontal blanking period of the television scanning, and the ability to accurately cancel the noise in a short period of time as in the present embodiment is a great merit. Further, impedances of the noise canceler circuit as viewed from the unit cell are the same between a case where the signal component and noise component are output and a case where the noise component is output, both included in the noise canceling operation. Therefore, it is possible to accurately cancel the noise.

That is, impedances of the noise canceler circuit as viewed from the unit cell are substantially the same between a case where the noise component is output and a case where the signal component and noise component are output. Therefore, the noise components of both the cases are substantially the same, and if a difference in noise component between both the cases is eliminated, it is possible to accurately eliminate the noise output and to output only the, signal component. Therefore, it is possible to accurately cancel the noise. Further, if the noise canceler circuit is viewed from the unit cell, only the gate capacitor can be seen in view of impedance, and its volume is extremely small. Therefore, it is possible to reliably cancel the noise in a short period of time.

Thirty-fifth Embodiment

Figure 85:
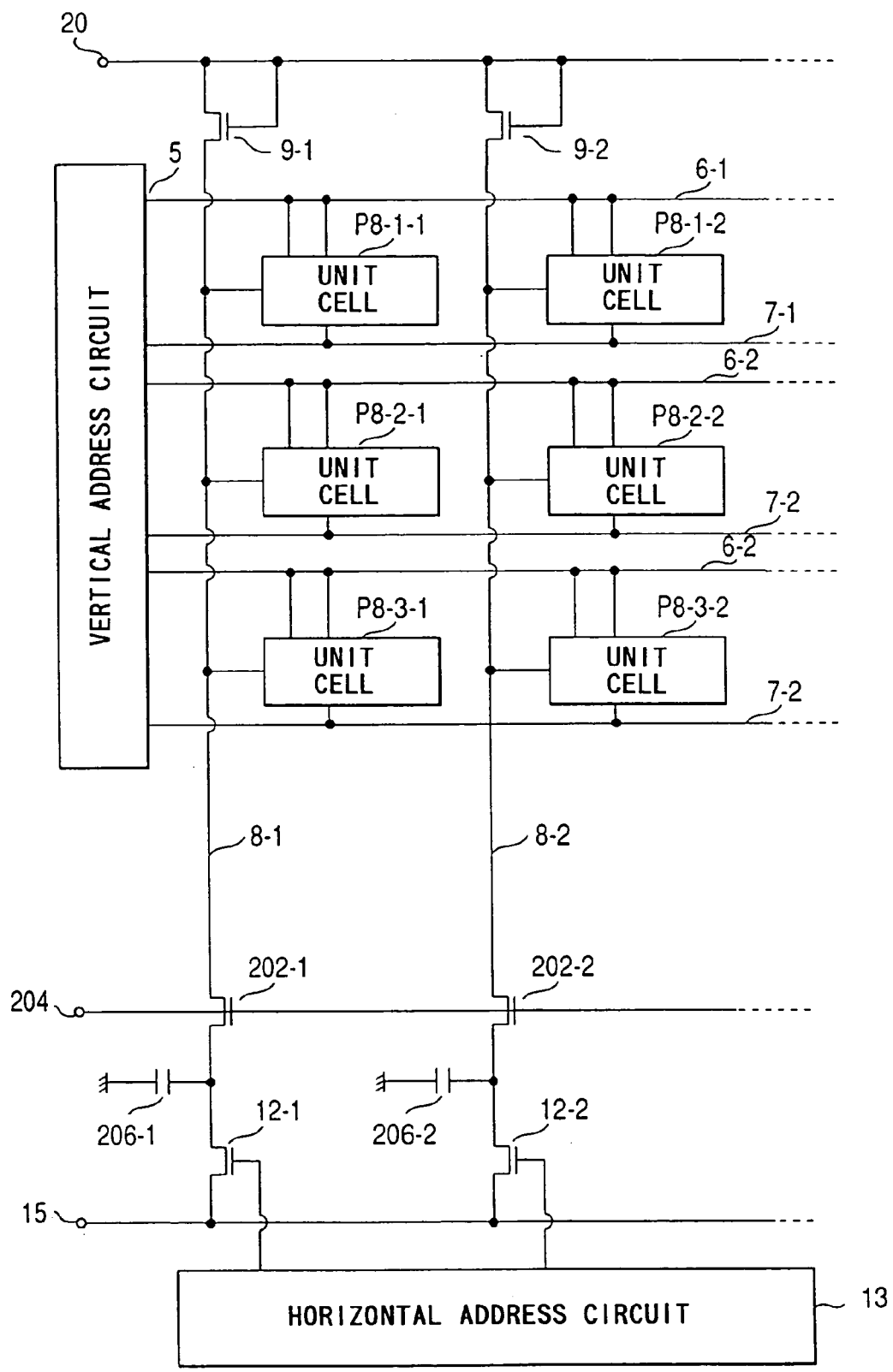
FIG. 85 is a diagram for explaining the thirty-fifth embodiment of the present invention and showing a circuit diagram showing an arrangement of an MOS-type solid-state imaging device.

FIG. 85 is a circuit diagram showing of an imaging device using an amplification-type MOS sensor according to thirty-fifth embodiment of the present invention. The circuit arrangement in the vicinity of a unit cell P8-i-j is the same as that in the thirty-third embodiment.

Separation transistors 202-1, 202-2, . . . are serially connected to the vertical signal lines 8-1, 8-2, . . . , and amplification capacitors 206-1, 206-2, . . . are provided between the separation transistors 202-1, 202-2, . . . and the horizontal selection transistors 12-1, 12-2, . . . . That is, in the present embodiment, a noise canceler is not provided in front of the horizontal selection transistor. Instead, an amplification capacitor for adjusting the amplification ratio is provided.

Thirty-sixth Embodiment

Figure 86:
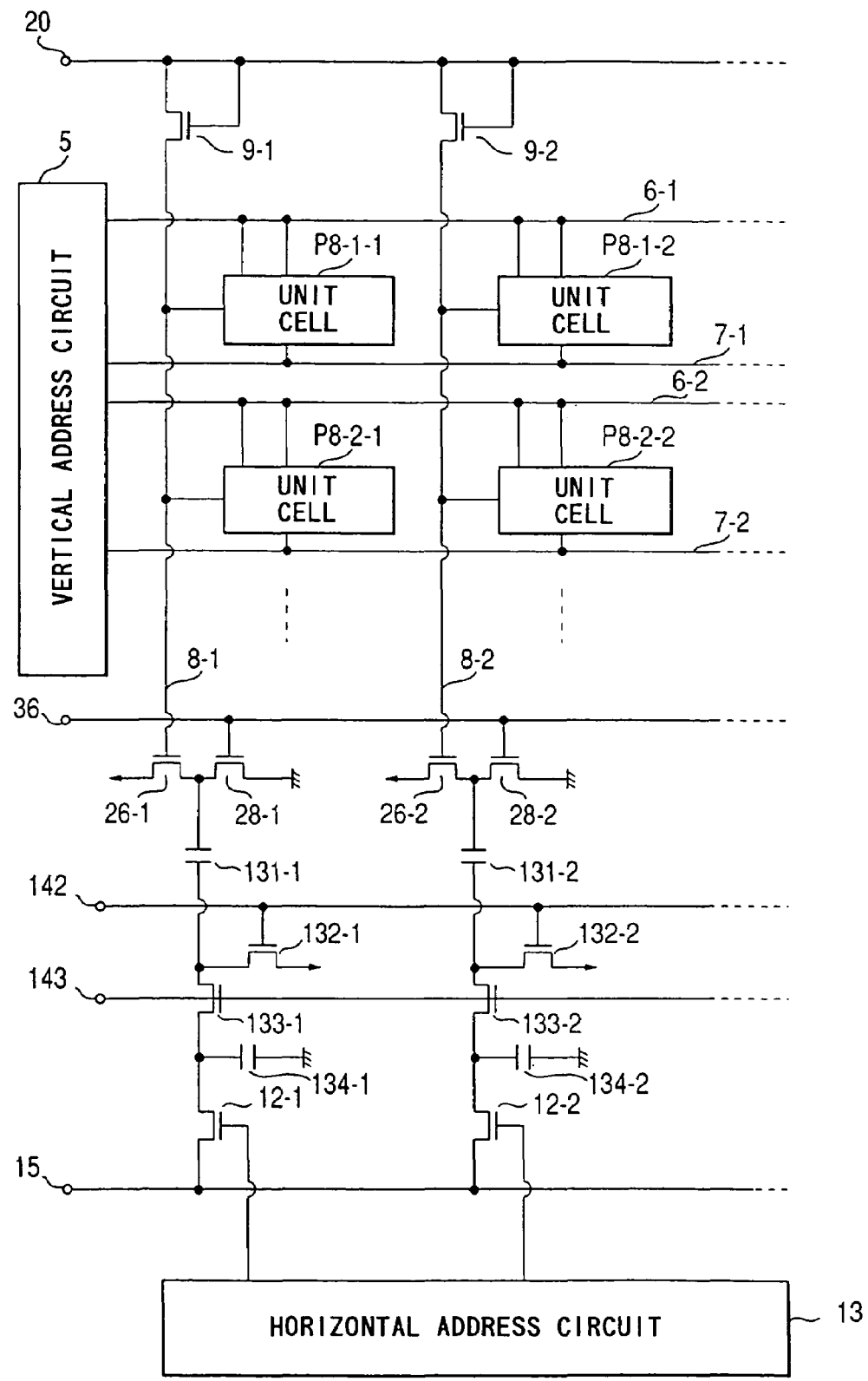
FIG. 86 is a diagram for explaining the thirty-sixth embodiment of the present invention and showing a circuit diagram showing an arrangement of an MOS-type solid-state imaging device.

FIG. 86 is a circuit diagram showing of an imaging device using an amplification-type MOS sensor according to thirty-sixth embodiment of the present invention. The circuit arrangement in the vicinity of a unit cell P8-i-j is the same as that in the thirty-third embodiment.

In the present thirty-sixth embodiment, the impedance conversion circuit of thirty-fourth embodiment is connected to the noise canceler circuit of thirty-third embodiment. In the present embodiment, the common source of the clamp transistors 132 is driven by direct current.

Thirty-seventh Embodiment

Figure 87:
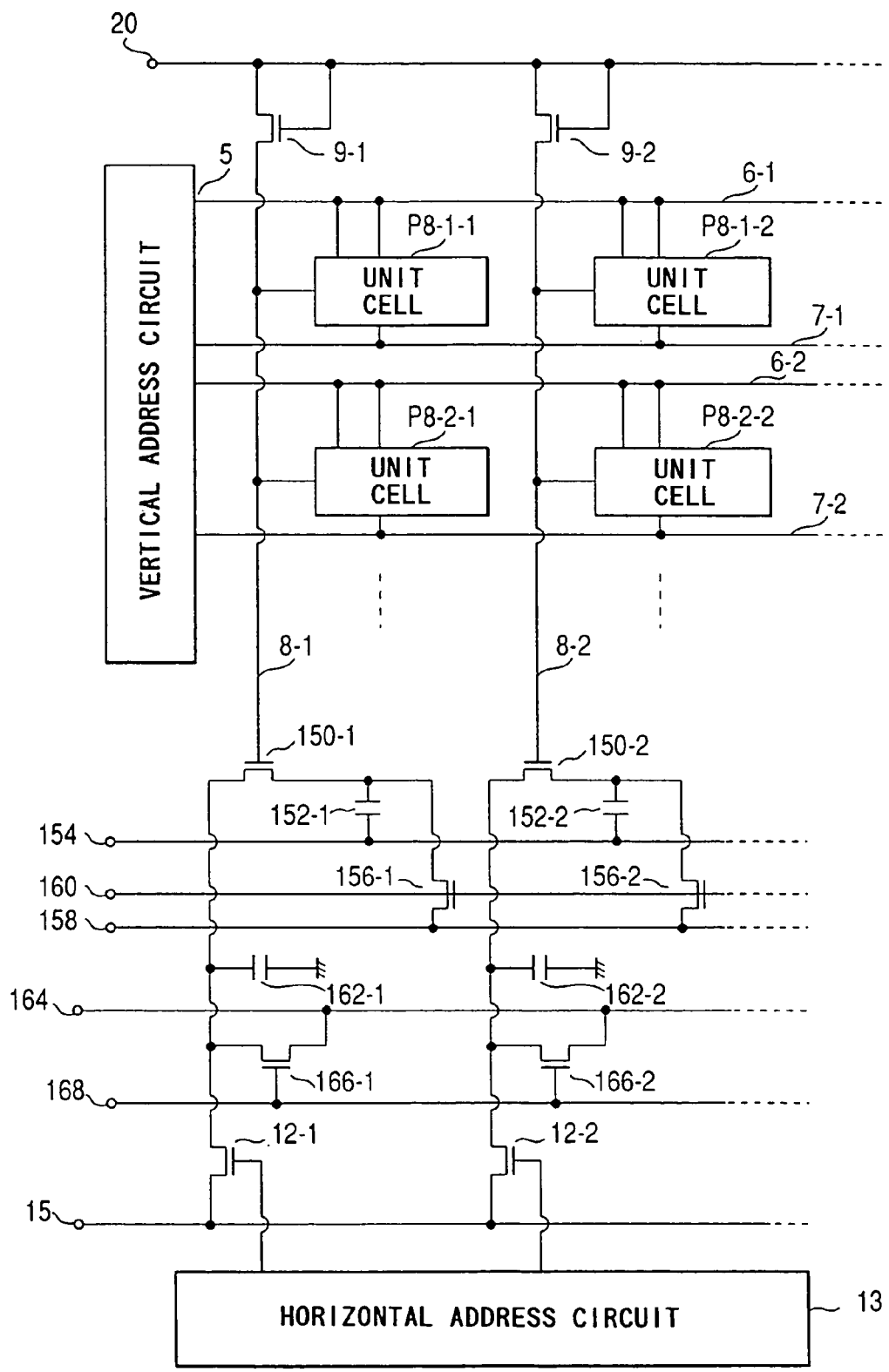
FIG. 87 is a diagram for explaining the thirty-seventh embodiment of the present invention and showing a circuit diagram showing an arrangement of an MOS-type solid-state imaging device.
Figure 88:
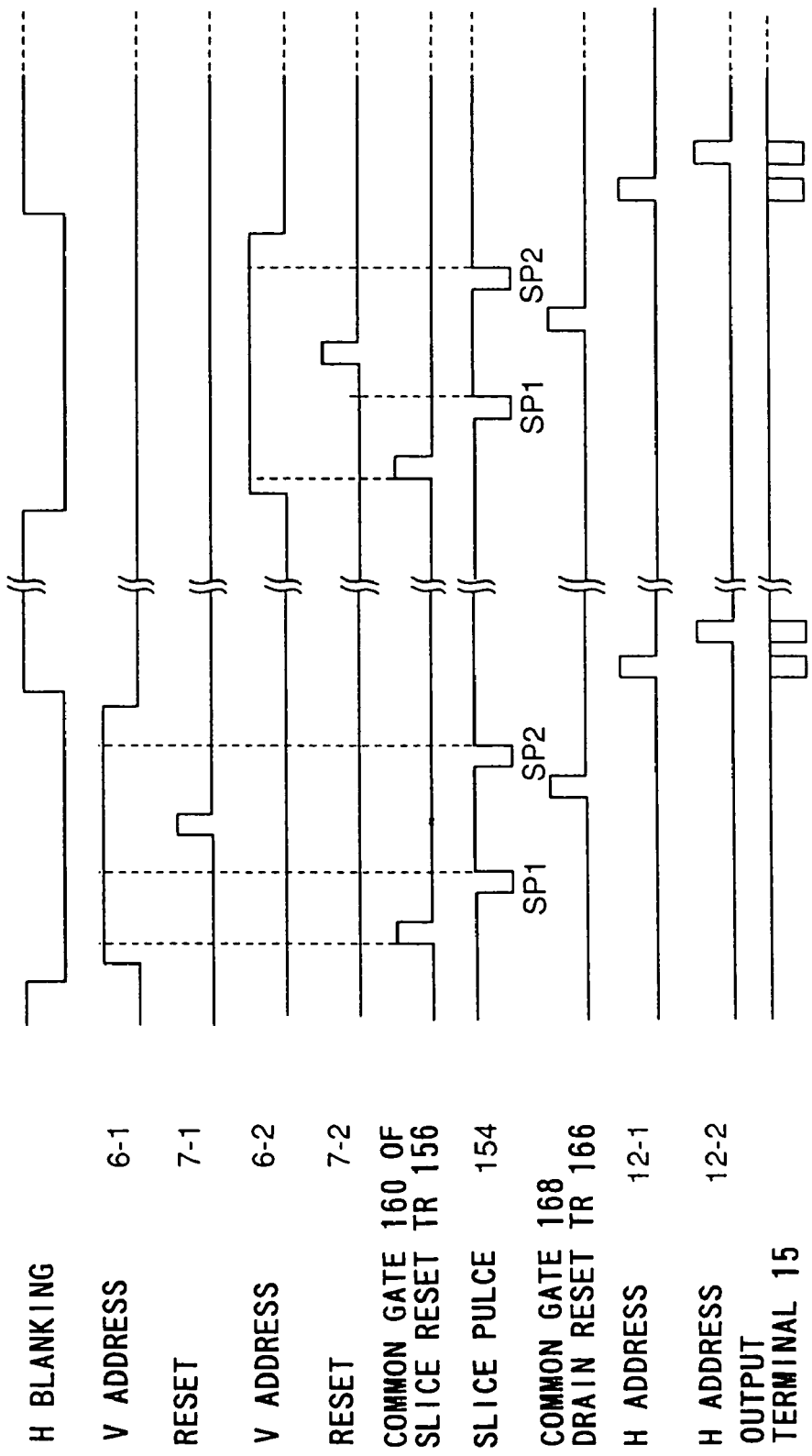
FIG. 88 is a timing chart showing the operation of the thirty-seventh embodiment.

With reference to FIGS. 87 and 88, thirty-seventh embodiment of the present invention will be described. FIG. 87 is a circuit diagram showing of an imaging device using an amplification-type MOS sensor according to thirty-seventh embodiment of the present invention. The circuit arrangement in the vicinity of a unit cell P8-i-j is the same as that in the thirty-third embodiment.

Ends of the vertical signal lines 8-1, 8-2, . . . which are opposite from the load transistors 9-1, 9-2, . . . are connected to gates of the slice transistors 150-1, 150-2, . . . , respectively. One ends of the slice capacitors 152-1, 152-2, . . . are connected to sources of the slice transistors 150-1, 150-2, . . . , and other ends of the slice capacitors 152-1,

152-2, . . . are connected to a slice pulse supply terminal 154. In order to reset source potentials of the slice transistors 150-1, 150-2, . . . , the slice reset transistors 156-1, 156-2, . . . are provided between sources of the slice transistors and the slice electric power source terminal 158, and the slice reset terminal 160 is connected to gates of the transistors 156-1, 156-2, . . . .

Slice electric charge transmitting capacitor 162-1, 162-2, . . . are connected to drains of the slice transistors 150-1, 150-2, . . . . Further, in order to reset the drain potentials of the slice transistors 150-1, 150-2, . . . , drain reset transistors 166-1, 166-2, . . . are provided between the drains of the slice transistors 150-1, 150-2, . . . and the accumulation drain electric power source terminal 164. The drain reset terminal 168 is connected to gates of the transistors 166-1, 166-2, . . . . Further, drains of the slice transistors 150-1, 150-2, . . . are connected to the signal output terminal 15 through the horizontal selection transistors 12-1, 12-2, . . . which are driven by horizontal address pulses supplied from the horizontal address circuit 13.

The MOS sensor of thirty-seventh embodiment has the same structure of the unit cell P8-i-j as that in thirty-third embodiment shown in FIG. 81, but has a different structure of the noise canceler. The noise canceler of thirty-seventh embodiment converts a voltage appearing on the vertical signal lines 8-1, 8-2, . . . into gate capacitor of the slice transistor 150, and performs a subtraction in an electric charge region, thereby suppressing the noise.

Next, a driving method of the present embodiment will be described. FIG. 88 is a timing chart showing the operation of the present embodiment, and FIG. 48 shows potentials of the slice transistors 150-1, 150-2, . . . .

First, if a vertical address pulse of high level is applied to the vertical address line 6-1 of a first line, only the vertical selection transistor 66 of the unit cell of this line is turned on, and a source follower circuit is constituted by the amplification transistor 64 and the load transistors 9-1, 9-2, . . . of this line.

Next, a slice reset pulse is applied to the slice reset terminal 160 to turn of the slice reset transistors 156-1, 156-2, . . . , thereby initializing the electric charges of the slice capacitors 152-1, 152-2, . . . .

Further, the slice reset transistors 156 are turned off. At this time, a signal voltage corresponding to a signal electric charge of the photodiode of the first line which is addressed appears on the vertical signal lines 8-1, 8-2, . . . .

A first slice pulse SP1 is applied to the slice pulse supply terminal 154. With this operation, the first slice electric charge is transmitted to the drain beyond a channel potential $V_{sch}$ under a gate of the slice transistor 150 when a signal is presented (i.e., when the signal component and noise component are output). At this time, a drain reset pulse is applied to the drain reset terminal 168, and the drain reset transistor 166 is turned on and therefore, the drain potential is fixed to a potential $V_{sdd}$ of the accumulation drain electric power source terminal 164. Hence, the first slice electric charge is discharged into the accumulation drain electric power source terminal 164 through the drain reset transistor 166.

Next, if a reset pulse is applied to the reset line 7-1, a noise component free from a signal is output to the vertical signal lines 8-1, 8-2, . . . in which the photodiode of the cell is reset. A second slice pulse SP2 is applied to the slice pulse supply terminal 154. With this operation, a second slice electric charge is transmitted beyond a channel potential $V_{och}$ under a gate of the slice transistor 150 to which a voltage when there is no signal electric charge is applied. At this time, because the drain reset transistor 166 is turned off, the second slice electric charge is transmitted to the slice electric charge transmitting capacitor 162.

Then, a horizontal selection pulse is sequentially applied from the horizontal address circuit 13 to the horizontal selection transistors 12-1, 12-2, . . . , thereby sequentially outputting signals of one line from the horizontal signal line 15. By sequentially repeating this operation for the next line, and the subsequent lines, all of the two-dimensional signals can be read out.

In this device, if a value of the slice capacitor 152 is represented by $C_{s1}$, an electric charge (second slice electric charge) which is finally read out to the signal output terminal 15 is represented by $C_{s1} \times (V_{sch} - V_{och})$, and there appears an electric charge which is proportional to a difference between a case where there exists a signal electric charge and a case where a reset operation is conducted and there exists no signal electric charge. Therefore, a fixed-pattern noise due to the threshold variations of the amplification transistor 64 in the unit cell is suppressed. A circuit which converts a voltage appearing on the vertical signal 8 into an electric charge, and performs a subtraction in the electric charge region can also be called as a noise canceler circuit.

A noise canceling operation in the circuit of this type is different from that in thirty-third embodiment shown in FIG. 81. According to thirty-third embodiment, in the clamp node 145, a noise is eliminated in the electric charge region and a noise is canceled in the electric charge region. On the other hand, in the present embodiment, a noise is not canceled in the electric charge region at the source end of the slice transistor 150, and when the second slice pulse SP2 of the thirty-fourth embodiment is applied, an electric charge in which the noise is canceled is transmitted to the drain. That is, the noise is canceled in the electric charge region.

As described above, according to thirty-seventh embodiment, because an output of the unit cell is output through the noise canceler, it is possible to eliminate fixed-pattern noise corresponding to the threshold variations of the amplification transistor of the unit cell.

Further, an output from the unit cell is supplied to the noise canceler through the gate capacitor of the slice transistor. Therefore, even if the noise component is output or the signal component and noise component are output, the impedance of the noise canceler circuit as viewed from the unit cell is substantially the same. Therefore, the noise components of both the cases are substantially the same, and if the subtraction of the two outputs is performed, the noise output can be exactly canceled so that only the signal component can be output and thus, the noise can accurately be canceled. Further, the impedance of the noise canceler circuit is regarded as only a gate capacitance viewed from the unit cell and thus is very small. Therefore, it is possible to exactly cancel the noise in a short period of time.

It should be noted that the second slice pulse SP2 may be influenced by the first slice pulse SP1 which is immediately in front of the second slice pulse SP2. Therefore in order to equalize the influences of the first and second slice pulses with respect to the actions of the first and second transistors, it is effective to incorporate a dummy slice pulse immediately in front of the first slice pulse SP1. If amplitudes of the first and second slice pulses are the same, a signal electric charge may not be read out in an extremely small signal region, or a linearity may be deteriorated. In this case, it is effective to stabilize the operation to make the amplitude of the second slice pulse greater than that of the first slice pulse, thereby adding a bias electric charge to an electric charge which is read out by the second slice pulse. Further, it is also effective to made a width of the second slice pulse wider than that of the first slice pulse.

Thirty-eighth Embodiment

Figure 89:
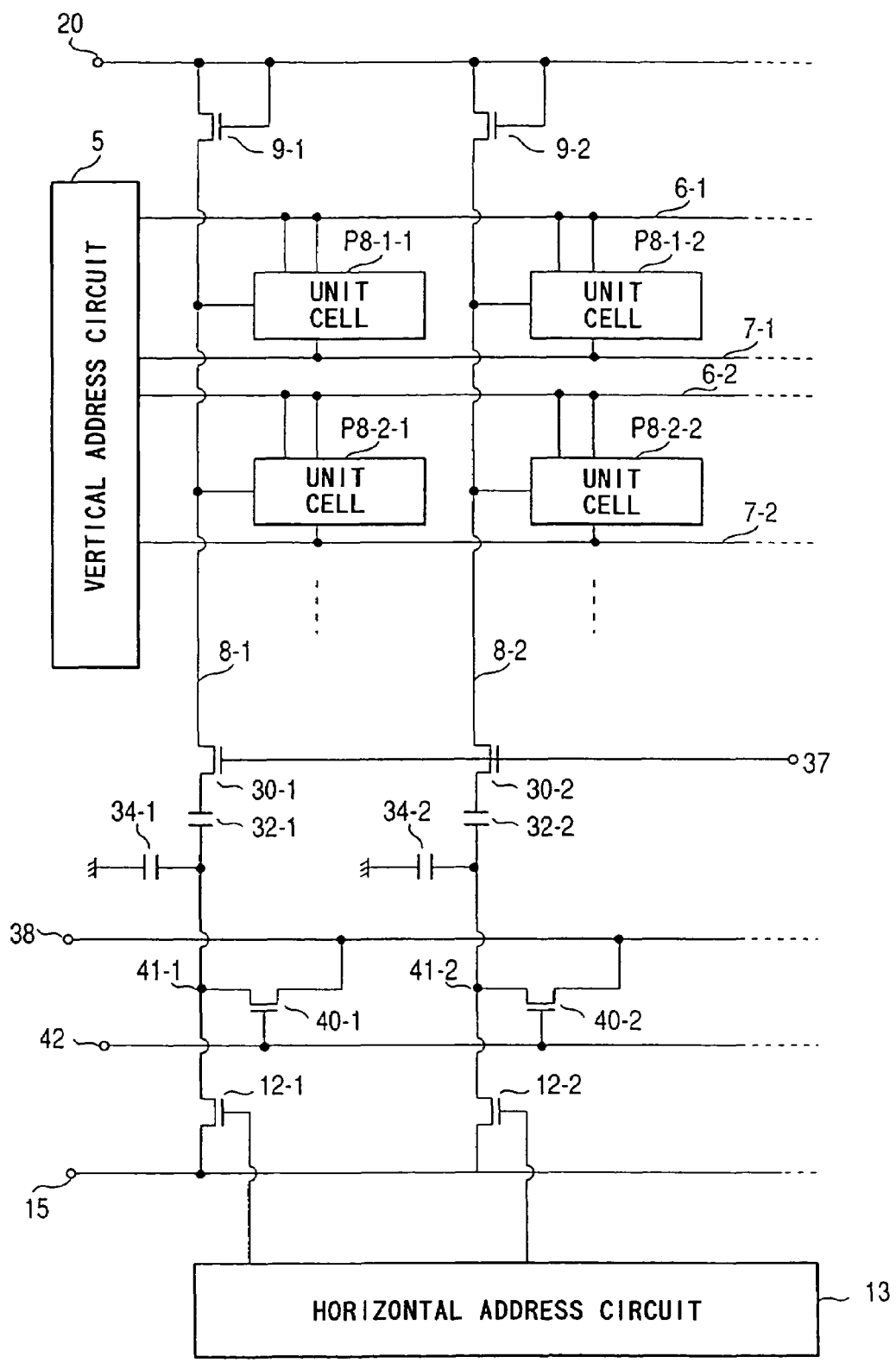
FIG. 89 is a diagram for explaining the thirty-eighth embodiment of the present invention and showing a circuit diagram showing an arrangement of an MOS-type solid-state imaging device.

With reference to FIG. 89, thirty-eighth embodiment of the present invention will be described. FIG. 89 is a circuit diagram showing of an imaging device using an amplification-type MOS sensor according to thirty-eighth embodiment of the present invention. The circuit arrangement in the vicinity of a unit cell P8-i-j is the same as that in the thirty-third embodiment.

Thirty-eighth embodiment is an embodiment in which the impedance conversion circuit comprising the source follower transistor is omitted from thirty-fourth embodiment.

Thirty-ninth Embodiment

Figure 90:
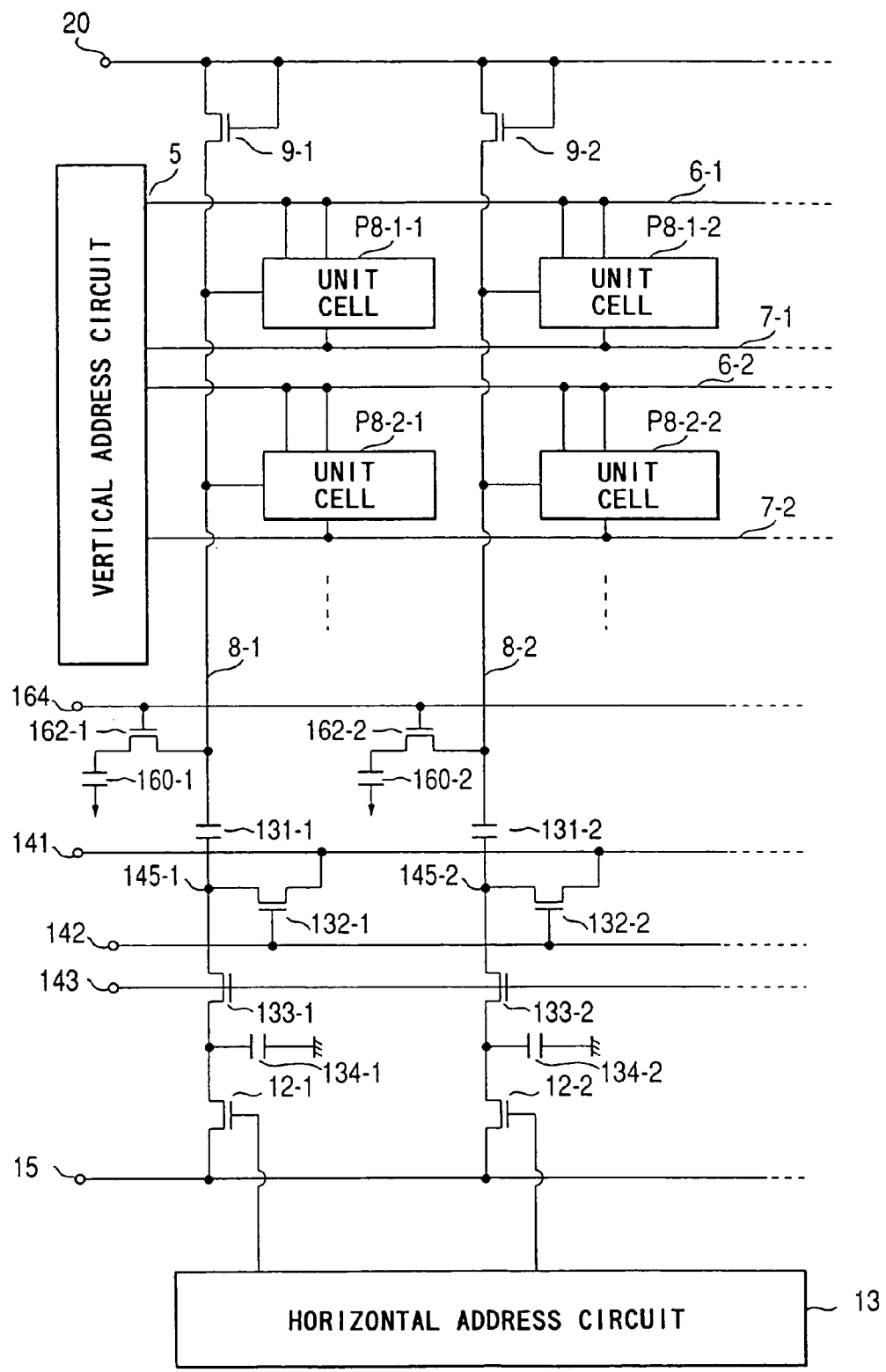
FIG. 90 is a diagram for explaining the thirty-ninth embodiment of the present invention and showing a first arrangement of an MOS-type solid-state imaging device.
Figure 91:
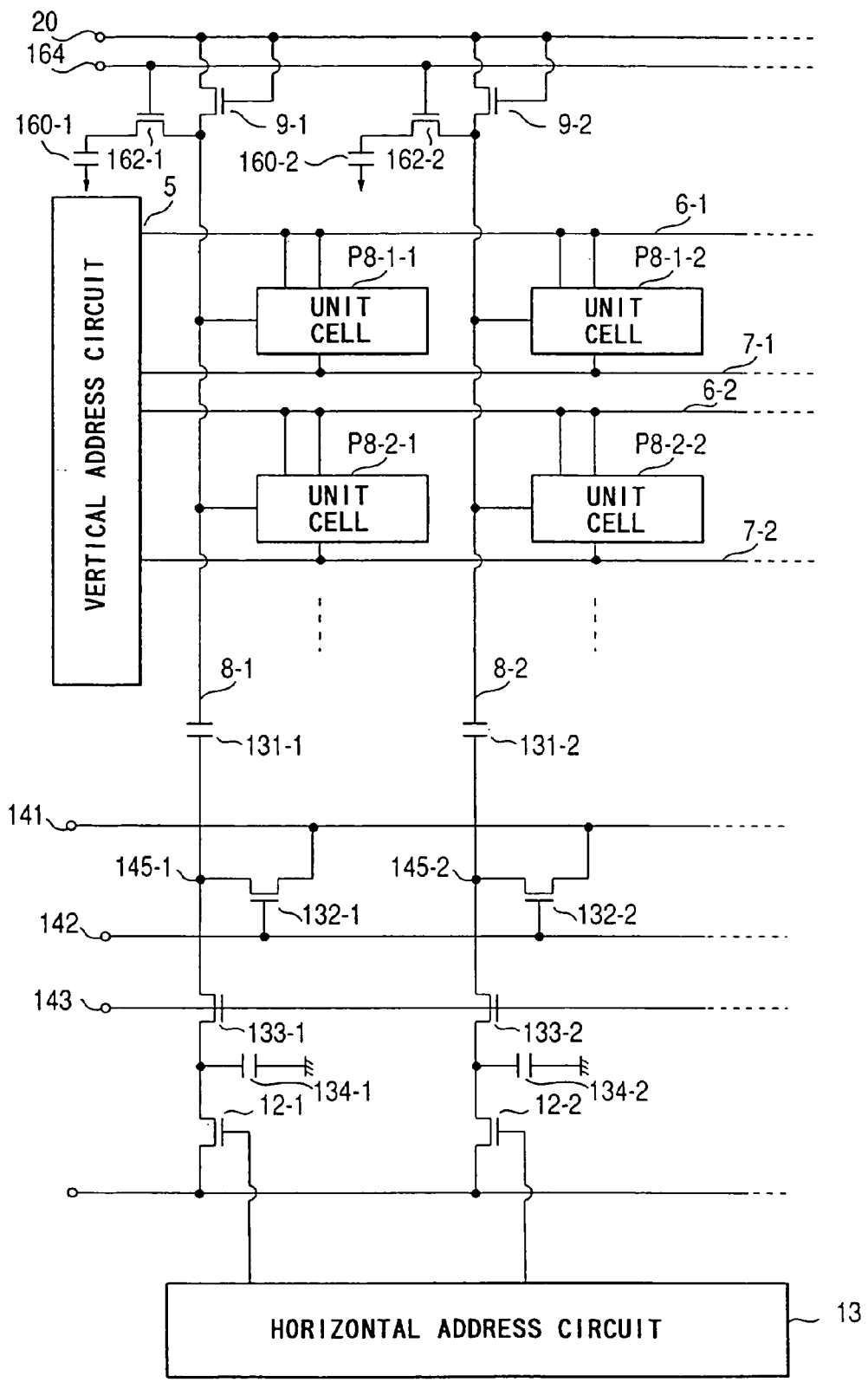
FIG. 91 is a diagram for explaining the thirty-ninth embodiment of the present invention and showing a second arrangement of an MOS-type solid-state imaging device.
Figure 92:
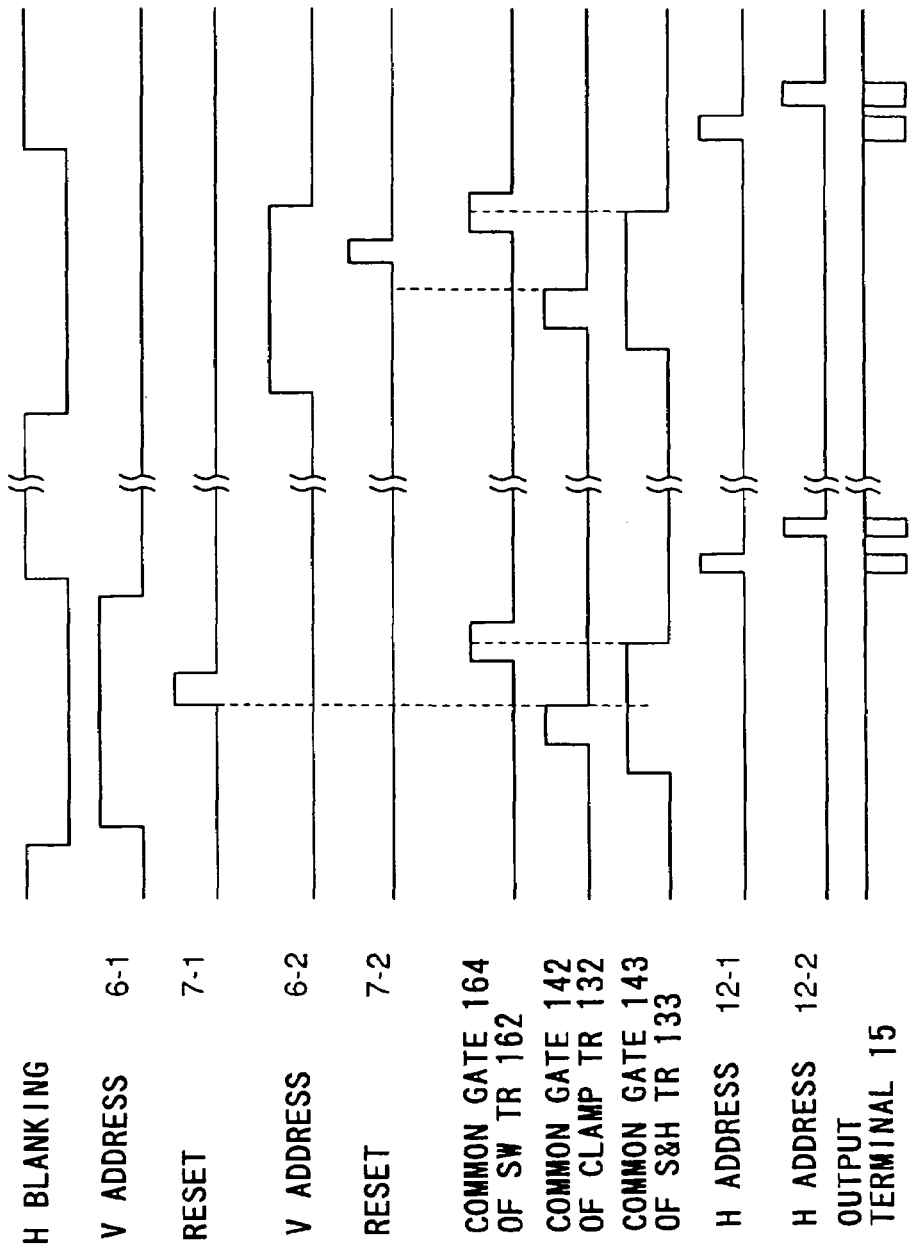
FIG. 92 is a timing chart showing the operation of the thirty-ninth embodiment.

With reference to FIGS. 90, 91 and 92, thirty-ninth embodiment of the present invention will be described. Each of FIGS. 90 and 91 is a circuit diagram showing of an imaging device using an amplification-type MOS sensor according to thirty-ninth embodiment of the present invention. The circuit arrangement in the vicinity of a unit cell P8-i-j is the same as that in the thirty-third embodiment.

Many portions of the present embodiments correspond to those in thirty-third embodiment shown in FIG. 81,-but different points are that capacitors $C_{CMP}$ 160-1, 160-2, . . . for correcting a difference in impedance as viewed from the unit cell between a case the signal component and noise component are output and a case where only the noise component is output are connected closer to the side of imaging region than to the clamp capacitors 131-1, 131-2, . . . in parallel to the vertical signal lines 8-1, 8-2, . . . through switch 162-1, 162-2, . . . . The correction capacitor 160 and the switch 162 are connected between the clamp capacitor 131 and the imaging region in the case of FIG. 90, and between the imaging region and the load transistor 9 in the case of FIG. 91.

FIG. 92 shows an operational timing of the present embodiment. The switch 162 is turned on during a time period in which a clamping by the clamp transistor 132 is completed and only the noise after the photodiode is reset is output to the vertical signal line. With this operation, if the sample/hold capacitor 134 is represented by $C_{SH}$, and if the clamp capacitor 131 is represented by $C_{CL}$, capacity connected to the vertical signal line 8 at the time of sample/hold is given by:

$$C = C_{CMP} + C_{SH} \cdot C_{CL}/(C_{CL}+C_{SH})$$

If a size of the correction capacitor $C_{CMP}$ is set in a range of $2\{C_{CL} - C_{CL} \cdot C_{SH}/(C_{CL}+C_{SH})\} > C_{CMP} > 0$, the capacity connected to the vertical signal line at the time of sample/hold approaches a size of the capacity $C_{CL}$ of the clamp capacitor 131-1. Therefore, a difference $V_{CL}$ becomes smaller and thus, noises are also reduced.

FIG. 55 shows a variation with time elapse of a potential of the vertical signal line 8 and a potential of the clamp node 145. In the present embodiment, as in a dark time case in which the signal is zero, even if potentials of the vertical signal line 8 in which the potential returns at the time of clamping and the potential returns at the time of sample/hold are the same, the potential of the clamp node, when the sample/hold is completed does not return to a value which is approximate to $\Delta V_{CL}$ and becomes zero. Therefore, there causes no inconvenience that even though it is a dark time in which the signal is zero, a signal corresponding to $\Delta V_{CL}$ may appear. Therefore, it is possible to prevent noise due to variation of $\Delta V_{CL}$ from being generated.

According to the present embodiment, as described above, in the MOS-type solid-state imaging element having a noise eliminating circuit, it is possible to suppress the variations in capacity during the noise eliminating operation which is the causes for generating noise, by providing the vertical signal line 8 with the correction capacitor 160, which contributes to reduce the noise. That is, the impedances as viewed from the cell becomes the same between a case where the signal and noise after the photodiode is selected is output and a case where the noise after the reset operation is completed is output, and noise can accurately be canceled.

As a modification of thirty-ninth embodiment, a correcting capacitor may be connected to the noise canceler of any of thirty-fourth embodiment shown in FIG. 83, thirty-fifth embodiment shown in FIG. 85, thirty-sixth embodiment shown in FIG. 86, thirty-seventh embodiment shown in FIG. 87, and thirty-eighth embodiment shown in FIG. 89.

In thirty-fourth to thirty-ninth embodiments, the noise canceler circuit of thirty-third embodiment is changed. Next, another embodiment in which the structure of the unit cell of the thirty-third to thirty-ninth embodiments is changed.

Fortieth Embodiment

Figure 93:
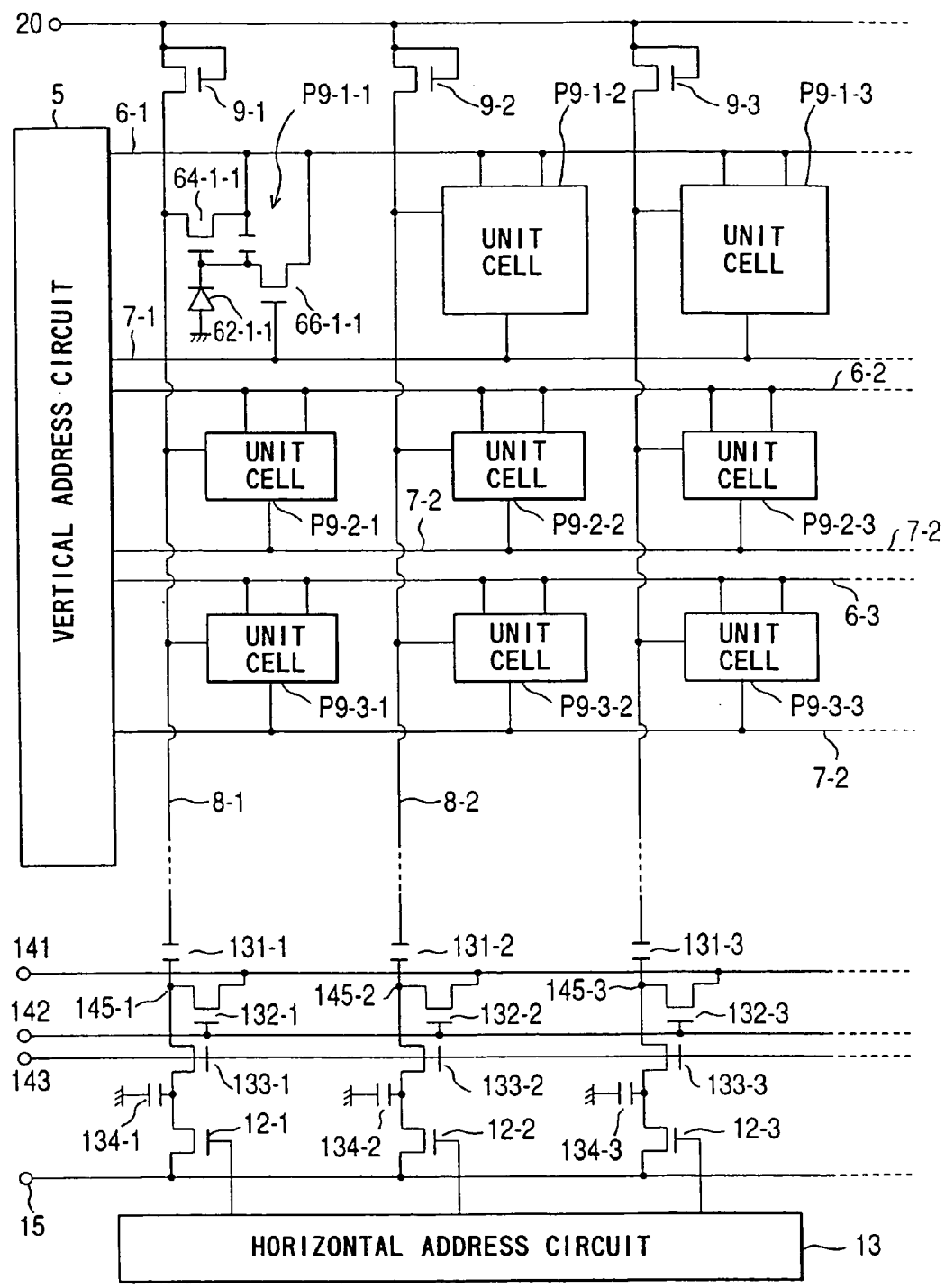
FIG. 93 is a diagram for explaining a fortieth embodiment of the present invention and showing the arrangement of the unit cell of an MOS-type solid-state imaging device.

With reference to FIG. 93, fortieth embodiment of the present invention will be described. FIG. 93 is a circuit diagram showing of an imaging device using an amplification-type MOS sensor according to fortieth embodiment of the present invention. A unit cell P9-i-j corresponds to the unit cell of thirty-third embodiment from which the address capacitor 69 is omitted.

In the present embodiment, when the drain of the amplification transistor 64 is addressed by the vertical address circuit 5, because a potential of a channel under the gate of the amplification transistor 64, a short channel effect is utilized. That is, when a potential of the drain of the amplification transistor 64 is increased, a depletion layer extends to the channel under the gate from the drain, and the threshold voltage varies into a negative direction. The present embodiment utilizes this effect. The causes that only the output signal of the photodiode 62 of the unit cell of the addressed line appears on the vertical signal line 8 is quite the same as that of thirty-third embodiment.

According to the present embodiment, as described above, it is possible to address the vertical address line not only without the vertical selection transistor but also without the address capacitor and therefore, it is possible to reduce the number of devices or elements as compared with thirty-third embodiment, and the cell can be divided finely.

In the present fortieth embodiment also, it is possible to modify the noise canceler as in the thirty-third embodiment. That is, the descriptions made for FIGS. 81 to 92, and 55 can equally be applied to fortieth embodiment.

Forty-first Embodiment

Figure 94:
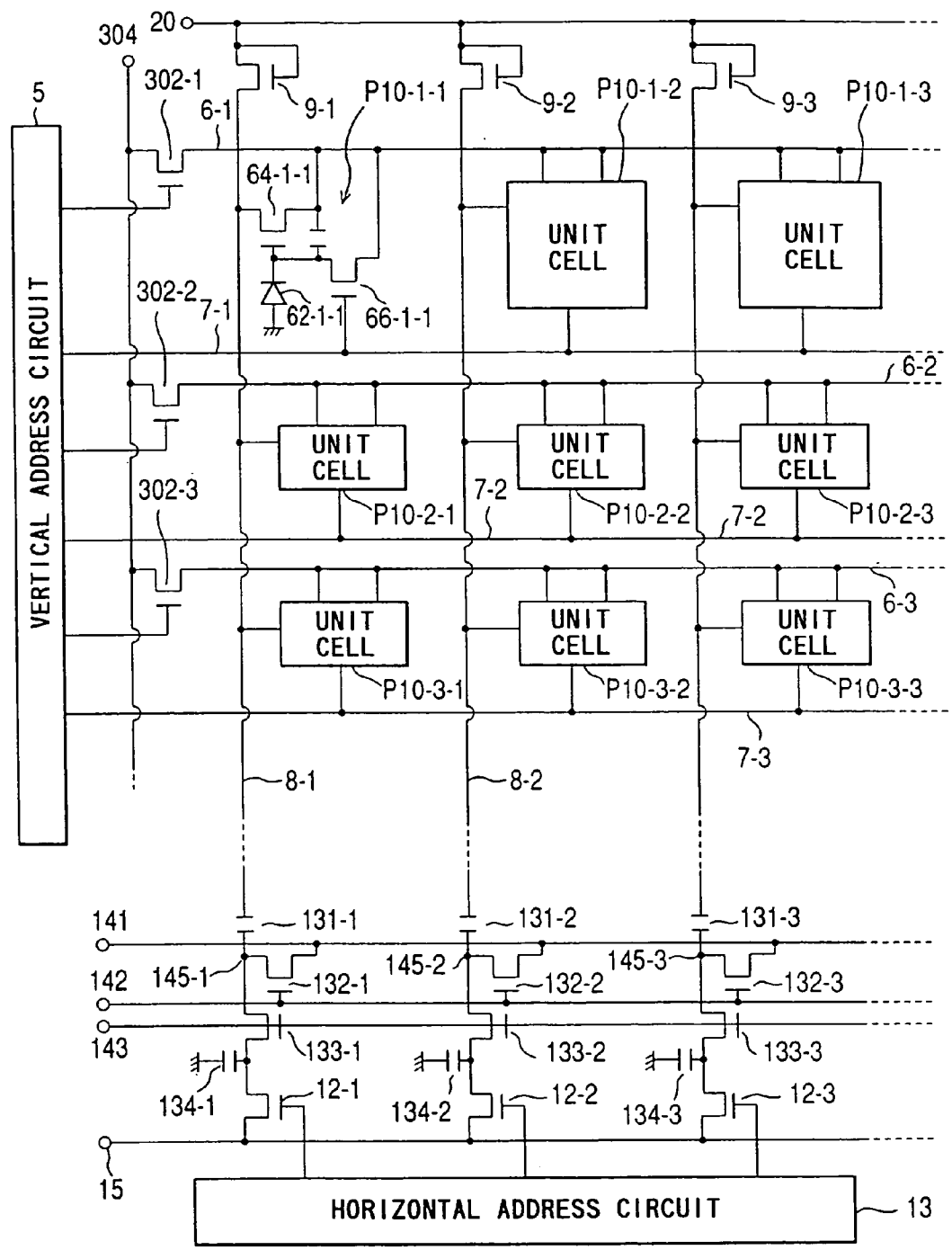
FIG. 94 is a diagram for explaining a forty-first embodiment of the present invention and showing the arrangement of the unit cell of an MOS-type solid-state imaging device.

With reference to FIG. 94, forty-first embodiment will be described. FIG. 94 is a circuit diagram showing the entire solid-state imaging device of a structure using an amplification-type MOS sensor of the present embodiment. A unit cell P10-i-j is provided for every vertical address line one each, and a vertical selection transistor is provided outside the cell. That is, the unit cell P10-i-j comprises a photodiode 62-i-j, an amplification transistor 64-i-j for amplifying a detection signal of the photodiode 62-i-j, and a reset transistor 66-i-j for resetting a signal electric charge of the photodiode 62-i-j.

Vertical selection transistors 302-1, 302-2, . . . extending from the vertical address circuit 5 in a horizontal direction are connected to gates of the vertical selection transistors 302-1, 302-2, . . . . Sources of the vertical selection transistors 302-1, 302-2, . . . are connected to sources of the amplification transistors 64 of the unit cell and sources of the reset transistors 66. Drains of the vertical selection transistors 302-1, 302-2, . . . are commonly connected to a drain terminal 304.

According to the present embodiment, although one vertical address line which is addressed by the vertical address circuit 5 is brought into a level of the common drain electric power source 304 (high level) because the vertical selection transistor 302 is turned on, other vertical address lines which are not addressed are electrically floating. Therefore, an amplification transistor 64 of a unit cell connected to a vertical address line which is not addressed is not operated, and only a detection signal of a photodiode 62 of a unit cell connected to a vertical address line which is addressed appears on the vertical signal line 8. An operational timing is the same as that in thirty-third embodiment shown in FIG. 82.

The noise canceler of the present forty-first embodiment can be modified as in thirty-third embodiment. That is, the description made for FIGS. 81 to 92 and 55 can equally be applied to forty-first embodiment.

Forty-second Embodiment

Figure 95:
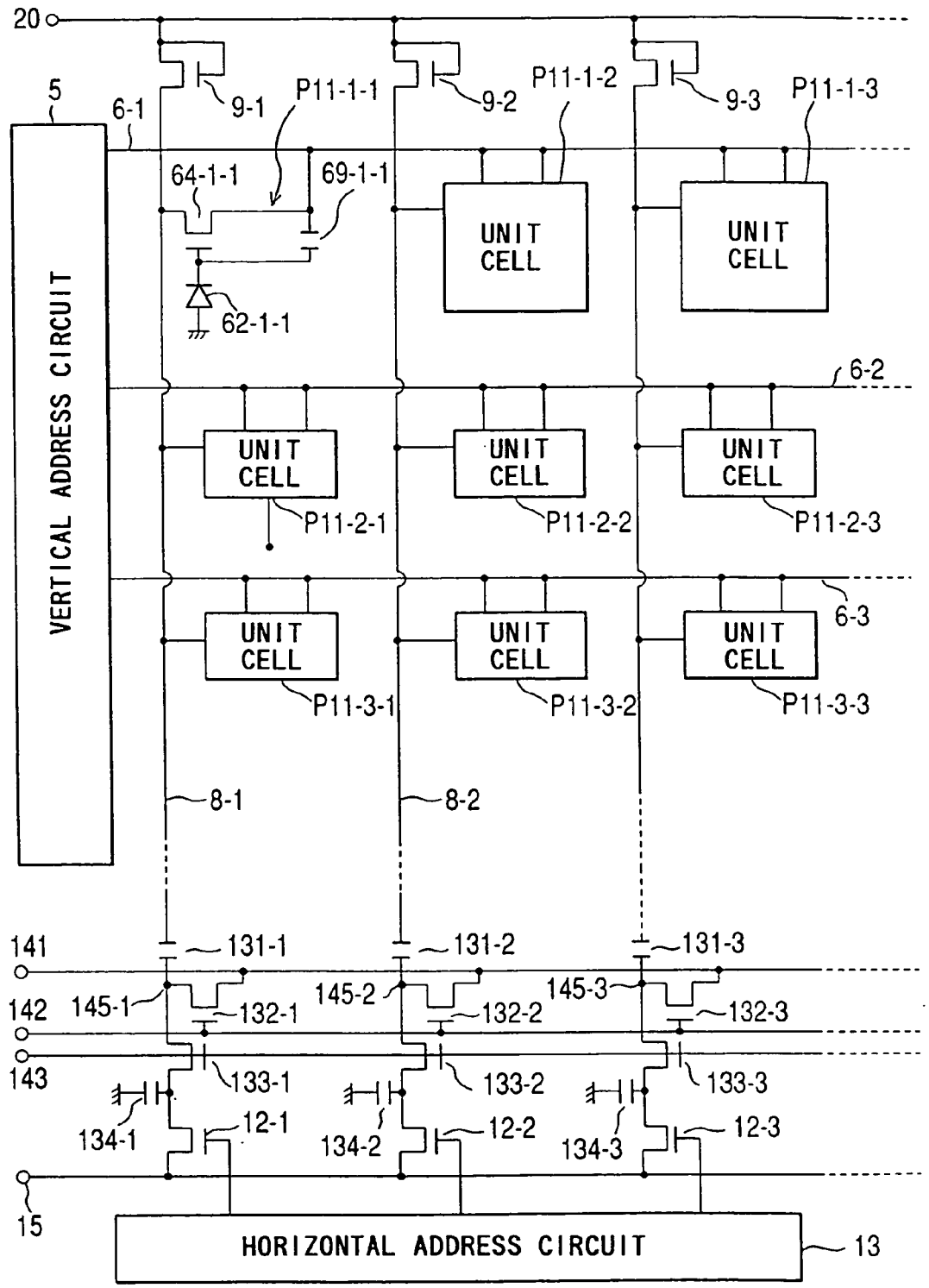
FIG. 95 is a diagram for explaining a forty-second embodiment of the present invention and showing the arrangement of the unit cell of an MOS-type solid-state imaging device.

With reference to FIG. 95, forty-second embodiment will be described. FIG. 95 is a circuit diagram showing the entire solid-state imaging device of a structure using an amplification-type MOS sensor of the present embodiment. A unit cell P11-i-j of the present embodiment corresponds to the basic cell of thirty-third embodiment shown in FIG. 81 except that the reset transistor 66 and the reset line 7 are omitted. That is, the unit cell P11-i-j comprises a photodiode 62-i-j, and an amplification transistor 64-i-j for amplifying a detection signal of the photodiode 62-i-j.

The vertical address lines 6-1, 6-2, . . . extending from the vertical address circuit 5 in a horizontal direction are connected to the drains of the amplification transistors 64, and are connected to the gates of the amplification transistors 64 through the address capacitors 69.

Figure 96:
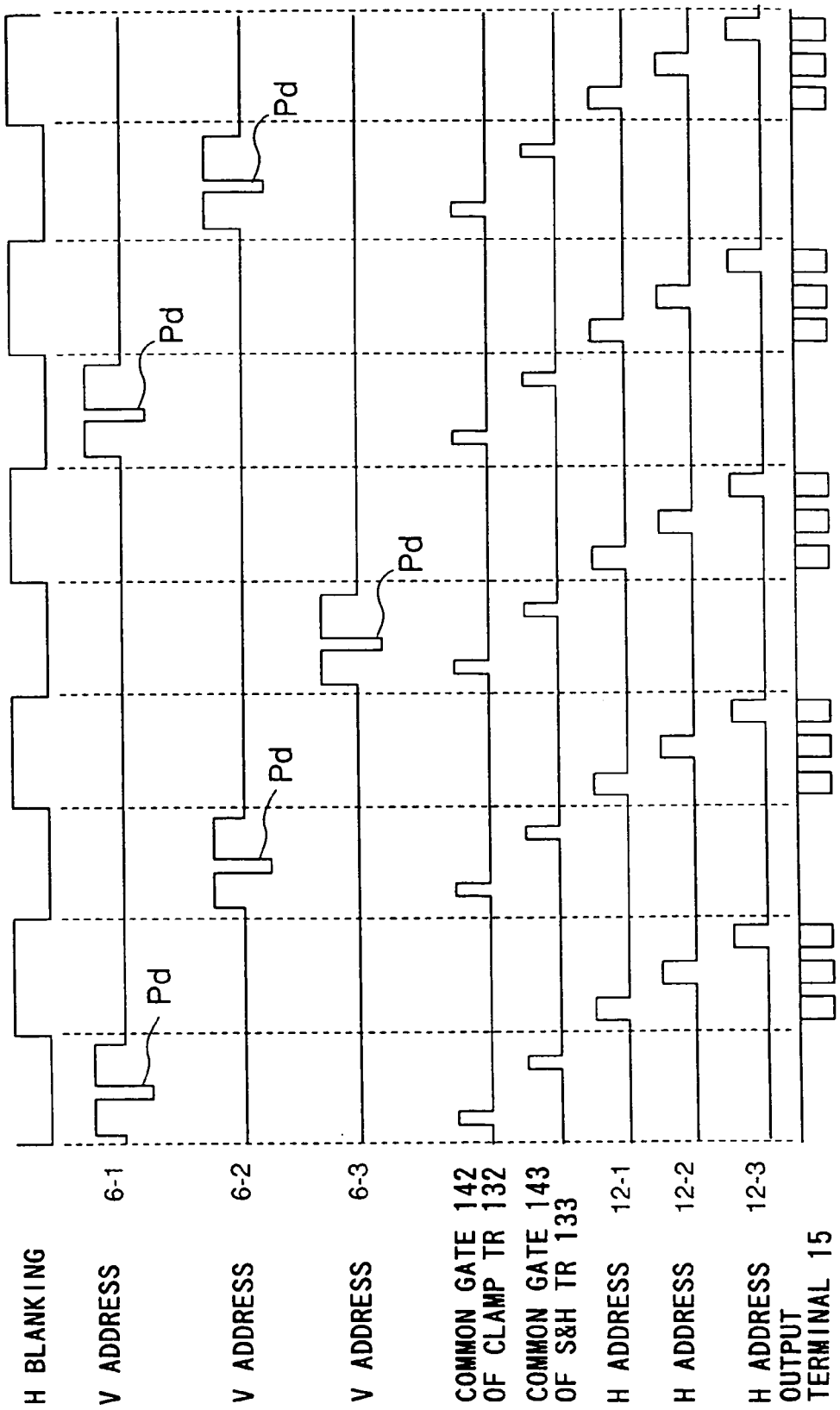
FIG. 96 is a timing chart showing the operation of the forty-second embodiment.

An operational timing chart of the present embodiment is shown in FIG. 96. The timing chart of FIG. 96 is the same as that in thirty-third embodiment shown in FIG. 82 except that a negative signal electric charge discharging pulse $P_d$ is inserted in an intermediate portion of the address pulse which is applied to the vertical address line 6-1, 6-2, . . . .

A sequence in the timing chart of FIG. 96 will be described below. The following order is required.

First rise of vertical address pulse→Fall of clamp pulse→Rise of signal electric charge discharging pulse→Fall of signal electric charge discharging pulse→Fall of sample/hold pulse→Second fall of vertical address pulse Although the order of first rise of the vertical address pulse, rise of the sample/hold pulse and rise of the clamp pulse can be arbitrarily set, the above described order is preferable.

Figure 97:
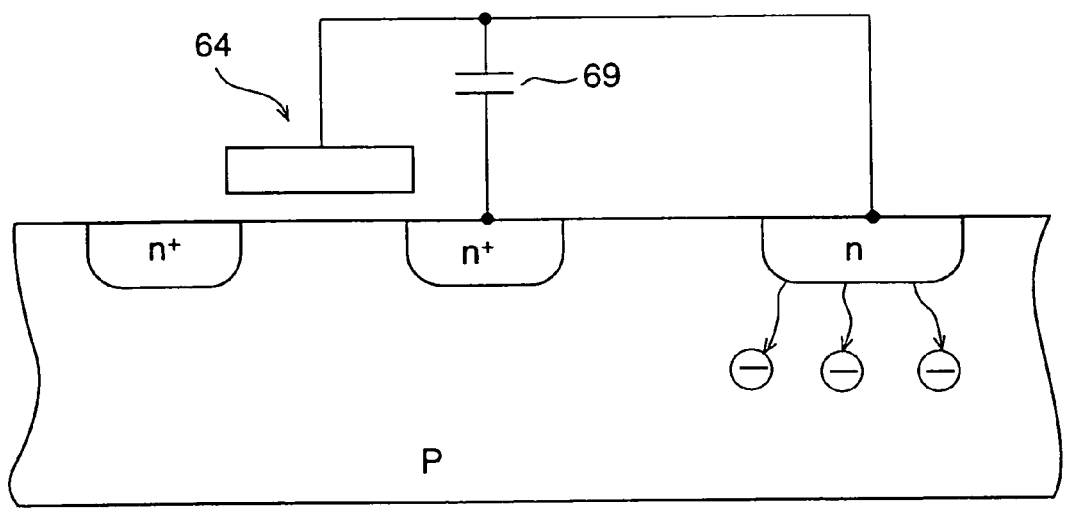
FIG. 97 is a diagram showing a device arrangement of the forty-second embodiment.

A sectional structure of the basic cell and a manner of discharging a signal electric charge of the present embodiment are shown in FIG. 97. The basic operation as the same as that in thirty-third embodiment. By providing the address capacitor 69, it is possible to address the vertical address line without the vertical selection transistor. After a signal is read out, a negative signal electric charge discharging pulse $P_d$ is applied to the vertical address lines 6-1, 6-2, . . . , to bias a potential of the photodiode 62 in a negative direction through a connection capacitor, thereby discharging the inside signal electric charge into the p-type substrate. With this operation, it is possible to reset the signal electric charge. An operation of the noise eliminating circuit is the same as that in thirty-third embodiment.

According to the present embodiment, as described above, it is possible to constitute the basic cell by the photodiode 62, the amplification transistor 64 and the address capacitor 69, and to further finely divide the basic cell.

The noise canceler of the present forty-second embodiment can be modified as in thirty-third embodiment. That is, the description made for FIGS. 81 to 92 and 55 can equally be applied to forty-second embodiment.

Forty-third Embodiment

Figure 98:
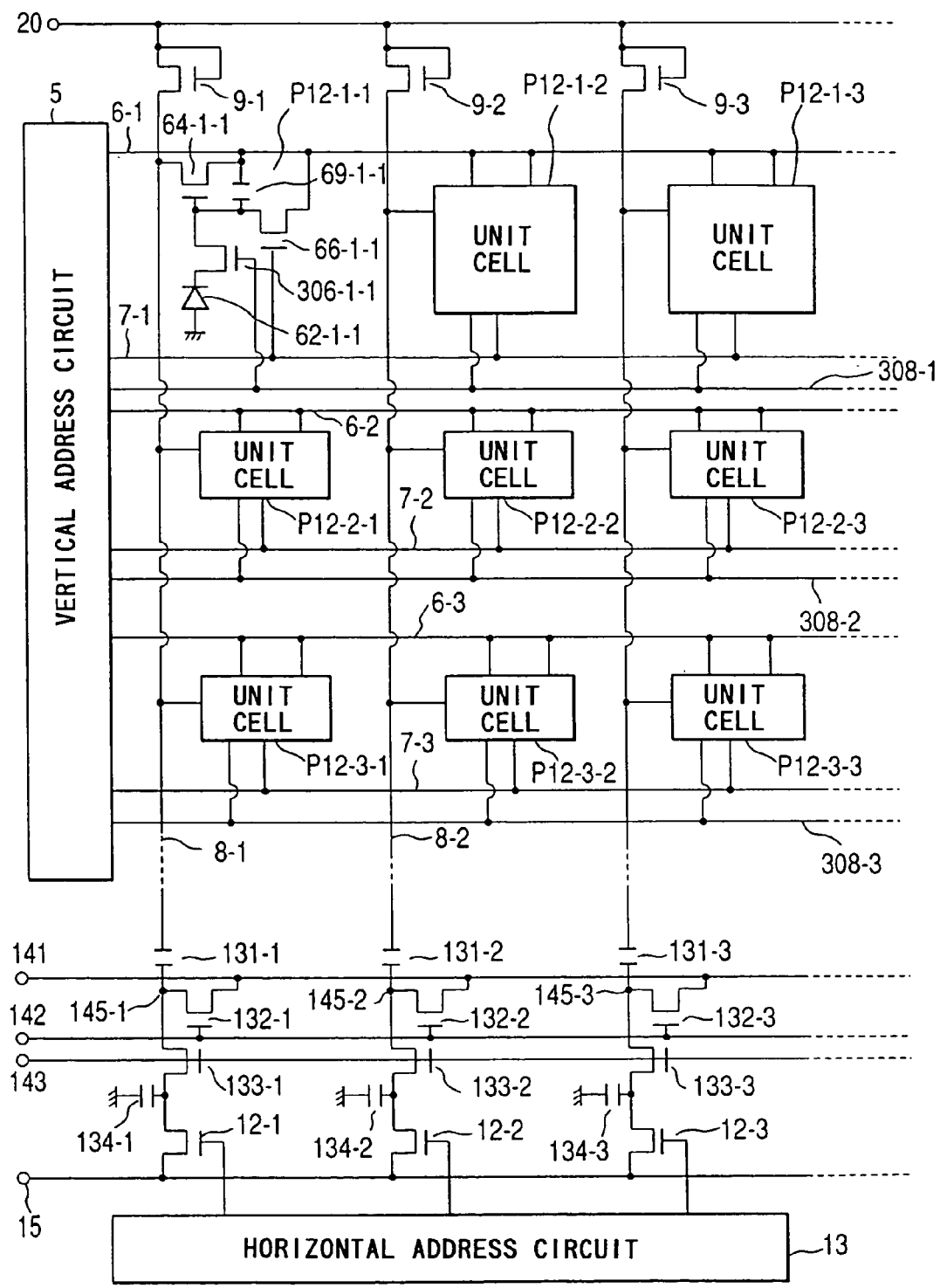
FIG. 98 is a diagram for explaining a forty-third embodiment of the present invention and showing the arrangement of the unit cell of an MOS-type solid-state imaging device.

With reference to FIG. 98, forty-third embodiment will be described. FIG. 98 is a circuit diagram showing the entire solid-state imaging device of a structure using an amplification-type MOS sensor of the present embodiment. A unit cell P12-i-j of the present embodiment corresponds to the cell structure of thirty-third embodiment shown in FIG. 81 except that a transmitting transistor 306 is added between the photodiode 62 and the gate of the amplification transistor 64. A common gate 308 of the transmitting transistor 306 is connected to the vertical address circuit 5.

Forty-fourth Embodiment

Figure 99:
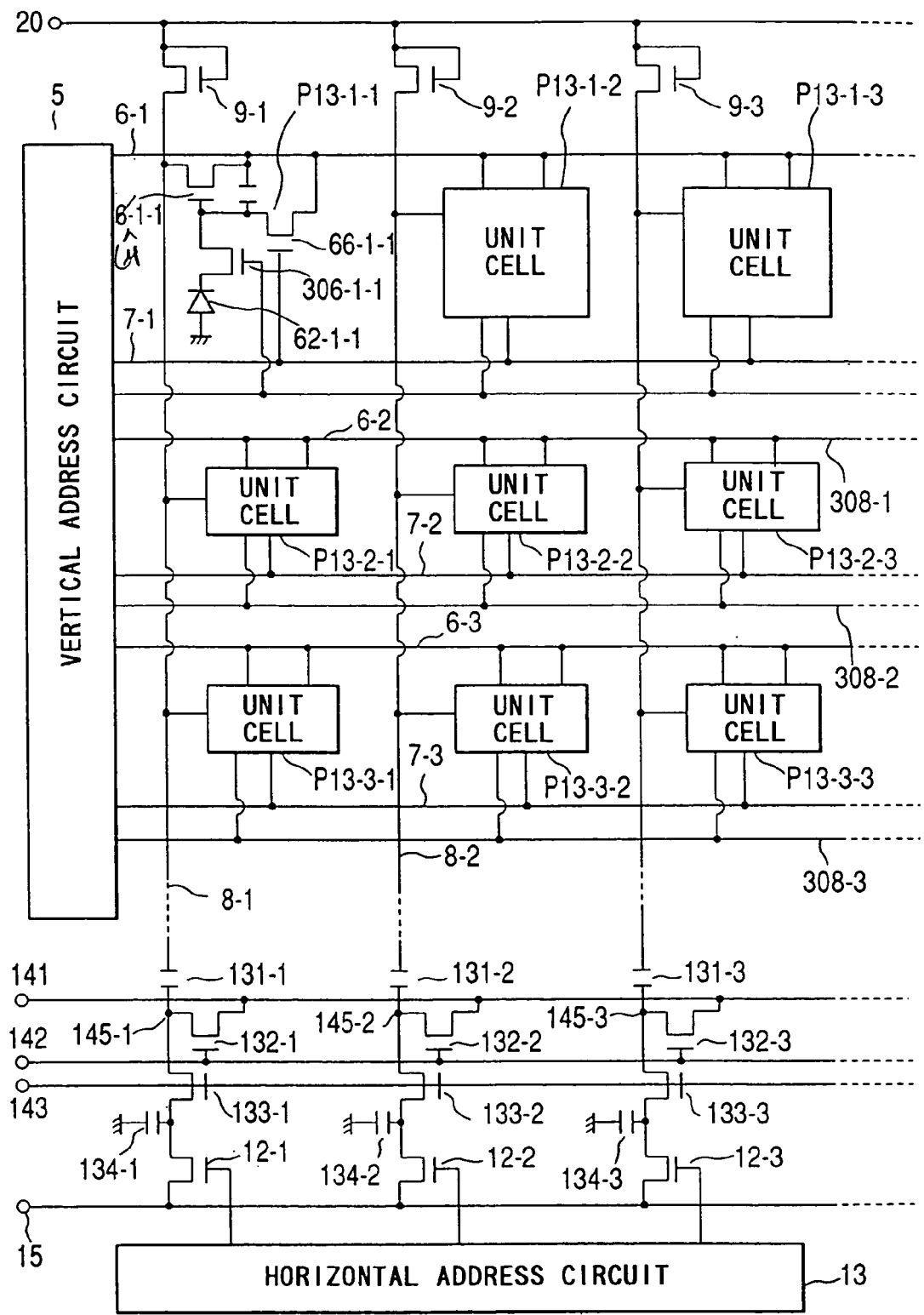
FIG. 99 is a diagram for explaining a forty-fourth embodiment of the present invention and showing the arrangement of the unit cell of an MOS-type solid-state imaging device.

With reference to FIG. 99, forty-fourth embodiment will be described. FIG. 99 is a circuit diagram showing the entire solid-state imaging device of a structure using an amplification-type MOS sensor of the present embodiment. A unit cell P13-i-j of the present embodiment corresponds to the cell structure of fortieth embodiment shown in FIG. 93 except that a transmitting transistor 306 is added between the photodiode 62 and the gate of the amplification transistor 64.

Forty-fifth Embodiment

Figure 100:
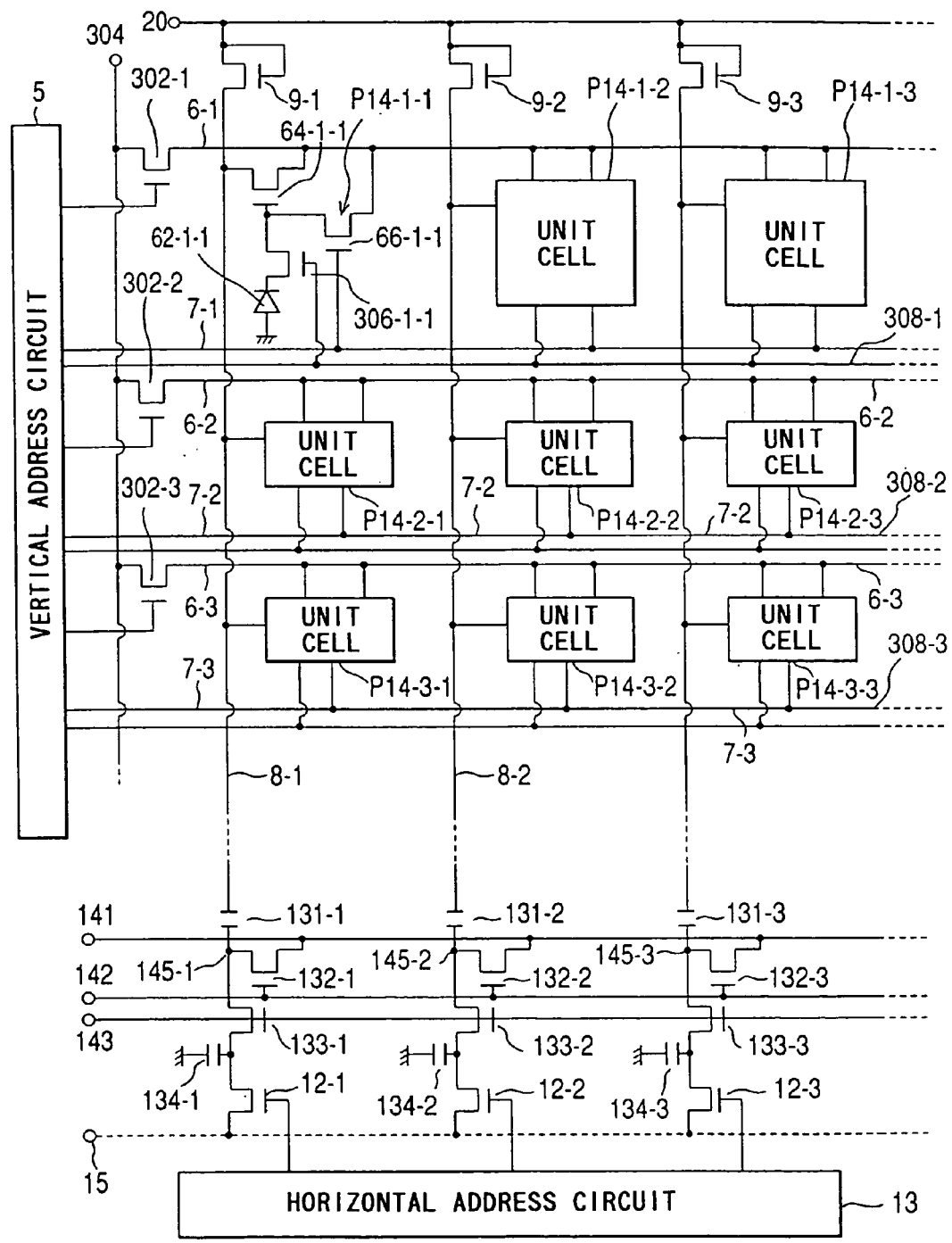
FIG. 100 is a diagram for explaining a forty-fifth embodiment of the present invention and showing the arrangement of the unit cell of an MOS-type solid-state imaging device.

With reference to FIG. 100, forty-fifth embodiment will be described. FIG. 100 is a circuit diagram showing the entire solid-state imaging device of a structure using an amplification-type MOS sensor of the present embodiment. A unit cell P14-i-j of the present embodiment corresponds to the cell structure of forty-first embodiment shown in FIG. 94 except that a transmitting transistor 306 is added between the photodiode 62 and the gate of the amplification transistor 64.

Forty-sixth Embodiment

Figure 101:
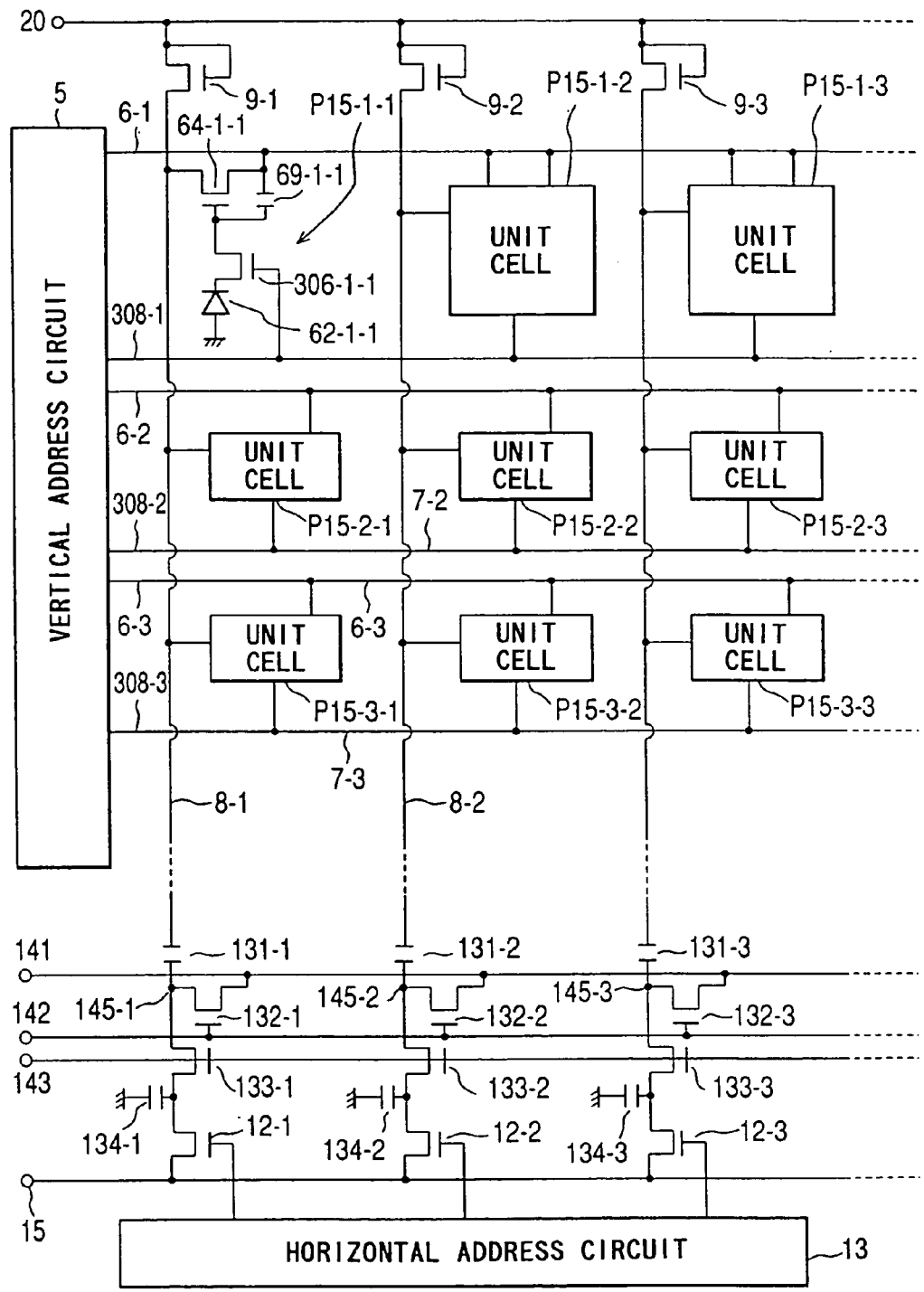
FIG. 101 is a diagram for explaining a forty-sixth embodiment of the present invention and showing the arrangement of the unit cell of an MOS-type solid-state imaging device.

With reference to FIG. 101, forty-sixth embodiment will be described. FIG. 101 is a circuit diagram showing the entire solid-state imaging device of a structure using an amplification-type MOS sensor of the present embodiment. A unit cell P15-i-j of the present embodiment corresponds to the cell structure of forty-second embodiment shown in FIG. 95 except that a transmitting transistor 306 is added between the photodiode 62 and the gate of the amplification transistor 64.

Figure 102:
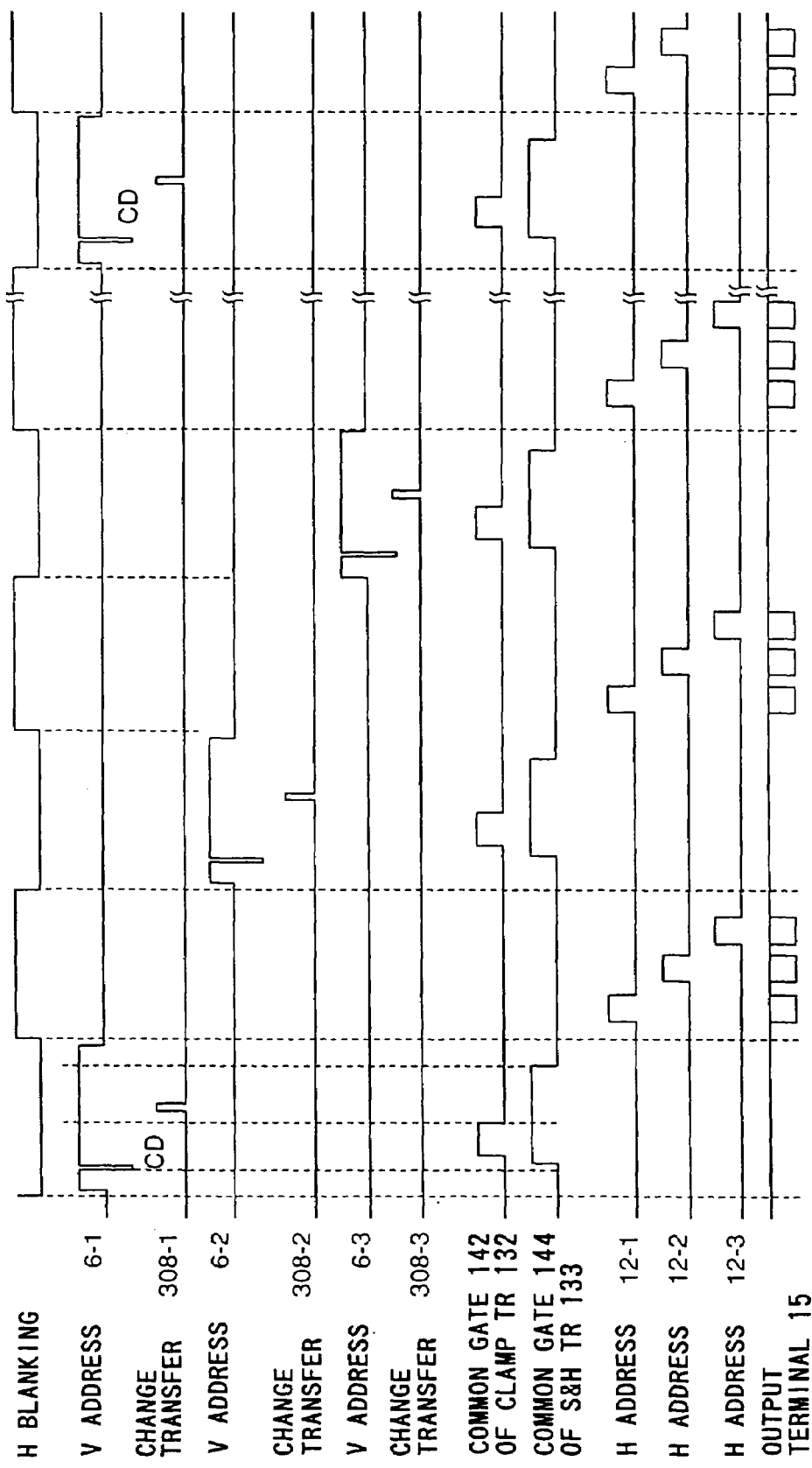
FIG. 102 is a timing chart showing the operation of the forty-sixth embodiment.

FIG. 102 is a timing chart showing an operation of the present embodiment. During a horizontal blanking period, if an address pulse of high level is applied to the vertical address line 6-1, this address pulse of high level is supplied to a gate of an amplification transistor 64 of a unit cell connected to this line through the address capacitor 69, and a potential of a channel under this gate becomes higher than potentials of channels under gates of amplification transistor 64 of unit cells connected to other lines, and is turned on. Therefore, a source follower circuit is constituted by the load transistor 9 and the amplification transistor 64 of the unit cell connected to the vertical address line 6-1, and the gate voltage of the amplification transistor 64, i.e., a voltage which is substantially equal to a voltage of the photodiode 64 appears on the vertical signal line 8.

As described above, only the gate potential of the amplification transistor 64 of the line which is addressed appears on the vertical signal lines 8-1, 8-2, . . . , and gate potentials of amplification transistors 64 of other lines do not appear. Therefore, even if the vertical selection transistor is omitted, it is possible to address the vertical address line.

After that, a negative electric charge discharging pulse CD having a large amplitude is applied to the vertical address line 6-1, and the electric charge of the photodiode 62 is reset. Then, after a sample/hold pulse of high level is applied to the common gate 143 of the sample/hold transistors 133-1, 133-2, . . . , a clamp pulse is applied to the common gate 142 of the clamp transistors 132-1, 132-2, . . . to turn on the clamp transistors 132-1, 132-2, . . . , thereby fixing each of the clamp nodes 145-1, 145-2, . . . to a voltage which is the same as that of the clamp electric power source 141.

Next, after the clamp transistors 132-1, 132-2, . . . are turned off, a transmitting pulse of high level is applied to the electric charge transmitting line 308-1 to turn on the electric charge transmitting transistors 306-1, 306-2, . . . . With this operation, appearing on each of the clamp nodes 145-1, 145-2, . . . is a voltage obtained by adding, to the clamp electric power source 141, a difference in voltage between a case where there exists a signal electric charge in the photodiode 62 and a case where a reset operation is conducted and there is no signal electric charge. Then, an applying operation of the sample/hold pulse is completed.

Then, a horizontal address pulse is sequentially applied to the horizontal selection transistors 12-1, 12-2, . . . from the horizontal address circuit 13, and a signal of one line is output from the horizontal signal line 15.

A sequence in the timing chart of FIG. 96 will be described below. The following order is required.

First rise of vertical address pulse→First fall of vertical address pulse→Second rise of vertical address pulse→Fall of clamp pulse→Rise of electric charge transmitting pulse→Fall of electric charge transmitting pulse→Fall of sample/hold pulse→Second fall of vertical address pulse Although the order of second raise of the vertical pulse, rise of the sample/hold pulse, rise of clamp pulse and fall of the clamp pulse can be arbitrarily set, the above described order is preferable.

With the arrangements of forty-third to forty-sixth embodiments, it is possible to lower the capacity value which detects the electric charge and to enhance the sensitivity by separating the photodiode 62 and the amplification transistor 64. Further, it is also possible to turn off the transmitting transistor 306 to first output, to the vertical signal line 8, a voltage corresponding to a noise component which is obtained when there is no signal electric charge, and then to turn of the transmitting transistor 306 to output a voltage corresponding to the signal component and noise component obtained when there is a signal electric charge. Such an operation to reset at the beginning has a merit that a random noise which is generated by the reset operation can simultaneously be eliminated.

The noise canceler of each of forty-third to forty-sixth embodiments can be modified as in thirty-third embodiment. That is, the description made for FIGS. 81 to 92 and 55 can equally be applied to forty-third to forty-sixth embodiments also.

The present invention is not limited to the above embodiments, and can be variously modified. If, for example, the amplification transistors of unit cells can be manufactured without any threshold variation, since no fixed pattern noise is caused, the noise cancelers can be omitted. If fixed pattern noise exerts no influence on the image quality, the noise cancelers can be also omitted.

In the noise cancelers of each embodiment, since noise decreases as a signal current (only a noise component) to be read out in the absence of an input signal decreases, the voltage applied to the storage drain power supply terminal is preferably set to be almost equal to the video bias voltage. The video bias voltage is the voltage to which the horizontal signal line 15 is almost fixed when a signal is to be read out from the horizontal signal line 15 with a current. FIG. 95 shows a modification implementing this arrangement. An operational amplifier 176 is connected to the output signal line 15, and a load resistor 178 is connected between the input and output terminals of the operational amplifier 176. According to this arrangement, a signal current is forcibly supplied to the load resistor 178, and the horizontal signal line 15 is fixed to a virtual voltage, i.e., the video bias voltage.

In each embodiment described above, the unit cells are arranged in the form of a two-dimensional matrix. As is obvious, however, the present invention can be applied to an imaging device having a one-dimensional array of unit cells. That is, the present invention can be easily applied to not only an arrangement as an area sensor having unit cells in the form of an m×n two-dimensional matrix, but also an arrangement as one-dimensional line sensor having unit cells arranged in a row.

Forty-seventh Embodiment

Figure 103:
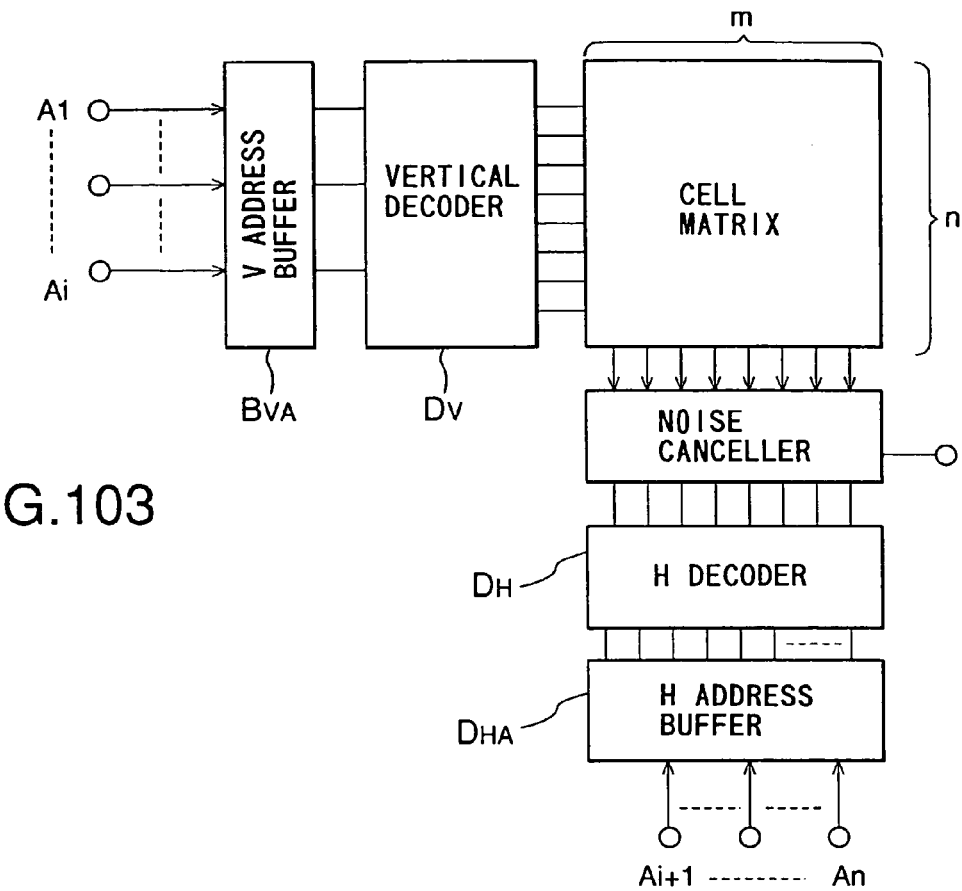
FIG. 103 explains a forty-seventh embodiment of the present invention and is a block diagram showing an arrangement of the peripheral circuit including the cell portion wherein the MOS cell matrix of the present invention is accessed.

When an MOS cell matrix as the light-receiving portion of the matrix arrangement of an MOS sensor is to be randomly accessed, peripheral circuits including a cell portion are arranged as shown in FIG. 103.

Referring to FIG. 103, the MOS sensor has an m×n pixel arrangement having m×n photodiodes arranged in the form of a matrix. This MOS sensor is constituted by a light-receiving device (input device) I having m×n photodiodes in the form of a matrix, a processor device III having a read controller CONT for sequentially reading out signals from the photodiodes constituting the input device I and a noise canceler NC, and an output device for outputting the signals read out by the processor device III.

The read controller CONT is constituted by a vertical address circuit 5 and a horizontal address circuit 13. The vertical address circuit 5 is replaced with a vertical address buffer BVA and a vertical decoder DV, and the horizontal address circuit 13 is replaced with a horizontal address buffer BHA and a horizontal decoder DH. Address signals A1 to Ai are input to the vertical address buffer BVA. Address signals Ai to An are input to the horizontal address buffer BHA. Specific cells are selected by these addresses. The vertical decoder DV and the horizontal decoder DH select a specific line in accordance with address signals input through the vertical address buffer BVA and the horizontal address buffer BHA.

Figure 104:
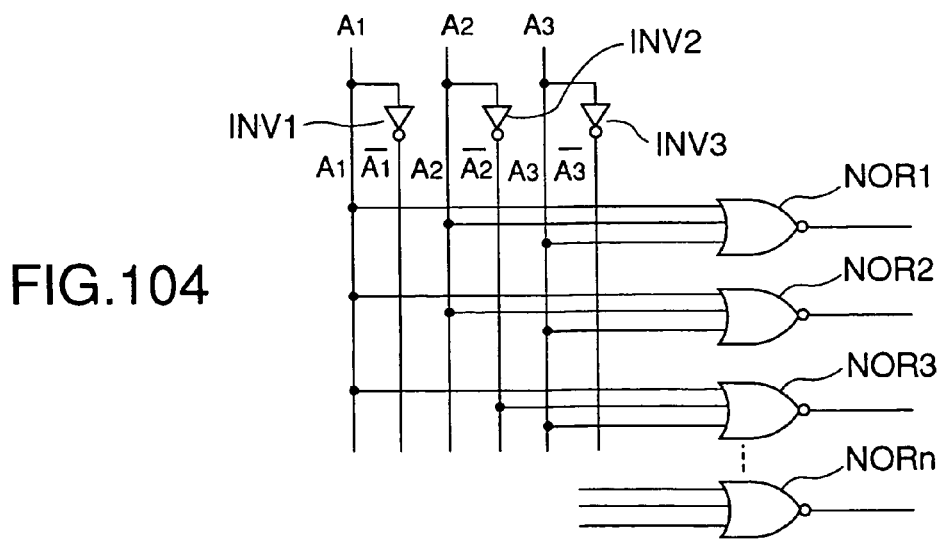
FIG. 104 is a detailed circuit diagram showing address buffers $B_{VA}$, $B_{HA}$ and decoder circuits $D_V$, $D_H$.

FIG. 104 shows a detailed arrangement of the vertical address buffer BVA, the horizontal address buffer BHA, and the decoders DV and DH. For the sake of descriptive convenience, FIG. 104 shows a case in which only the address signals A1, A2, and A3 are used. Signals obtained by inverting the address signals A1, A2, and A3 through corresponding inverters INV1, INV2, and INV3 are supplied parallel to the original signals through vertical lines. Combinations of three different signals are selected from these signals, are input to NOR circuits NOR1, NOR2, and NOR3, respectively. Each of the NOR circuits NOR1, NOR2, and NOR3 calculates the NOR of the three input signals, and outputs an H-level signal only when all the input signals are at L level, thereby selecting a specific line.

Address signals for selecting vertical and horizontal lines may be input from other address terminals. However, these signals can be input from the same address terminal by using a multiplexer, a RAS signal for receiving an address signal as a row address signal (an address signal in the vertical direction), and a CAS signal for receiving an address signal as a column address signal (an address signal in the horizontal direction).

As described above, according to the present invention, there is provided an amplification-type MOS-type solid-state imaging device which can perform noise cancellation to obtain a clear image signal, and can be driven by a single power supply. There is also provided an amplification-type MOS-type solid-state imaging device which can attain a reduction in unit cell size and a reduction in the overall apparatus size. There is also provided a system to which the MOS-type solid-state imaging device is applied, which can attain a reduction in power consumption and obtain high image quality by using this amplification-type MOS-type solid-state imaging device.

What is claimed is:

1. An image system comprising:
  a one-dimensional array of image sensors configured to photoelectrically convert an optical image into an electrical signal corresponding to a light amount of the optical image in units of the image sensors, each of the image sensors comprising a photoelectric converter, an amplification transistor having a gate to which said photoelectric converter is connected through a transfer transistor and for amplifying an output signal from said photoelectric converter and outputting the electrical signal, a selection transistor having a gate to which a selection signal is supplied, and a reset transistor connected to a connection point between said amplification transistor and said transfer transistor;
  noise cancellers, each of which is connected to an image sensor and subtracts a noise component from the electrical signal, each of the noise cancellers comprising a sample/hold capacitor to which the electrical signal from said image sensor is supplied through a clamp capacitor and a sample/hold transistor, and a clamp transistor connected to a connection point between said clamp capacitor and said sample/hold transistor; and
  a semiconductor substrate including a $p^-$-type impurity base layer and a $p^+$-type impurity layer formed thereon, and wherein said array of image sensors is formed in said $p^+$-type impurity layer.

2. The image system according to claim 1, further comprising an image monitor configured to display an image based on the electrical signal from said noise cancellers.

3. The image system according to claim 1, further comprising a printer configured to print an image based on the electrical signal from said noise cancellers.

4. The image system according to claim 1, wherein said selection transistor selectively turns on said amplification transistor.

5. The image system according to claim 1, wherein said reset transistor selectively resets the gate of said amplification transistor.

6. The image system according to claim 1, wherein said sample/hold capacitor comprises a first terminal connected to the sample/hold transistor and a second terminal connected to a ground potential.

7. The image system according to claim 1, wherein each of said noise cancellers further comprises a source follower circuit connected between said image sensor and said clamp capacitor.

8. The image system according to claim 1, wherein each of said noise cancellers further comprises a correction capacitor connected to a connection point between said image sensor and said clamp capacitor configured to decrease a difference between impedances of said clamp capacitor in ON and OFF periods.

9. The image system according to claim 1, wherein said sample/hold capacitor and said clamp capacitor are stacked on each other.

10. The image system according to claim 1, wherein said image sensors are two-dimensionally arrayed.

11. An image system comprising:
  a one-dimensional array of image sensors configured to photoelectrically convert an optical image into an electrical signal corresponding to a light amount of the optical image in units of the image sensors;
  noise cancellers, each of which is connected to an image sensor and subtracts a noise component from the electrical signal, each of the noise cancellers comprising a sample/hold capacitor to which the electrical signal from said image sensor is supplied through a sample/hold transistor and a clamp capacitor, and a clamp transistor connected to a connection point between said clamp capacitor and said sample/hold capacitor; and
  a semiconductor substrate including a $p^-$-type impurity base layer and a $p^+$-type impurity layer formed thereon, and wherein said array of image sensors is formed in said $p^+$-type impurity layer.

12. The image system according to claim 11, wherein said sample/hold capacitor comprises a first terminal connected to the clamp capacitor and a second terminal connected to a ground potential.

13. The image system according to claim 11, wherein each of said image sensors comprises:
  a photoelectric converter;
  an amplification transistor having a gate to which said photoelectric converter is connected and for amplifying an output signal output from said photoelectric converter and outputting an amplified signal;
  a selection transistor having a gate to which a selection signal is supplied; and
  a reset transistor connected to a connection point between said amplification transistor and said selection transistor.

14. The image system according to claim 13, wherein said selection transistor selectively turns on said amplification transistor.

15. The image system according to claim 13, wherein said reset transistor is connected between the gate of the amplification transistor and the connection point between said amplification transistor and said selection transistor and selectively resets the gate of said amplification transistor.

16. The image system according to claim 13, wherein each of said image sensors further comprises a feedback capacitor connected between the reset transistor and the gate of said amplification transistor.

17. The image system according to claim 13, wherein each of said image sensors further comprises a discharge transistor connected between the gate of said amplification transistor and a gate of the reset transistor.

18. The image system according to claim 13, wherein each of said image sensors further comprises a transfer transistor connected between the gate of said amplification transistor and the photoelectric converter.

19. The image system according to claim 11, wherein each of said image sensors comprises:
photoelectric converters;
selection transistors respectively connected to said photoelectric converters and configured to select one of output signals from said photoelectric converters; and
an output circuit configured to receive one of the output signals from said photoelectric converters which is selected by said selection transistors, amplify the output signal, and output an amplified signal.

20. The image system according to claim 19, wherein said output circuit comprises:
an amplification transistor having a gate to which said selected one of the output signals from said photoelectric converters is supplied,
a selection transistor having a gate to which a selection signal is supplied, and
a reset transistor connected to said selection transistor.

21. The image system according to claim 19, wherein said selection transistor selectively turns on said amplification transistor.

22. The image system according to claim 19, wherein said reset transistor is connected between the gate of the amplification transistor and said selection transistor and selectively resets the gate of said amplification transistor.

23. The image system according to claim 19, wherein said output circuit comprises:
an amplification transistor having a gate to which said selected one of the output signals from said photoelectric converters is supplied,
a selection capacitor to which a selection signal is supplied, and
a reset transistor connected to said selection capacitor.

24. The image system according to claim 19, wherein said photoelectric converters are arranged side by side in a vertical direction.

25. The image system according to claim 19, wherein said photoelectric converters are arranged side by side in a horizontal direction.

26. The image system according to claim 25, wherein the output signals from said photoelectric converters are supplied to a first node of a reset transistor and a gate of the amplification transistor through the photodiode selection transistors.

27. The image system according to claim 11, wherein each of said image sensors comprises:
four photoelectric converters arranged in a 2×2 matrix;
selection transistors respectively connected to said photoelectric converters and configured to select one of output signals from said photoelectric converters; and
an output circuit configured to receive one of the output signals from said photoelectric converters which is selected by said selection transistors, amplify the output signal, and output an amplified signal.

28. The image system according to claim 11, wherein each of said image sensors comprises:
a photodiode;
an amplification transistor having a gate to which the photodiode is connected and for amplifying an output signal output from said photoelectric converter and outputting an amplified signal;
a reset transistor to which the photodiode is connected and for resetting a signal electric charge; and
an address capacitor connected between a first node and the gate of the amplification transistor.

29. The image system according to claim 11, wherein each of said image sensors comprises:
a photodiode;
an amplification transistor having a gate to which the photodiode is connected and for amplifying an output signal from said photoelectric converter and outputting an amplified signal; and
an address capacitor connected between a first node and the gate of the amplification transistor.

30. The image system according to claim 29, wherein each of said image sensors further comprises a transmitting transistor connected between the photodiode and the gate of the amplification transistor.

31. The image system according to claim 11, wherein each of said image sensors comprises:
a photodiode;
an amplification transistor having a gate to which the photodiode is connected and for amplifying an output signal output from said photoelectric converter and outputting an amplified signal;
a transmitting transistor connected between the photodiode and the gate of the amplification transistor; and
a reset transistor connected to a connection point between said amplification transistor and said transmitting transistor.

32. The image system according to claim 11, wherein each of said image sensors comprises:
a photodiode;
an amplification transistor having a gate to which the photodiode is connected and for amplifying an output signal from said photoelectric converter and outputting an amplified signal;
an address capacitor connected between a first node and the gate of the amplification transistor; and
a transmitting transistor connected between the photodiode and the gate of the amplification transistor.

33. The image system according to claim 11, wherein each of said noise cancellers further comprises a source follower circuit connected between said image sensor and said clamp capacitor.

34. The image system according to claim 11, wherein each of said noise cancellers further comprises a correction capacitor connected to a connection point between said image sensor and said clamp capacitor configured to decrease a difference between impedances of said clamp capacitor in ON and OFF periods.

35. The image system according to claim 11, wherein said sample/hold capacitor and said clamp capacitor are stacked on each other.

36. The image system according to claim 11, wherein said image sensors are two-dimensionally arrayed.

* * * * *

UNITED STATES PATENT AND TRADEMARK OFFICE
CERTIFICATE OF CORRECTION

| | |
|---|---|
| PATENT NO. | : 7,113,213 B2 |
| APPLICATION NO. | : 09/927632 |
| DATED | : September 26, 2006 |
| INVENTOR(S) | : Matsunaga et al. |

Page 1 of 1

It is certified that error appears in the above-identified patent and that said Letters Patent is hereby corrected as shown below:

On the title page, Item (73), the Assignee information has been omitted. Item (73) should read:

-- (73)   Assignee:   **Kabushiki Kaisha Toshiba,
Kawasaki (JP)** --

Also, on the title page, the inventors' city of residence information is incorrect. Item (75) should read:

-- (75)   Inventors:   Yoshiyuki Matsunaga, 1-4-21-212, Kobukuroya, Kamakura-shi, Kanagawa-ken (JP) 247; Keiji Mabuchi, 2-14-10, Minamikase, Saiwai-ku, Kawasaki-shi, Kanagawa-ken (JP) 211; Shinji Ohsawa, 1-21-24-204, Kokubukita, Ebina-shi, Kanagawa-ken (JP) 243-04; Nobuo Nakamura, 2-1-E620, Toshiba-cho, Fuchu-shi, Tokyo (JP) 183; Hirofumi Yamashita, 1-5-22, Higashiyaguchi, Ota-ku, Tokyo (JP) 146; Hiroki Miura, 2-8-2, Shiomidai, Isogo-ku, Yokohama-shi, Kanagawa-ken (JP) 235; Nagataka Tanaka, 4-19-18-409, Nakamachidai, Tsuzuki-ku, Yokohama-shi, Kanagawa-ken, (JP) 224 --

Signed and Sealed this

Nineteenth Day of December, 2006

JON W. DUDAS
*Director of the United States Patent and Trademark Office*